US011094891B2

(12) United States Patent
Zeng et al.

(10) Patent No.: US 11,094,891 B2
(45) Date of Patent: Aug. 17, 2021

(54) ORGANIC ELECTROLUMINESCENT MATERIALS AND DEVICES

(71) Applicant: Universal Display Corporation, Ewing, NJ (US)

(72) Inventors: Lichang Zeng, Lawrenceville, NJ (US); Vadim Adamovich, Yardley, PA (US); Chuanjun Xia, Lawrenceville, NJ (US); Michael S. Weaver, Princeton, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 437 days.

(21) Appl. No.: 15/447,588

(22) Filed: Mar. 2, 2017

(65) Prior Publication Data

US 2017/0271598 A1 Sep. 21, 2017

Related U.S. Application Data

(60) Provisional application No. 62/309,132, filed on Mar. 16, 2016.

(51) Int. Cl.
*H01L 51/54* (2006.01)
*H01L 51/00* (2006.01)
*C09K 11/02* (2006.01)
*C09K 11/06* (2006.01)
*H01L 51/50* (2006.01)
*H05B 33/20* (2006.01)

(52) U.S. Cl.
CPC ........ *H01L 51/0072* (2013.01); *C09K 11/025* (2013.01); *C09K 11/06* (2013.01); *H01L 51/5096* (2013.01); *H05B 33/20* (2013.01); *C09K 2211/1007* (2013.01); *C09K 2211/1011* (2013.01); *C09K 2211/1014* (2013.01); *C09K 2211/1029* (2013.01); *C09K 2211/1044* (2013.01); *C09K 2211/1048* (2013.01); *C09K 2211/1051* (2013.01); *C09K 2211/1059* (2013.01); *C09K 2211/1066* (2013.01); *C09K 2211/1074* (2013.01); *C09K 2211/1077* (2013.01); *C09K 2211/1081* (2013.01); *C09K 2211/1085* (2013.01); *C09K 2211/185* (2013.01); *C09K 2211/188* (2013.01); *H01L 51/0085* (2013.01); *H01L 2251/5384* (2013.01)

(58) Field of Classification Search
CPC ... C09K 11/025; C09K 11/06; C09K 2211/10; C09K 2211/1007; C09K 2211/1011; C09K 2211/1014; C09K 2211/1029; C09K 2211/1044; C09K 2211/1048; C09K 2211/1051; C09K 2211/1059; C09K 2211/1066; C09K 2211/1074; C09K 2211/1085; C09K 2211/1081; C09K 2211/185; C09K 2211/188; H01L 2251/5384; H01L 51/0032; H01L 51/0052; H01L 51/0056; H01L 51/0058; H01L 51/0054; H01L 51/0067; H01L 51/0071; H01L 51/0072; H01L 51/0073; H01L 51/0074; H01L 51/0085; H01L 51/0087; H01L 51/0088; H01L 51/50; H01L 51/5012; H01L 51/5016; H01L 51/5048; H01L 51/5052; H01L 51/5056; H01L 51/506; H01L 51/5072; H01L 51/5076; H01L 51/5096
USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,921,915 | B2 | 7/2005 | Takiguchi et al. |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

(Continued)

*Primary Examiner* — Andrew K Bohaty
(74) *Attorney, Agent, or Firm* — Duane Morris LLP

(57) ABSTRACT

A dual host system for OLEDs that contains hole-transporting indolocarbazole and electron-transporting indolocarbazole exhibiting superior performance in the OLEDs is disclosed.

19 Claims, 2 Drawing Sheets

(56) References Cited

U.S. PATENT DOCUMENTS

| | | |
|---|---|---|
| 7,087,321 B2 | 8/2006 | Kwong et al. |
| 7,090,928 B2 | 8/2006 | Thompson et al. |
| 7,154,114 B2 | 12/2006 | Brooks et al. |
| 7,250,226 B2 | 7/2007 | Tokito et al. |
| 7,279,704 B2 | 10/2007 | Walters et al. |
| 7,332,232 B2 | 2/2008 | Ma et al. |
| 7,338,722 B2 | 3/2008 | Thompson et al. |
| 7,393,599 B2 | 7/2008 | Thompson et al. |
| 7,396,598 B2 | 7/2008 | Takeuchi et al. |
| 7,431,968 B1 | 10/2008 | Shtein et al. |
| 7,445,855 B2 | 11/2008 | Mackenzie et al. |
| 7,534,505 B2 | 5/2009 | Lin et al. |
| 2002/0034656 A1 | 3/2002 | Thompson et al. |
| 2002/0134984 A1 | 9/2002 | Igarashi |
| 2002/0158242 A1 | 10/2002 | Son et al. |
| 2003/0138657 A1 | 7/2003 | Li et al. |
| 2003/0152802 A1 | 8/2003 | Tsuboyama et al. |
| 2003/0162053 A1 | 8/2003 | Marks et al. |
| 2003/0175553 A1 | 9/2003 | Thompson et al. |
| 2003/0230980 A1 | 12/2003 | Forrest et al. |
| 2004/0036077 A1 | 2/2004 | Ise |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2005/0025993 A1 | 2/2005 | Thompson et al. |
| 2005/0112407 A1 | 5/2005 | Ogasawara et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0202194 A1 | 9/2006 | Jeong et al. |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0190359 A1 | 8/2007 | Knowles et al. |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0101870 A1 | 4/2009 | Pakash et al. |
| 2009/0108737 A1 | 4/2009 | Kwong et al. |
| 2009/0115316 A1 | 5/2009 | Zheng et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |
| 2011/0057171 A1* | 3/2011 | Adamovich ........ H01L 51/5016 257/40 |
| 2012/0007070 A1* | 1/2012 | Kai .................... H01L 51/0072 257/40 |
| 2012/0273764 A1* | 11/2012 | Yu ......................... C09K 11/06 257/40 |
| 2014/0299865 A1* | 10/2014 | Nishimura .......... H01L 51/0067 257/40 |

FOREIGN PATENT DOCUMENTS

| | | |
|---|---|---|
| EP | 2034538 | 3/2009 |
| JP | 200511610 | 1/2005 |
| JP | 2007123392 | 5/2007 |
| JP | 2007254297 | 10/2007 |
| JP | 2008074939 | 4/2008 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 04107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2015/167259 | 11/2015 |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato) beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

(56) References Cited

OTHER PUBLICATIONS

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1)162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Lo, Shih-Chun et al., "Blue Phosphorescence from Iridium(III) Complexes at Room Temperature," Chem. Mater., 18(21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota,Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based on Silole Derivatives and Their Exciplexes," Organic Electronics, 4:113-121 (2003).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Ranjan, Sudhir et al., "Realizing Green Phosphorescent Light-Emitting Materials from Rhenium(I) Pyrazolato Diimine Complexes," Inorg. Chem., 42(4):1248-1255 (2003).

Sakamoto, Youichi et al., "Synthesis, Characterization, and Electron-Transport Property of Perfluorinated Phenylene Dendrimers," J. Am. Chem. Soc., 122(8):1832-1833 (2000).

Salbeck, J. et al., "Low Molecular Organic Glasses for Blue Electroluminescence," Synthetic Metals, 91: 209-215 (1997).

Shirota, Yasuhiko et al., "Starburst Molecules Based on pi-Electron Systems as Materials for Organic Electroluminescent Devices," Journal of Luminescence, 72-74:985-991 (1997).

Sotoyama, Wataru et al., "Efficient Organic Light-Emitting Diodes with Phosphorescent Platinum Complexes Containing N^C^N-Coordinating Tridentate Ligand," Appl. Phys. Lett., 86:153505-1-153505-3 (2005).

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).

T. Östergård et al., "Langmuir-Blodgett Light-Emitting Diodes of Poly(3-Hexylthiophene) Electro-Optical Characteristics Related to Structure," Synthetic Metals, 88:171-177 (1997).

Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).

Tang, C.W. and VanSlyke, S.A., "Organic Electroluminescent Diodes," Appl. Phys. Lett., 51(12):913-915 (1987).

Tung, Yung-Liang et al., "Organic Light-Emitting Diodes Based on Charge-Neutral Ru II Phosphorescent Emitters," Adv. Mater., 17(8)1059-1064 (2005).

Van Slyke, S. A. et al., "Organic Electroluminescent Devices with Improved Stability," Appl. Phys. Lett., 69(15):2160-2162 (1996).

Wang, Y. et al., "Highly Efficient Electroluminescent Materials Based on Fluorinated Organometallic Iridium Compounds," Appl. Phys. Lett., 79(4):449-451 (2001).

Wong, Keith Man-Chung et al., A Novel Class of Phosphorescent Gold(III) Alkynyl-Based Organic Light-Emitting Devices with Tunable Colour, Chem. Commun., 2906-2908 (2005).

Wong, Wai-Yeung, "Multifunctional Iridium Complexes Based on Carbazole Modules as Highly Efficient Electrophosphors," Angew. Chem. Int. Ed., 45:7800-7803 (2006).

\* cited by examiner

ORGANIC ELECTROLUMINESCENT MATERIALS AND DEVICES

CROSS-REFERENCE TO RELATED APPLICATIONS

This application claims priority under 35 U.S.C. § 119(e) to U.S. Provisional Application Ser. No. 62/309,132, filed Mar. 16, 2016, the entire contents of which is incorporated herein by reference.

FIELD

The present invention relates to a dual host system comprising a hole-transporting indolocarbazole compound and an electron-transporting indolocarbazole compound that exhibits superior performance in organic electroluminescence devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted Ir(ppy)$_3$, which has the following structure:

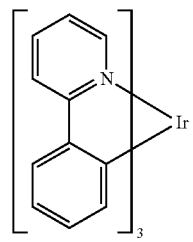

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" or "deposited over" a second layer, the first layer is disposed further away from substrate. There may be other layers between the first and second layer, unless it is specified that the first layer is "in contact with" the second layer. For example, a cathode may be described as "disposed over" or "deposited over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an aspect of the present disclosure, a composition comprising a mixture of a first compound and a second compound is disclosed; wherein the first compound has a structure of Formula I:

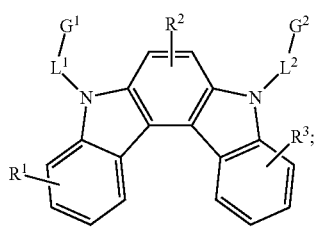

Formula I wherein the second compound has a structure of Formula II

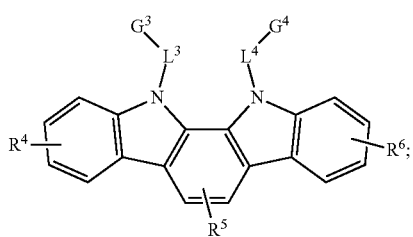

Formula II wherein $L^1$, $L^2$, $L^3$ and $L^4$ are each independently selected from the group consisting of direct bond, alkyl, alkenyl, alkynyl, aryl, heteroaryl, and combinations thereof;

wherein $G^1$ and $G^2$ are each independently selected from the group consisting of hydrogen, deuterium, halogen, alkyl, alkyloxy, cycloalkyl, cycloalkoxyl, silyl, amino, benzene, biphenyl, terphenyl, naphthalene, triphenylene, pyrene, anthracene, phenanthrene, fluoranthene, fluorene, dibenzofuran, dibenzothiophene, dibenzoselenophene, carbazole, and combinations thereof; wherein $G^3$ is selected from the group consisting of pyridine, pyramidine, pyrazine, triazine, quinoline, isoquinoline, quinazoline, quinoxaline, benzimidazole, aza-triphenylene, phenanthroline, aza-pyrene, aza-anthracene, aza-fluorene, aza-dibenzofuran, aza-dibenzothiophene, aza-dibenzoselenophene, aza-carbazole, and combinations thereof;

wherein $G^4$ is selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;

wherein $G^3$ is optionally further substituted with substituent selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;

wherein $R^1$, $R^2$, $R^3$, $R^4$, $R^5$ and $R^6$ each independently represents mono to maximum allowable substitutions, or no substitution; and wherein $R^1$, $R^2$, $R^3$, $R^4$, $R^5$ and $R^6$ are each independently selected from the group consisting of hydrogen, deuterium, halogen, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, and wherein any two adjacent substituents optionally join or fuse into a ring.

According to another aspect of the present disclosure, an OLED is disclosed where the OLED comprises:
an anode;
a cathode; and
an organic layer, disposed between the anode and the cathode, comprising a mixture of a first compound and a second compound;
wherein the first compound has a structure of Formula I:

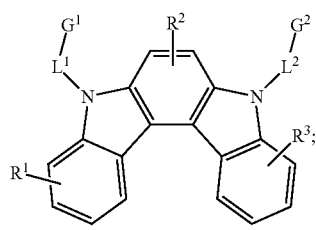

Formula I wherein the second compound has a structure of Formula II:

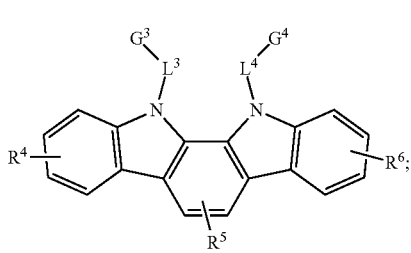

Formula II wherein $L^1$, $L^2$, $L^3$ and $L^4$ are each independently selected from the group consisting of direct bond, alkyl, alkenyl, alkynyl, aryl, heteroaryl, and combinations thereof;

wherein $G^1$ and $G^2$ are each independently selected from the group consisting of hydrogen, deuterium, halogen, alkyl, alkyloxy, cycloalkyl, cycloalkoxyl, silyl, amino, benzene, biphenyl, terphenyl, naphthalene, triphenylene, pyrene, anthracene, phenanthrene, fluoranthene, fluorene, dibenzofuran, dibenzothiophene, dibenzoselenophene, carbazole, and combinations thereof;

wherein $G^3$ is selected from the group consisting of pyridine, pyramidine, pyrazine, triazine, quinoline, isoquinoline, quinazoline, aza-triphenylene, phenanthroline, aza-pyrene, aza-anthracene, aza-fluorene, aza-dibenzofuran, aza-dibenzothiophene, aza-dibenzoselenophene, aza-carbazole, and combinations thereof;

wherein $G^4$ is selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;

wherein $G^3$ is optionally further substituted with substituent selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;

wherein $R^1$, $R^2$, $R^3$, $R^4$, $R^5$ and $R^6$ each independently represents mono to maximum allowable substitutions, or no substitution; and wherein $R^1$, $R^2$, $R^3$, $R^4$, $R^5$ and $R^6$ are each independently selected from the group consisting of hydrogen, deuterium, halogen, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, and wherein any two adjacent substituents optionally join or fuse into a ring.

According to another aspect of the present disclosure, a method for fabricating an OLED comprising a first electrode, a second electrode, and a first organic layer disposed between the first electrode and the second electrode, wherein the first organic layer comprises a first composition comprising a mixture of a first compound and a second compound, is disclosed. The method comprises:

providing a substrate having the first electrode disposed thereon;

depositing the first organic layer over the first electrode; and depositing the second electrode over the first organic layer, wherein the first compound has a structure of Formula I:

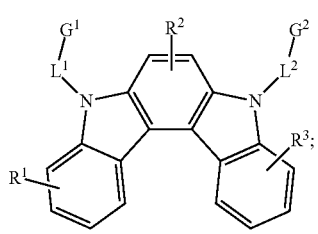

Formula I wherein the second compound has a structure of Formula II;

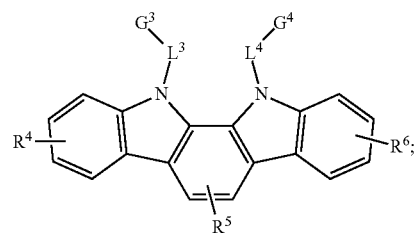

Formula II wherein $L^1$, $L^2$, $L^3$ and $L^4$ are each independently selected from the group consisting of direct bond, alkyl, alkenyl, alkynyl, aryl, heteroaryl, and combinations thereof;

wherein $G^1$ and $G^2$ are each independently selected from the group consisting of hydrogen, deuterium, halogen, alkyl, alkyloxy, cycloalkyl, cycloalkoxyl, silyl, amino, benzene, biphenyl, terphenyl, naphthalene, triphenylene, pyrene, anthracene, phenanthrene, fluoranthene, fluorene, dibenzofuran, dibenzothiophene, dibenzoselenophene, carbazole, and combinations thereof; wherein $G^3$ is selected from the group consisting of pyridine, pyramidine, pyrazine, triazine, quinoline, isoquinoline, quinazoline, aza-triphenylene, phenanthroline, aza-pyrene, aza-anthracene, aza-fluorene, aza-dibenzofuran, aza-dibenzothiophene, aza-dibenzoselenophene, aza-carbazole, and combinations thereof;

wherein $G^4$ is selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;

wherein $G^3$ is optionally further substituted with substituent selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;

wherein $R^1$, $R^2$, $R^3$, $R^4$, $R^5$ and $R^6$ each independently represents mono to maximum allowable substitutions, or no substitution; and wherein $R^1$, $R^2$, $R^3$, $R^4$, $R^5$ and $R^6$ are each independently selected from the group consisting of hydrogen, deuterium, halogen, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, and wherein any two adjacent substituents optionally join or fuse into a ring.

According to another aspect, an OLED is disclosed which comprises: an anode; a cathode; a first organic layer and an electron blocking layer, disposed between the anode and the cathode. The first organic layer in this embodiment is an emissive layer. The electron blocking layer comprising a compound having a structure of Formula I:

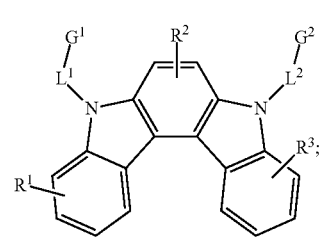

Formula I wherein $L^1$, $L^2$ are each independently selected from the group consisting of direct bond, alkyl, alkenyl, alkynyl, aryl, heteroaryl, and combinations thereof;

wherein $G^1$ and $G^2$ are each independently selected from the group consisting of hydrogen, deuterium, halogen, alkyl, alkyloxy, cycloalkyl, cycloalkoxyl, silyl, amino, benzene, biphenyl, terphenyl, naphthalene, triphenylene, pyrene, anthracene, phenanthrene, fluoranthene, fluorene, dibenzofuran, dibenzothiophene, dibenzoselenophene, carbazole, and combinations thereof;

wherein $R^1$, $R^2$, and $R^3$ each independently represents mono to maximum allowable substitutions, or no substitution; and wherein $R^1$, $R^2$, and $R^3$ are each independently selected from the group consisting of hydrogen, deuterium, halogen, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, and wherein any two adjacent substituents optionally join or fuse into a ring.

According to another aspect, a consumer product comprising an OLED is disclosed where the OLED comprises:
an anode;
a cathode; and
an organic layer, disposed between the anode and the cathode, comprising a mixture of a first compound and a second compound;
wherein the first compound has a structure of Formula I:

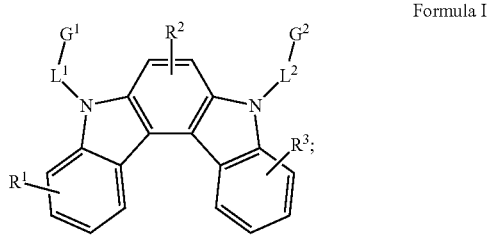

Formula I wherein the second compound has a structure of Formula II:

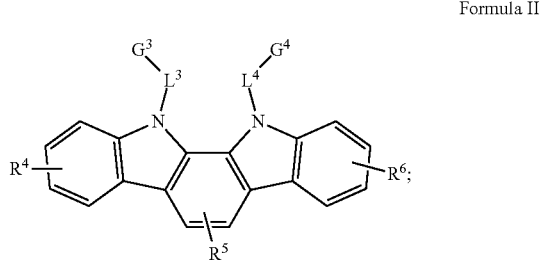

Formula II wherein $L^1$, $L^2$, $L^3$ and $L^4$ are each independently selected from the group consisting of direct bond, alkyl, alkenyl, alkynyl, aryl, heteroaryl, and combinations thereof;

wherein $G^1$ and $G^2$ are each independently selected from the group consisting of hydrogen, deuterium, halogen, alkyl, alkyloxy, cycloalkyl, cycloalkoxyl, silyl, amino, benzene, biphenyl, terphenyl, naphthalene, triphenylene, pyrene, anthracene, phenanthrene, fluoranthene, fluorene, dibenzofuran, dibenzothiophene, dibenzoselenophene, carbazole, and combinations thereof;

wherein $G^3$ is selected from the group consisting of pyridine, pyramidine, pyrazine, triazine, quinoline, isoquinoline, quinazoline, aza-triphenylene, phenanthroline, aza-pyrene, aza-anthracene, aza-fluorene, aza-dibenzofuran, aza-dibenzothiophene, aza-dibenzoselenophene, aza-carbazole, and combinations thereof;

wherein $G^4$ is selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;

wherein $G^3$ is optionally further substituted with substituent selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;

wherein $R^1$, $R^2$, $R^3$, $R^4$, $R^5$ and $R^6$ each independently represents mono to maximum allowable substitutions, or no substitution; and wherein $R^1$, $R^2$, $R^3$, $R^4$, $R^5$ and $R^6$ are each independently selected from the group consisting of hydrogen, deuterium, halogen, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, and wherein any two adjacent substituents optionally join or fuse into a ring.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
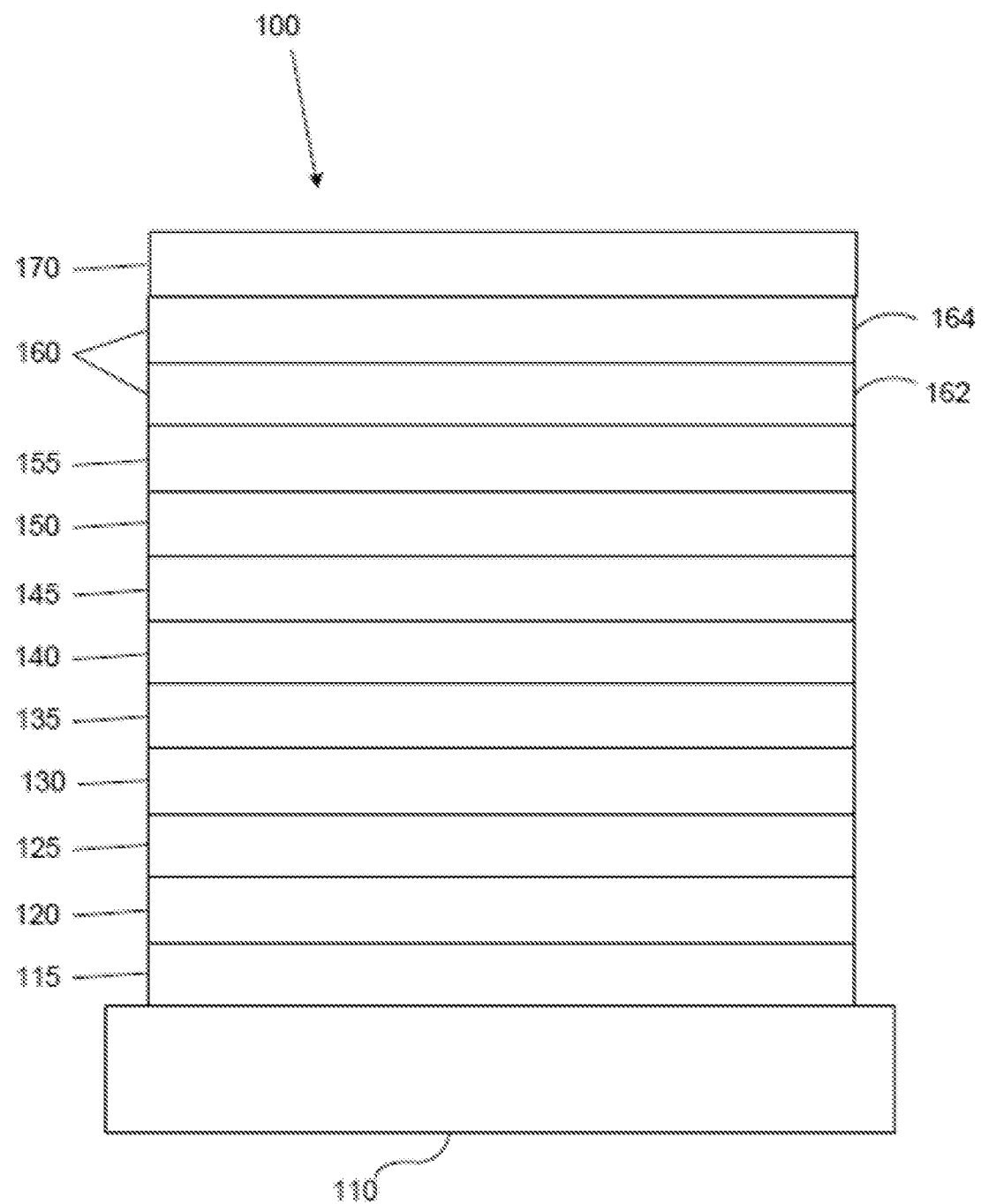
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
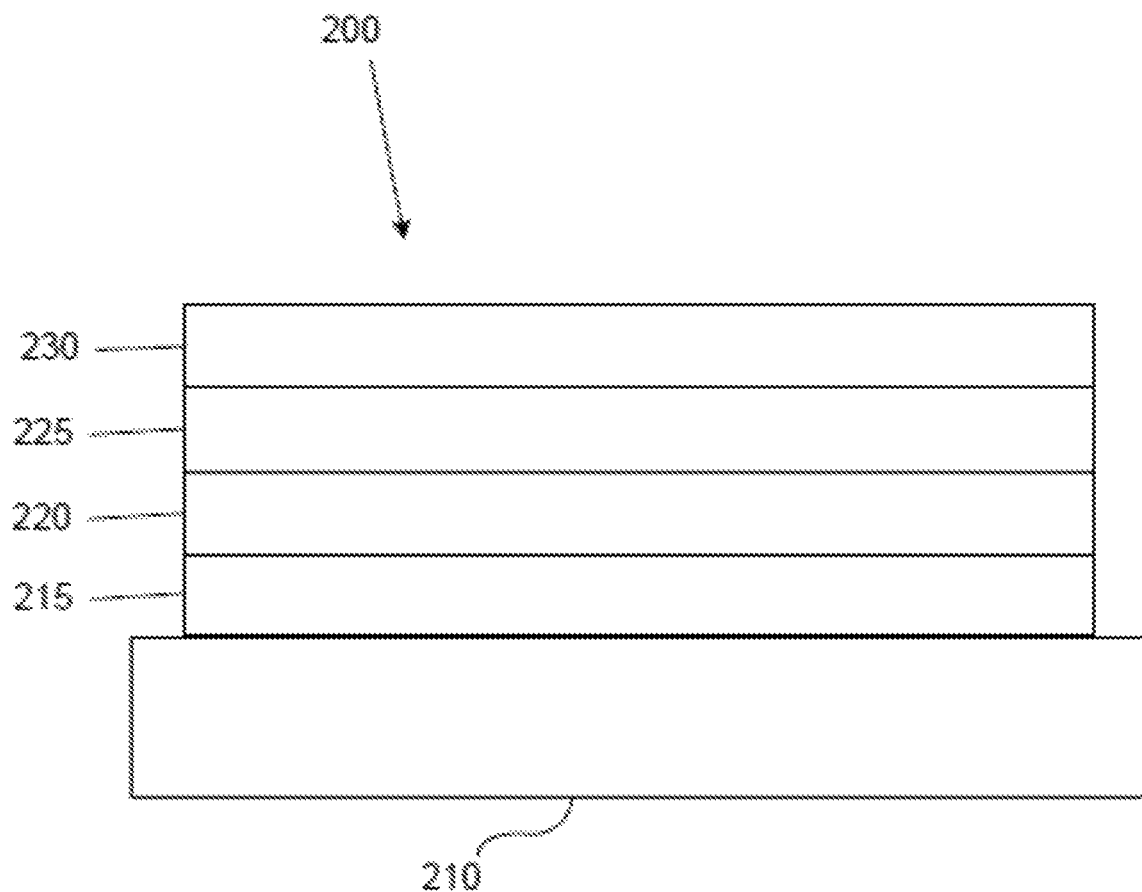
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo," "halogen," or "halide" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" as used herein contemplates cyclic alkyl radicals. Preferred cycloalkyl groups are those containing 3 to 10 ring carbon atoms and includes cyclopropyl, cyclopentyl, cyclohexyl, adamantyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Heteroaromatic cyclic radicals also means heteroaryl. Preferred hetero-non-aromatic cyclic groups are those containing 3 to 7 ring atoms which includes at least one hetero atom, and includes cyclic amines such as morpholino, piperdino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" as used herein contemplates single-ring hetero-aromatic groups that may include from one to five heteroatoms. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, heteroalkyl, arylalkyl, alkyloxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the state-of-the-art OLED devices, two or more host materials can be used in the emissive layer (EML). For example, one hole-transporting cohost (h-host) and one electron-transporting cohost (e-host) can be judiciously selected for EML to minimize charge-injection barrier and balance charge carrier fluxes for achieving reduced operation voltage, improved efficiency and extended lifetime. To fabricate such a multiple-component EML, the two hosts can be thermally evaporated from two different sources; or alternatively, the two hosts can be mixed together and thermally evaporated from one single source if they are premixable, i.e. their concentrations remain constant during long-term thermal evaporation.

The performance of host materials is dependent on their chemical structures. Indolocarbazole derivatives have rigid planar structures and favorable energy levels, conducive to excellent charge-transport properties. Indolocarbazole has high triplet energies which can effectively confine excitons on the emitters, desirable to improve device efficiency.

There are five different isomers of indolocarbazole. Both hole-transporting and electron-transporting materials can be synthesized by introducing appropriate building blocks to any one of these indolcoarbazoles. This versatility in materials synthesis makes indolocarbazole particularly attractive for use in the multicomponent EML in OLEDs. When both the h-host and e-host are derivatised from indolocarbazole, they have structural similarity, which have multiple benefits. For example, two components of similar structures are more likely to assemble together, facilitating charge transport while alleviating the negative effect of potential phase separation which is detrimental to device performance. Further, it should be more straightforward to find two premixable components among compounds with structural similarity.

Often, the EML of OLEDs exhibiting good lifetime and efficiency requires more than two components (e.g. 3 or 4 components). Fabricating such EMLs using vacuum thermal evaporation (VTE) process then requires evaporating 3 or 4 evaporation source materials in separate VTE sublimation crucibles, which is very complicated and costly compared to a standard two-component EML with a single host and an emitter, which requires only two evaporation sources.

Premixing two or more materials and evaporating them from one VTE sublimation crucible can reduce the complexity of the fabrication process. However, the co-evaporation must be stable and produce an evaporated film having a composition that remains constant through the evaporation process. Variations in the film's composition may adversely affect the device performance. In order to obtain a stable co-evaporation from a mixture of compounds under vacuum, one would assume that the materials must have the same evaporation temperature under the same condition. However, this may not be the only parameter one has to consider. When two compounds are mixed together, they may interact with each other and the evaporation property of the mixture may differ from their individual properties. On the other hand, materials with slightly different evaporation temperatures may form a stable co-evaporation mixture. Therefore, it is extremely difficult to achieve a stable co-evaporation mixture. So far, there have been very few stable co-evaporation mixture examples. "Evaporation temperature" of a material is measured in a vacuum deposition tool at a constant pressure, normally between $1\times10^{-7}$ Torr to $1\times10^{-8}$ Torr, at a 2 Å/sec deposition rate on a surface positioned at a set distance away from the evaporation source of the material being evaporated, e.g. sublimation crucible in a VTE tool. The various measured values such as temperature, pressure, deposition rate, etc. disclosed herein are expected to have nominal variations because of the expected tolerances in the measurements that produced these quantitative values as understood by one of ordinary skill in the art.

Many factors other than temperature can contribute to the ability to achieve stable co-evaporation, such as the miscibility of the different materials and the phase transition temperatures of the different materials. The inventors have found that when two materials have similar evaporation temperatures, and similar mass loss rate or similar vapor pressures, the two materials can co-evaporate consistently. "Mass loss rate" of a material is defined as the percentage of mass lost over time ("percentage/minute" or "%/min") and is determined by measuring the time it takes to lose the first 10% of the mass of a sample of the material as measured by thermal gravity analysis (TGA) under a given experimental condition at a given constant temperature for a given material after the a steady evaporation state is reached. The given constant temperature is one temperature point that is chosen so that the value of mass loss rate is between about 0.05 to 0.50%/min. A skilled person in this field should appreciate that in order to compare two parameters, the experimental condition should be consistent. The method of measuring mass loss rate and vapor pressure is well known in the art and can be found, for example, in Bull. et al. Mater. Sci. 2011, 34, 7.

In this disclosure, inventors have discovered unexpected good results from the combination of indolo[2,3-c]carbazole hole-transporting hosts and indolo[2,3-a]carbazole electron transporting hosts in the emissive layer. This combination offers high EQE, low voltage, and long lifetime for PHOLEDs.

According to an aspect, a composition comprising a mixture of a first compound and a second compound is disclosed; wherein the first compound has a structure of Formula I:

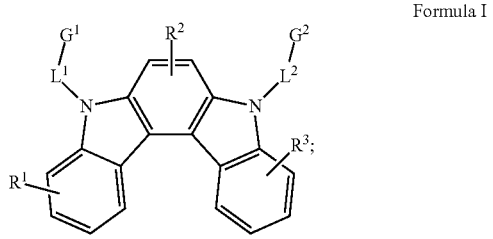

Formula I wherein the second compound has a structure of Formula II:

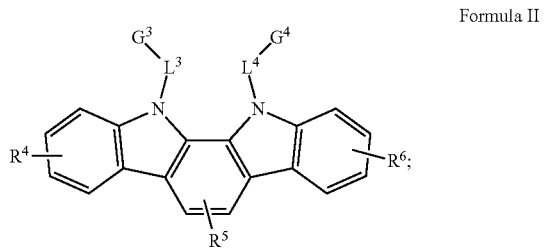

Formula II wherein $L^1$, $L^2$, $L^3$ and $L^4$ are each independently selected from the group consisting of direct bond, alkyl, alkenyl, alkynyl, aryl, heteroaryl, and combinations thereof;

wherein $G^1$ and $G^2$ are each independently selected from the group consisting of hydrogen, deuterium, halogen, alkyl, alkyloxy, cycloalkyl, cycloalkoxyl, silyl, amino, benzene, biphenyl, terphenyl, naphthalene, triphenylene, pyrene, anthracene, phenanthrene, fluoranthene, fluorene, dibenzofuran, dibenzothiophene, dibenzoselenophene, carbazole, and combinations thereof;

wherein $G^3$ is selected from the group consisting of pyridine, pyramidine, pyrazine, triazine, quinoline, isoquinoline, quinazoline, quinoxaline, benzimidazole, aza-triphenylene, phenanthroline, aza-pyrene, aza-anthracene, aza-fluorene, aza-dibenzofuran, aza-dibenzothiophene, aza-dibenzoselenophene, aza-carbazole, and combinations thereof;

wherein $G^4$ is selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;

wherein $G^3$ is optionally further substituted with substituent selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;

wherein $R^1$, $R^2$, $R^3$, $R^4$, $R^5$ and $R^6$ each independently represents mono to maximum allowable substitutions, or no substitution;

wherein $R^1$, $R^2$, $R^3$, $R^4$, $R^5$ and $R^6$ are each independently selected from the group consisting of hydrogen, deuterium, halogen, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, and wherein any two adjacent substituents optionally join or fuse into a ring.

In some embodiments of the composition, the first compound has an evaporation temperature $T_1$ of 150 to 350° C., the second compound has an evaporation temperature $T_2$ of 150 to 350° C., the absolute value of $T_1-T_2$ is less than 20° C., the first compound has a concentration $C_1$ in said mixture and a concentration $C_2$ in a film formed by evaporating the mixture in a vacuum deposition tool at a constant pressure between $1\times10^{-6}$ Torr to $1\times10^{-9}$ Torr, at a 2 Å/sec deposition rate on a surface positioned at a predefined distance away from the mixture being evaporated, and the absolute value of $(C_1-C_2)/C_1$ is less than 5% (i.e., 0.05). The requirement that the absolute value of $(C_1-C_2)/C_1$ is less than 5% ensures that the composition of the mixture before evaporation and after deposition on the surface remain consistent. The concentration values $C_1$ and $C_2$ can be measured in any convenient units such as mol %, vol. %, and weight %, etc. One of ordinary skill in the art would of course recognize, however, that the two values $C_1$ and $C_2$ need to be in same units in order to calculate $(C_1-C_2)/C_1$.

In some embodiments of the composition, the first compound has a vapor pressure of $P_1$ at $T_1$ at 1 atm, and the second compound has a vapor pressure of $P_2$ at $T_2$ at 1 atm, and the ratio of $P_1/P_2$ is within the range of 0.90:1 to 1.10:1.

In some embodiments of the composition, the first compound has a first mass loss rate and the second compound has a second mass loss rate, wherein the ratio between the first mass loss rate and the second mass loss rate is within the range of 0.90:1 to 1.10:1.

In some embodiments of the composition, the first compound is selected from the group consisting of:

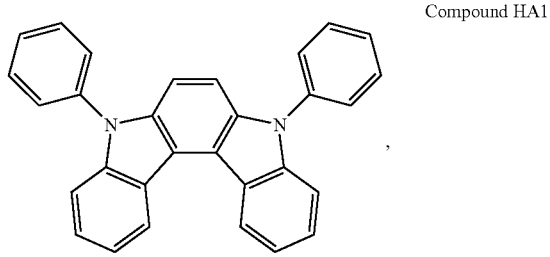

Compound HA1

Compound HA2
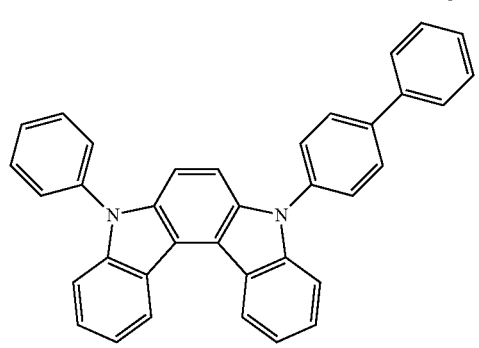
Compound HA3
Compound HA4
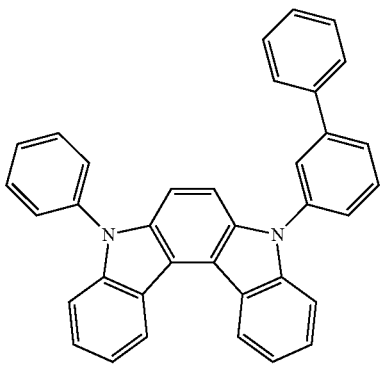
Compound HA5
Compound HA6
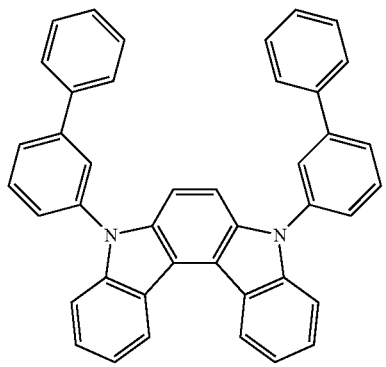
Compound HA7
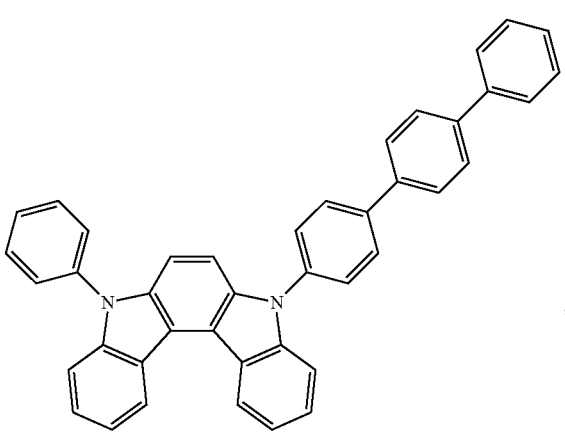
Compound HA8
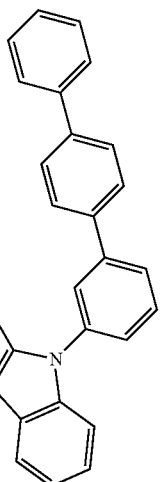

Compound HA9
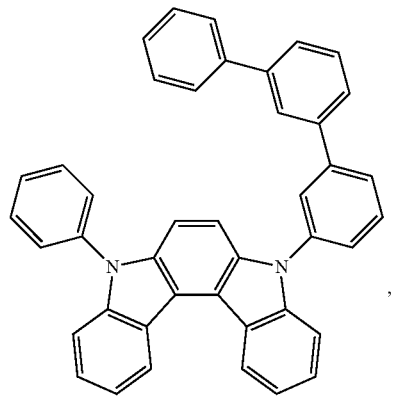
Compound HA10
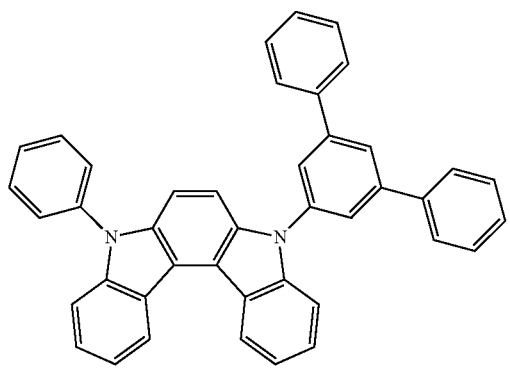
Compound HA11
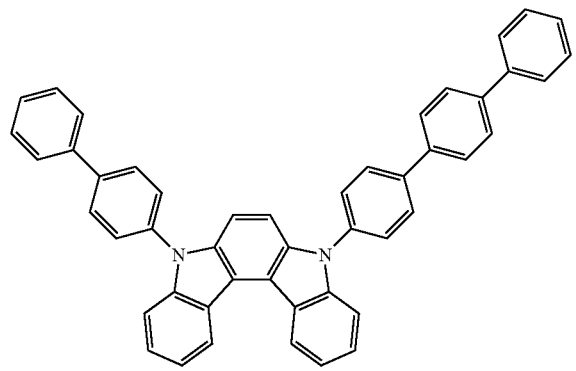
Compound HA12
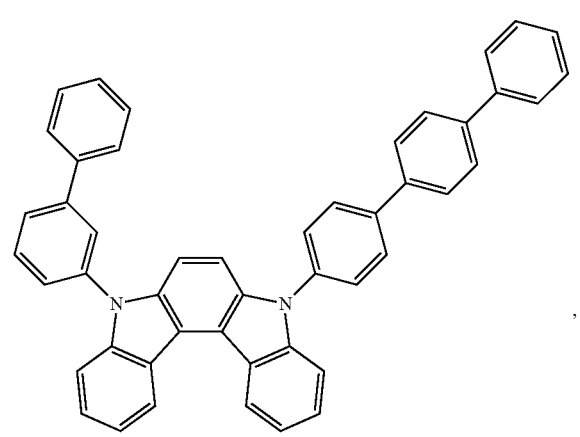
Compound HA13
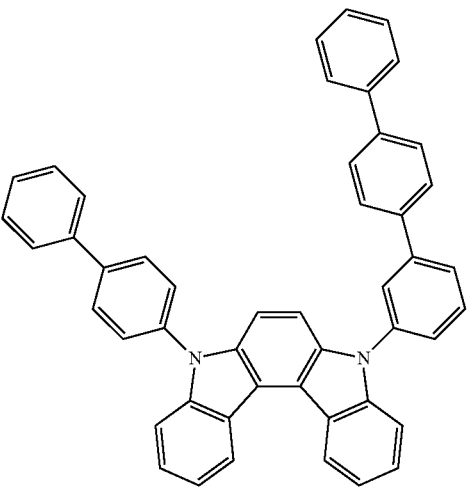
Compound HA14
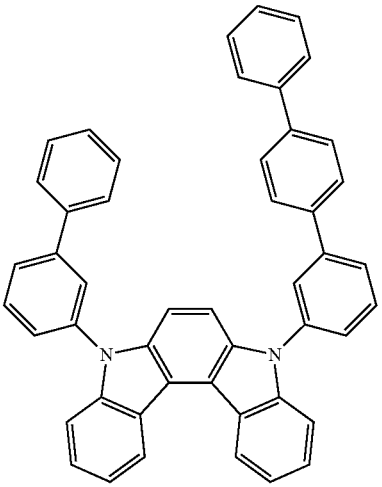
Compound HA15
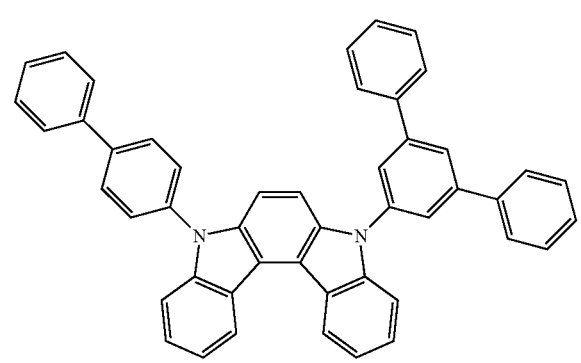

Compound HA16
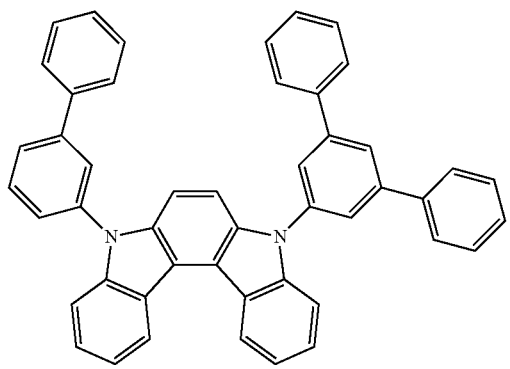
Compound HA17
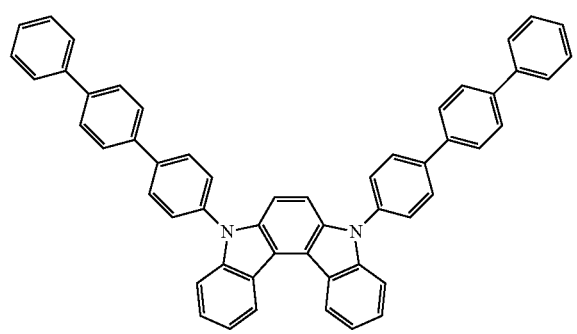
Compound HA18
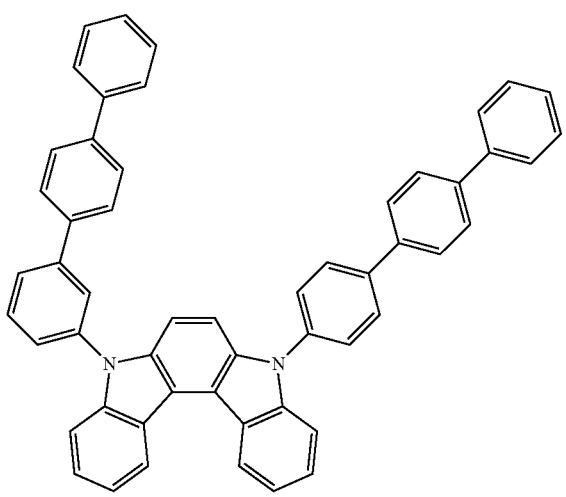
Compound HA19
Compound HA20
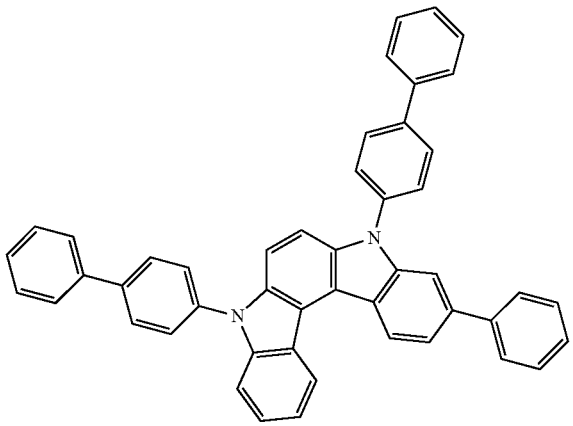
Compound HA21
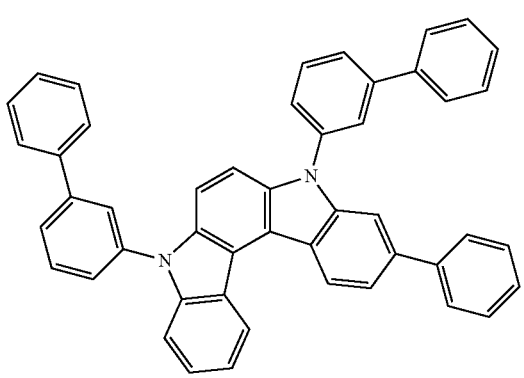
Compound HA22
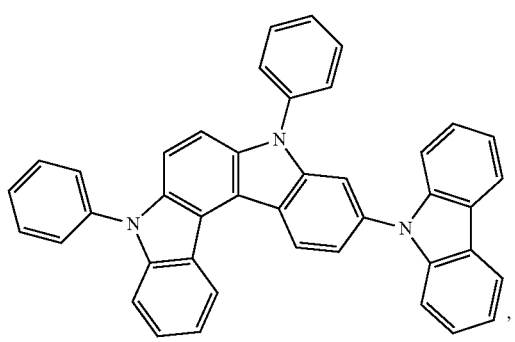
Compound HA23
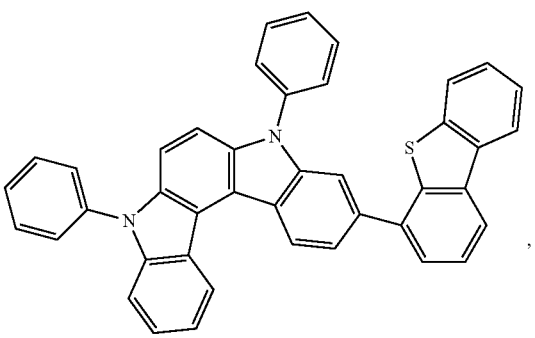

Compound HA24
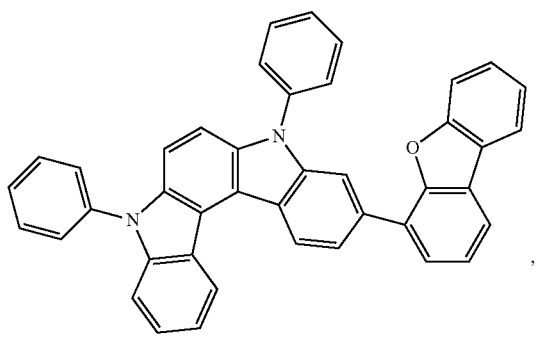
Compound HA25
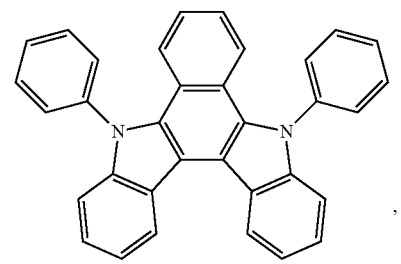
Compound HA26
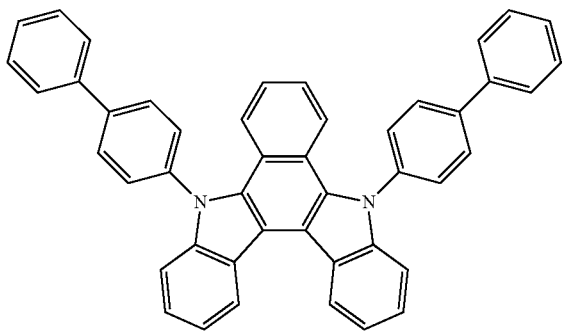
Compound HA27
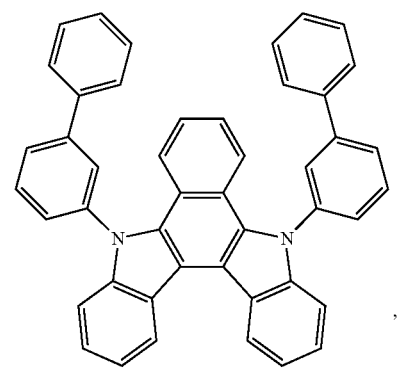
Compound HA28
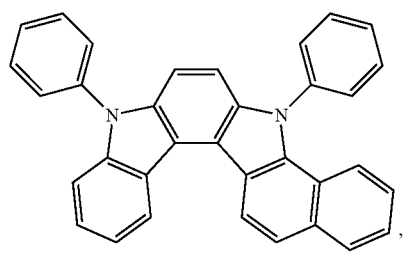
Compound HA29
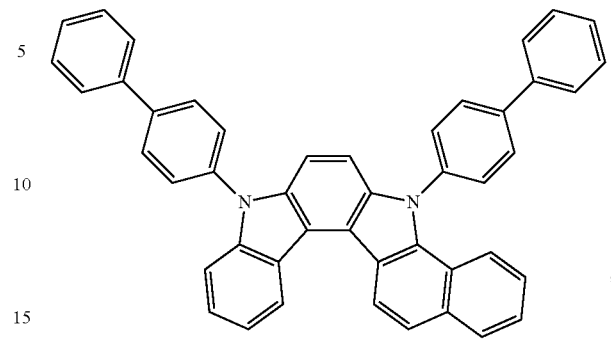
Compound HA30
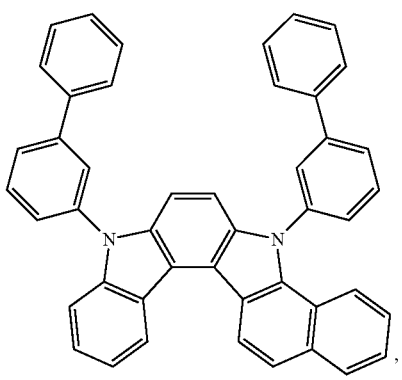
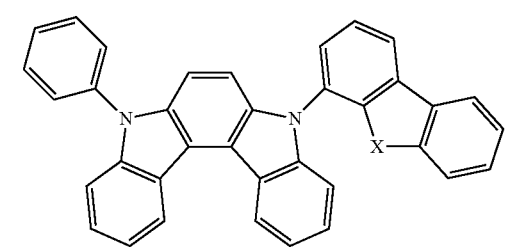
Compound HB1, wherein X is O;
Compound HB2, wherein X is S;
Compound HB3, wherein X is Se
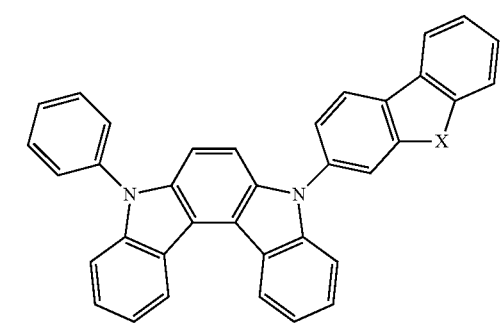
Compound HB4, wherein X is O;
Compound HB5, wherein X is S;
Compound HB6, wherein X is Se -continued

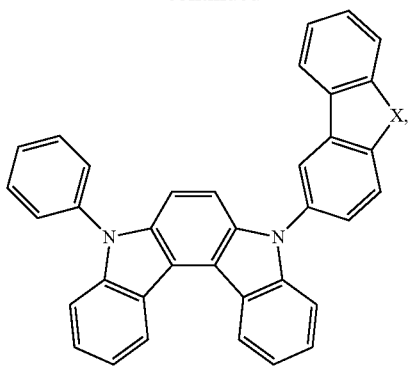

Compound HB7, wherein X is O;
Compound HB8, wherein X is S;
Compound HB9, wherein X is Se

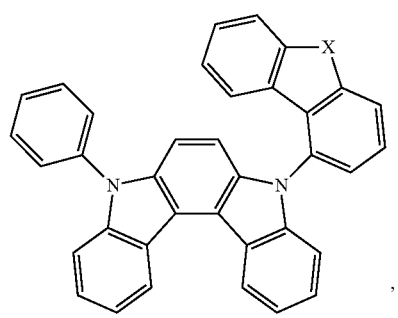

Compound HB10, wherein X is O;
Compound HB11, wherein X is S;
Compound HB12, wherein X is Se

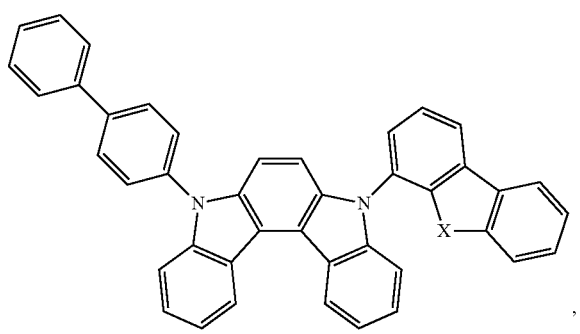

Compound HB13, wherein X is O;
Compound HB14 wherein X is S;
Compound HB15, wherein X is Se

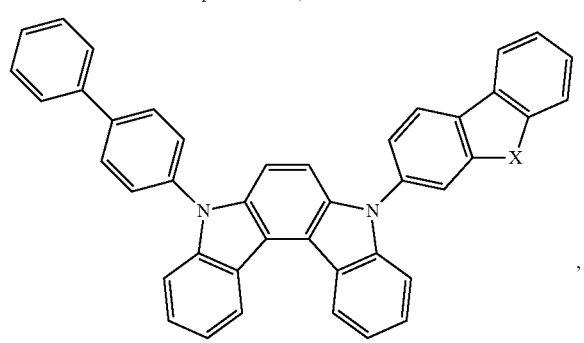

Compound HB16, wherein X is O;
Compound HB17, wherein X is S;
Compound HB18, wherein X is Se -continued

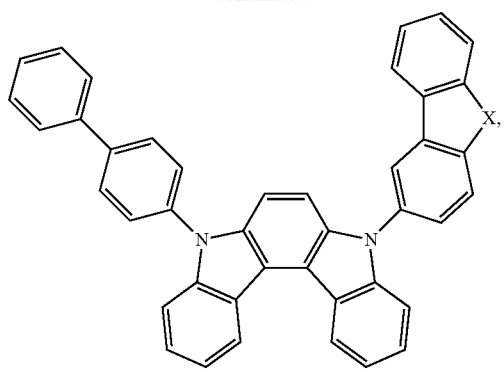

Compound HB19, wherein X is O;
Compound HB20, wherein X is S;
Compound HB21, wherein X is Se

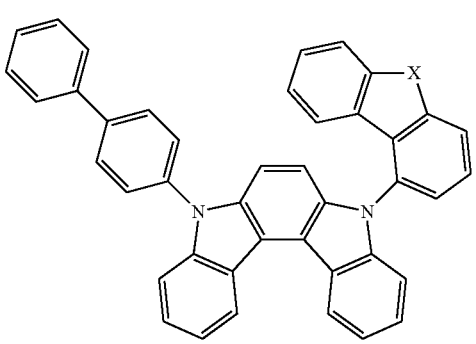

Compound HB22, wherein X is O;
Compound HB23, wherein X is S;
Compound HB24, wherein X is Se

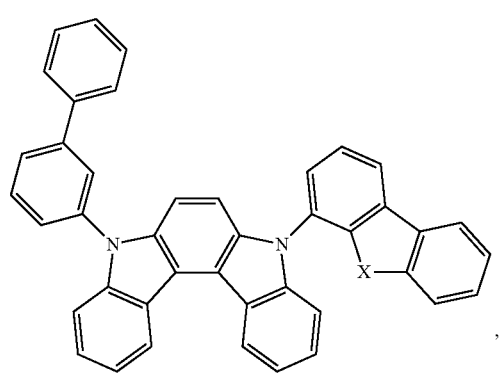

Compound HB25, wherein X is O;
Compound HB26, wherein X is S;
Compound HB27, wherein X is Se

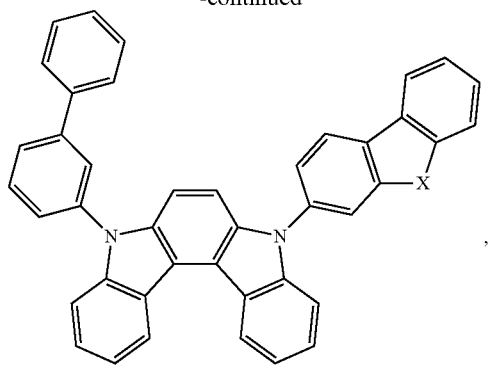

Compound HB28, wherein X is O;
Compound HB29, wherein X is S;
Compound HB30, wherein X is Se

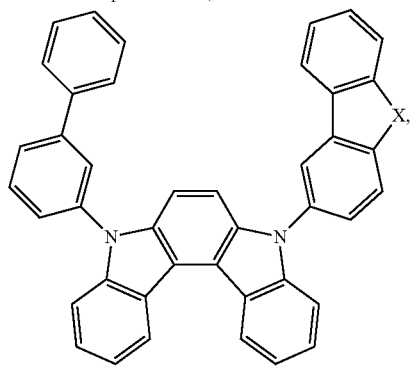

Compound HB31, wherein X is O;
Compound HB32, wherein X is S;
Compound HB33, wherein X is Se

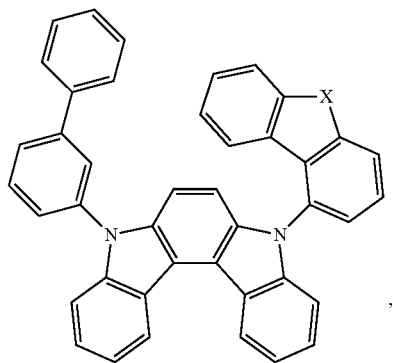

Compound HB34, wherein X is O;
Compound HB35, wherein X is S;
Compound HB36, wherein X is Se

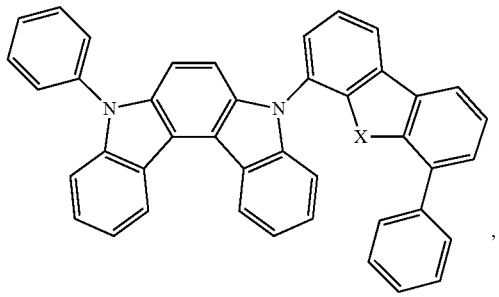

Compound HB37, wherein X is O;
Compound HB38, wherein X is S;
Compound HB39, wherein X is Se

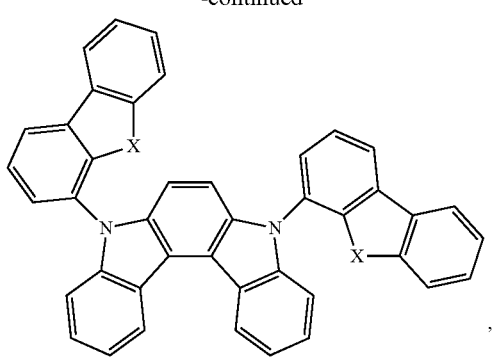

Compound HB40, wherein X is O;
Compound HB41, wherein X is S;
Compound HB42, wherein X is Se

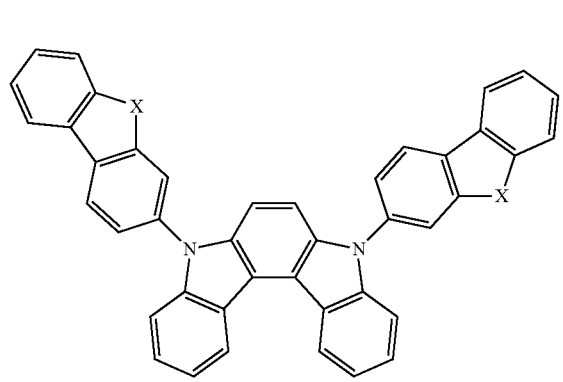

Compound HB43, wherein X is O;
Compound HB44, wherein X is S;
Compound HB45, wherein X is Se Compound HC1

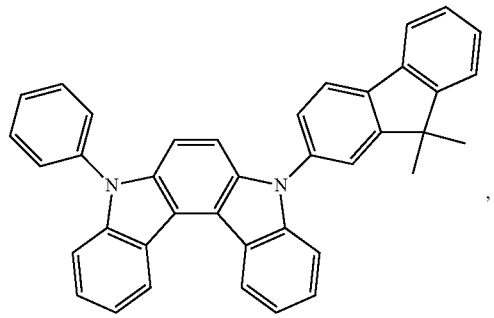

Compound HC2

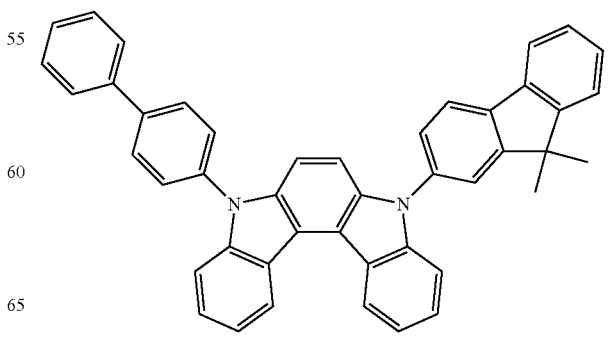

Compound HC3
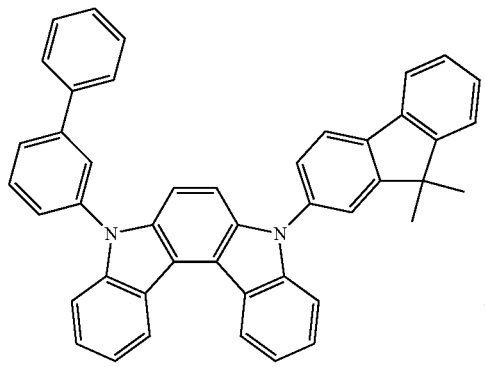
Compound HC4
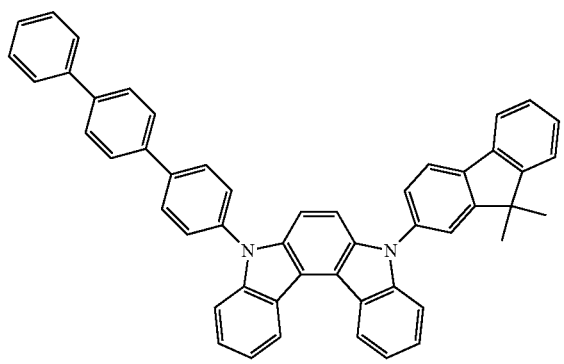
Compound HC5
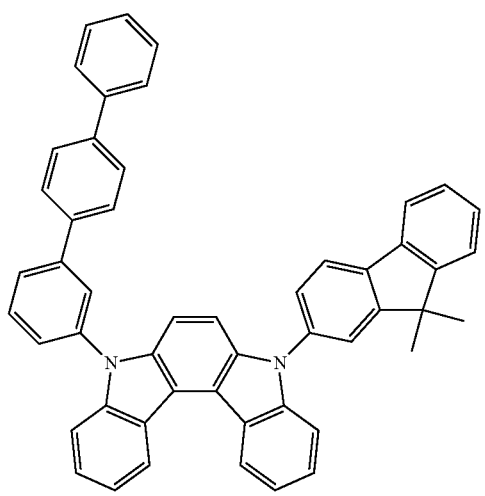
Compound HC6
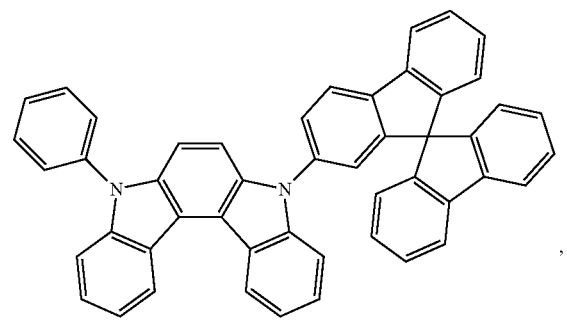
Compound HC7
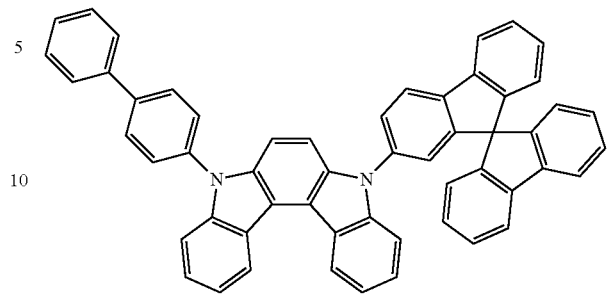
Compound HC8
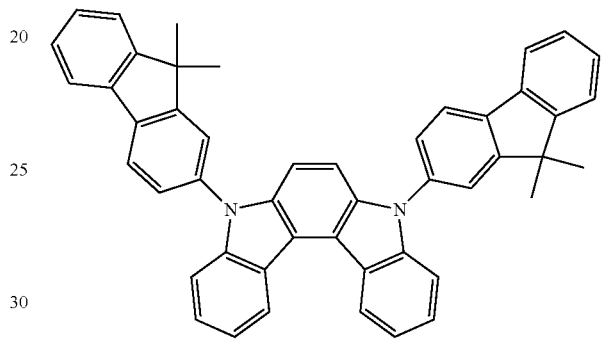
Compound HC9
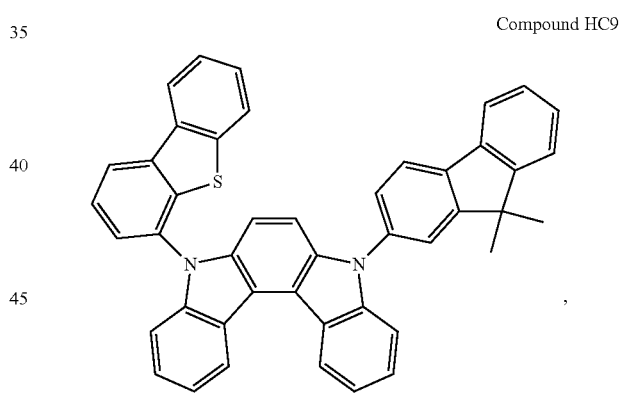
Compound HC10
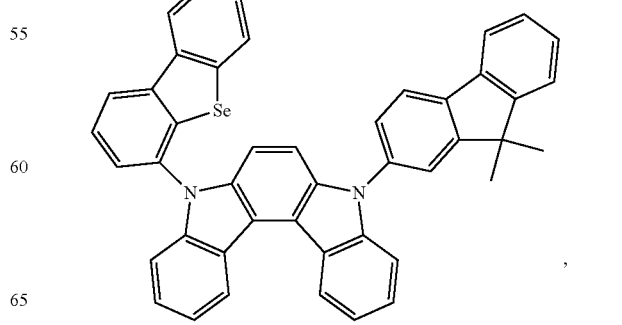

Compound HC11
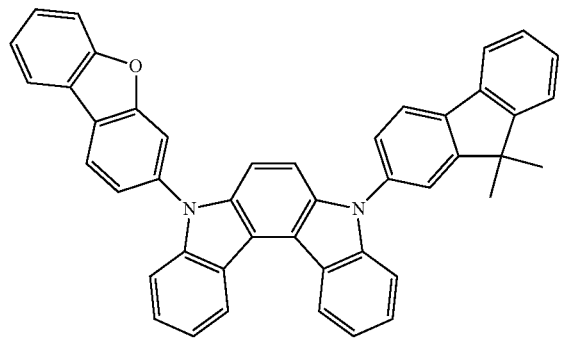
Compound HC12
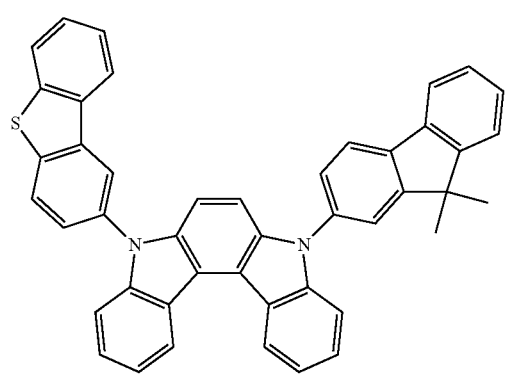
Compound HD1
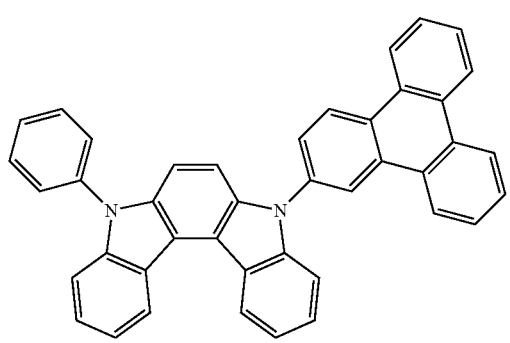
Compound HD2
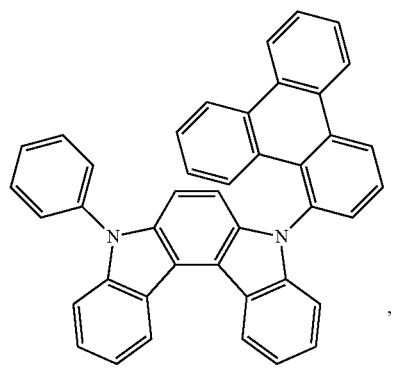
Compound HD3
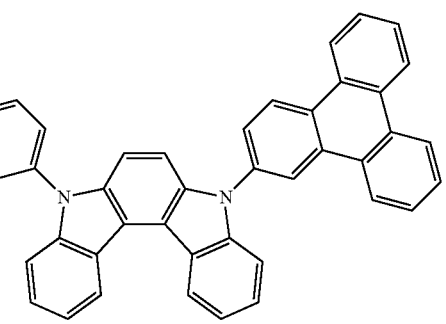
Compound HD4
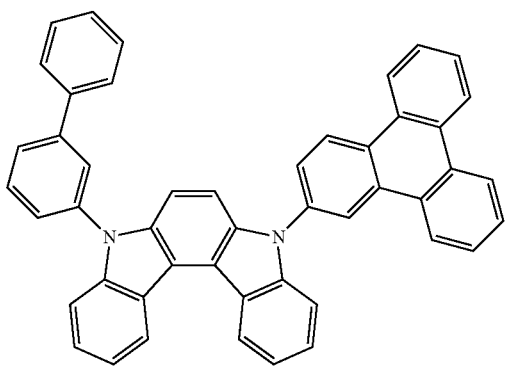
Compound HD5
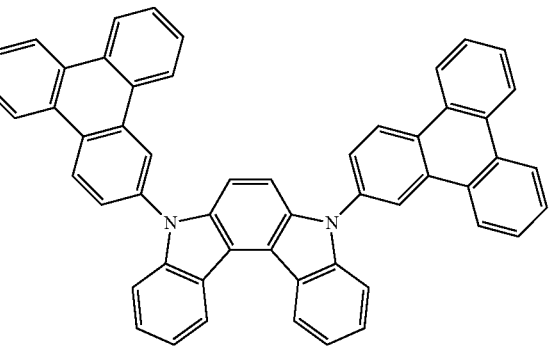
Compound HD6
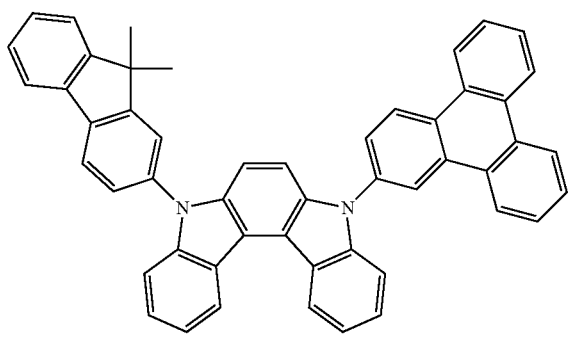

Compound HD7
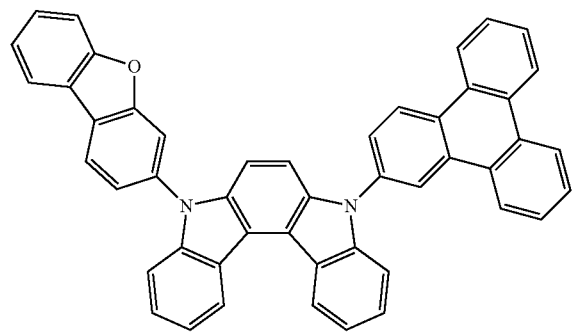
Compound HD8
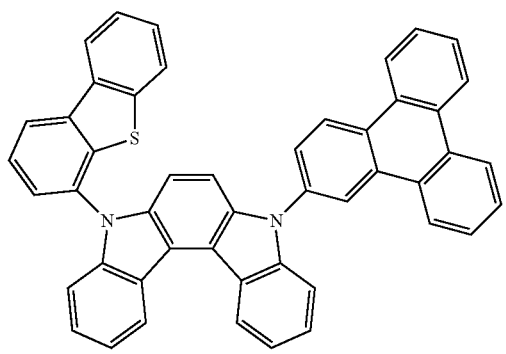
Compound HD9
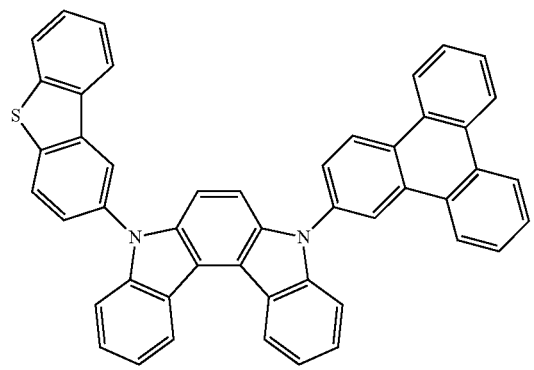
Compound HE1
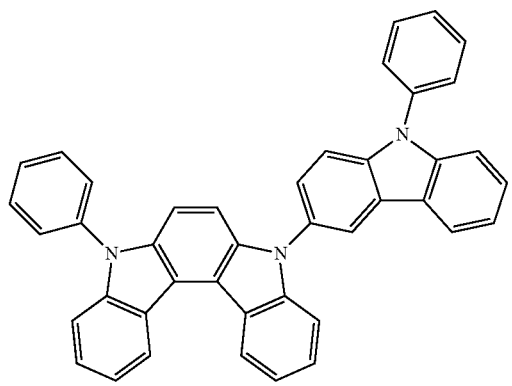
Compound HE2
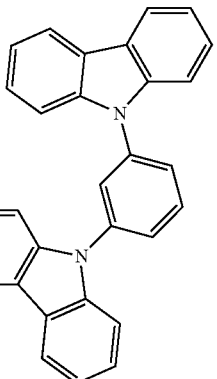
Compound HE3
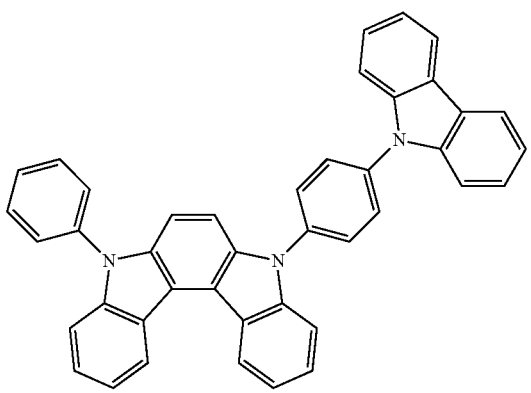
Compound HE4
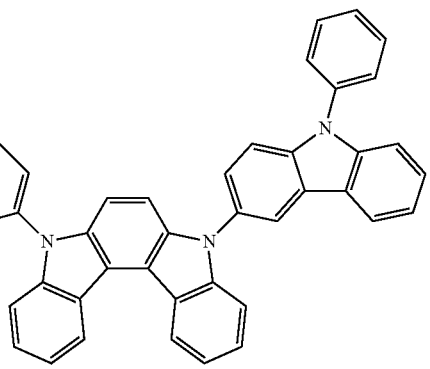
Compound HE5
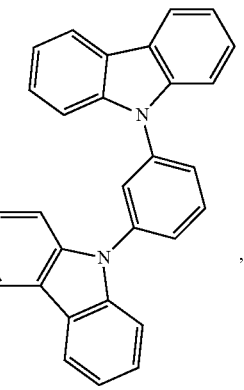

-continued
Compound HE6
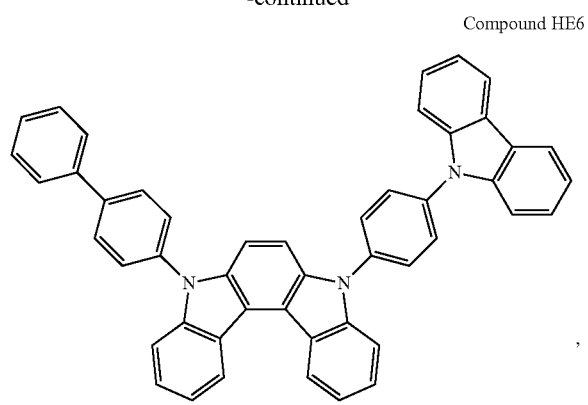
Compound HE7
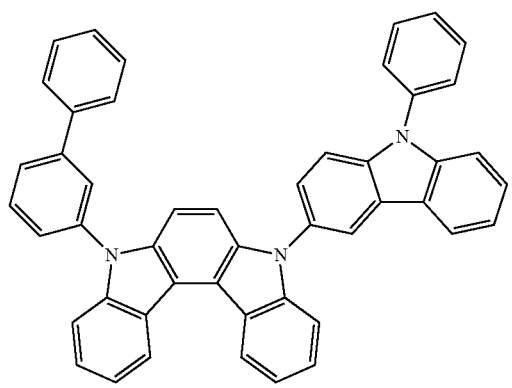
Compound HE8
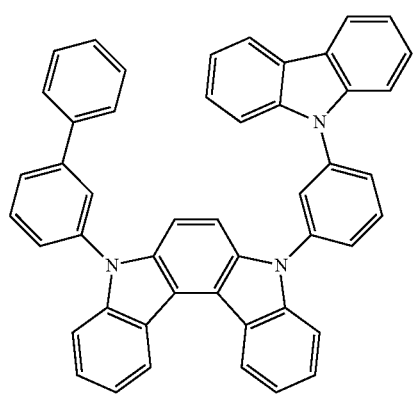
Compound HE9
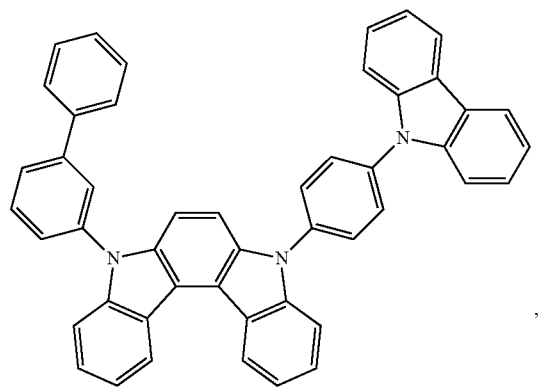
-continued
Compound HE10
Compound HE11
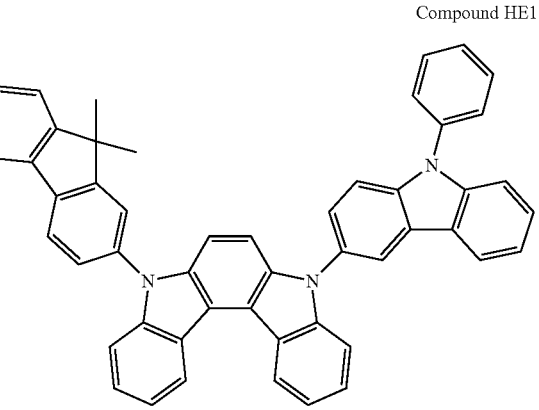
Compound HE12
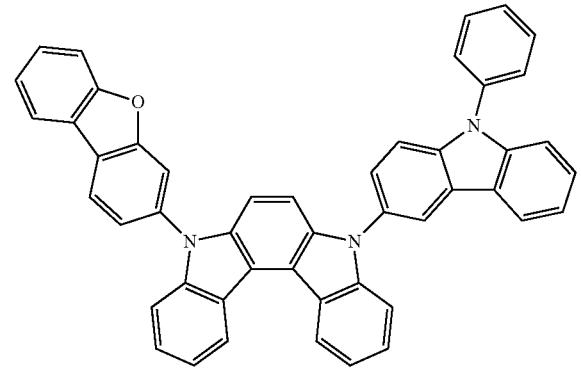
Compound HE13
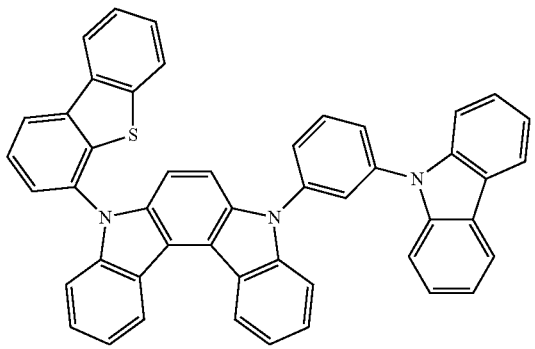

Compound HE14
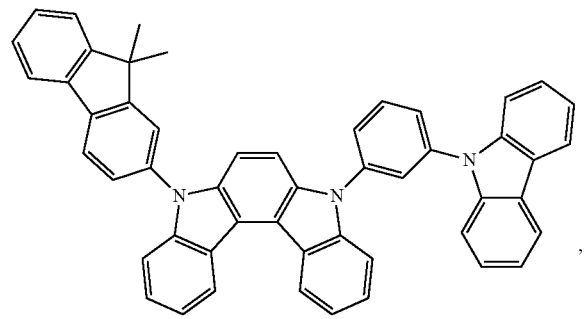
Compound HE15
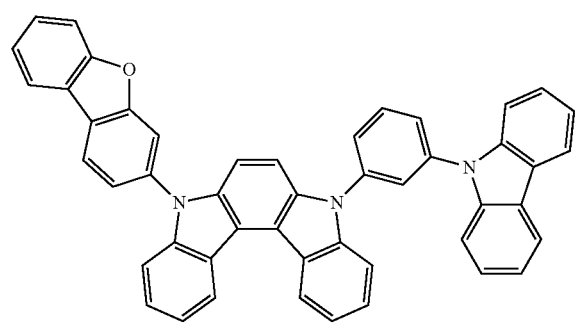
Compound HF1
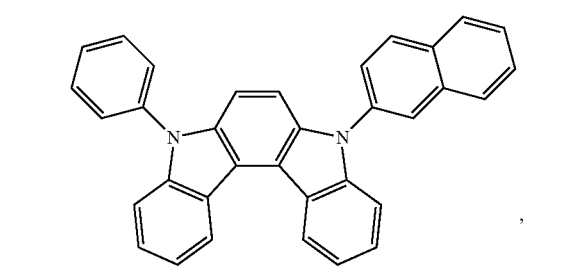
Compound HF2
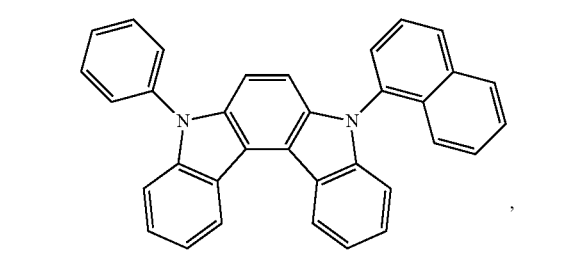
Compound HF3
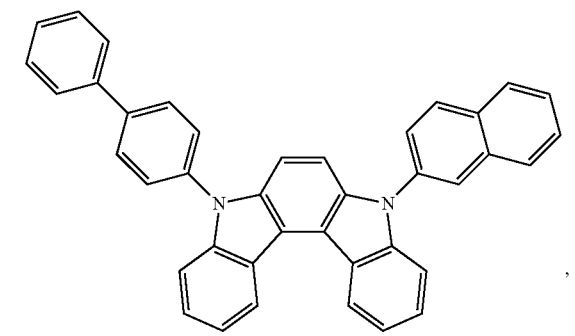
Compound HF4
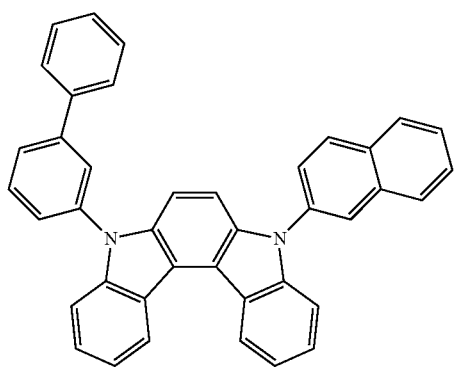
Compound HF5
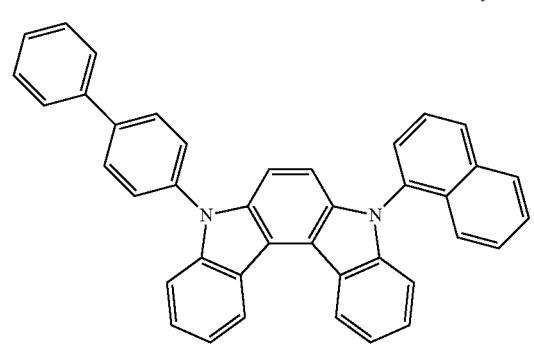
Compound HF6
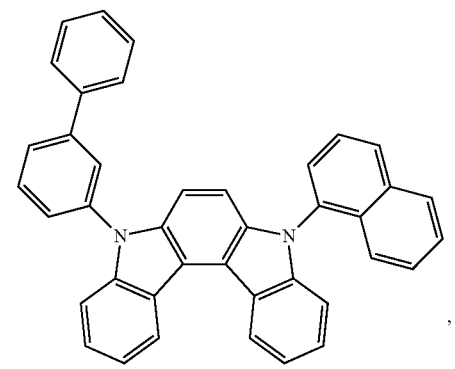
Compound HF7
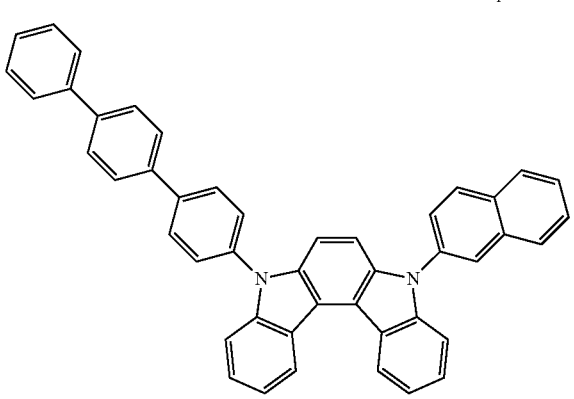

Compound HF8
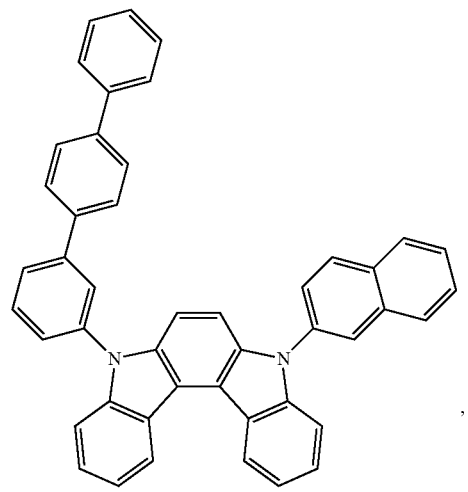
Compound HF9
Compound HF10
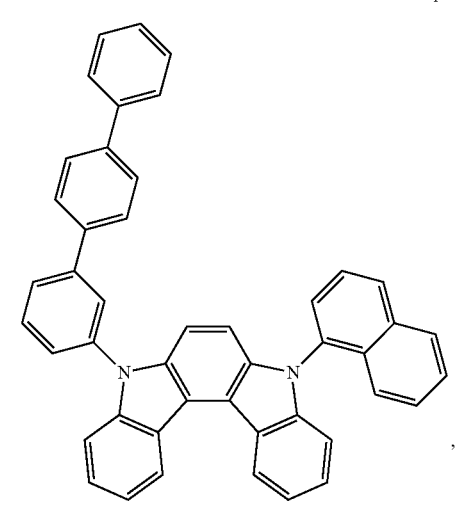
Compound HF11
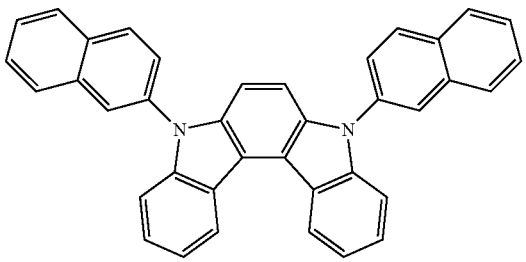
Compound HF12
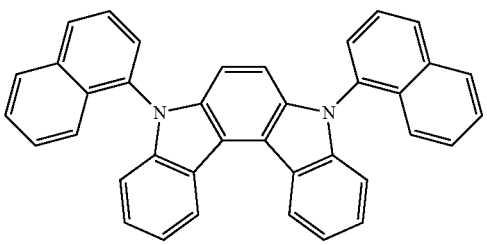
Compound HF13
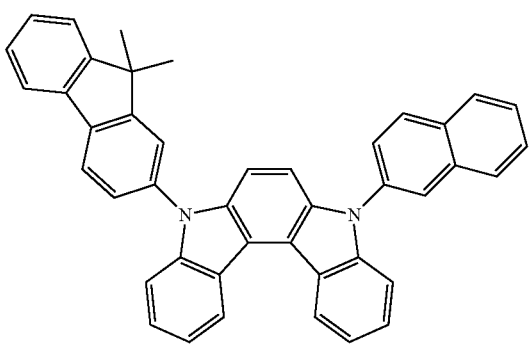
Compound HF14
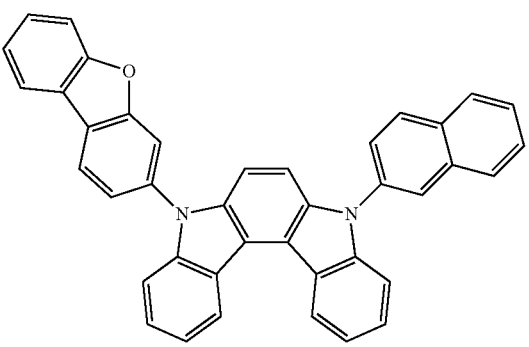
Compound HF15
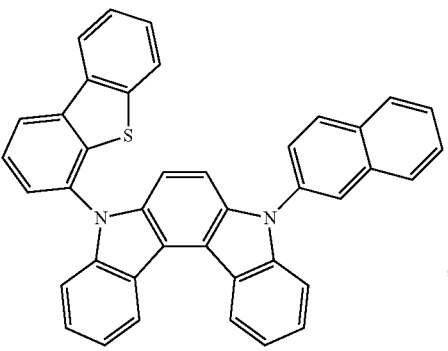

Compound HF16
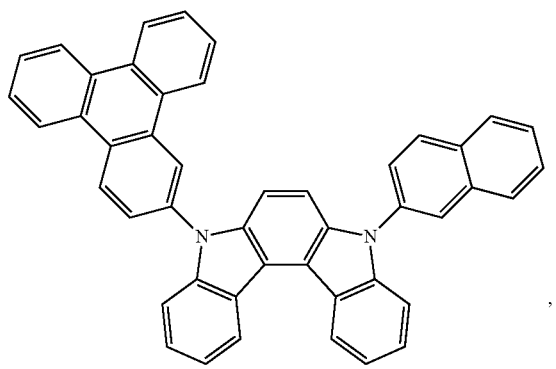
Compound HF17
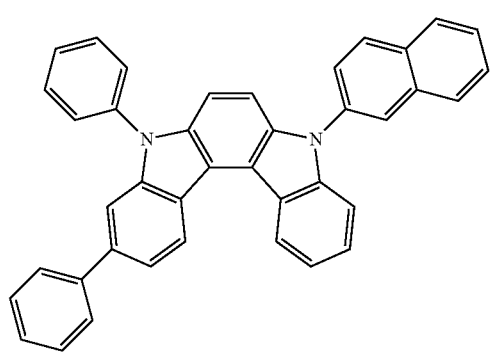
Compound HF18
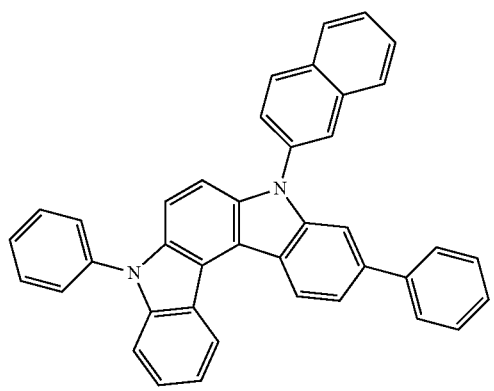
Compound HF19
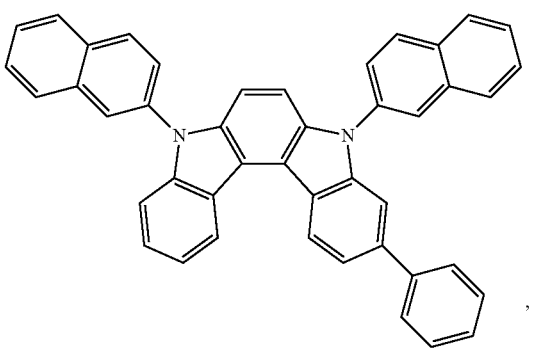
Compound HF20
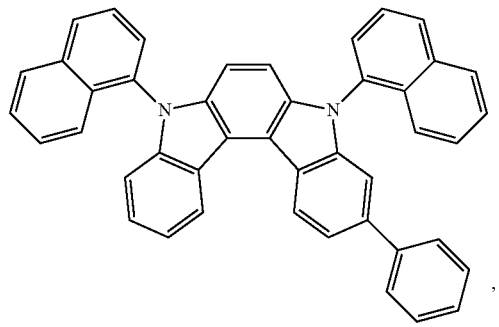
Compound HF20
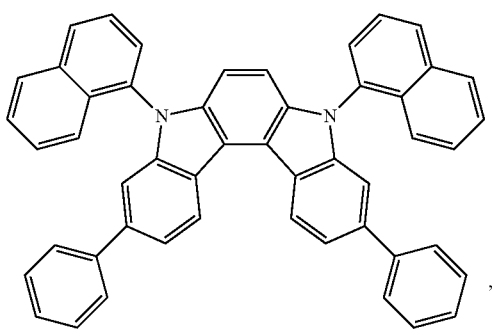
Compound HG1
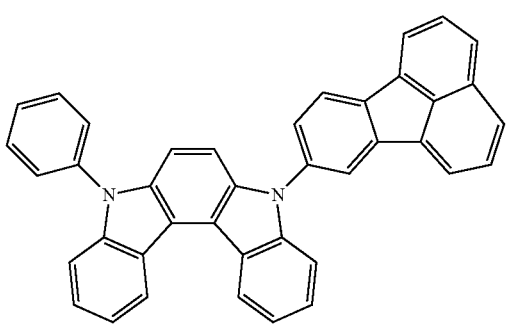
Compound HG2
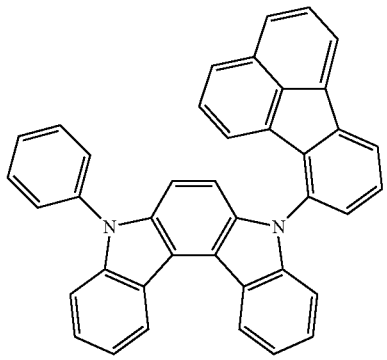

-continued
Compound HG3
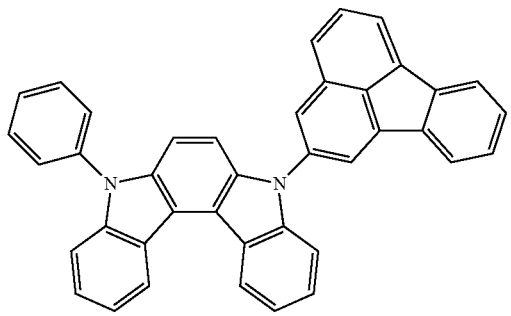
Compound HG4
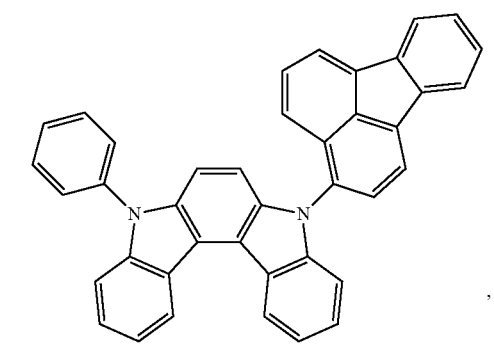
Compound HG5
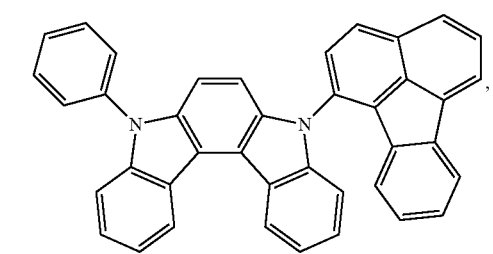
Compound HG6
Compound HG7
Compound HG8
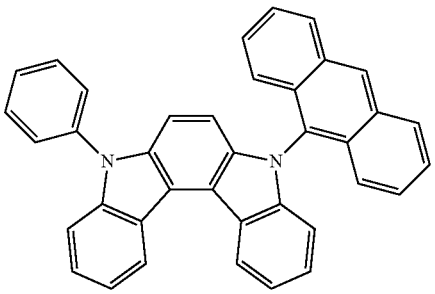
Compound HG9
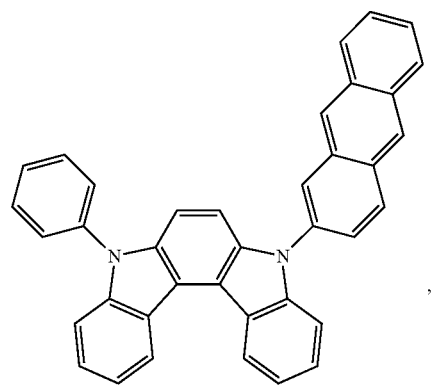
Compound HG10
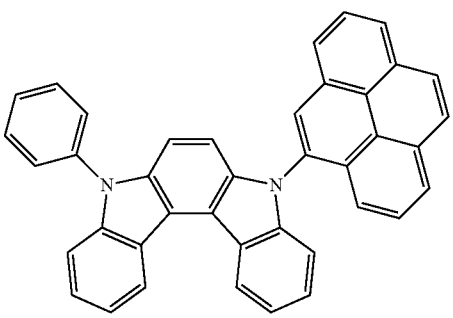
Compound HG11
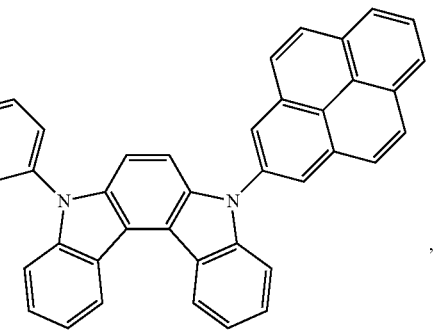
, and Compound HG12
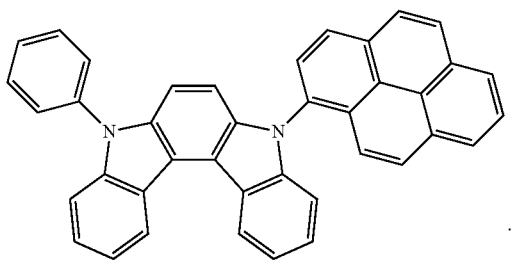
In some embodiments of the composition, the second compound is selected from a group consisting of:
Compound EA1
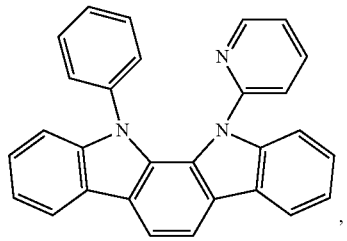
Compound EA2
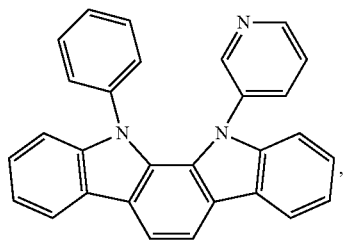
Compound EA3
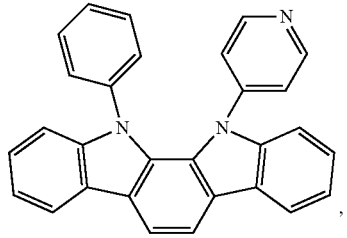
Compound EA4
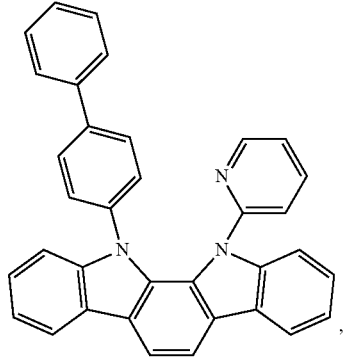
Compound EA5
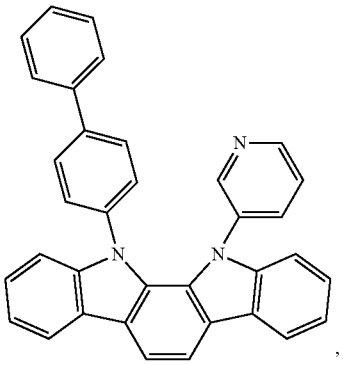
Compound EA6
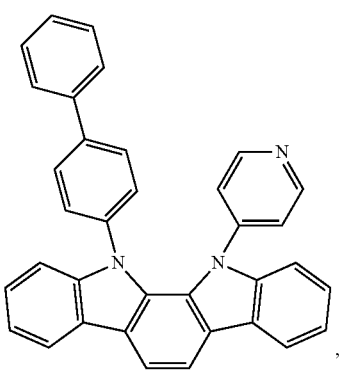
Compound EA7
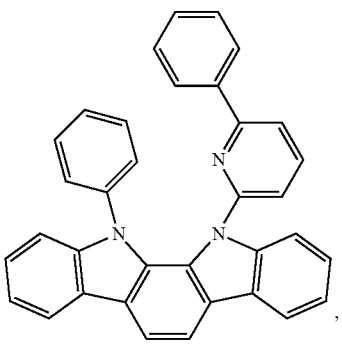
Compound EA8
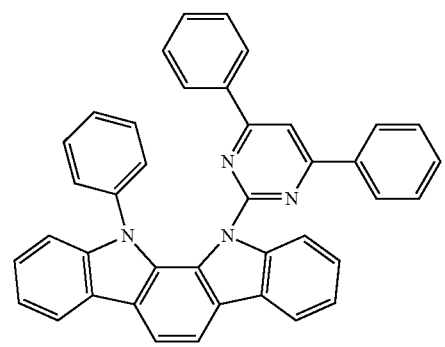

Compound EA9
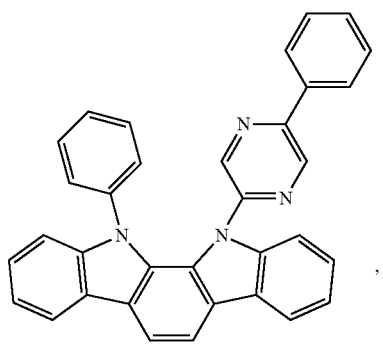
Compound EA10
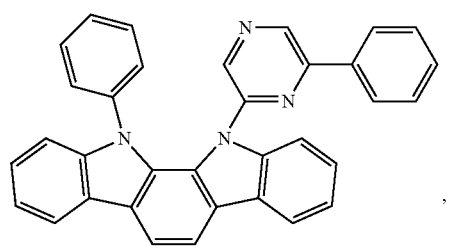
Compound EA11
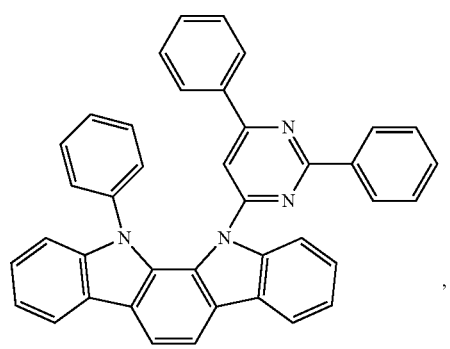
Compound EA12
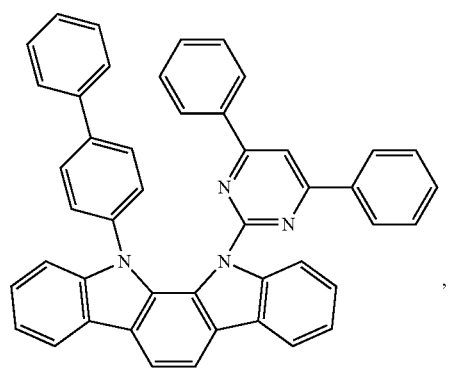
Compound EB1
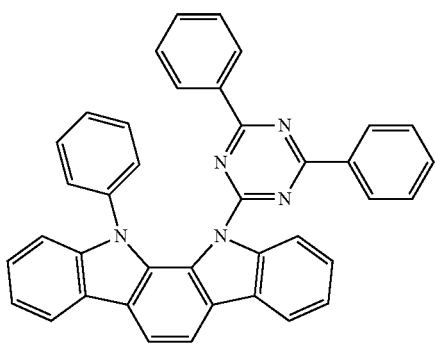
Compound EB2
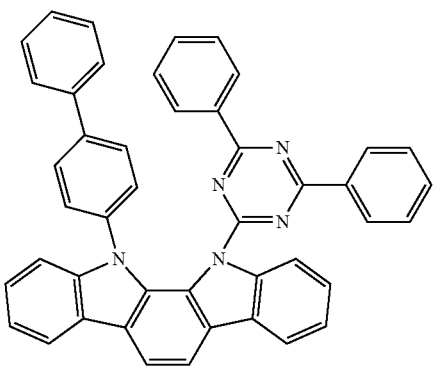
Compound EB3
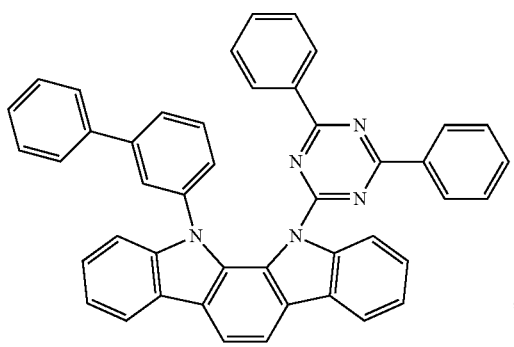
Compound EB4
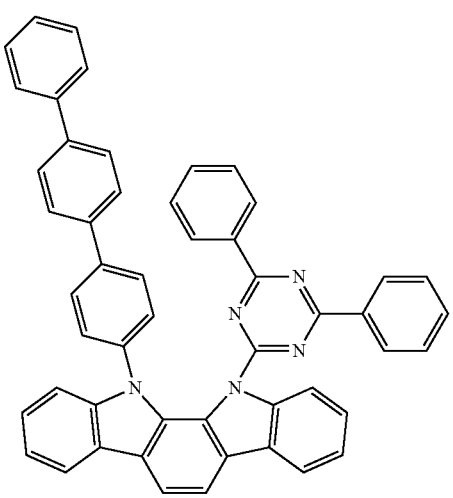

Compound EB5
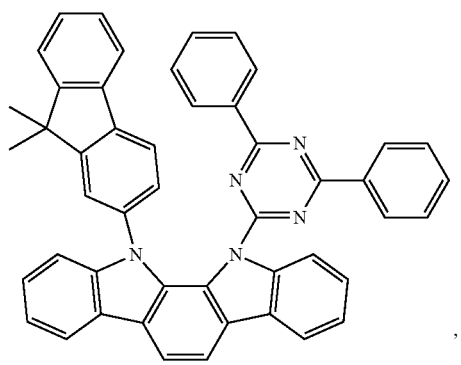
Compound EB6
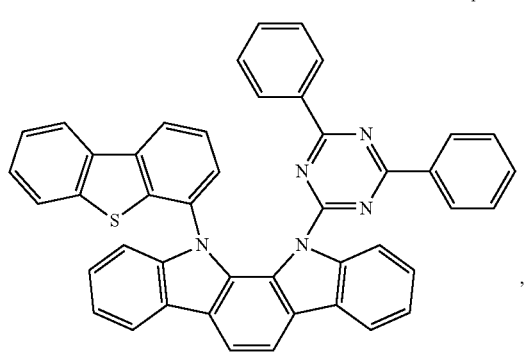
Compound EB7
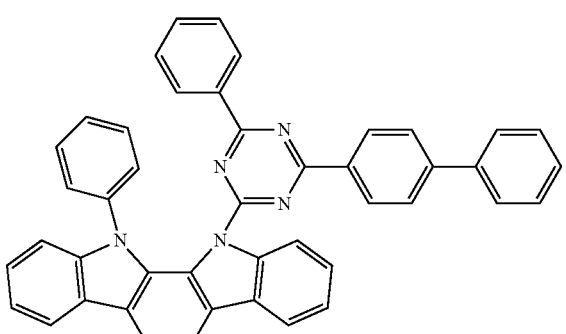
Compound EB8
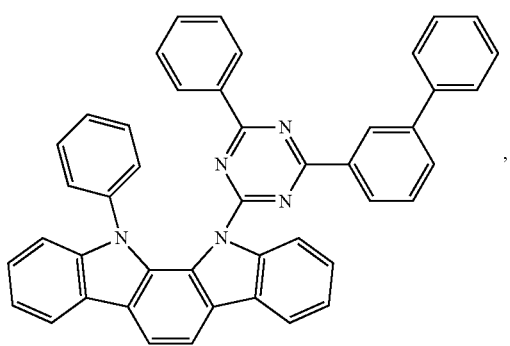
Compound EB9
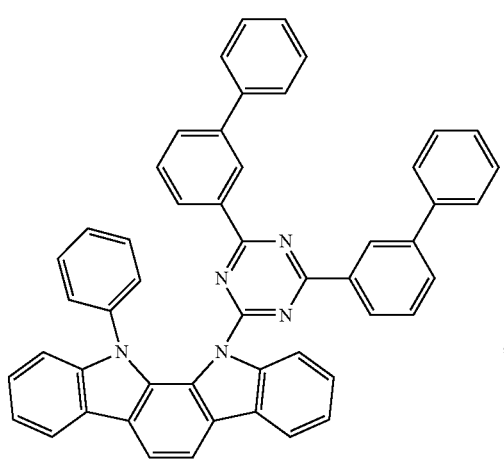
Compound EB10
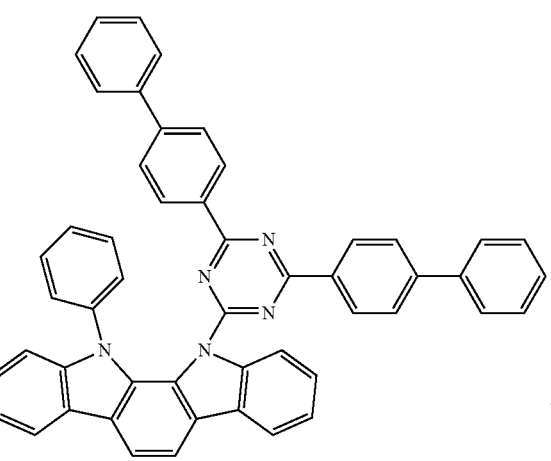
Compound EB11
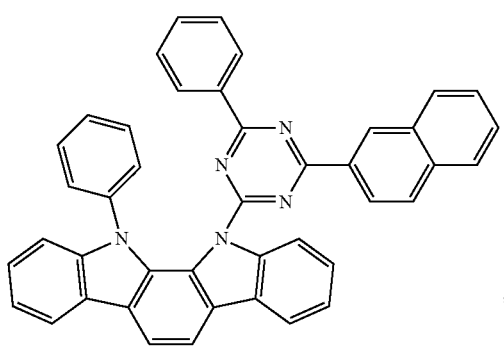

Compound EB12
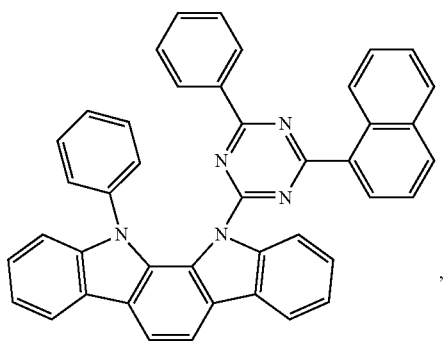
Compound EB13
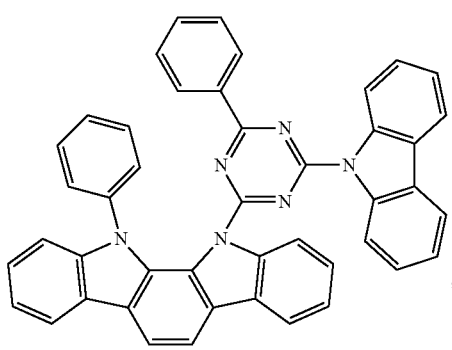
Compound EB14
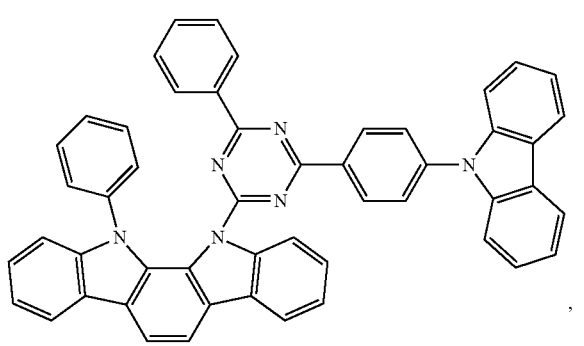
Compound EB15
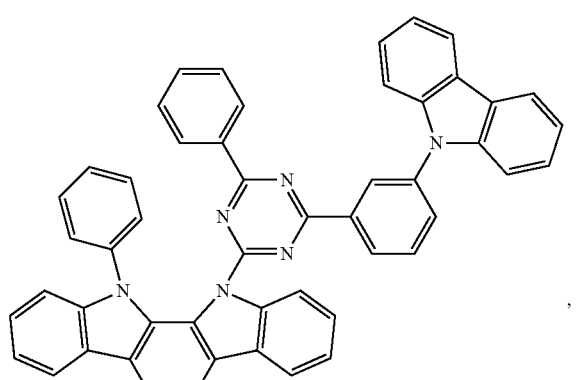
Compound EB16
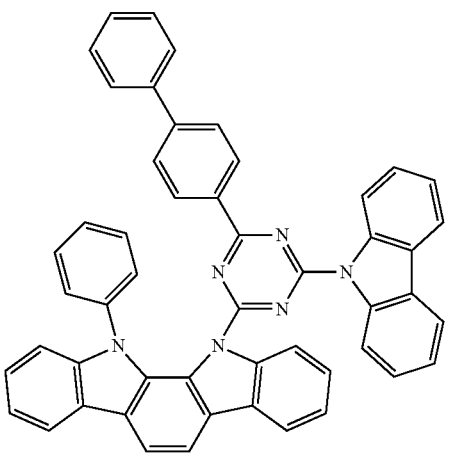
Compound EB17
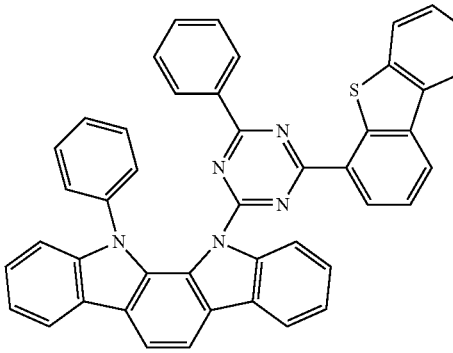
Compound EB18
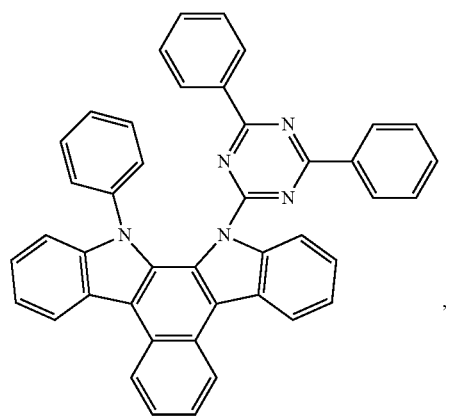

Compound EB19
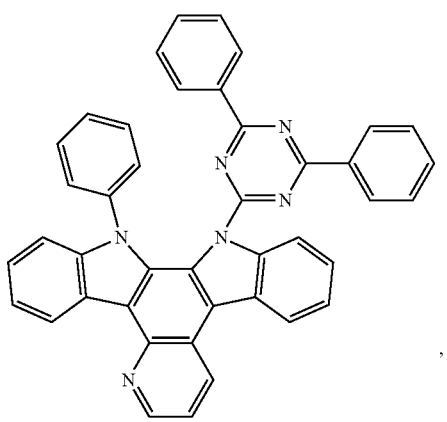
Compound EB20
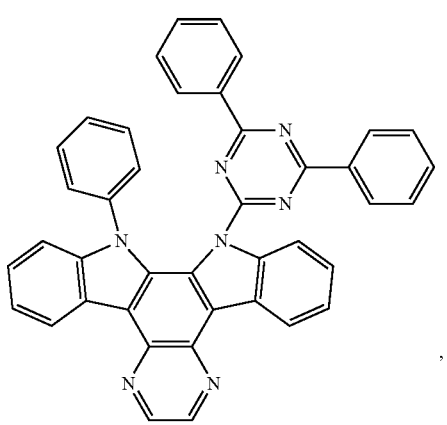
Compound EB21
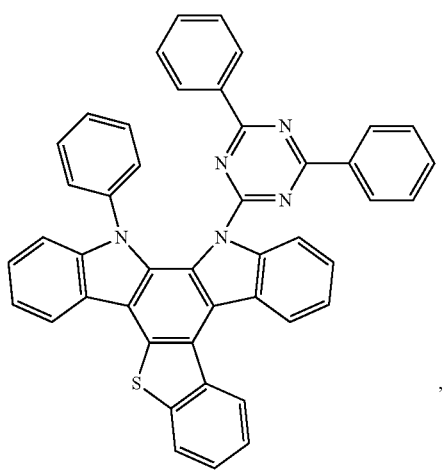
Compound EC1
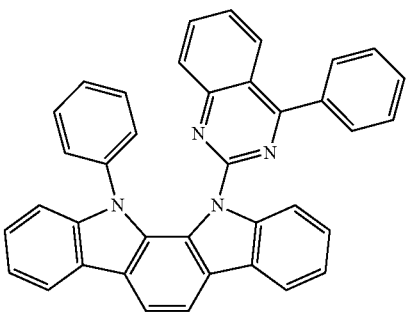
Compound EC2
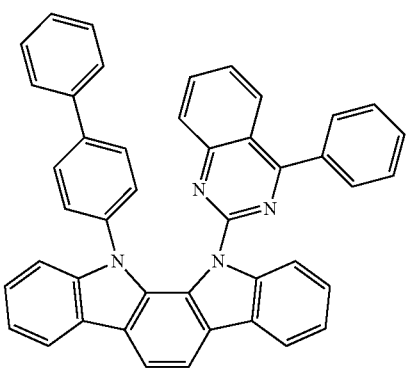
Compound EC3
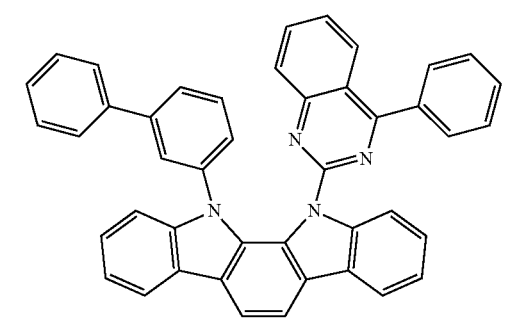
Compound EC4
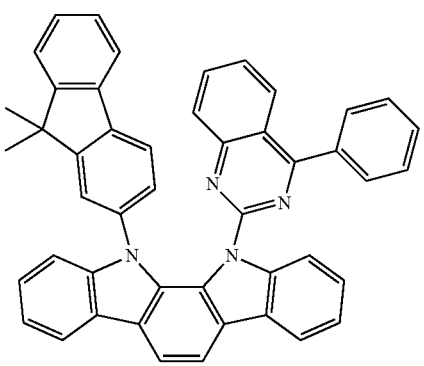

Compound EC5
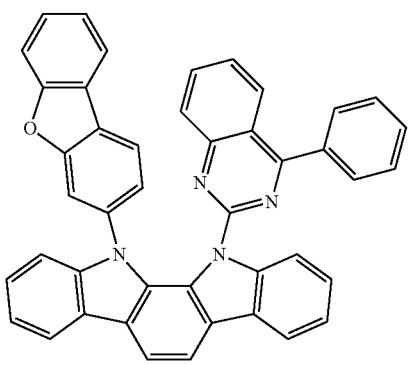
Compound EC6
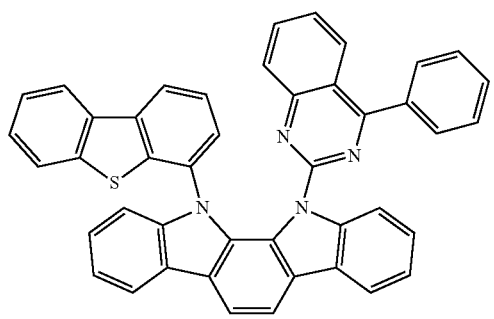
Compound EC7
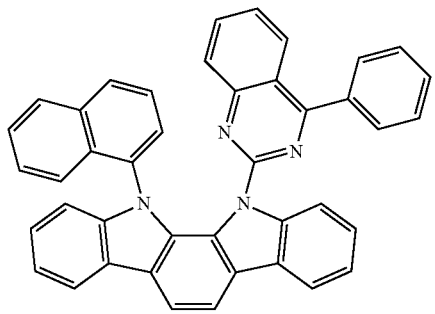
Compound EC8
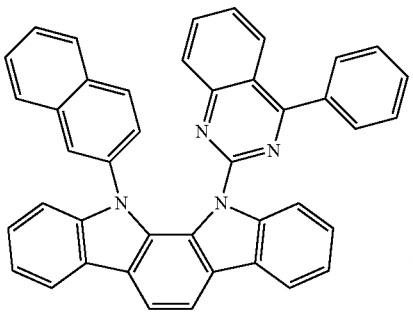
Compound EC9
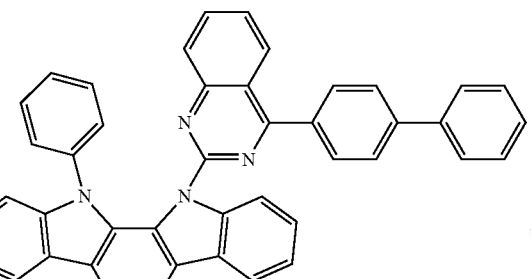
Compound EC10
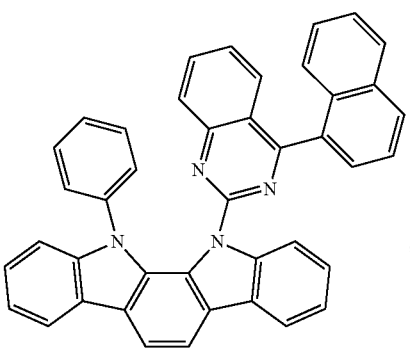
Compound EC11
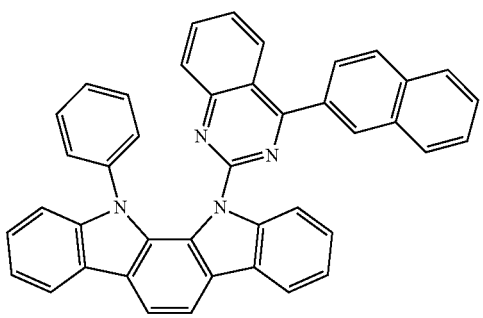
Compound EC12
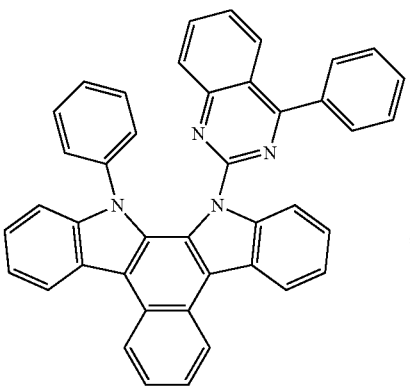

Compound EC13
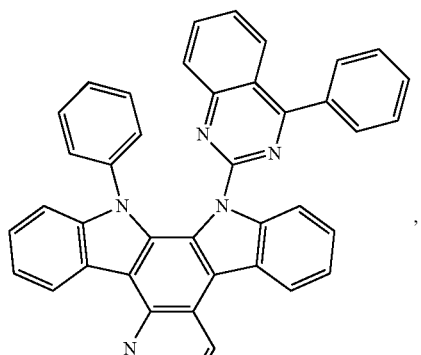
Compound EC14
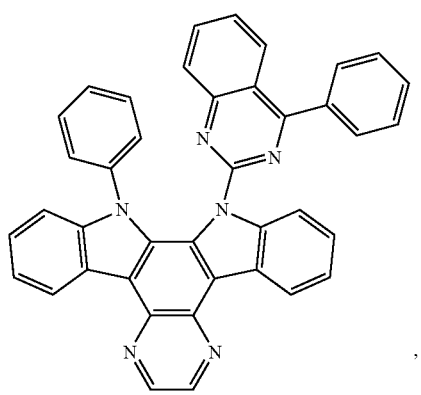
Compound EC15
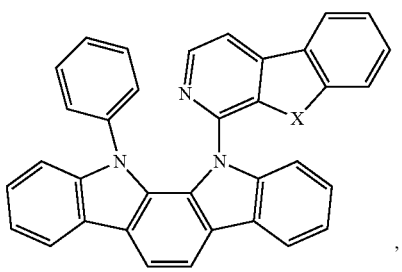
Compound EC16
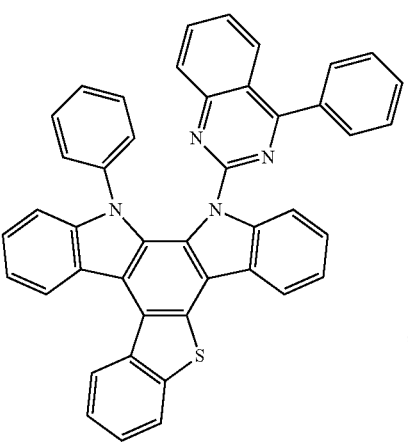
Compound EC17
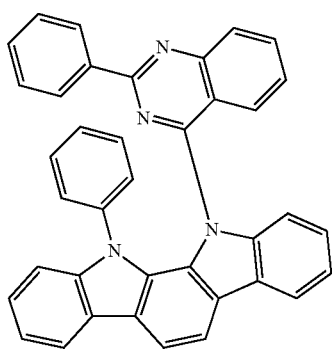
Compound EC18
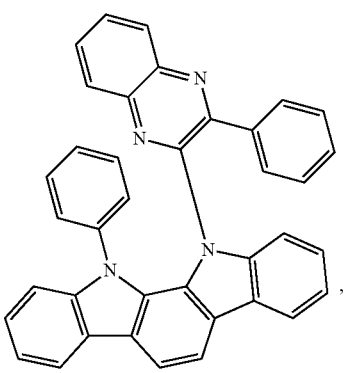
Compounds ED1 through ED2 having the following structure,
wherein in Compound ED1, X is O;
in Compound ED2, X is S;
in Compound ED3, X is Se -continued Compounds ED4 through ED6 having the following structure, wherein, in Compound ED4, X is O;
in Compound ED5, X is S;
in Compound ED6, X is Se Compounds ED7 through ED9 having the following structure, wherein, in Compound ED7, X is O;
in Compound ED8, X is S;
in Compound ED9, X is Se Compounds ED10 through ED12 having the following structure, wherein in Compound ED10, X is O;
in Compound ED11, X is S;
in Compound ED12, X is Se Compounds ED13 through ED15 having the following structure, wherein in Compound ED13, X is O;
in Compound ED14, X is S;
in Compound ED15, X is Se Compounds ED16 through ED18 having the following structure, wherein in Compound ED16, X is O;
in Compound ED17, X is S;
in Compound ED18, X is Se Compounds ED19 through ED21 having the following structure, wherein in Compound ED19, X is O;
in Compound ED20, X is S;
in Compound ED21, X is Se -continued
Compounds ED22 through ED24 having the following structure,
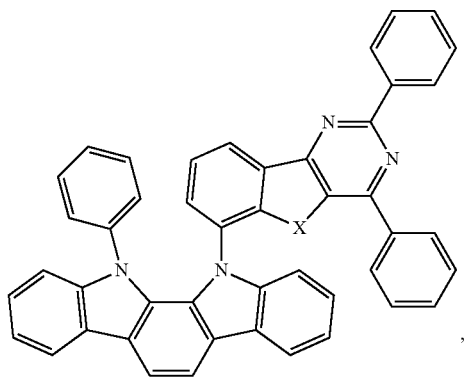
wherein in Compound ED22, X is O;
in Compound ED23, X is S;
in Compound ED24, X is Se
Compounds ED25 through ED27 having the following structure,
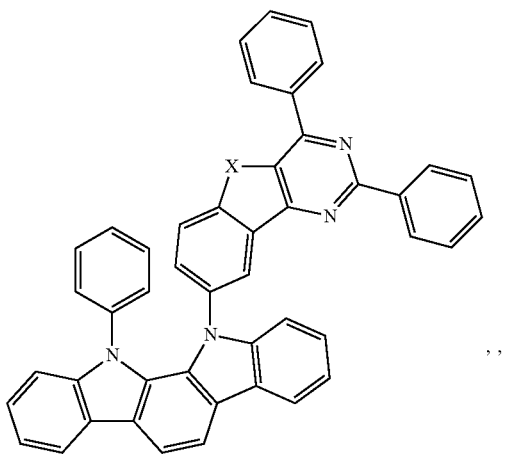
wherein in Compound ED25, X is O;
in Compound ED26, X is S;
in Compound ED27, X is Se
Compound EF1
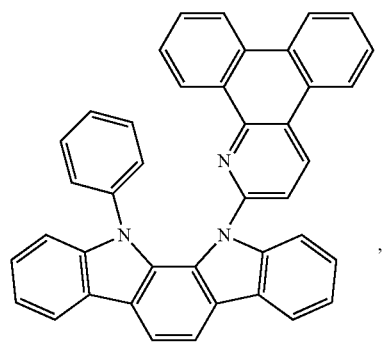
-continued
Compound EF2
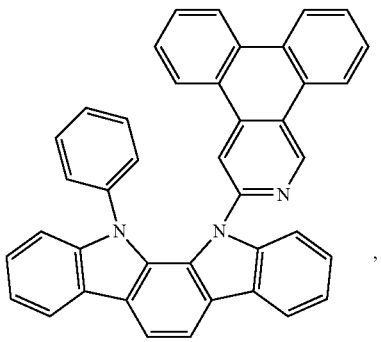
Compound EF3
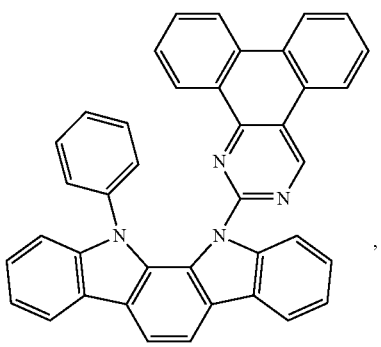
Compound EF4
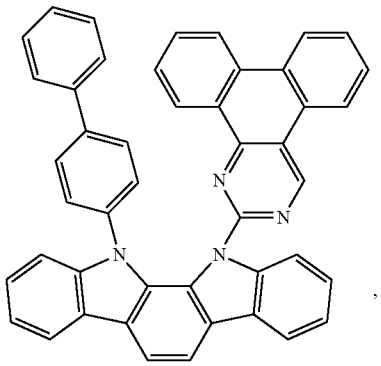
Compound EF5
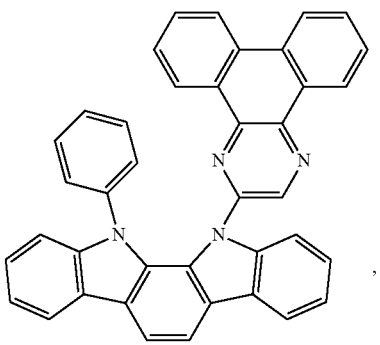
, and Compound EF6

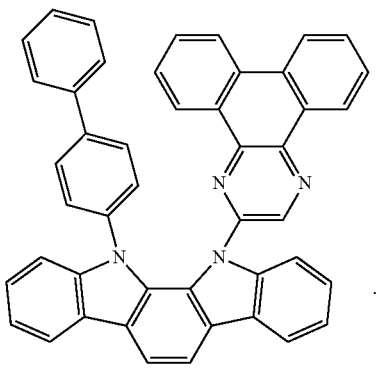

In some embodiments of the composition, the mixture of the first compound and the second compound is selected from the group consisting of the following mixtures defined by the pair of compounds for the first compound and the second compound in each mixture: (Compound HA1, Compound EB1), (Compound HA4, Compound EB1), (Compound HA5, Compound EB1), (Compound HA6, Compound EB1), (Compound HA11, Compound EB1), (Compound HA17, Compound EB1), (Compound HA20, Compound EB1), (Compound HA22, Compound EB1) (Compound HA29, Compound EB1), (Compound HB14, Compound EB1), (Compound HB20, Compound EB1), (Compound HC2, Compound EB1), (Compound HC8, Compound EB1), (Compound HD3, Compound EB1) (Compound HE4, Compound EB1), (Compound HF5, Compound EB1), (Compound HA1, Compound EB7), (Compound HA4, Compound EB7), (Compound HA5, Compound EB7), (Compound HA6, Compound EB7), (Compound HA11, Compound EB7), (Compound HA17, Compound EB7), (Compound HA20, Compound EB7), (Compound HA22, Compound EB7) (Compound HA29, Compound EB7), (Compound HB14, Compound EB7), (Compound HB20, Compound EB7), (Compound HC2, Compound EB7), (Compound HC8, Compound EB7), (Compound HD3, Compound EB7) (Compound HE4, Compound EB7), (Compound HF5, Compound EB7), (Compound HA1, Compound EA1), (Compound HA4, Compound EB2), (Compound HA5, Compound EB8), (Compound HA6, Compound EB13), (Compound HA11, Compound EC1), (Compound HA17, Compound EC2), (Compound HA20, Compound EC9), (Compound HA22, Compound EC11) (Compound HA29, Compound EC12), (Compound HB14, Compound EC15), (Compound HB20, Compound EC16), (Compound HC2, Compound ED2), (Compound HC8, Compound ED5), (Compound HD3, Compound ED20), (Compound HE4, Compound ED23), and (Compound HF5, Compound EF5).

According to another aspect of the present disclosure, an OLED is disclosed. The OLED comprising:

an anode;

a cathode; and an organic layer, disposed between the anode and the cathode, comprising a mixture of a first compound and a second compound;

wherein the first compound has a structure of Formula I:

Formula I

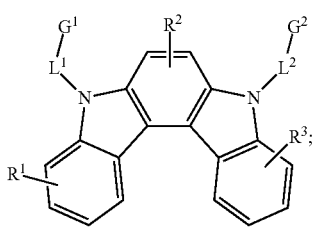

wherein the second compound has a structure of Formula II:

Formula II

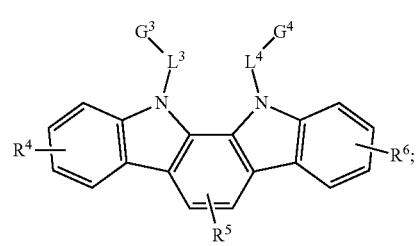

wherein $L^1$, $L^2$, $L^3$ and $L^4$ are each independently selected from the group consisting of direct bond, alkyl, alkenyl, alkynyl, aryl, heteroaryl, and combinations thereof;

wherein $G^1$ and $G^2$ are each independently selected from the group consisting of hydrogen, deuterium, halogen, alkyl, alkyloxy, cycloalkyl, cycloalkoxyl, silyl, amino, benzene, biphenyl, terphenyl, naphthalene, triphenylene, pyrene, anthracene, phenanthrene, fluoranthene, fluorene, dibenzofuran, dibenzothiophene, dibenzoselenophene, carbazole, and combinations thereof;

wherein $G^3$ is selected from the group consisting of pyridine, pyramidine, pyrazine, triazine, quinoline, isoquinoline, quinazoline, aza-triphenylene, phenanthroline, aza-pyrene, aza-anthracene, aza-fluorene, aza-dibenzofuran, aza-dibenzothiophene, aza-dibenzoselenophene, aza-carbazole, and combinations thereof;

wherein $G^4$ is selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;

wherein $G^3$ is optionally further substituted with substituent selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;

wherein $R^1$, $R^2$, $R^3$, $R^4$, $R^5$ and $R^6$ each independently represents mono to maximum allowable substitutions, or no substitution;

wherein $R^1$, $R^2$, $R^3$, $R^4$, $R^5$ and $R^6$ are each independently selected from the group consisting of hydrogen, deuterium, halogen, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, and wherein any two adjacent substituents optionally join or fuse into a ring.

In some embodiments of the OLED, the organic layer is an emissive layer and the first and second compounds in the mixture are co-hosts.

In some embodiments of the OLED, the organic layer further comprises a phosphorescent emissive dopant capable of functioning as an emitter in the OLED at room temperature; wherein the emissive dopant is a transition metal complex having at least one ligand or part of the ligand if the ligand is more than bidentate selected from the group consisting of:
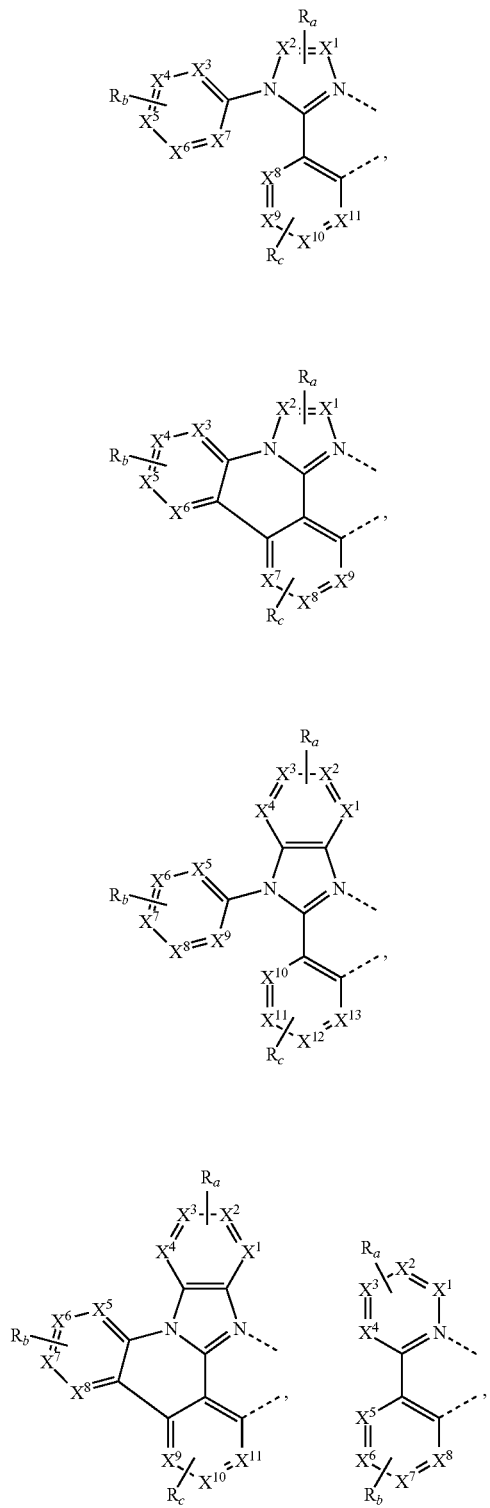
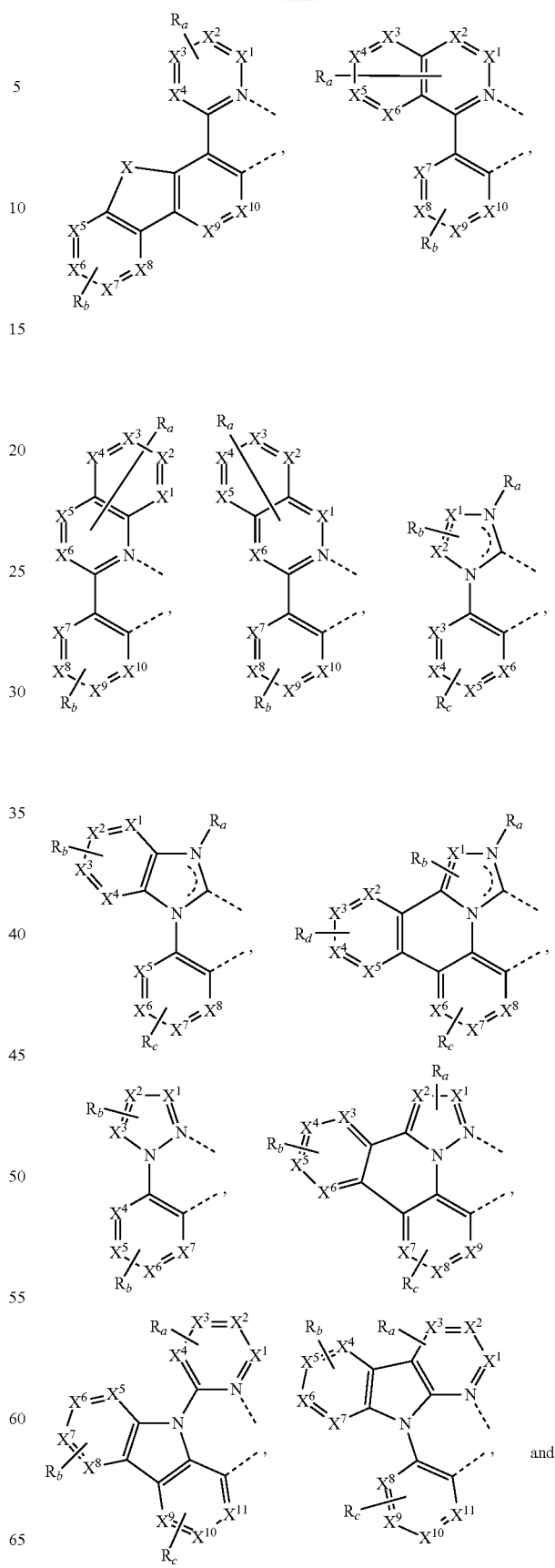
and -continued

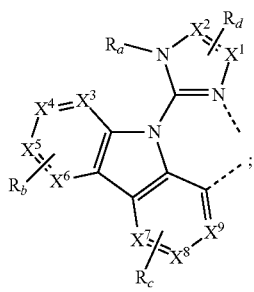

wherein each $X^1$ to $X^{13}$ are independently selected from the group consisting of carbon and nitrogen;

wherein X is selected from the group consisting of BR', NR', PR', O, S, Se, C=O, S=O, $SO_2$, CR'R", SiR'R", and GeR'R";

wherein R' and R" are optionally fused or joined to form a ring;

wherein each $R_a$, $R_b$, $R_c$, and $R_d$ may represent from mono substitution to the possible maximum number of substitution, or no substitution;

wherein R', R", $R_a$, $R_b$, $R_c$, and $R_d$ are each independently selected from the group consisting of hydrogen, deuterium, halide, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any two adjacent substituents of $R_a$, $R_b$, $R_c$, and $R_d$ are optionally fused or joined to form a ring or form a multidentate ligand.

In some embodiments of the OLED, the phosphorescent emissive dopant is selected from the group consisting of:

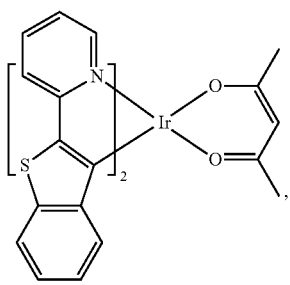

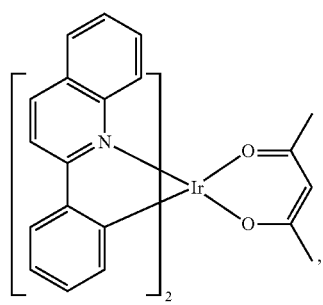

-continued

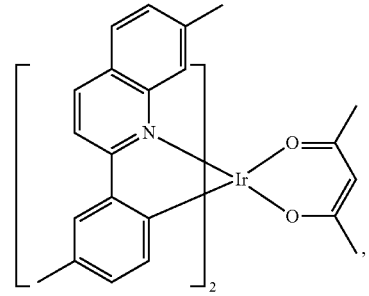

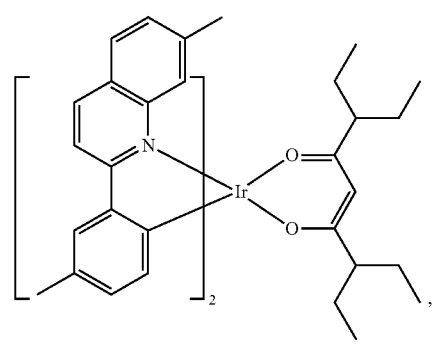

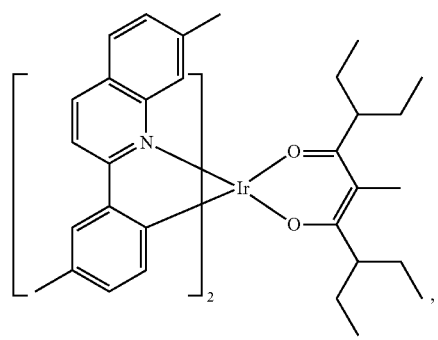

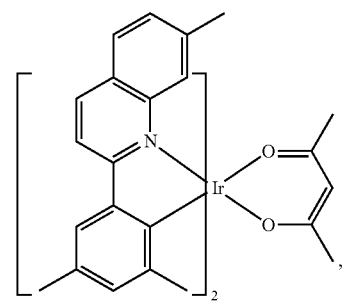

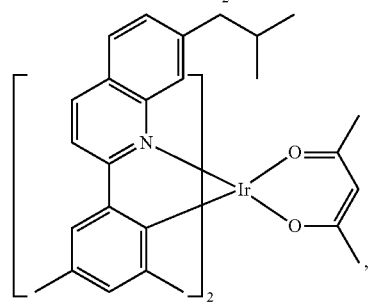

69
-continued
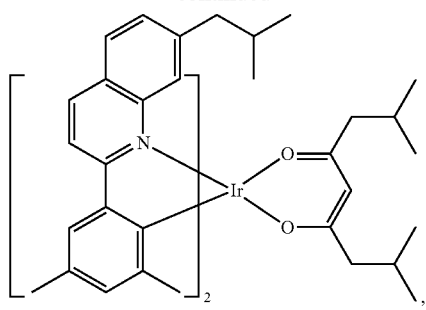
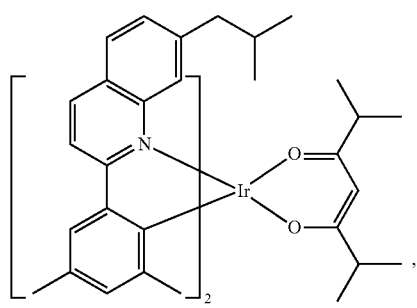
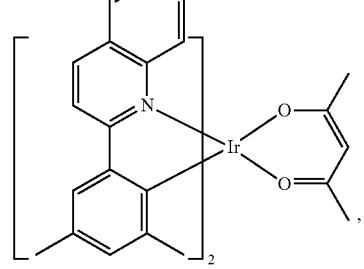
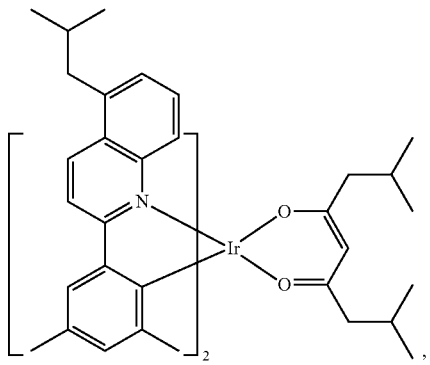
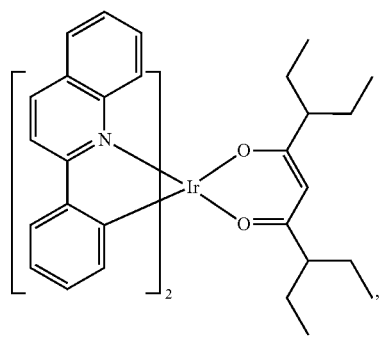
70
-continued
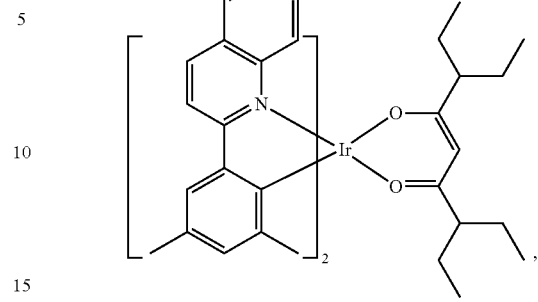
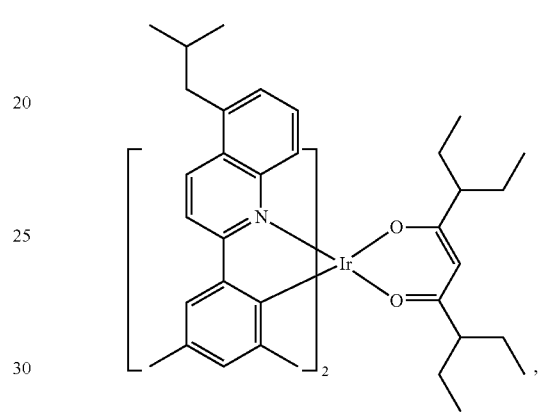
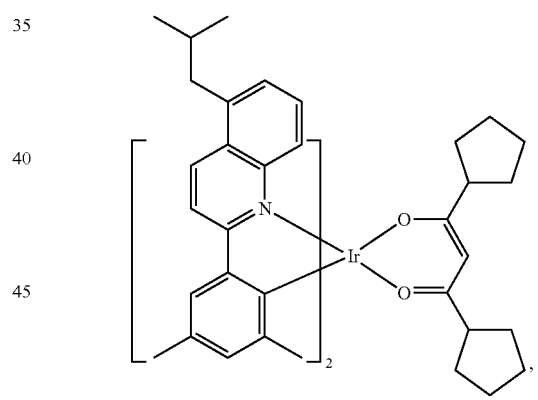
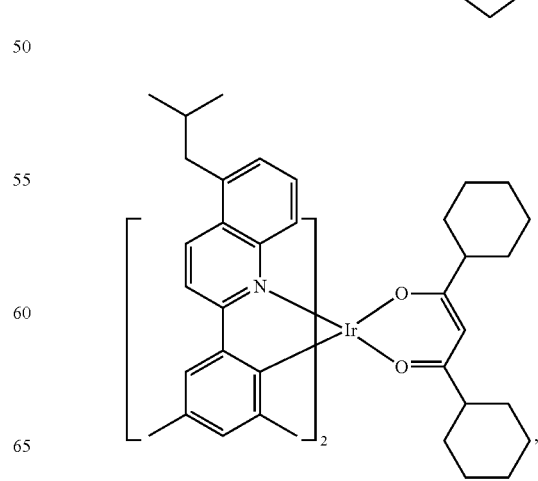

71
-continued
72
-continued
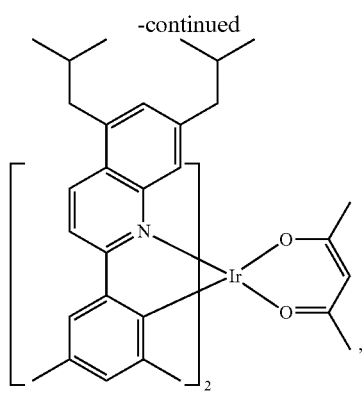
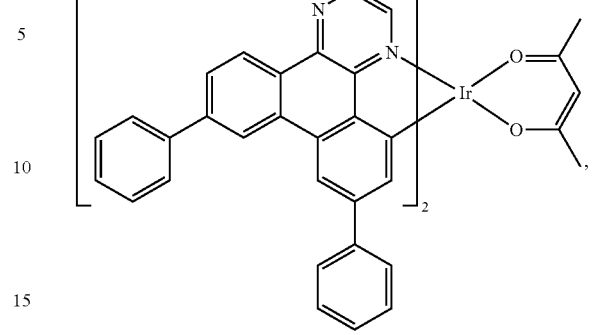
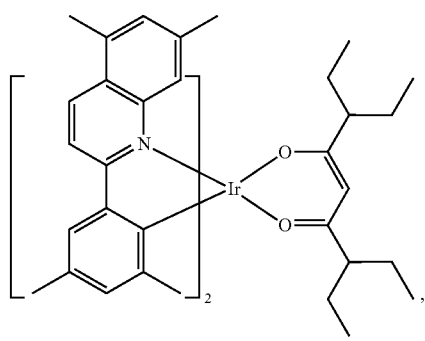
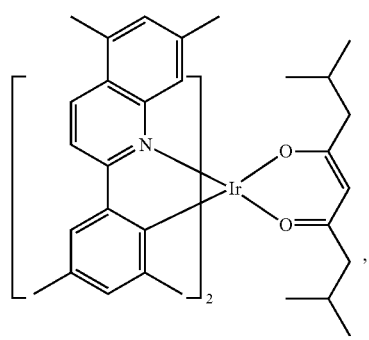
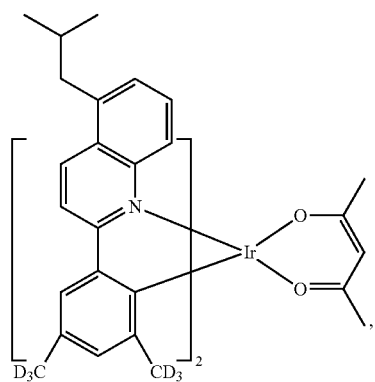

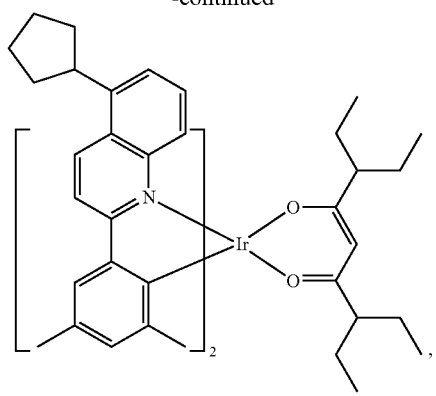
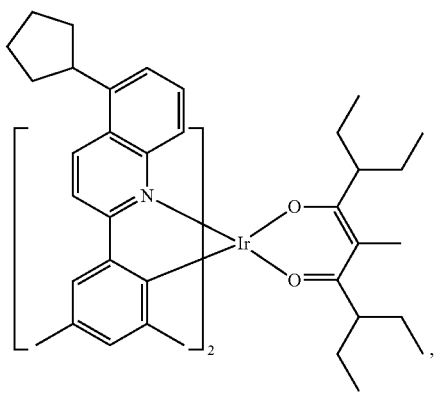
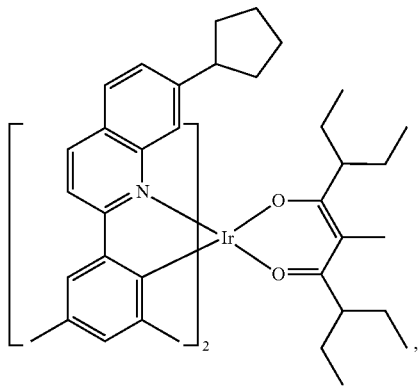
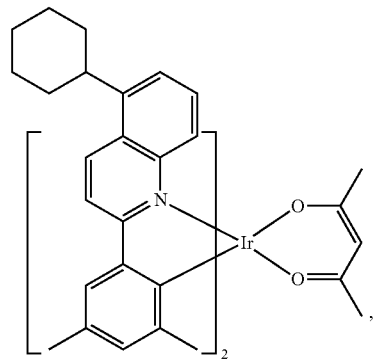
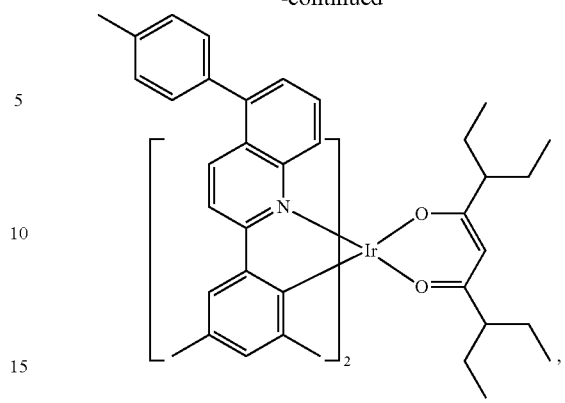
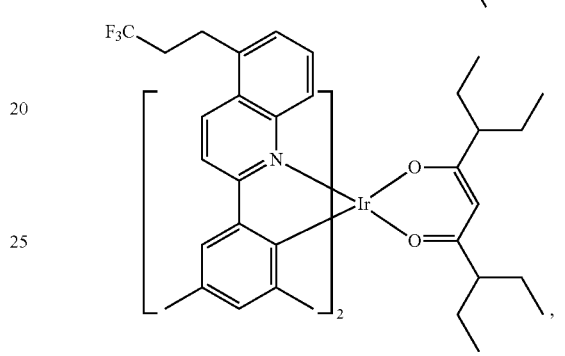
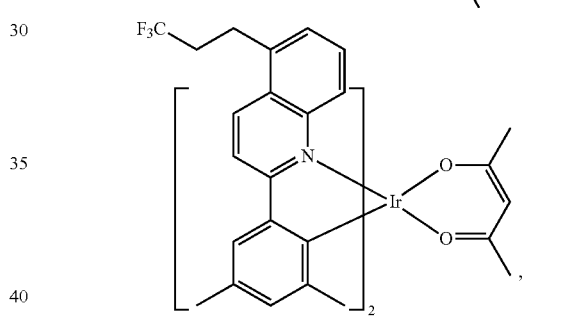
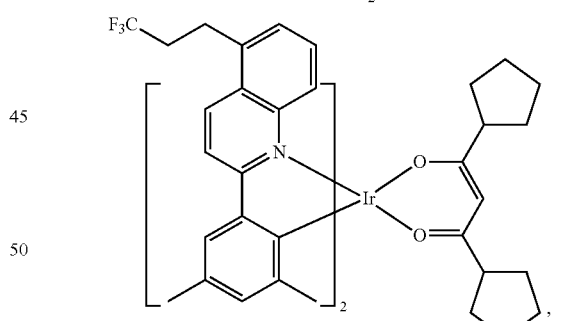
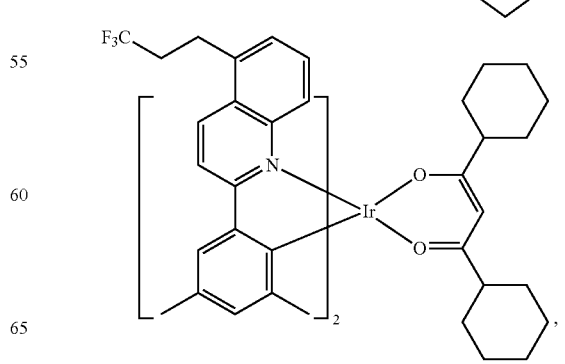

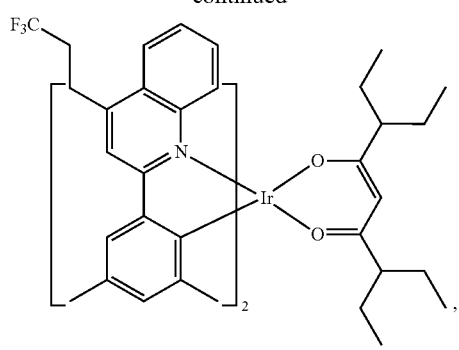
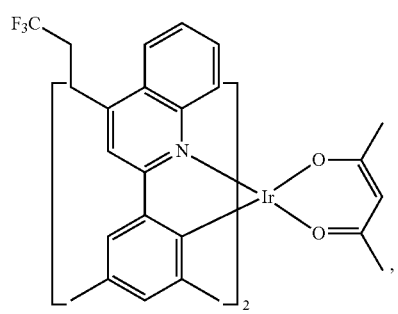
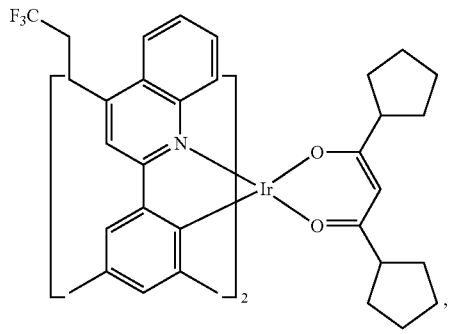
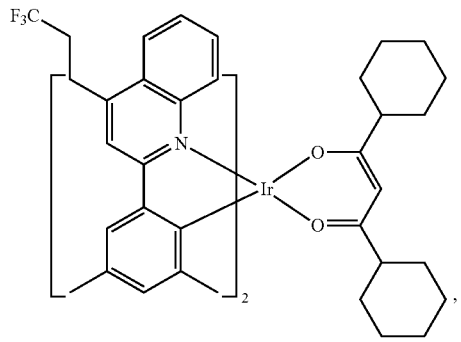
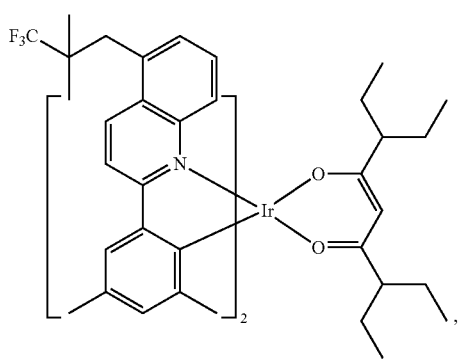
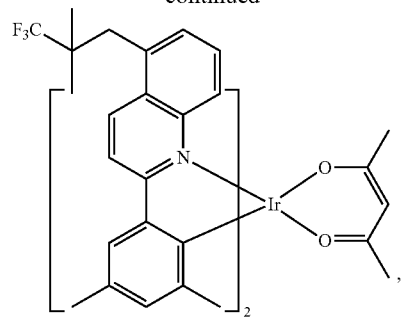
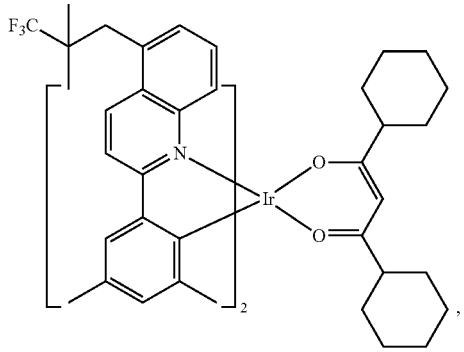
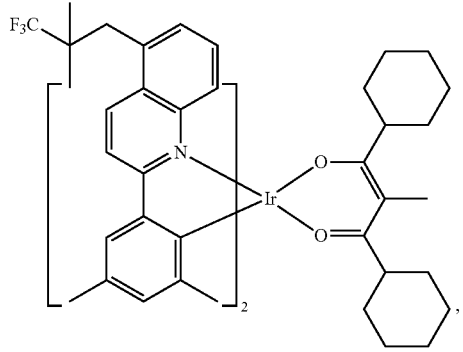
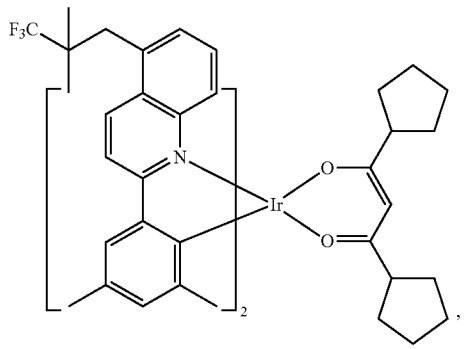
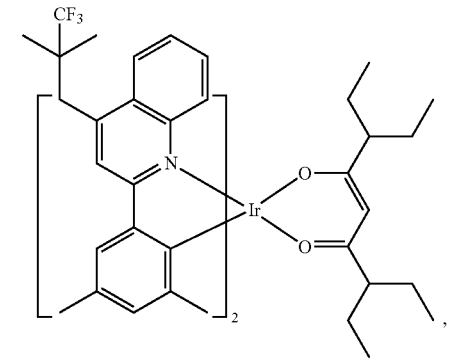

77
-continued
78
-continued
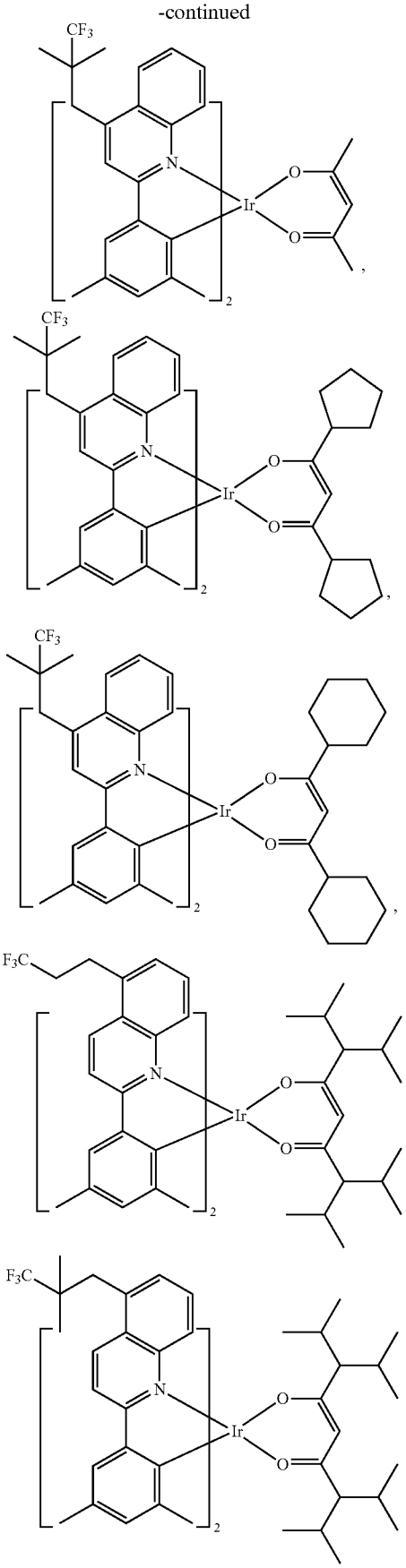
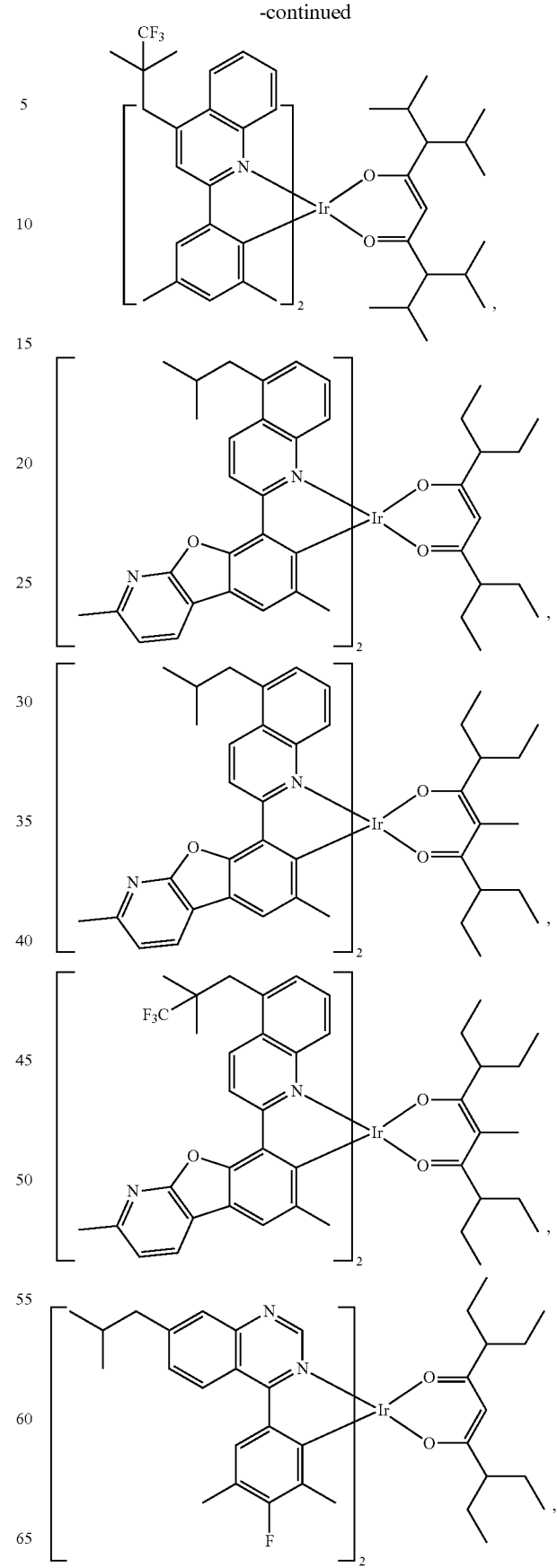

79
-continued
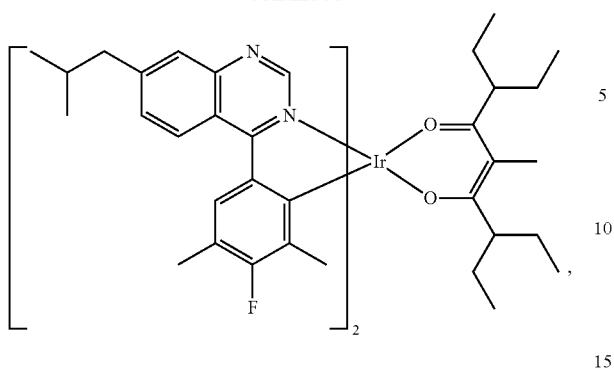
80
-continued
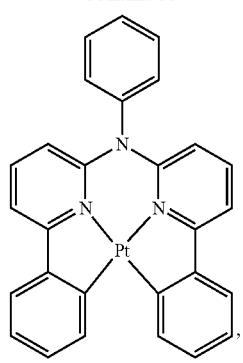
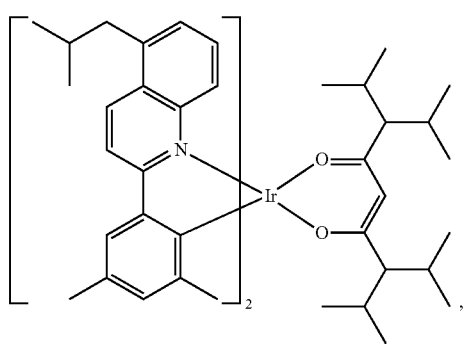
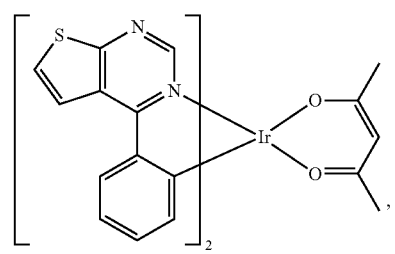
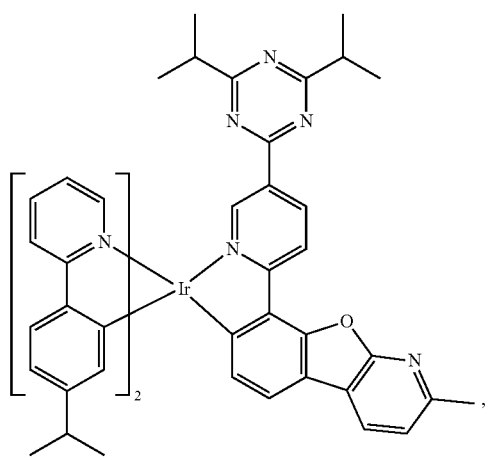
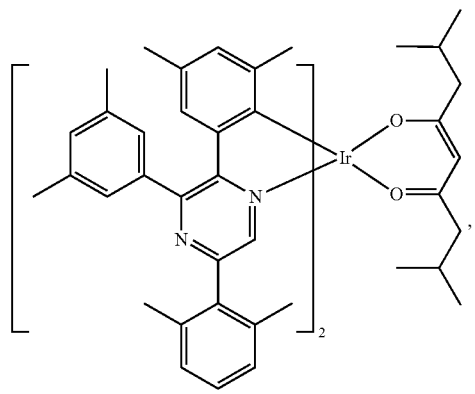
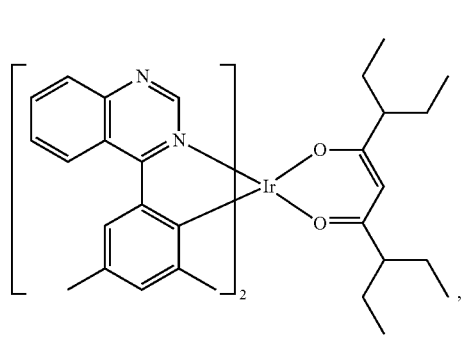
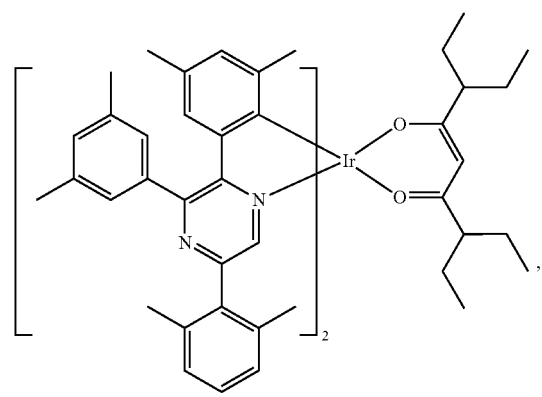

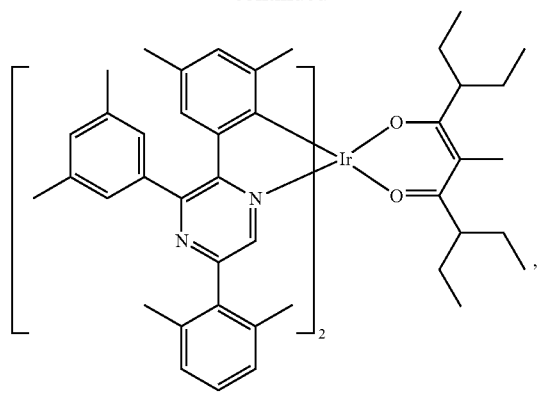
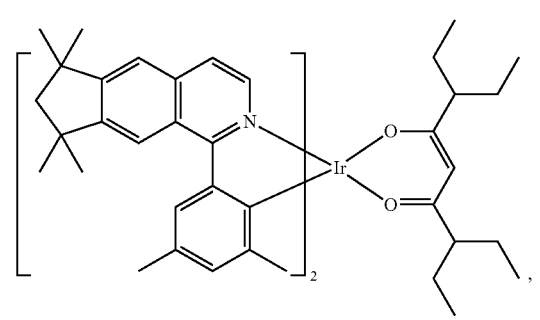
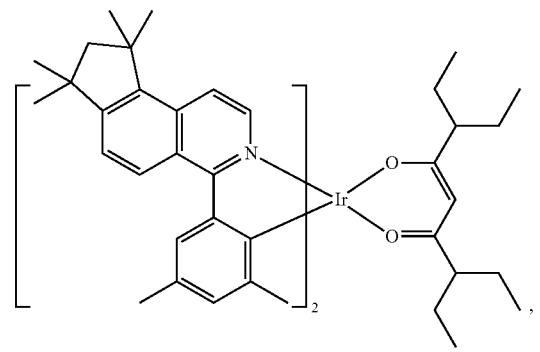
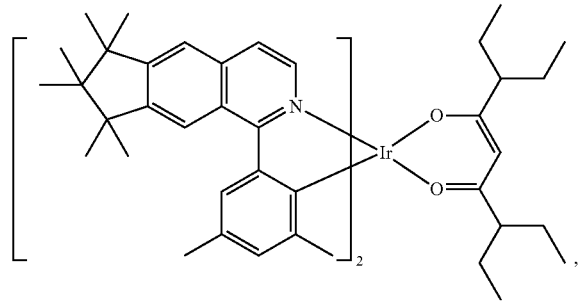
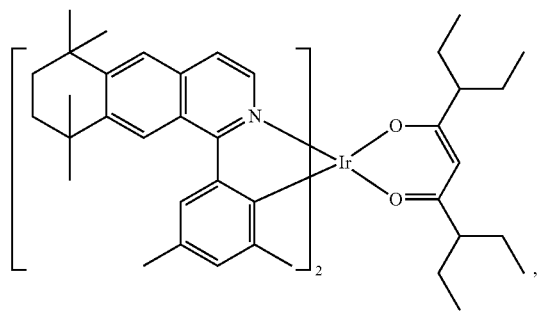
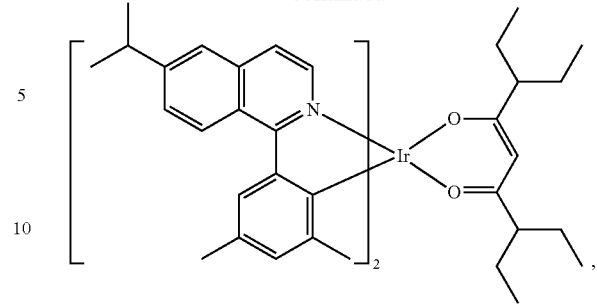
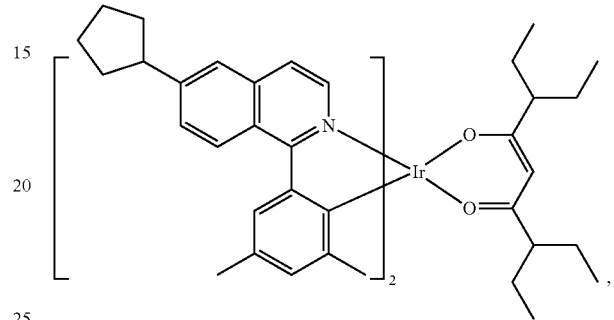
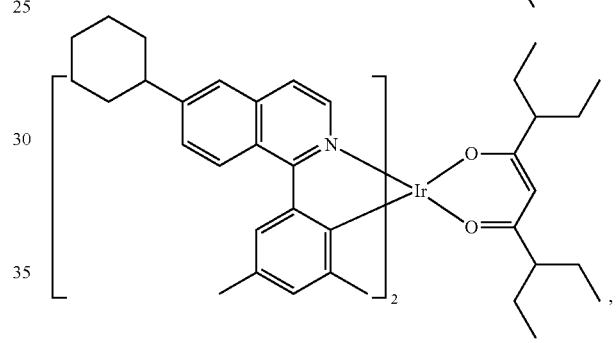
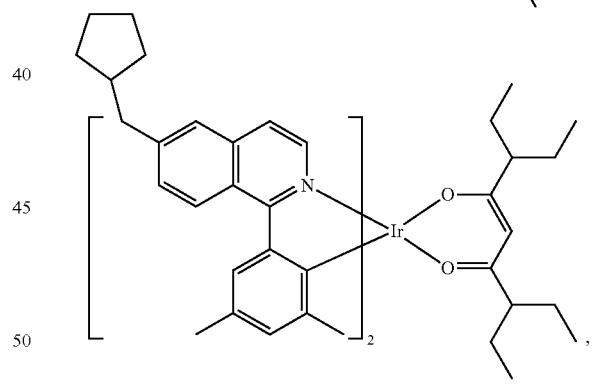
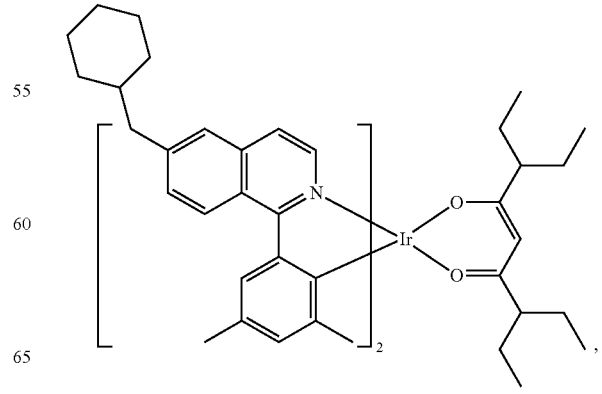

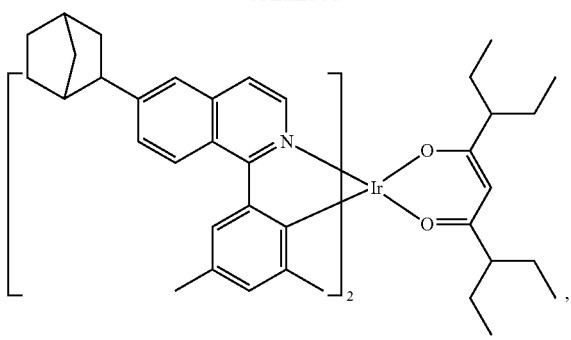
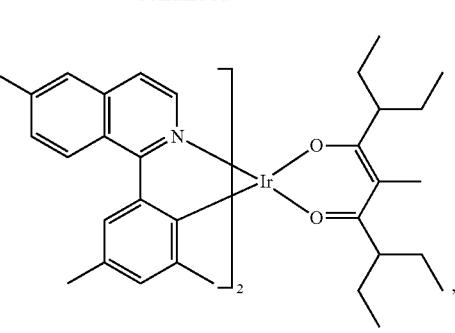
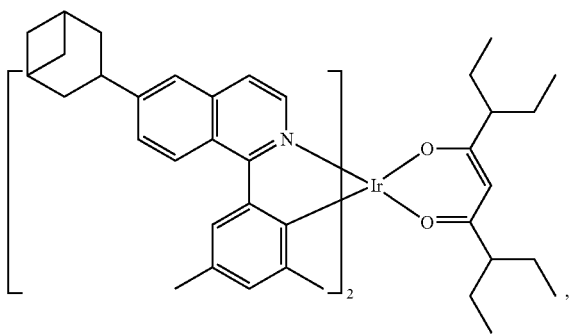
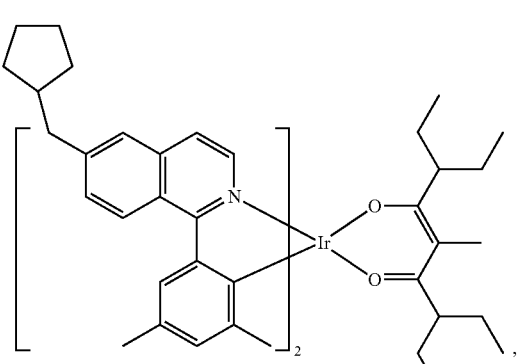
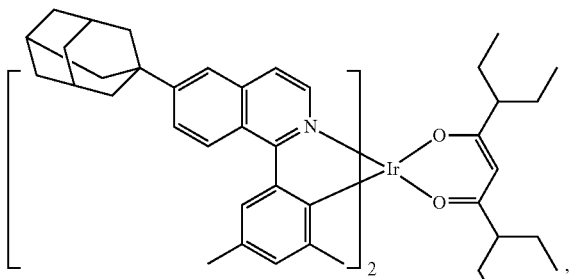
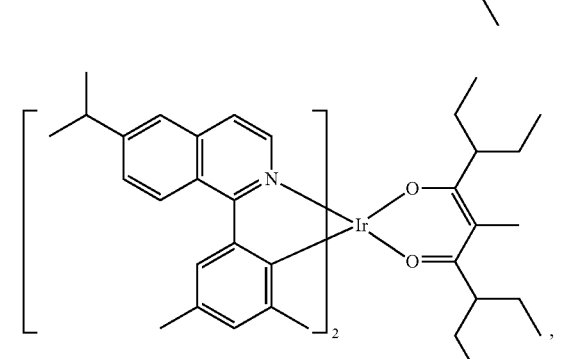
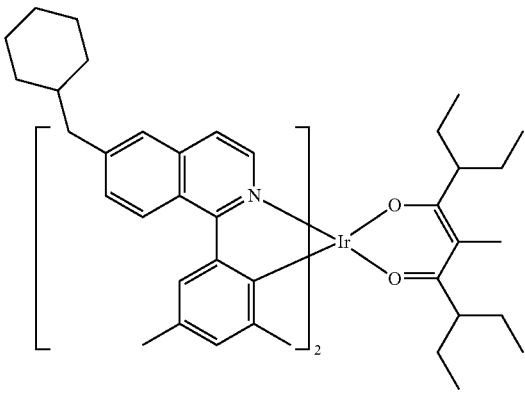
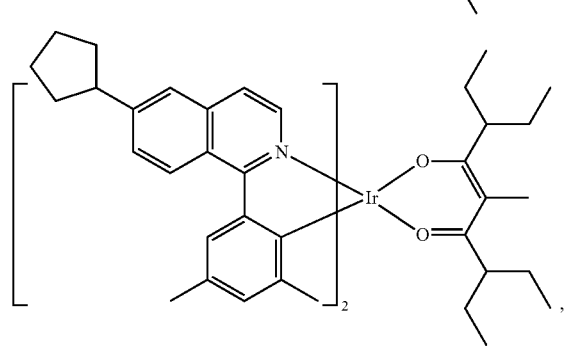
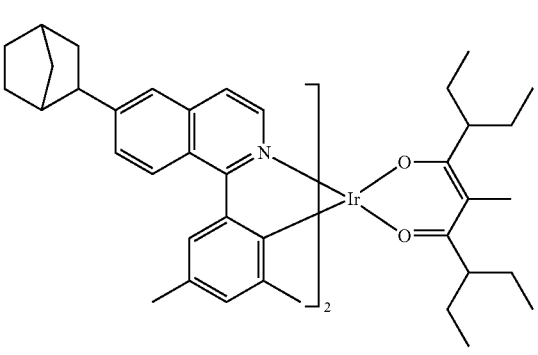

85
-continued
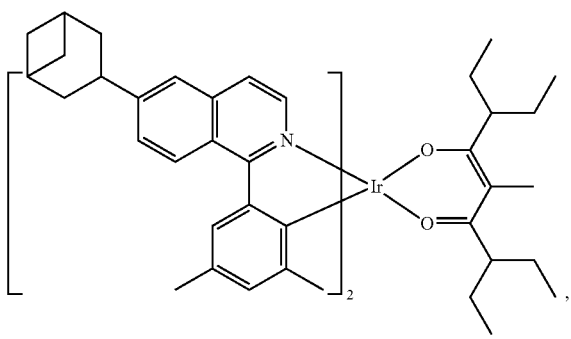
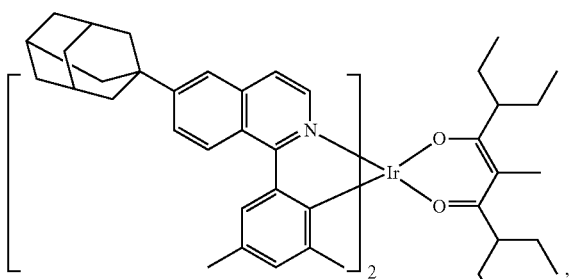
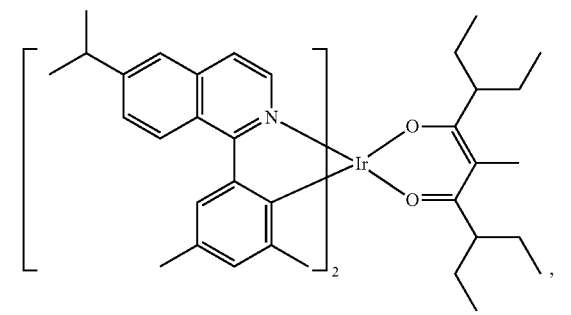
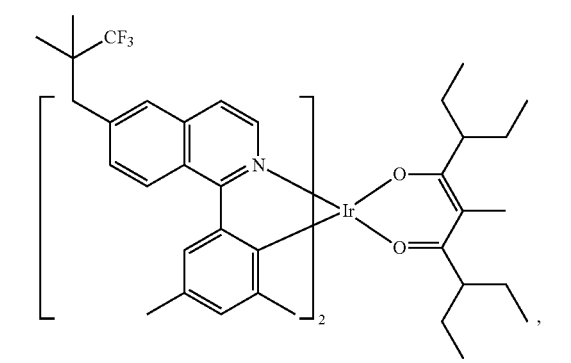
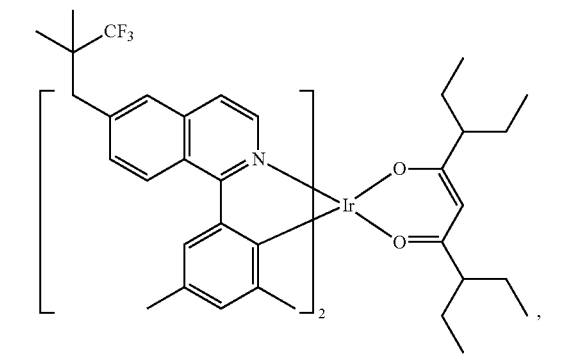
86
-continued
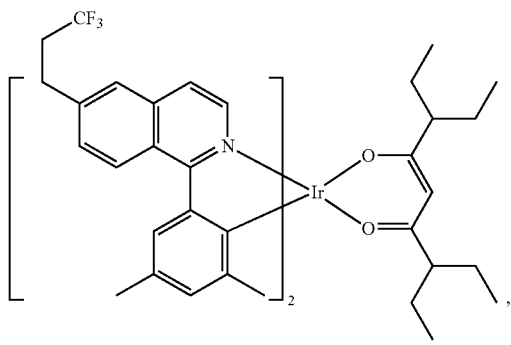
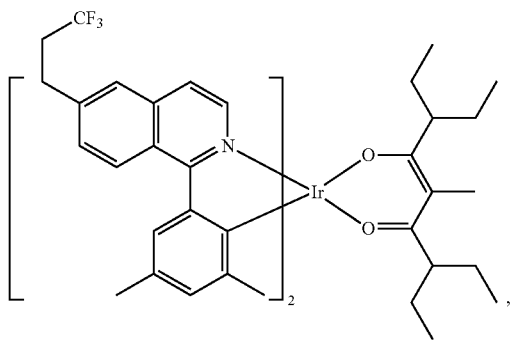
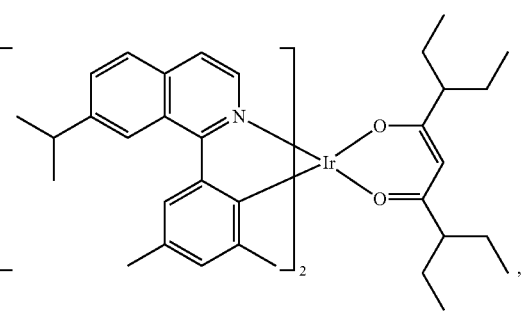
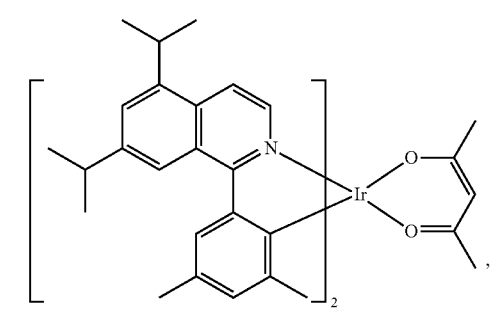

-continued
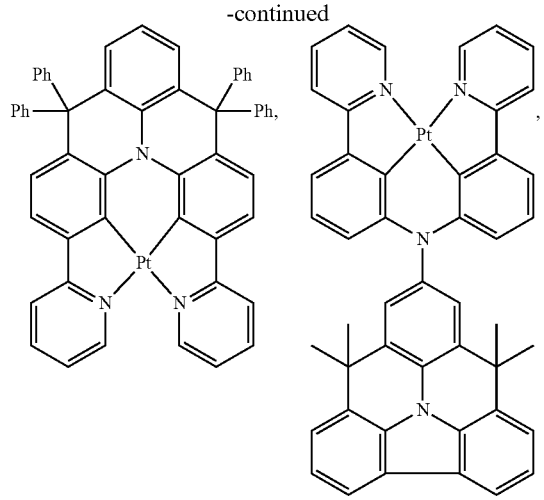
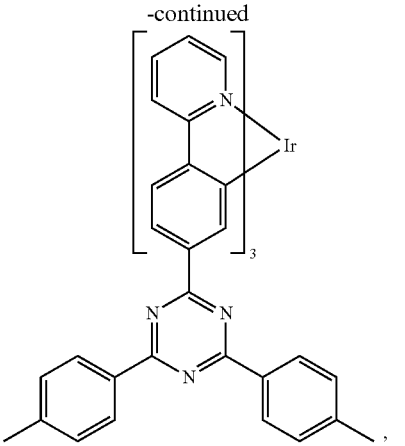
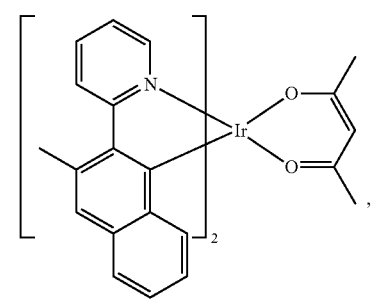
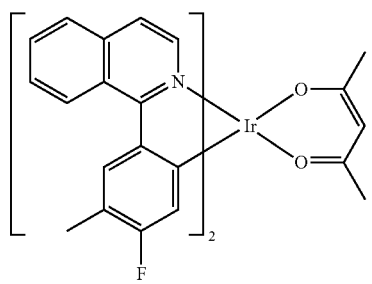
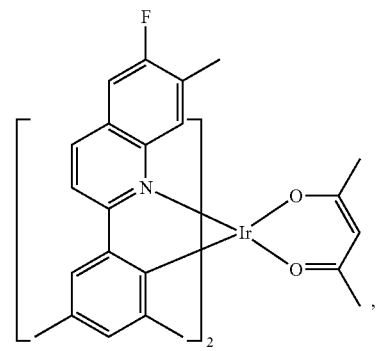
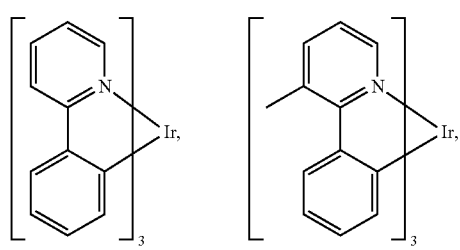

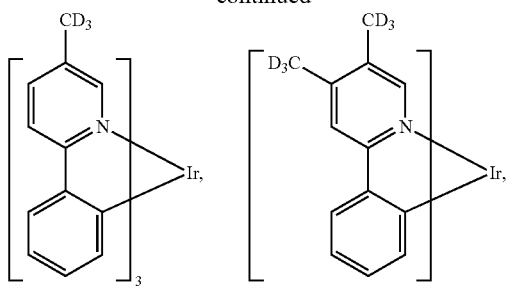
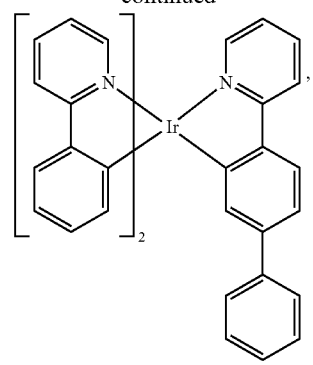
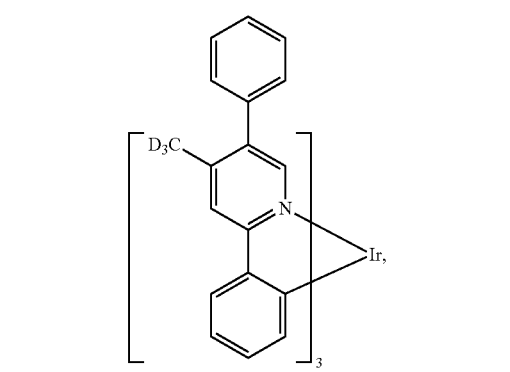
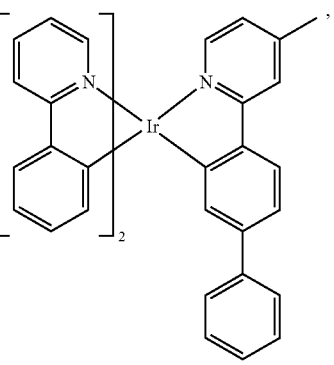
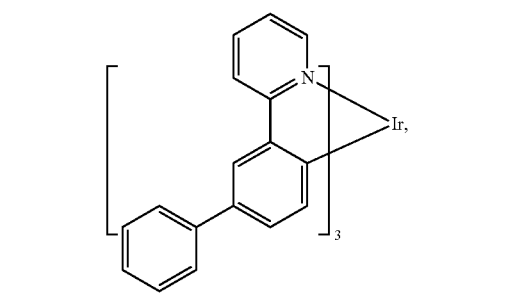
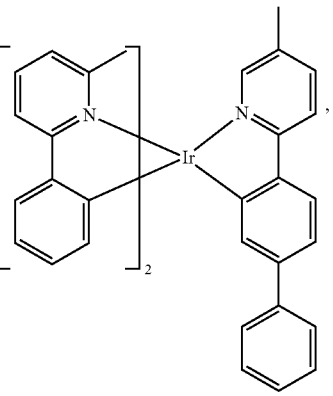
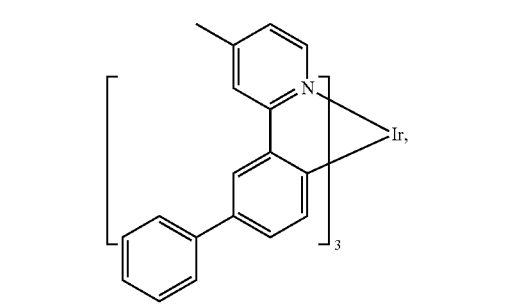
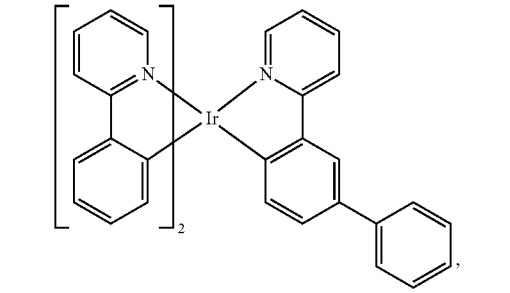
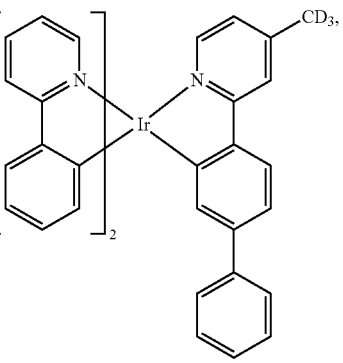

91
-continued
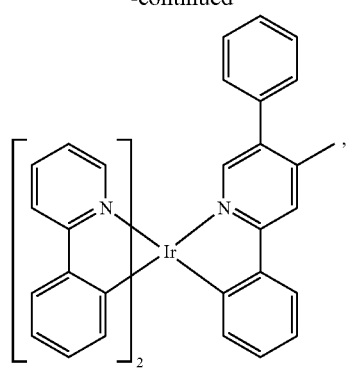
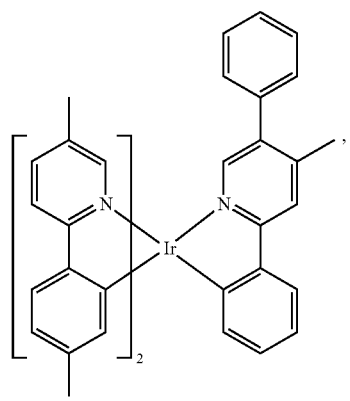
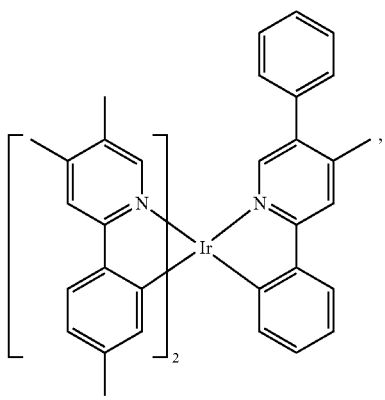
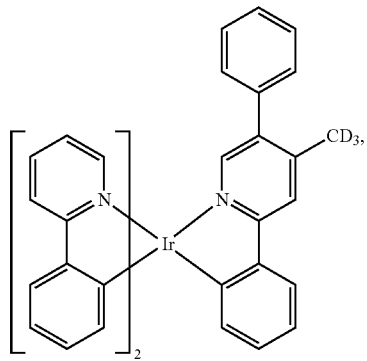
92
-continued
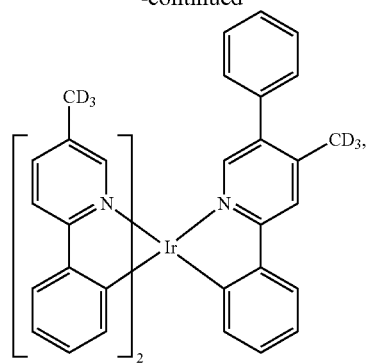
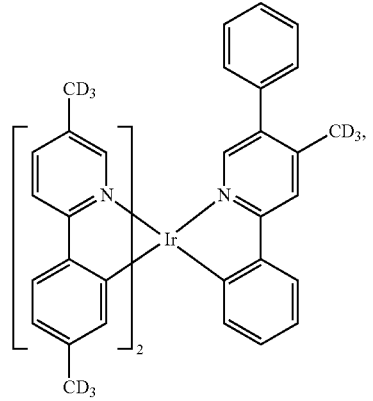
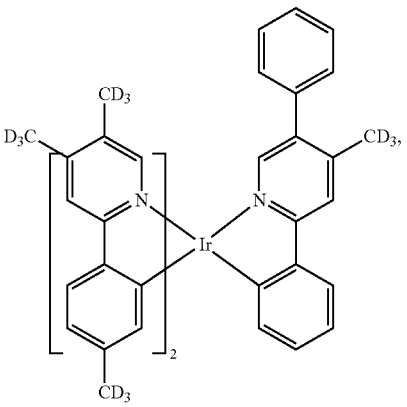
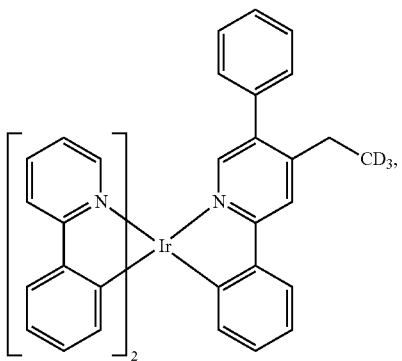

-continued
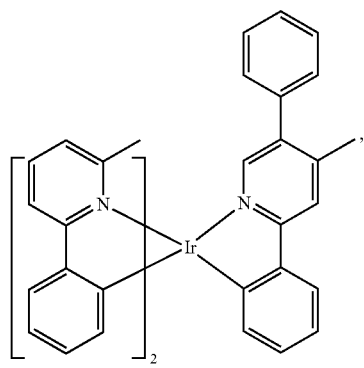
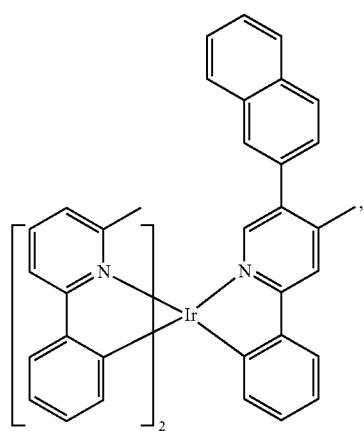
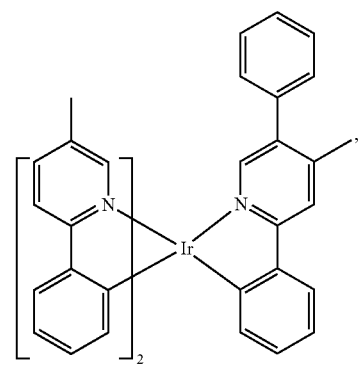
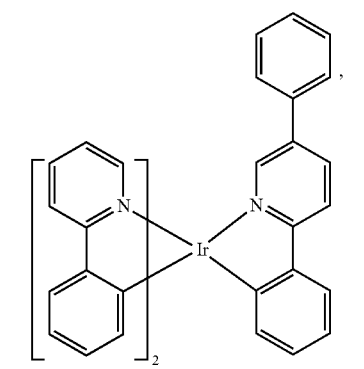
-continued
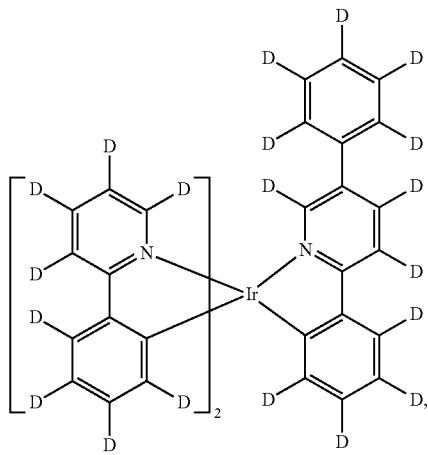
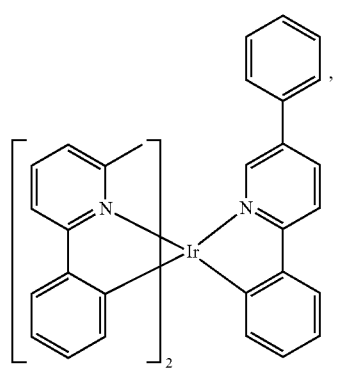
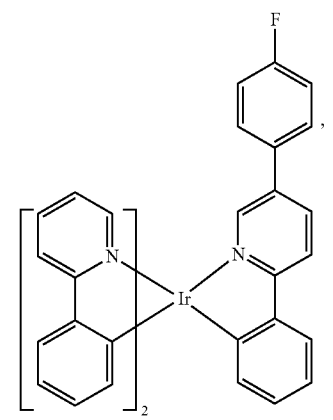
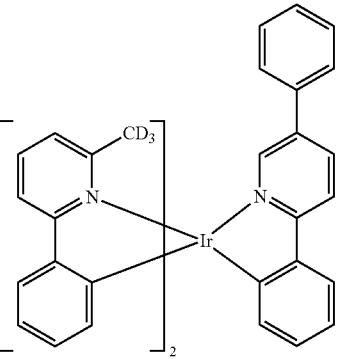

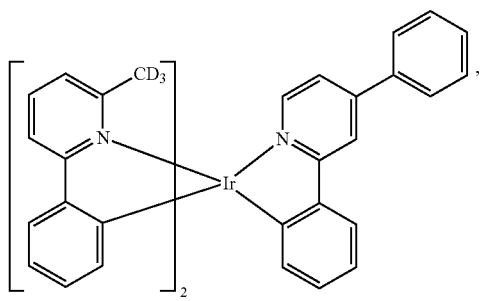
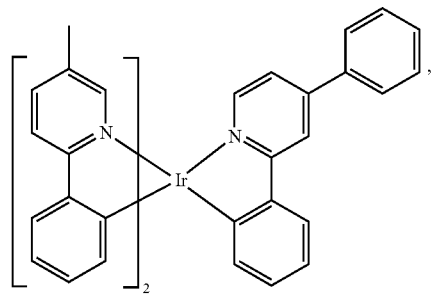
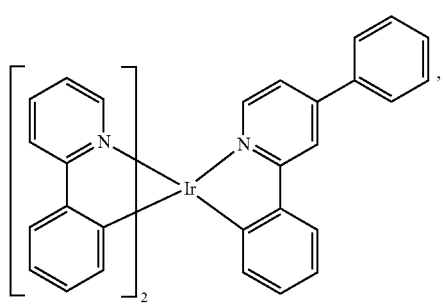
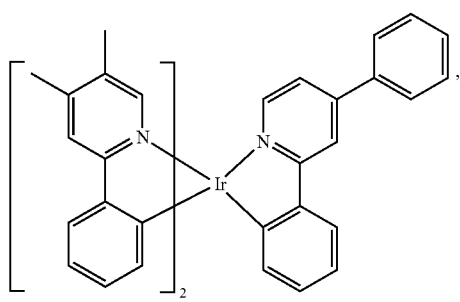
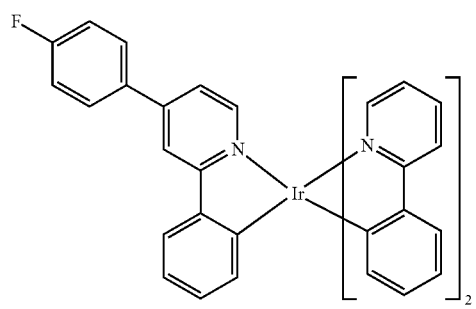
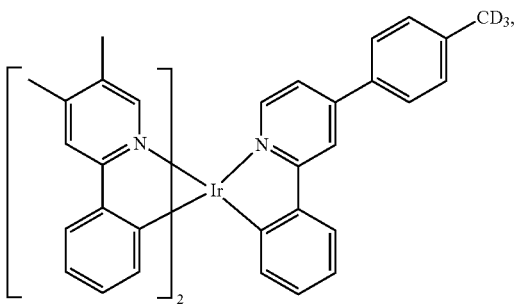
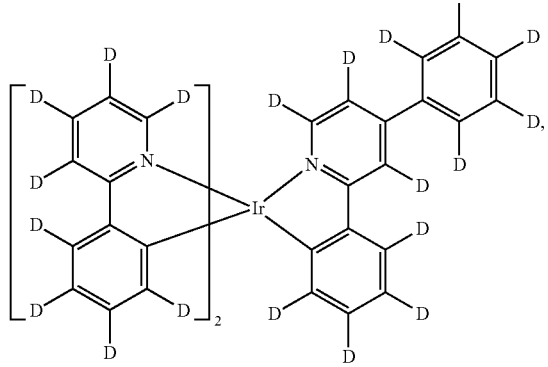
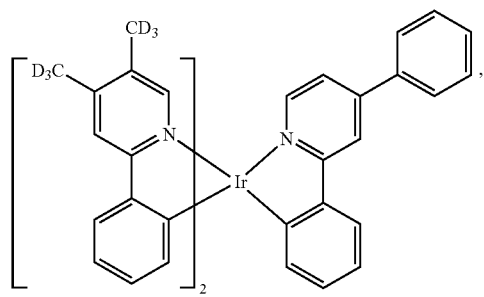
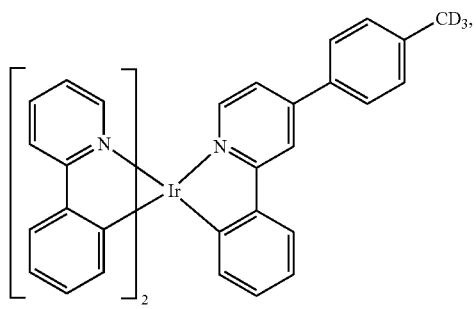
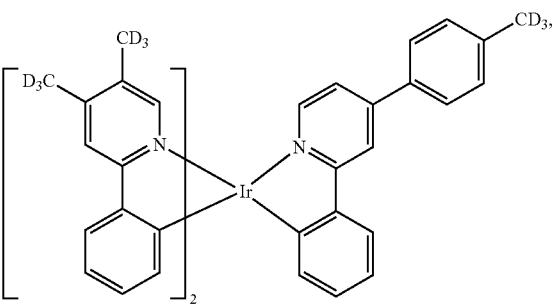

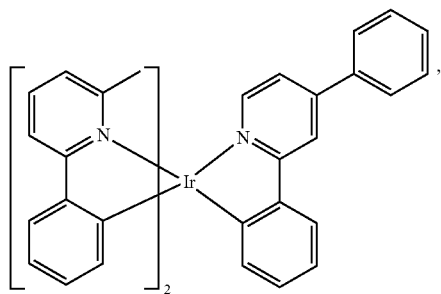
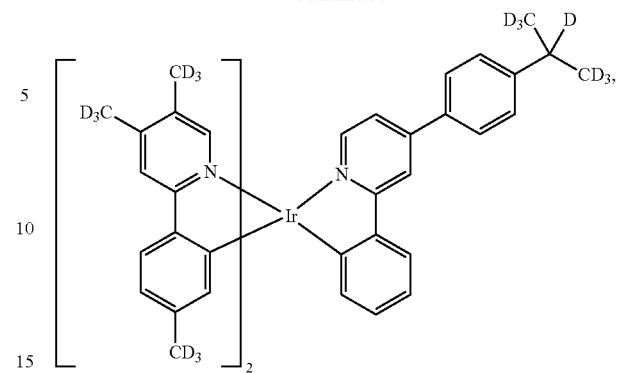
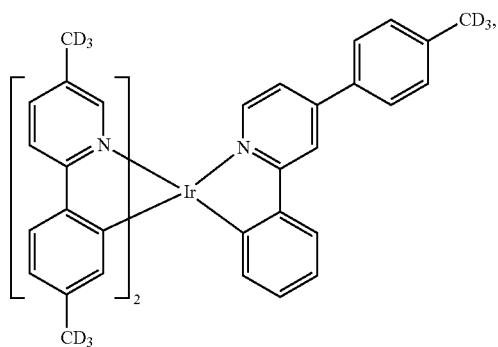
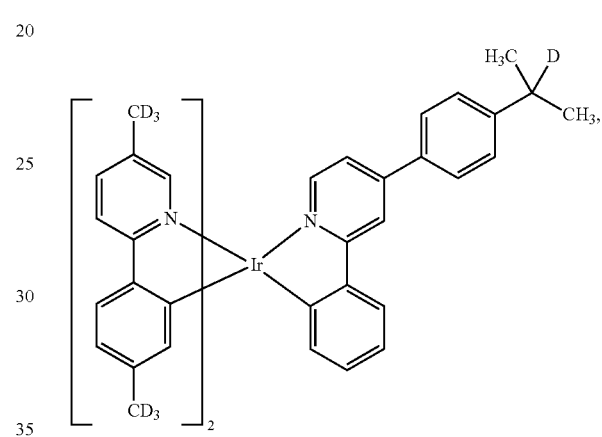
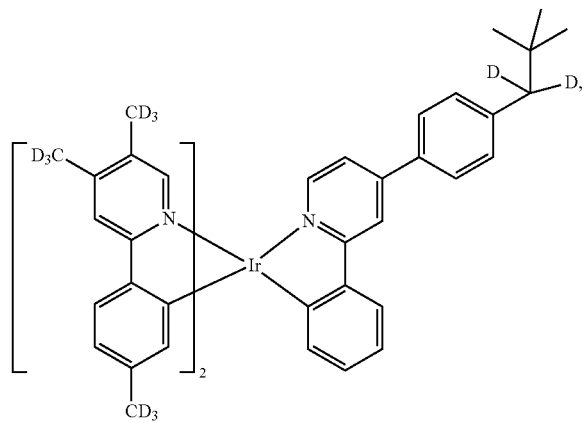
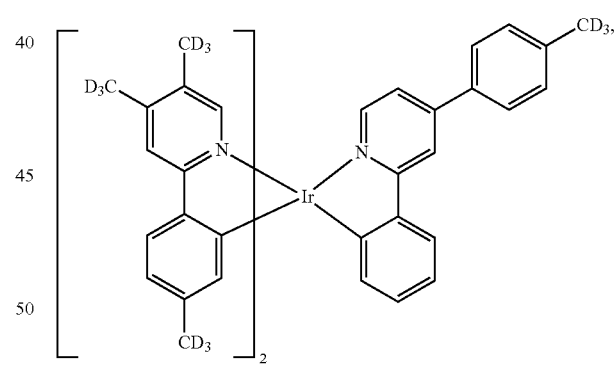
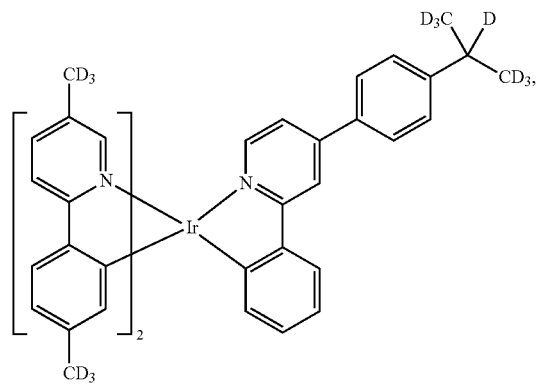
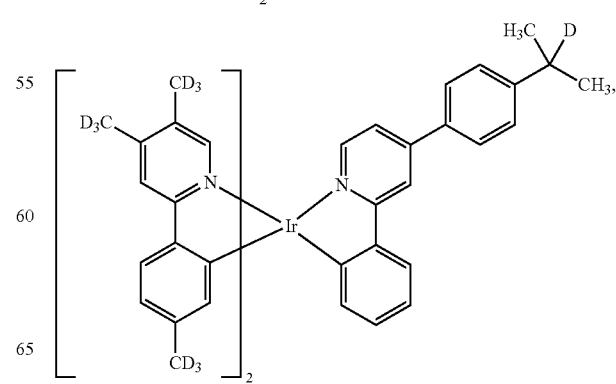

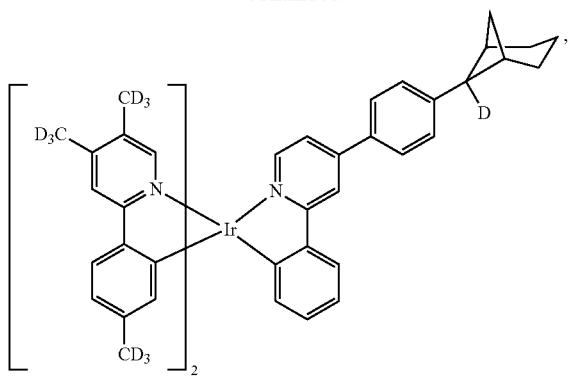
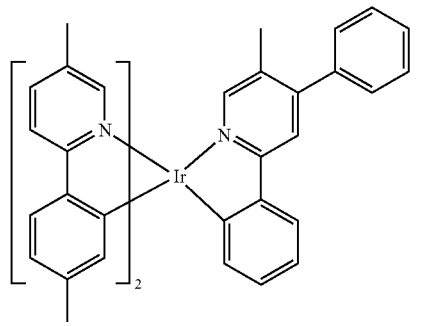
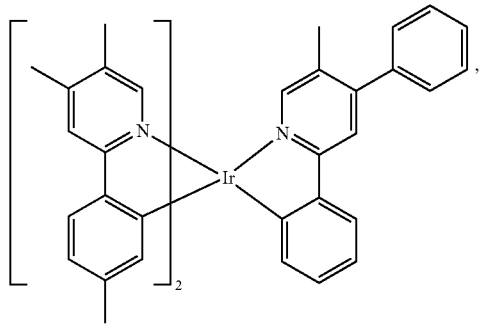
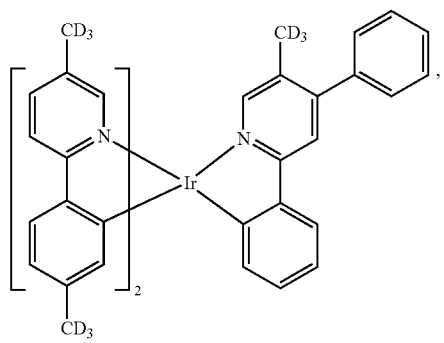
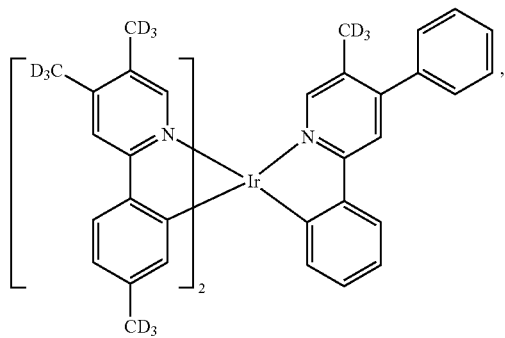
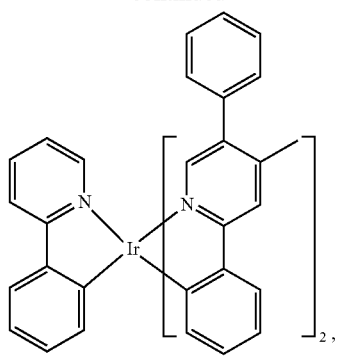
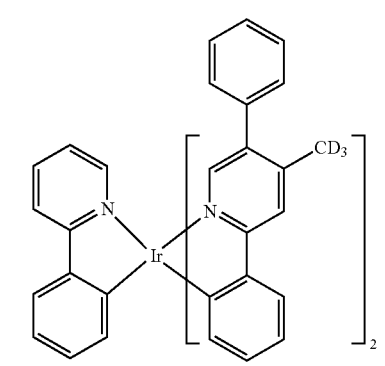
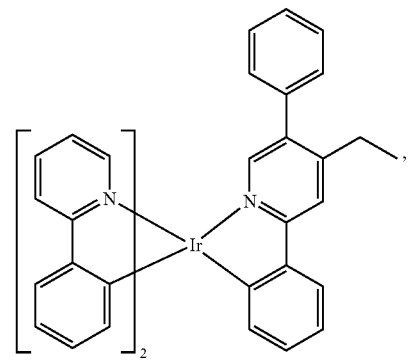
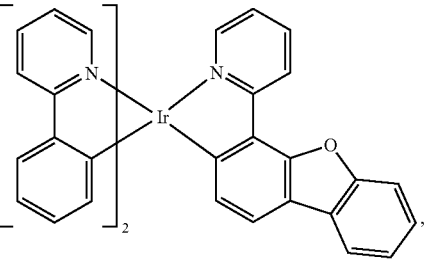
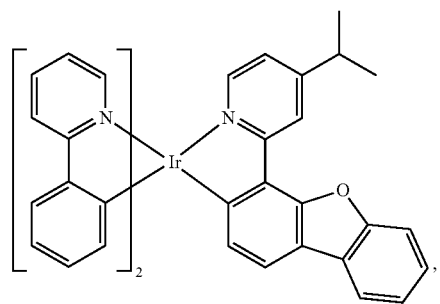

101
-continued
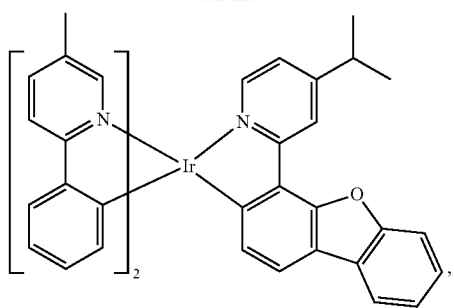
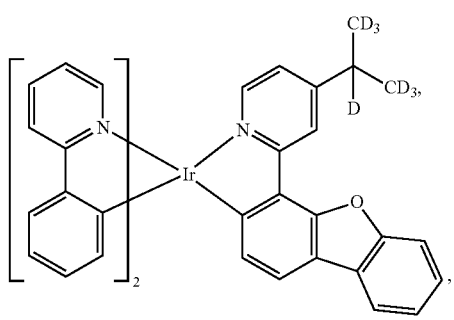
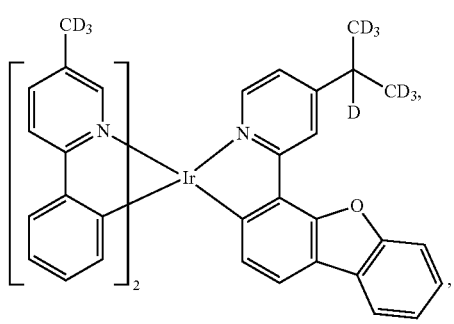
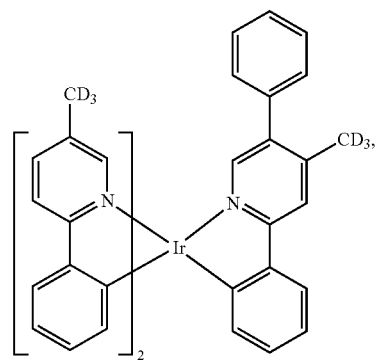
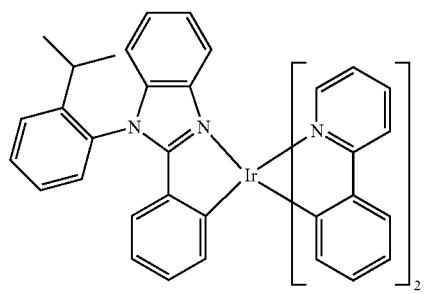
102
-continued
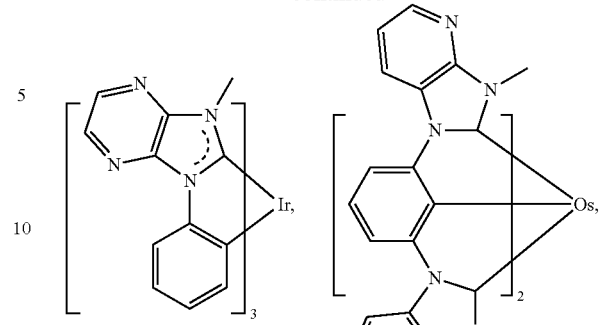
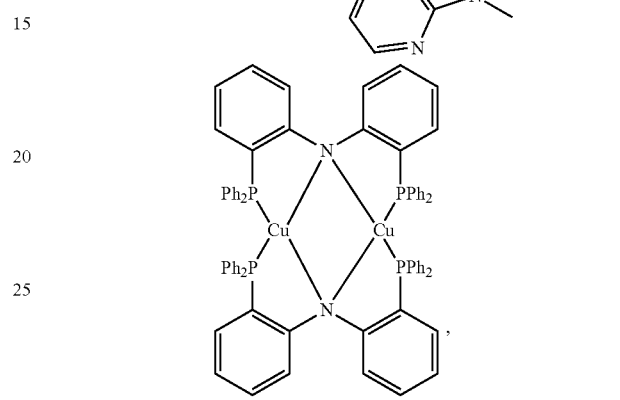
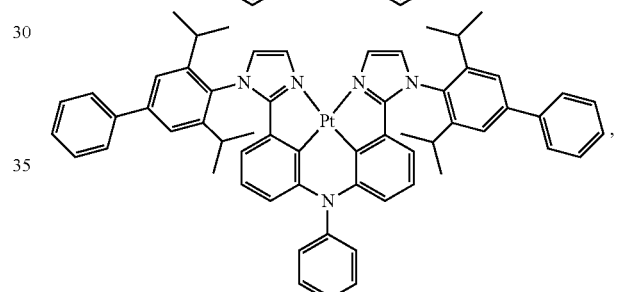
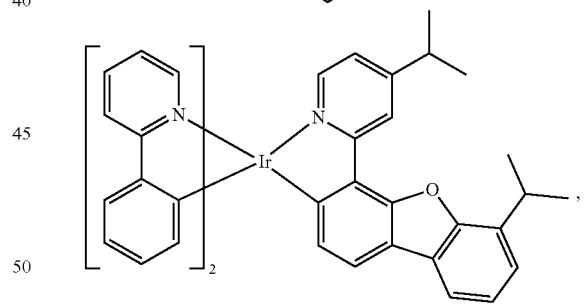
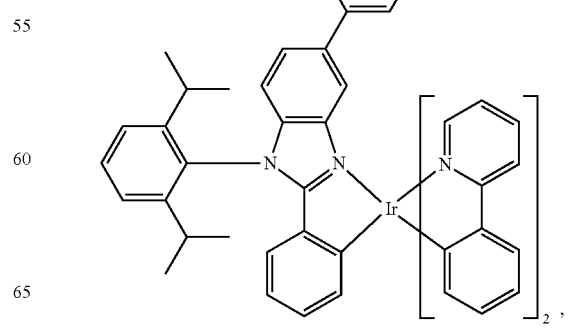

103
-continued
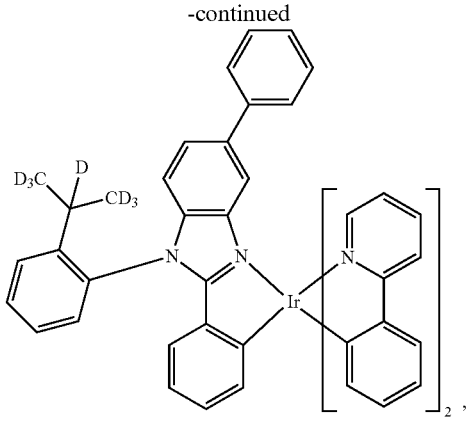
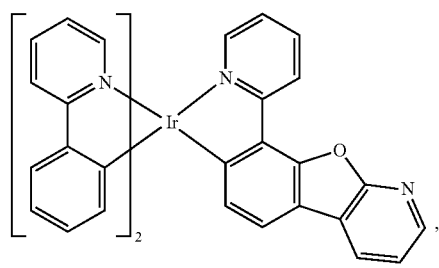
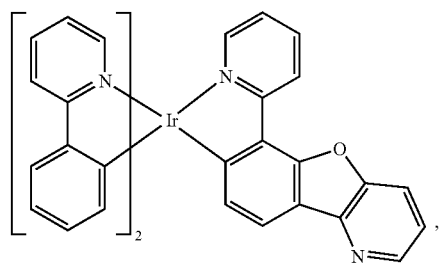
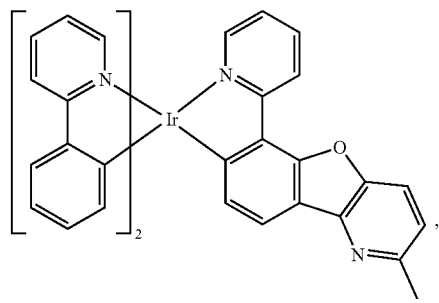
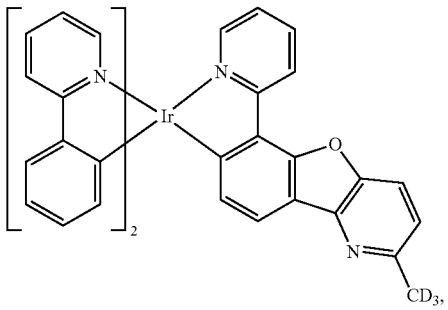
104
-continued
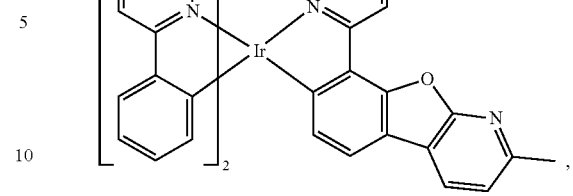
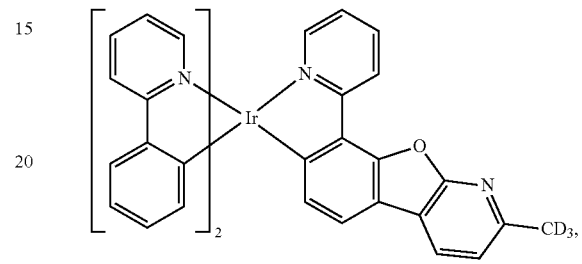
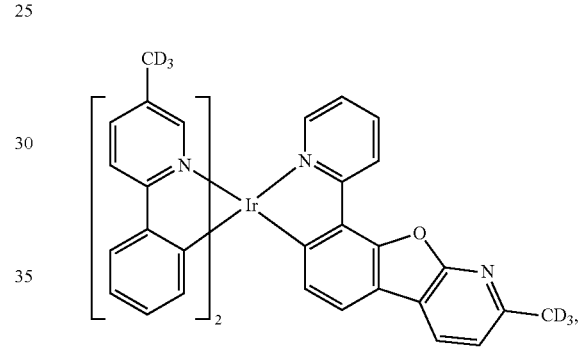
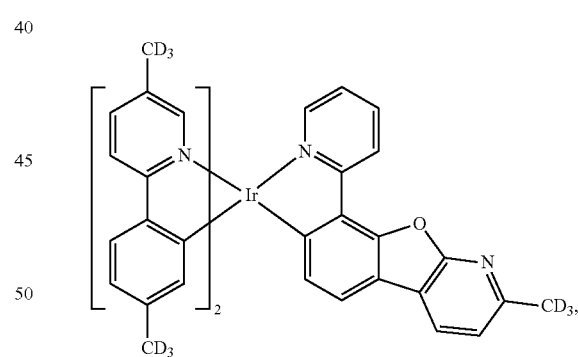
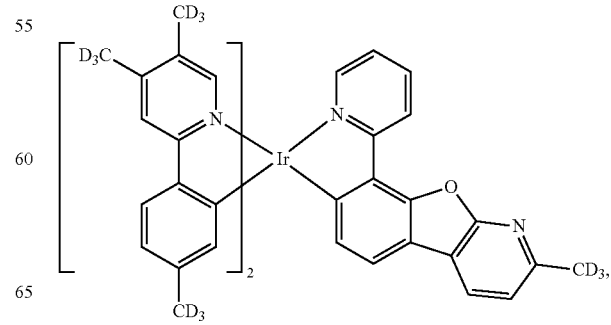

105
-continued
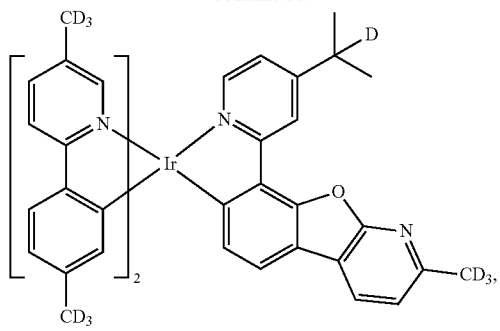
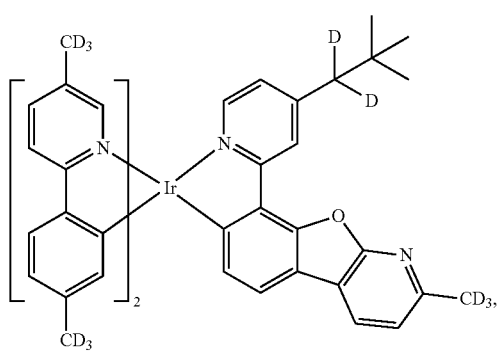
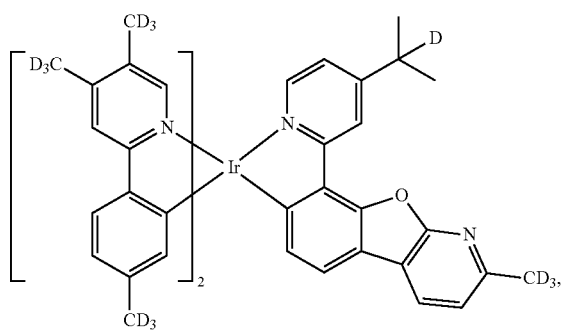
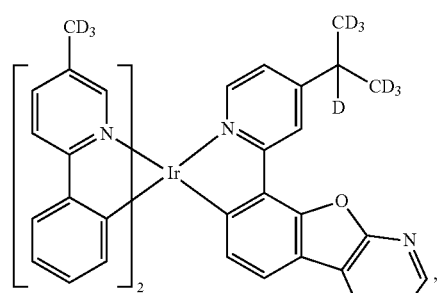
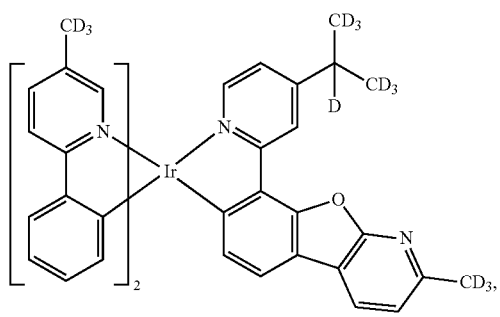
106
-continued
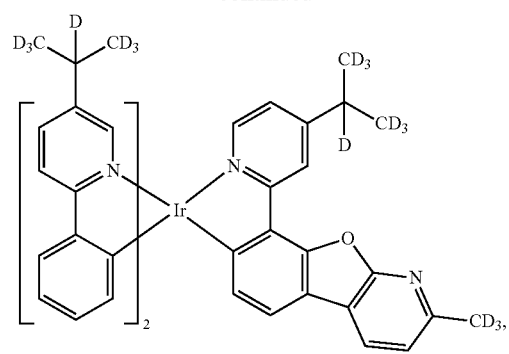
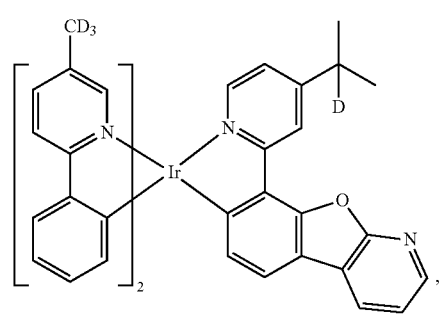
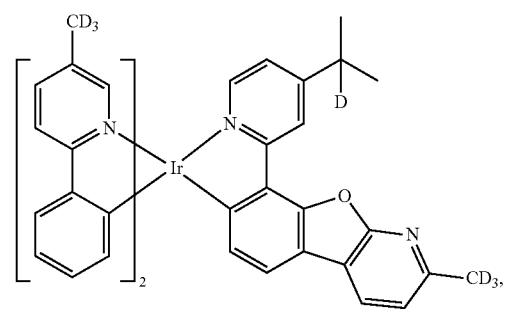
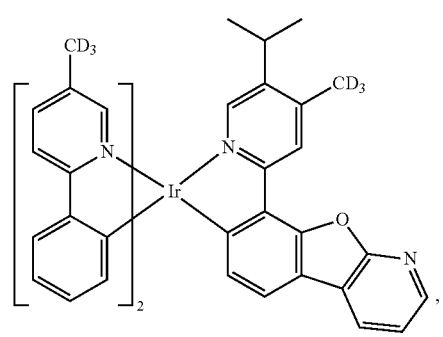
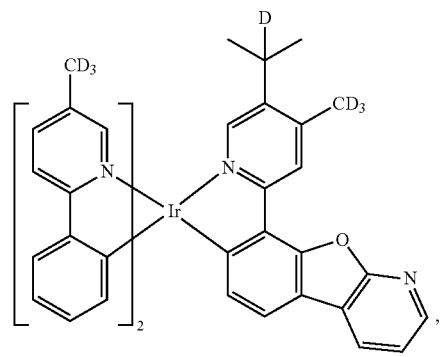

107
-continued
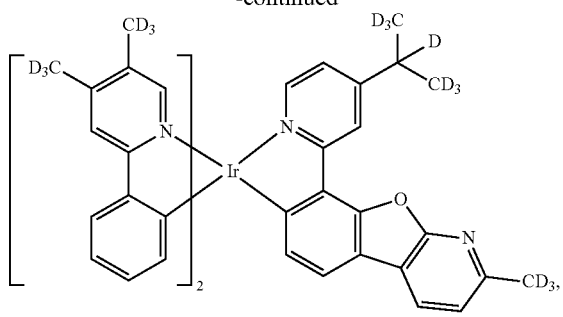
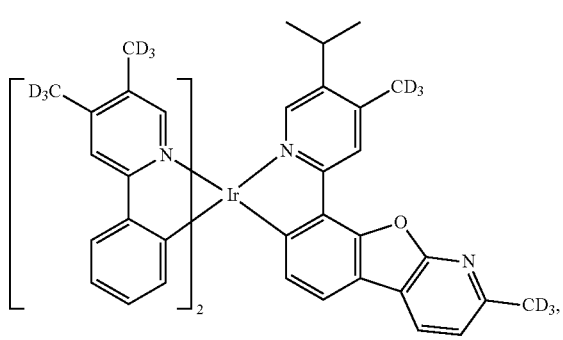
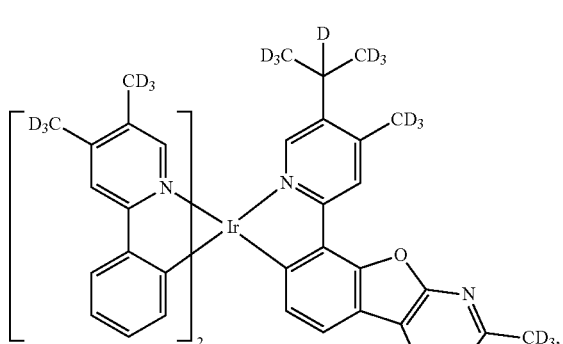
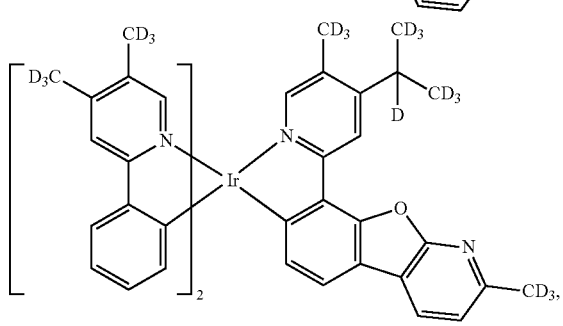
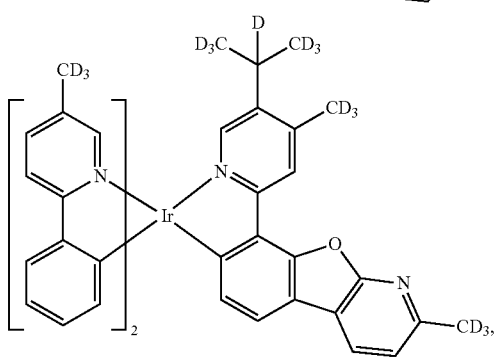
108
-continued
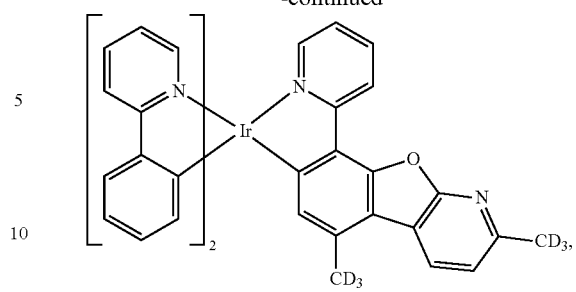
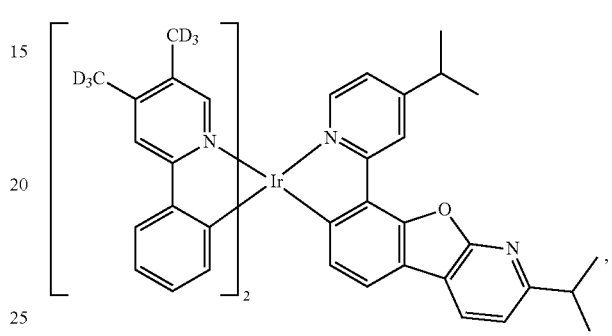
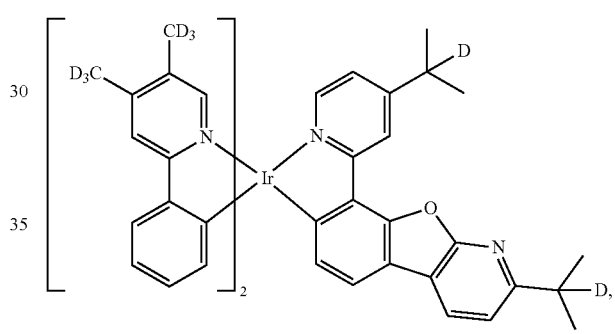
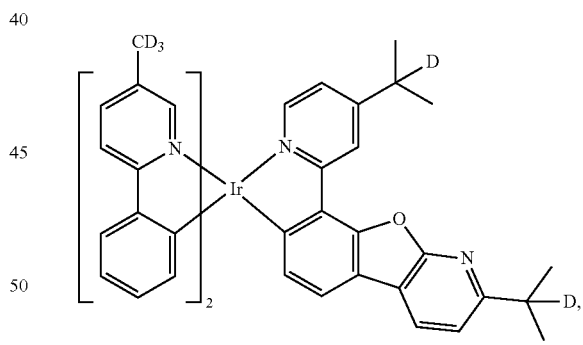
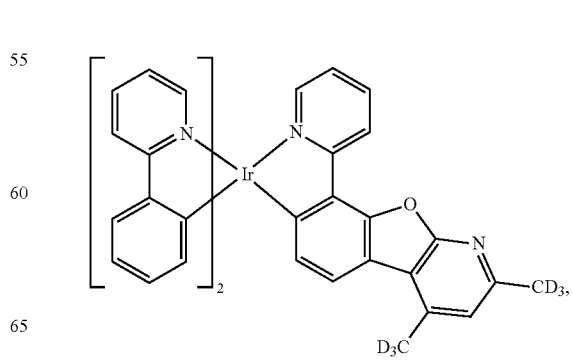

109
-continued
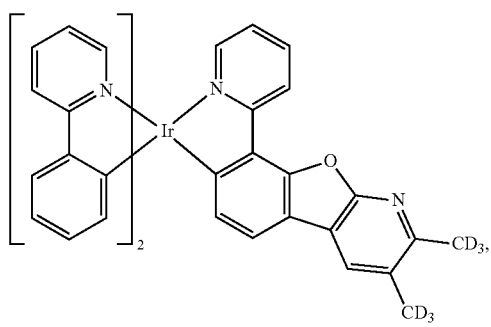
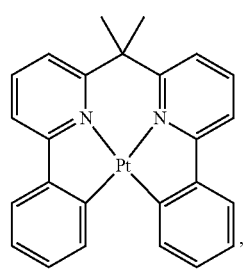
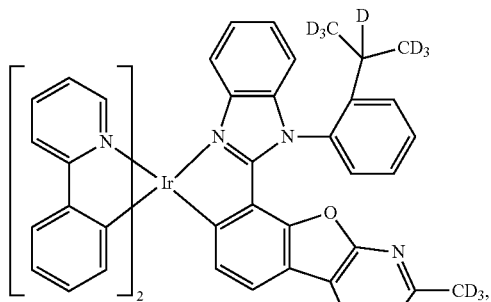
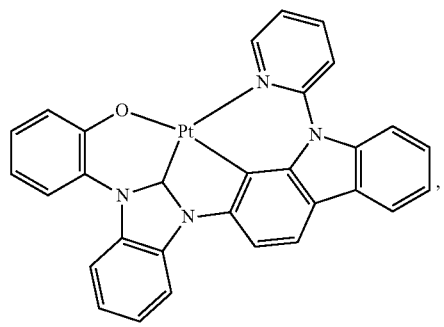
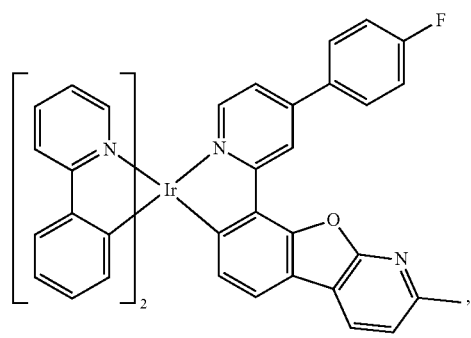
110
-continued
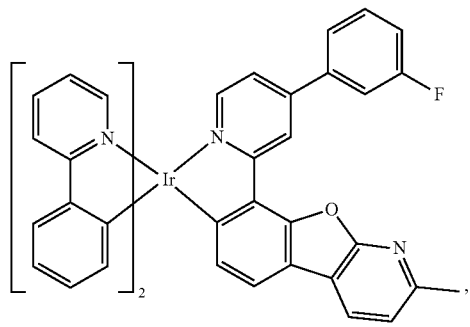

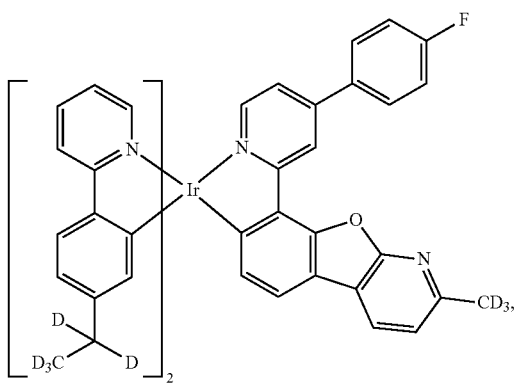
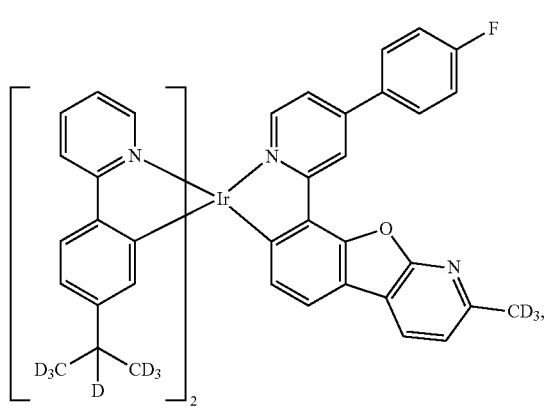
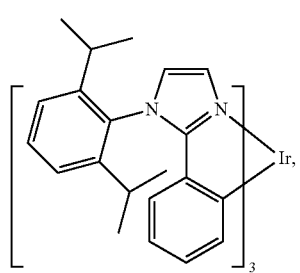
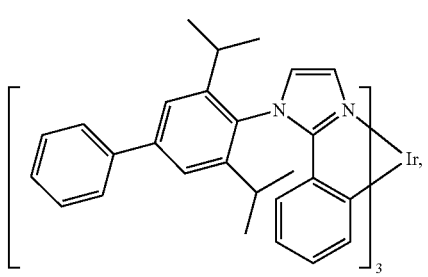
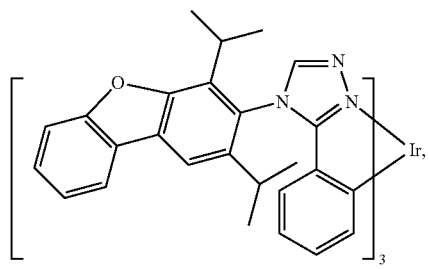
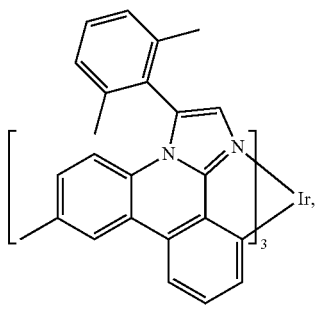
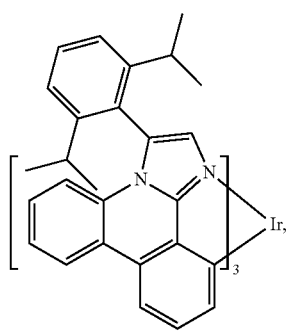
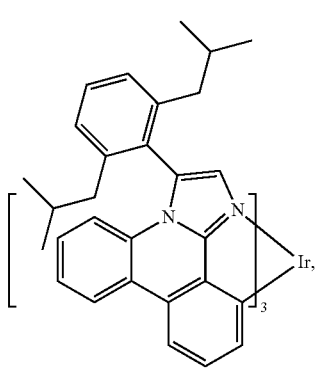
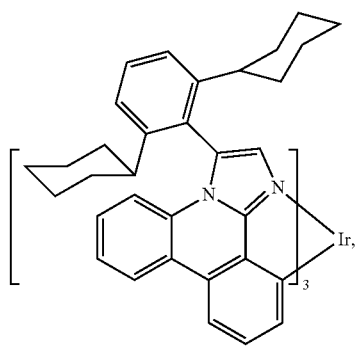

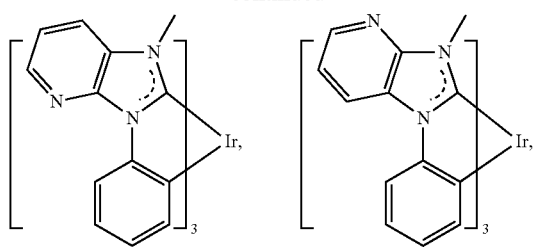
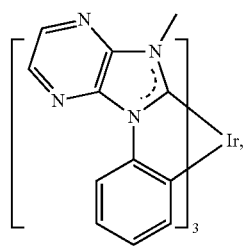
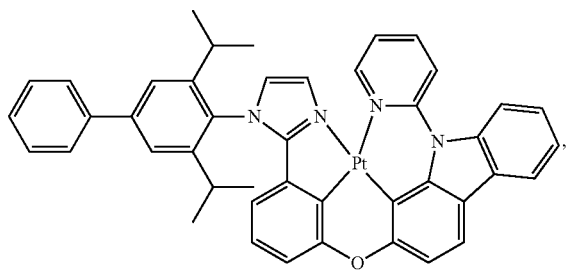
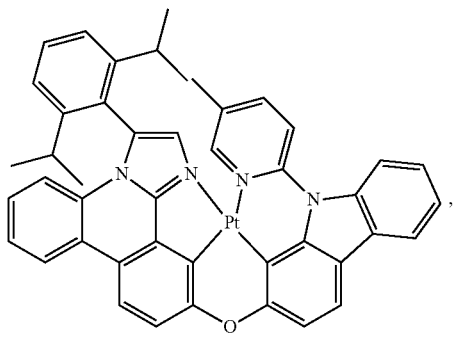
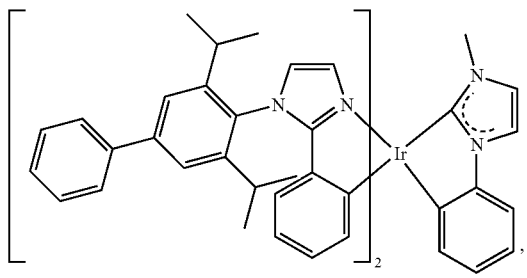
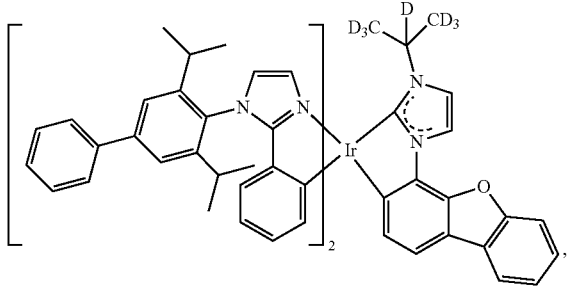

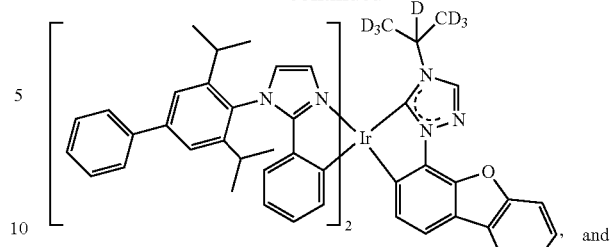
, and

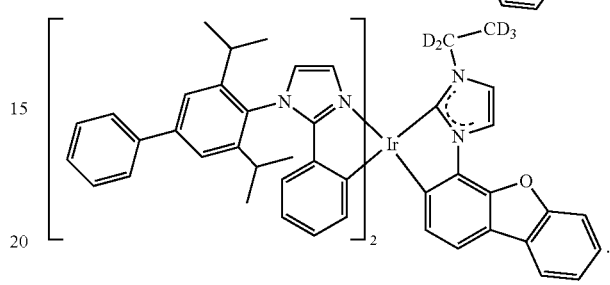
.

In some embodiments of the OLED, the organic layer is a blocking layer and the mixture is used as blocking materials in the organic layer. The term "blocking layer" as used here without specifying whether the layer is a hole blocking layer or an electron blocking layer means that the layer can be either type. In these embodiments, the OLED would further comprise an emissive layer capable of emitting light in the OLED at room temperature.

In some embodiments of the OLED, the organic layer is a transporting layer and the mixture is used as transporting materials in the organic layer. In these embodiments, the OLED would further comprise an emissive layer capable of emitting light in the OLED at room temperature.

According to another aspect, a method for fabricating an OLED comprising a first electrode, a second electrode, and a first organic layer disposed between the first electrode and the second electrode, wherein the first organic layer comprises a first composition comprising a mixture of a first compound and a second compound is disclosed. The method comprising:

providing a substrate having the first electrode disposed thereon;

depositing the first organic layer over the first electrode; and depositing the second electrode over the first organic layer, wherein the first compound has a structure of Formula I:

Formula I

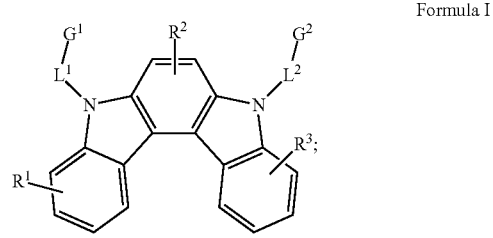

wherein the second compound has a structure of Formula II:

Formula II

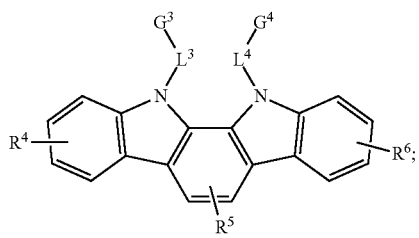

wherein $L^1$, $L^2$, $L^3$ and $L^4$ are each independently selected from the group consisting of direct bond, alkyl, alkenyl, alkynyl, aryl, heteroaryl, and combinations thereof;

wherein $G^1$ and $G^2$ are each independently selected from the group consisting of hydrogen, deuterium, halogen, alkyl, alkyloxy, cycloalkyl, cycloalkoxyl, silyl, amino, benzene, biphenyl, terphenyl, naphthalene, triphenylene, pyrene, anthracene, phenanthrene, fluoranthene, fluorene, dibenzofuran, dibenzothiophene, dibenzoselenophene, carbazole, and combinations thereof;

wherein $G^3$ is selected from the group consisting of pyridine, pyramidine, pyrazine, triazine, quinoline, isoquinoline, quinazoline, aza-triphenylene, phenanthroline, aza-pyrene, aza-anthracene, aza-fluorene, aza-dibenzofuran, aza-dibenzothiophene, aza-dibenzoselenophene, aza-carbazole, and combinations thereof;

wherein $G^4$ is selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;

wherein $G^3$ is optionally further substituted with substituent selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;

wherein $R^1$, $R^2$, $R^3$, $R^4$, $R^5$ and $R^6$ each independently represents mono to maximum allowable substitutions, or no substitution; and wherein $R^1$, $R^2$, $R^3$, $R^4$, $R^5$ and $R^6$ are each independently selected from the group consisting of hydrogen, deuterium, halogen, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, and wherein any two adjacent substituents optionally join or fuse into a ring.

According to another aspect, an OLED is disclosed which comprises: an anode; a cathode; and an electron blocking layer, disposed between the anode and the cathode, comprising a compound having a structure of Formula I:

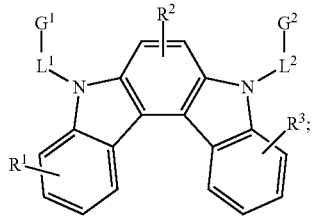

Formula I wherein $L^1$, $L^2$ are each independently selected from the group consisting of direct bond, alkyl, alkenyl, alkynyl, aryl, heteroaryl, and combinations thereof;

wherein $G^1$ and $G^2$ are each independently selected from the group consisting of hydrogen, deuterium, halogen, alkyl, alkyloxy, cycloalkyl, cycloalkoxyl, silyl, amino, benzene, biphenyl, terphenyl, naphthalene, triphenylene, pyrene, anthracene, phenanthrene, fluoranthene, fluorene, dibenzofuran, dibenzothiophene, dibenzoselenophene, carbazole, and combinations thereof;

wherein $R^1$, $R^2$, and $R^3$ each independently represents mono to maximum allowable substitutions, or no substitution; and wherein $R^1$, $R^2$, and $R^3$ are each independently selected from the group consisting of hydrogen, deuterium, halogen, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, and wherein any two adjacent substituents optionally join or fuse into a ring.

In some embodiments of the OLED having an electron blocking layer comprising a compound having the structure of Formula I, the OLED is incorporated into a device selected from the group consisting of a consumer product, an electronic component module, and a lighting panel.

In these embodiments of the OLED having an electron blocking layer comprising a compound having the structure of Formula I, the OLED further comprises an emissive layer;

wherein the emissive layer comprises a phosphorescent emissive dopant;

wherein the emissive dopant is a transition metal complex having at least one ligand or part of the ligand if the ligand is more than bidentate selected from the group consisting of:

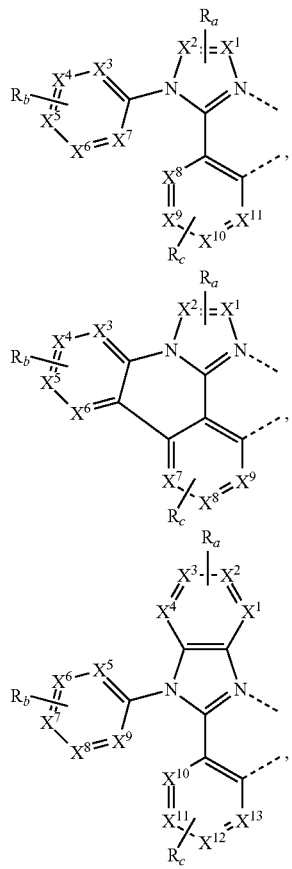

-continued

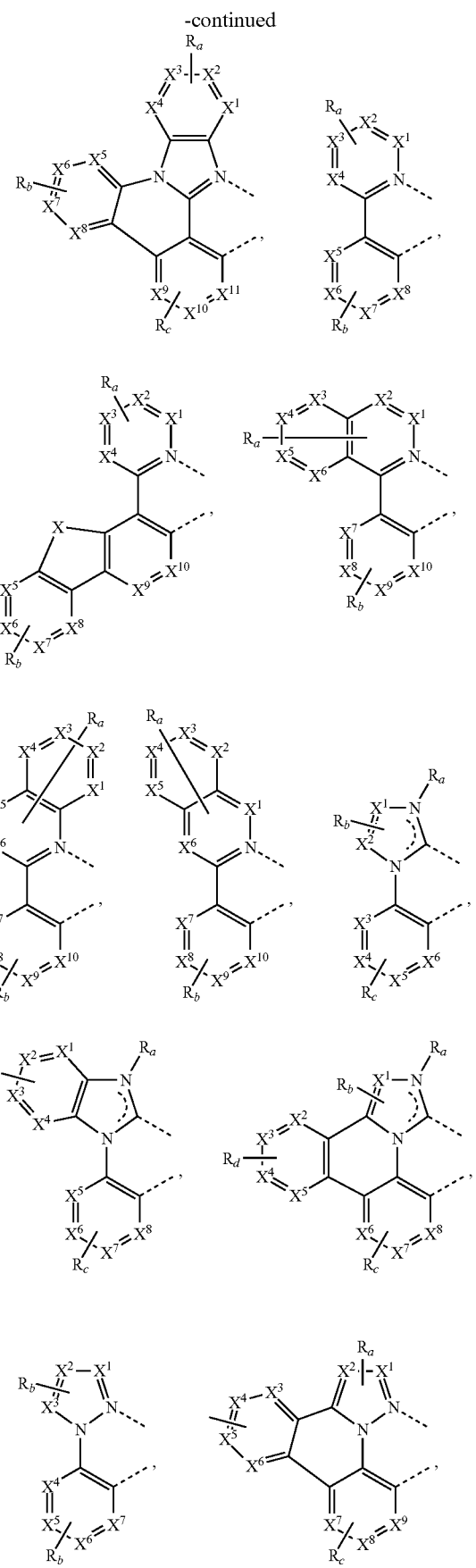

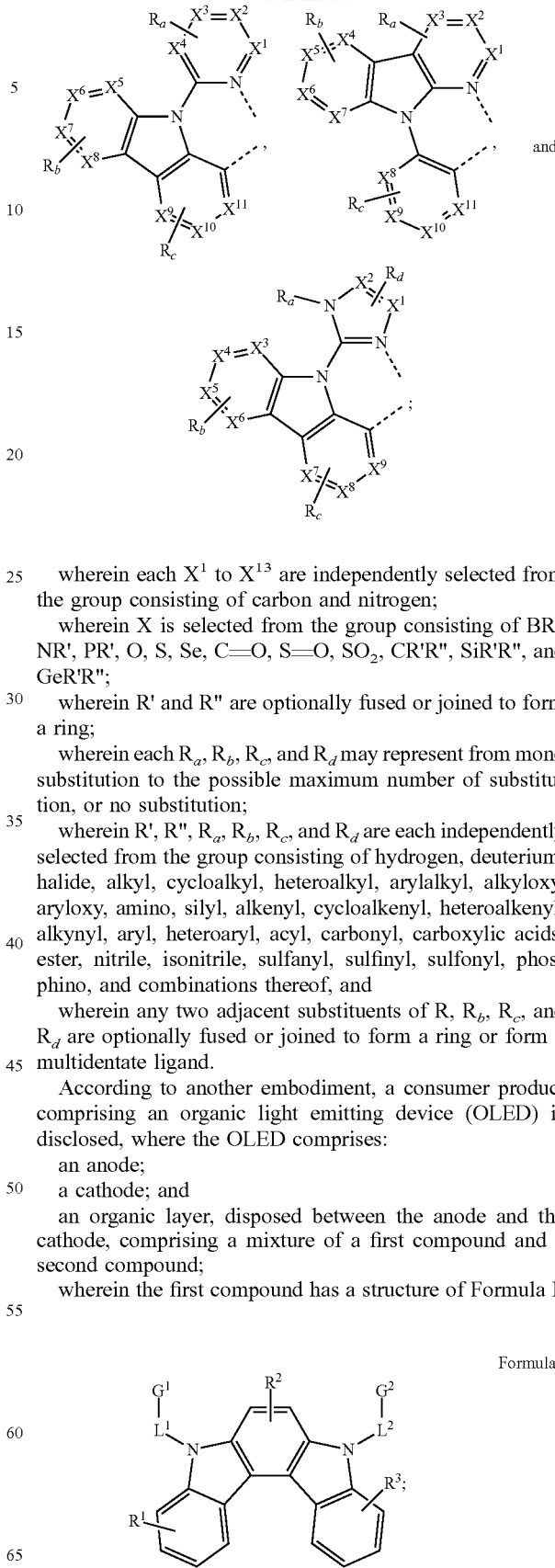

wherein each $X^1$ to $X^{13}$ are independently selected from the group consisting of carbon and nitrogen;

wherein X is selected from the group consisting of BR', NR', PR', O, S, Se, C=O, S=O, $SO_2$, CR'R", SiR'R", and GeR'R";

wherein R' and R" are optionally fused or joined to form a ring;

wherein each $R_a$, $R_b$, $R_c$, and $R_d$ may represent from mono substitution to the possible maximum number of substitution, or no substitution;

wherein R', R", $R_a$, $R_b$, $R_c$, and $R_d$ are each independently selected from the group consisting of hydrogen, deuterium, halide, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, and wherein any two adjacent substituents of R, $R_b$, $R_c$, and $R_d$ are optionally fused or joined to form a ring or form a multidentate ligand.

According to another embodiment, a consumer product comprising an organic light emitting device (OLED) is disclosed, where the OLED comprises:

an anode;

a cathode; and an organic layer, disposed between the anode and the cathode, comprising a mixture of a first compound and a second compound;

wherein the first compound has a structure of Formula I:

Formula I wherein the second compound has a structure of Formula II:

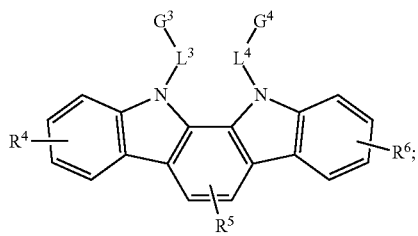

Formula II wherein $L^1$, $L^2$, $L^3$ and $L^4$ are each independently selected from the group consisting of direct bond, alkyl, alkenyl, alkynyl, aryl, heteroaryl, and combinations thereof;

wherein $G^1$ and $G^2$ are each independently selected from the group consisting of hydrogen, deuterium, halogen, alkyl, alkyloxy, cycloalkyl, cycloalkoxyl, silyl, amino, benzene, biphenyl, terphenyl, naphthalene, triphenylene, pyrene, anthracene, phenanthrene, fluoranthene, fluorene, dibenzofuran, dibenzothiophene, dibenzoselenophene, carbazole, and combinations thereof;

wherein $G^3$ is selected from the group consisting of pyridine, pyramidine, pyrazine, triazine, quinoline, isoquinoline, quinazoline, aza-triphenylene, phenanthroline, azapyrene, aza-anthracene, aza-fluorene, aza-dibenzofuran, aza-dibenzothiophene, aza-dibenzoselenophene, aza-carbazole, and combinations thereof;

wherein $G^4$ is selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;

wherein $G^3$ is optionally further substituted with substituent selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;

wherein $R^1$, $R^2$, $R^3$, $R^4$, $R^5$ and $R^6$ each independently represents mono to maximum allowable substitutions, or no substitution; and wherein $R^1$, $R^2$, $R^3$, $R^4$, $R^5$ and $R^6$ are each independently selected from the group consisting of hydrogen, deuterium, halogen, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, and wherein any two adjacent substituents optionally join or fuse into a ring.

Device Examples

All example devices were fabricated by high vacuum (<$10^{-7}$ Torr) thermal evaporation. The anode electrode was 750 Å of indium tin oxide (ITO). The cathode consisted of 10 Å of LiQ followed by 1,000 Å of Al. All devices were encapsulated with a glass lid sealed with an epoxy resin in a nitrogen glove box (<1 ppm of $H_2O$ and $O_2$) immediately after fabrication, and a moisture getter was incorporated inside the package. The organic stack of the device examples consisted of sequentially, from the ITO Surface: 100 Å of HATCN as the hole injection layer (HIL); 400 Å of PPh-TPD as the hole transporting layer (HTL); 50 Å of Compound HA4 as the electron blocking layer (EBL), 400 Å of an emissive layer (EML), followed by 350 Å of aDBT-ADN doped with 40 wt % of LiQ as the electron-transporting layer (ETL). The EML has three components: 52 wt % of the EML being Compound HA4, CC-1, CC-2 or CC-3 as the first host; 40 wt % of the EML being Compound EB1 as the second host; and 8 wt % of the EML being GD1 or GD2 as the emitter. The device structure was as shown in the schematic illustration of FIG. 1. The chemical structures of the materials used in devices are shown below:

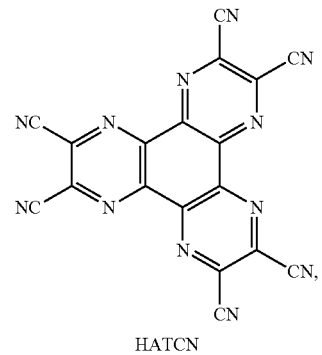

HATCN

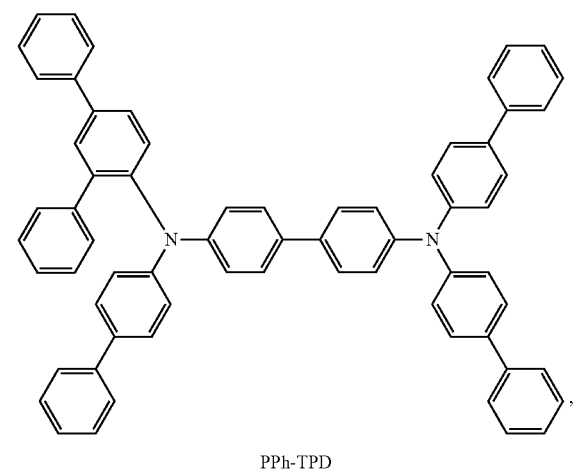

PPh-TPD

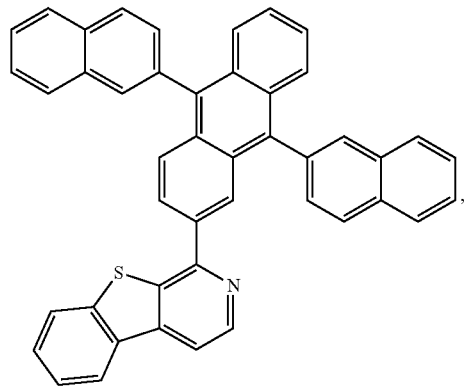

aDBT-ADN

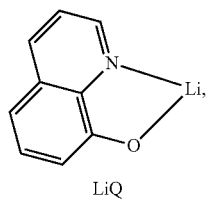

LiQ

-continued

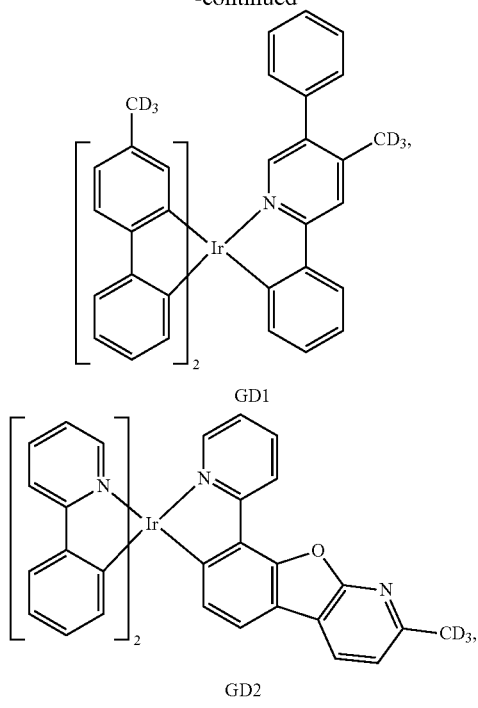

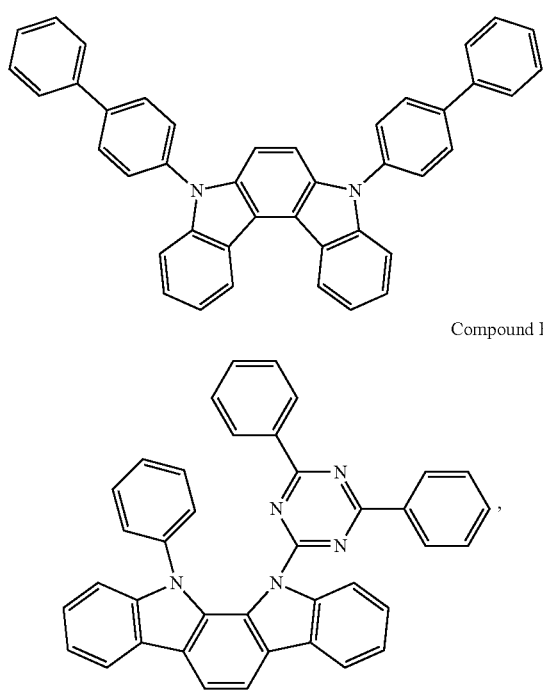

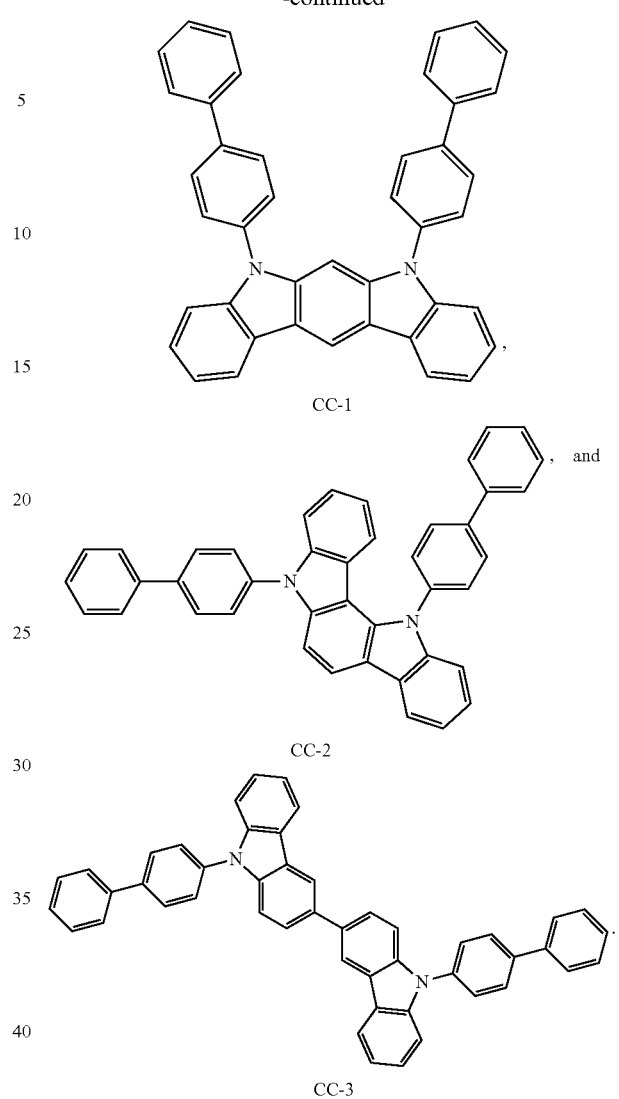

Table 1 below provides a summary of the performance data for the device examples. The emission color, voltage (V), external quantum efficiency (EQE) and power efficiency (PE) were recorded at 10 mA/cm². The relative lifetime LT95 (in arbitrary unit, A. U.), defined as the time it takes for a device to decay to 95% of its original luminescence under a constant operation current density that provides an initial luminescence of 1000 nits, is calculated from the measured value recorded at 40 mA/cm², assuming an acceleration factor of 1.8, and is normalized to that of Device C-1.

TABLE 1

| Example | EML | | | Color | V [V] | EQE [%] | PE [lm/W] | LT95 [A.U.] |
| | First Host | Second Host | Emitter | | | | | |
| --- | --- | --- | --- | --- | --- | --- | --- | --- |
| Device-C1 | CC-1 | Compound EB1 | GD1 | Green | 3.9 | 18 | 54 | 100 |
| Device-C2 | CC-2 | Compound EB1 | GD1 | Green | 3.8 | 17 | 52 | 76 |
| Device-C3 | CC-3 | Compound EB1 | GD1 | Green | 3.8 | 19 | 56 | 147 |
| Device-1 | Compound HA4 | Compound EB1 | GD1 | Green | 3.6 | 20 | 63 | 170 |
| Device-C4 | CC-1 | Compound EB1 | GD2 | Green | 3.5 | 21 | 71 | 79 |
| Device-C5 | CC-2 | Compound EB1 | GD2 | Green | 3.7 | 21 | 66 | 47 |

TABLE 1-continued

| | EML | | | | V | EQE | PE | LT95 |
|---|---|---|---|---|---|---|---|---|
| Example | First Host | Second Host | Emitter | Color | [V] | [%] | [lm/W] | [A.U.] |
| Device-C6 | CC-3 | Compound EB1 | GD2 | Green | 3.7 | 23 | 72 | 194 |
| Device-2 | Compound HA4 | Compound EB1 | GD2 | Green | 3.4 | 25 | 85 | 211 |

All devices emit green light. Devices using GD2 as the emitter exhibited higher efficiency than devices using GD1 as the emitter. The data in Table 1 demonstrate that, using the same emitter, the inventive host combination comprising Compound HA4 and Compound EB1 requires lower driving voltage and produces higher efficiency while achieving longer operation lifetime than the comparative host combinations comprising CC-1, CC-2 or CC-3 and Compound EB1. The superior performance of the inventive host combinations indicates that combining compounds of Formula I with Formula II might reach optimal charge carrier balance within the EML, attributable to their unique material properties determined by their chemical structures.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804 and US2012146012.

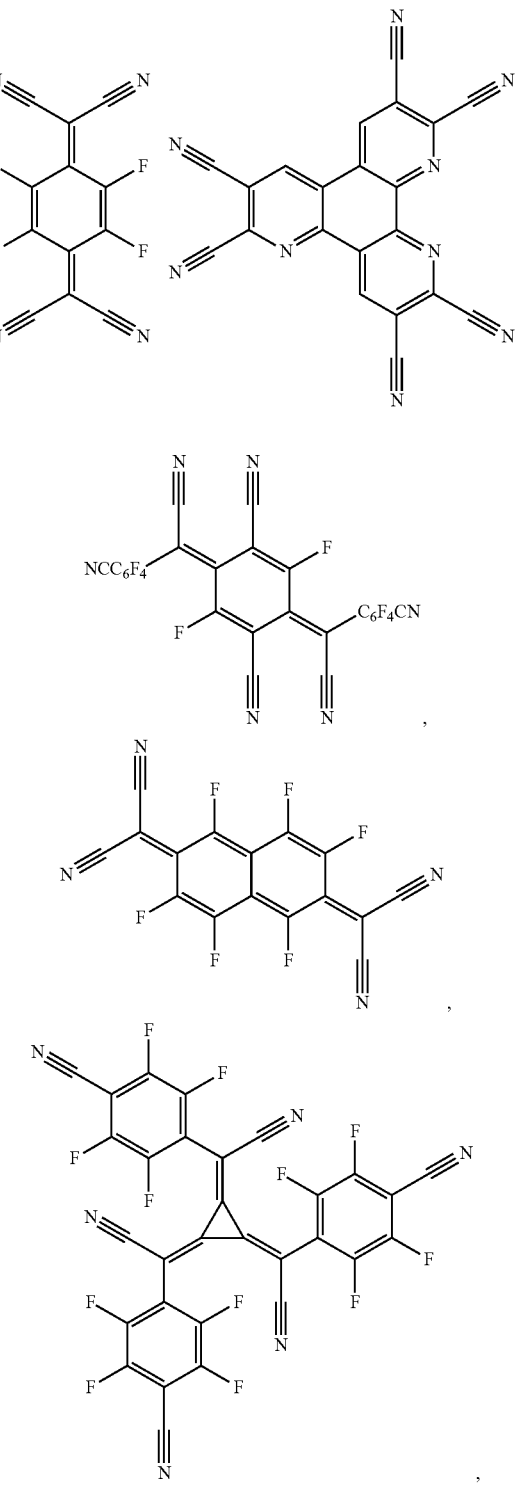

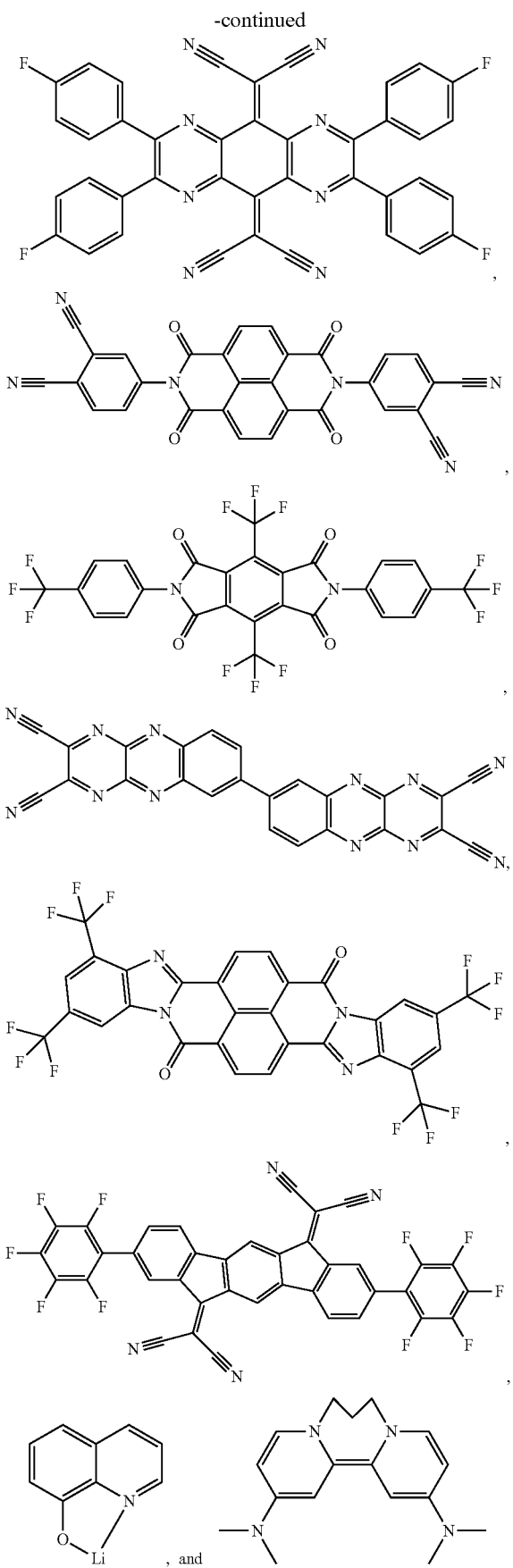

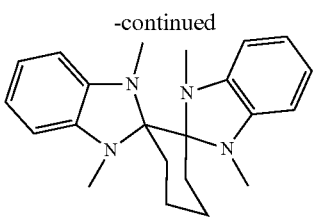

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but are not limited to the following general structures:

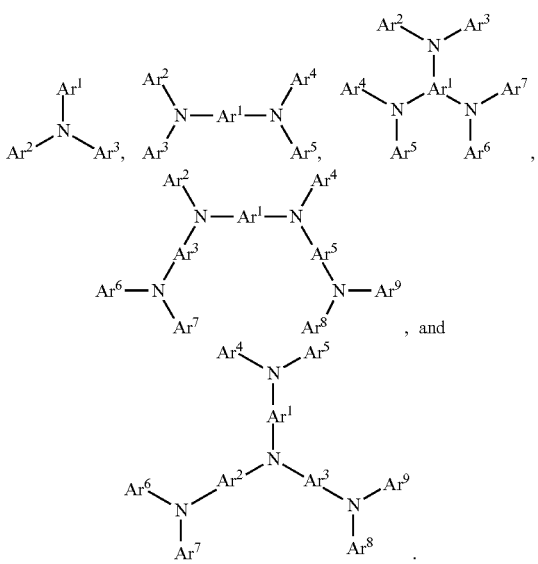

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halide, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

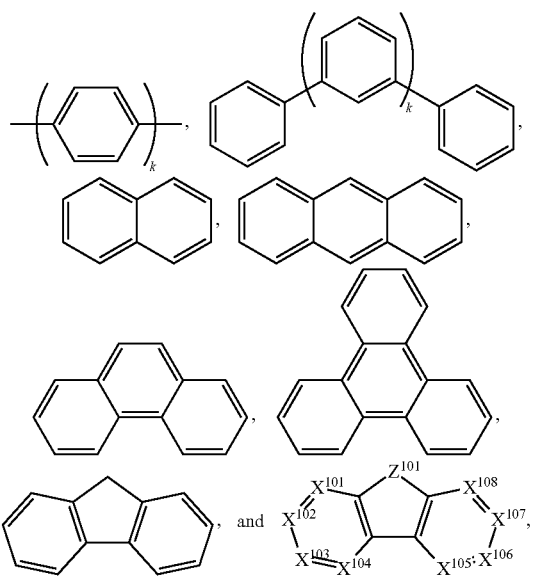

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

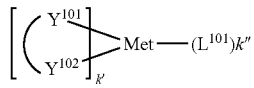

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+$/Fc couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018,

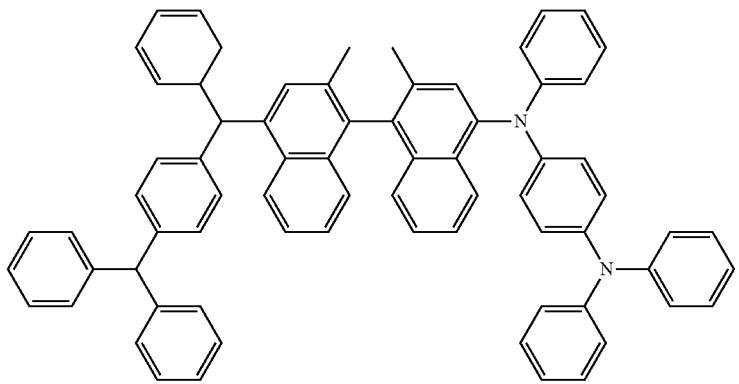

-continued
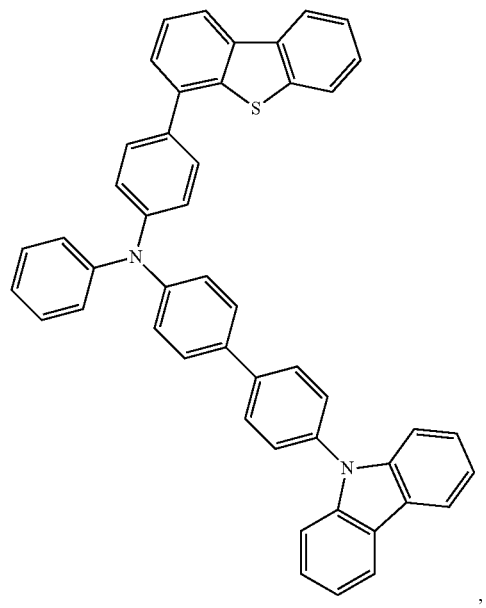
,
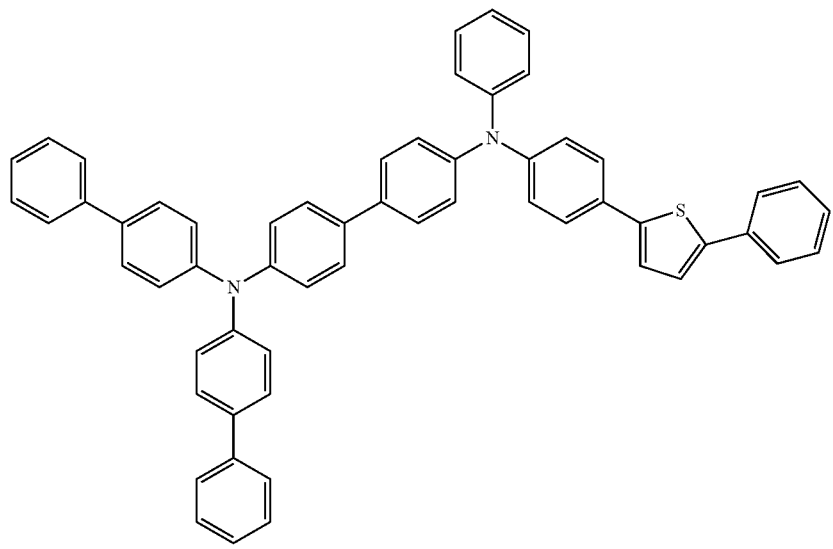
,
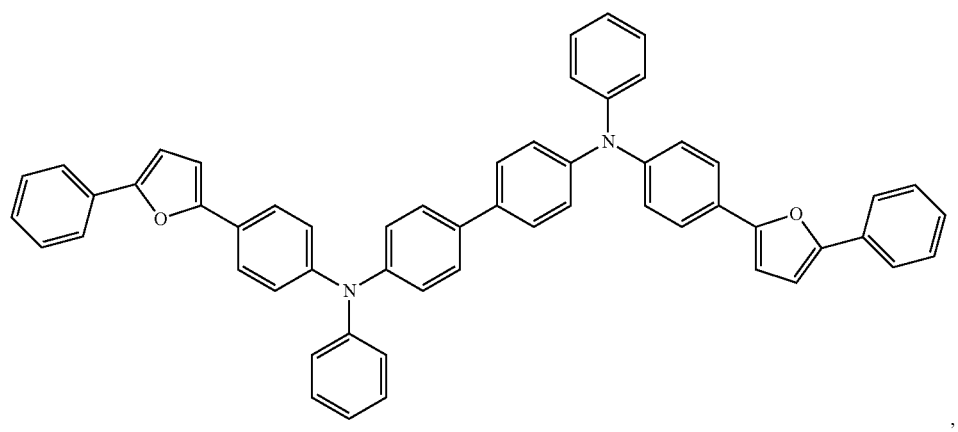
,

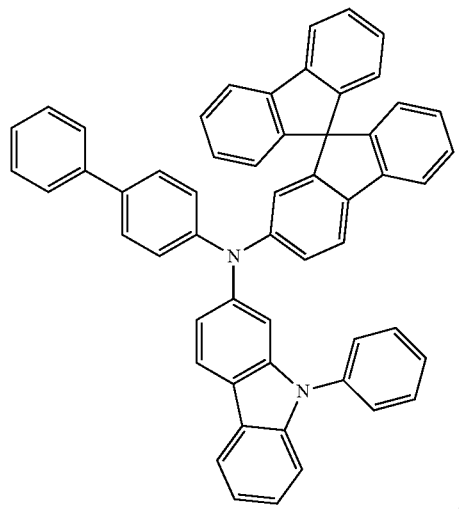
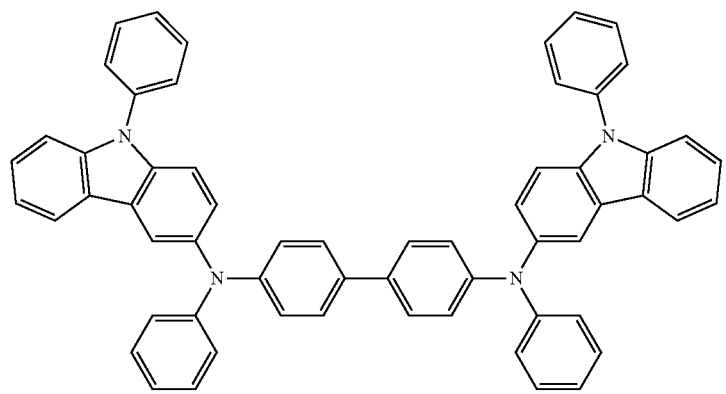
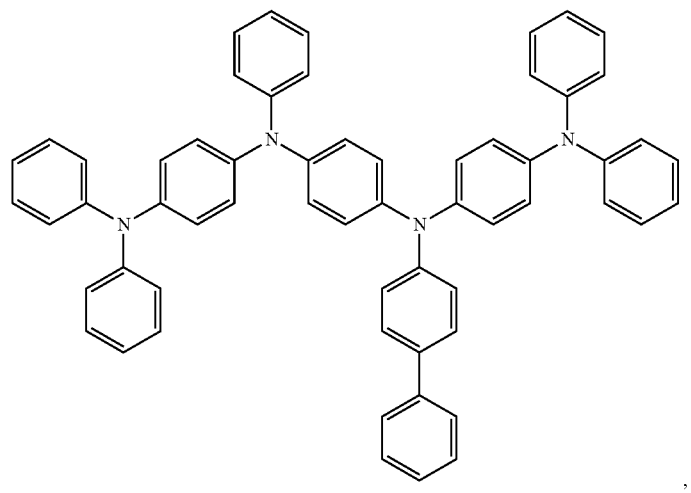

-continued
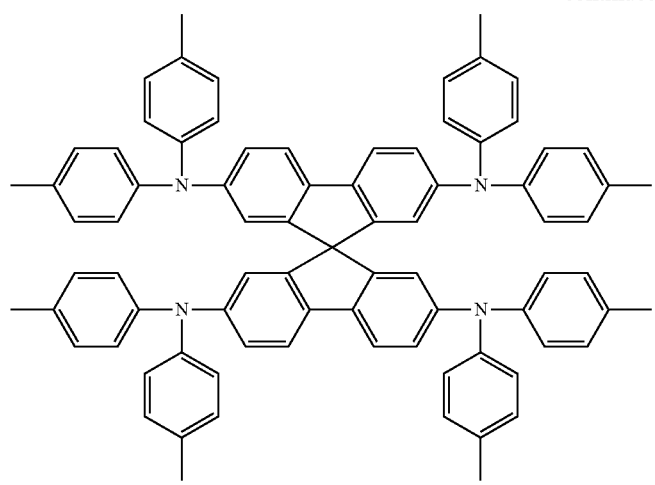
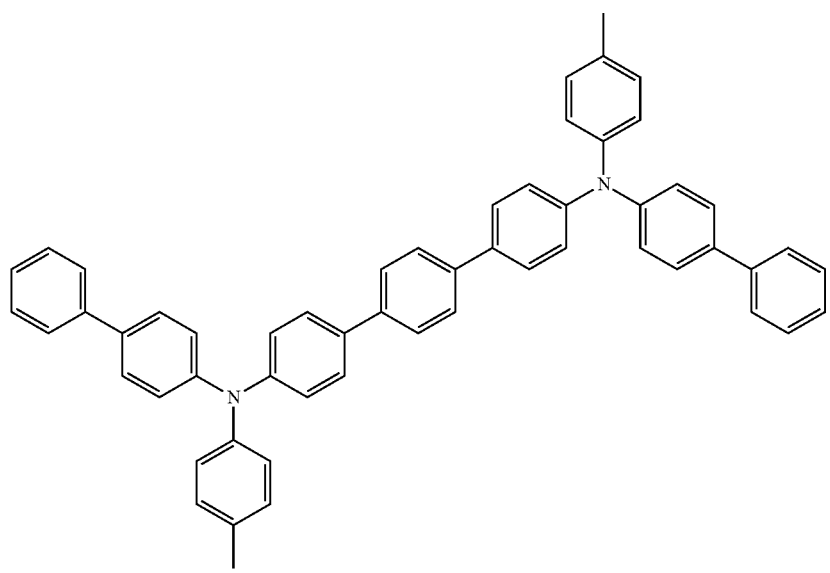
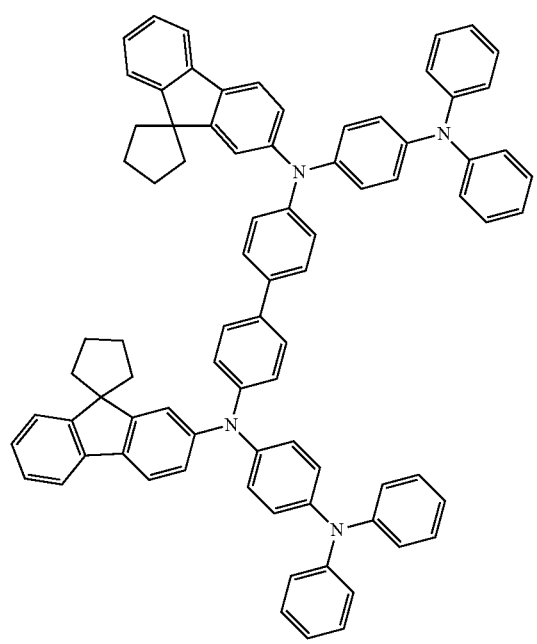

-continued
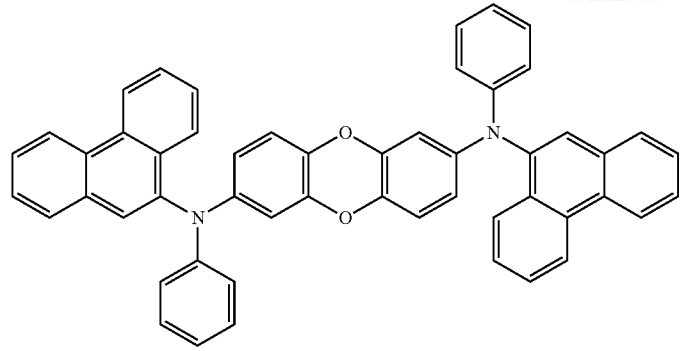
,
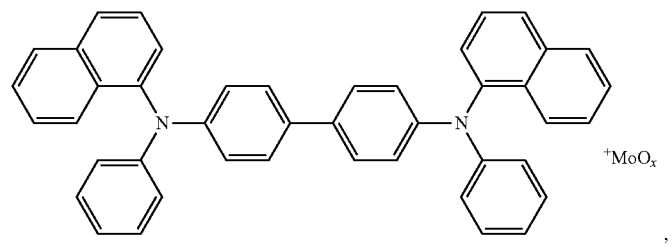
+MoOx
,
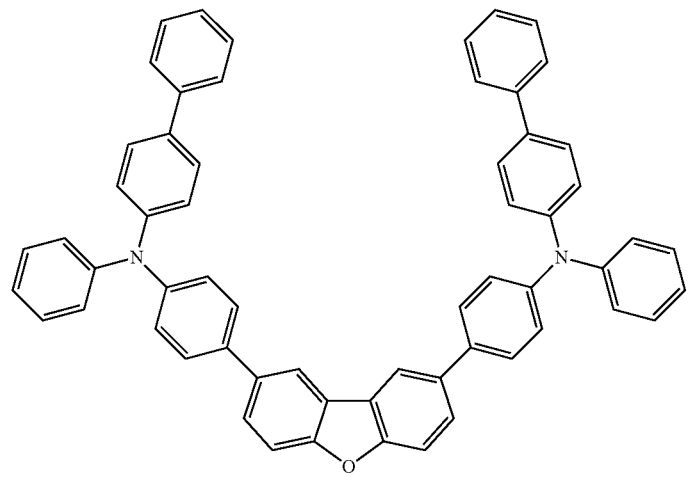
,
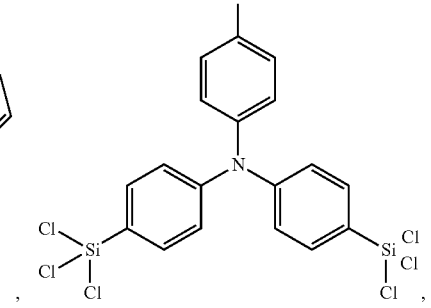
,
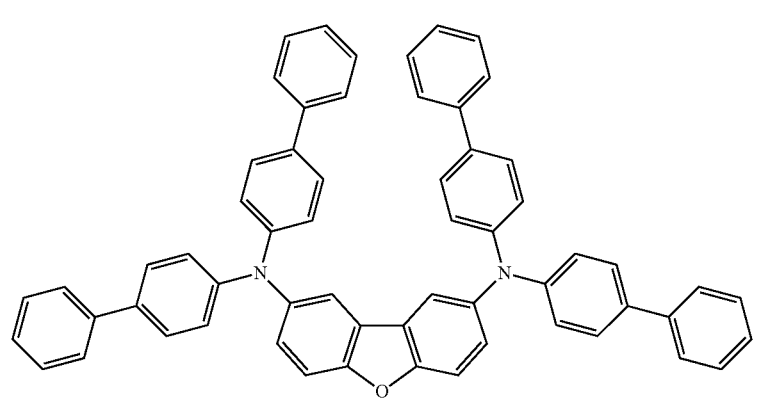
,
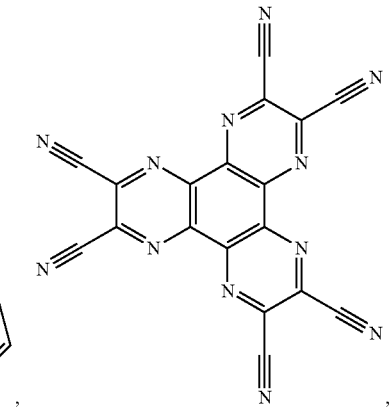
, -continued
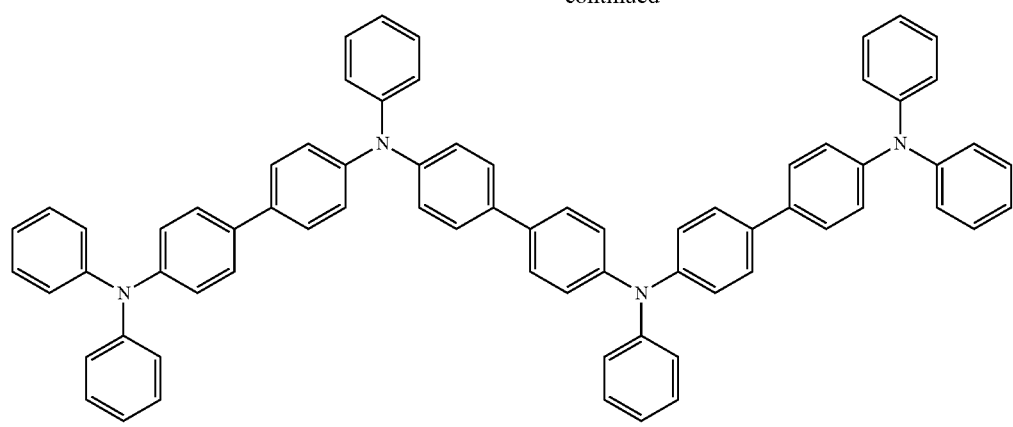
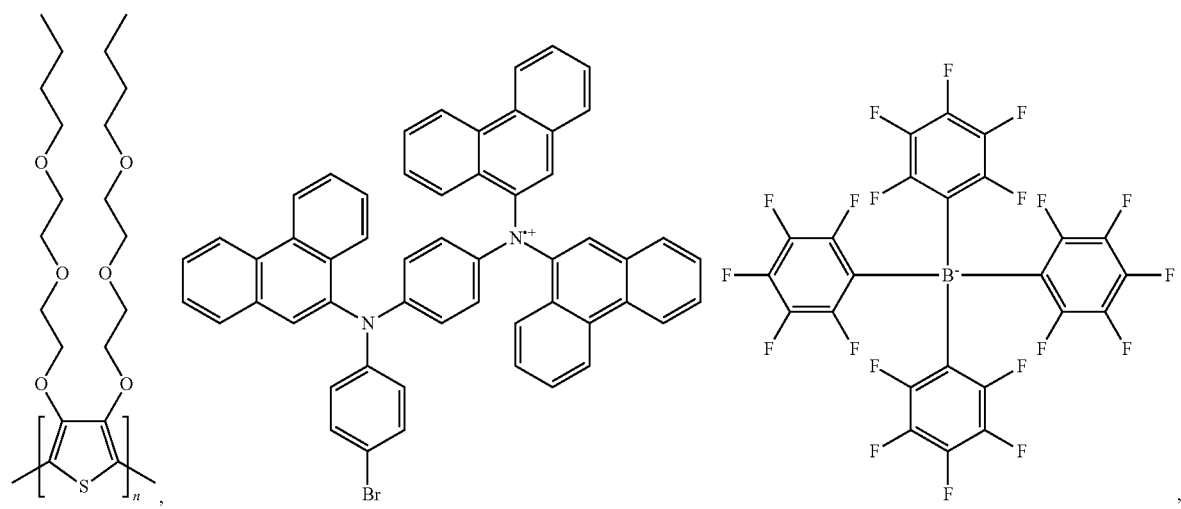
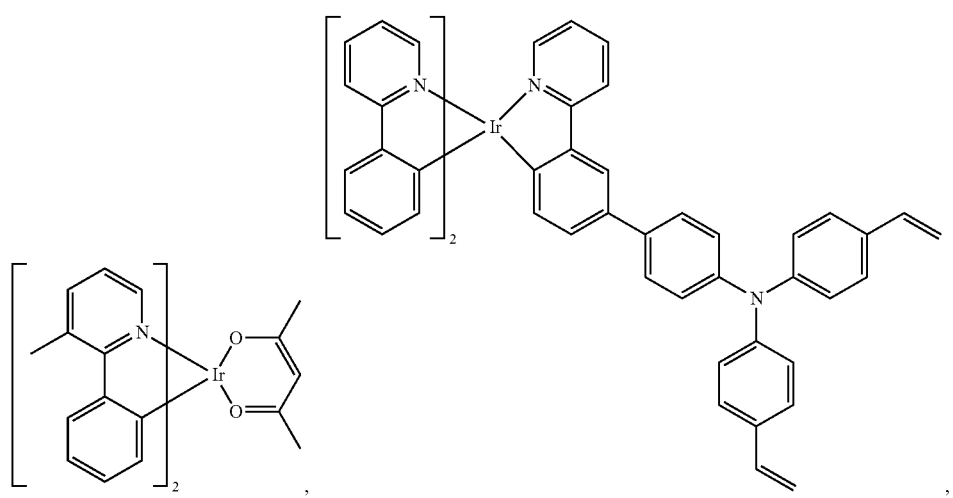

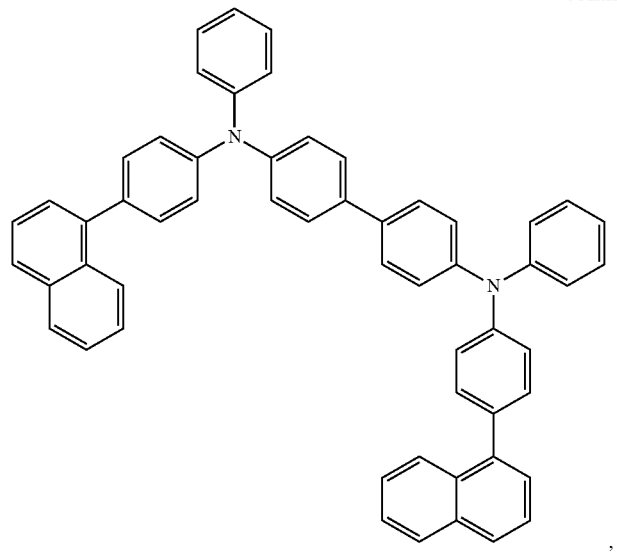
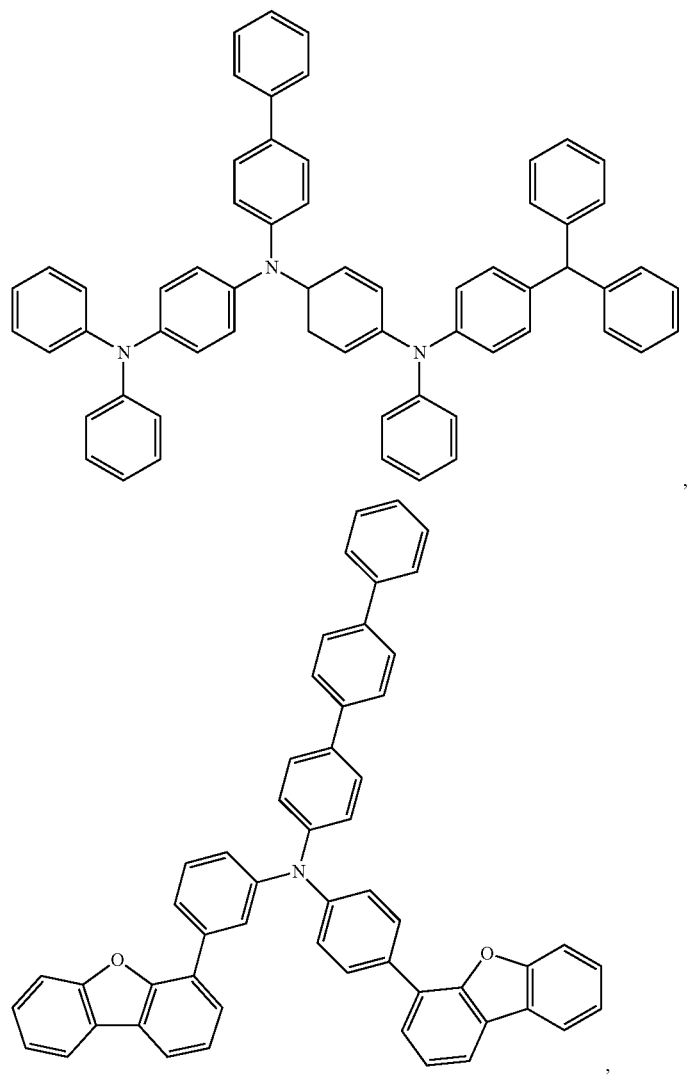

-continued
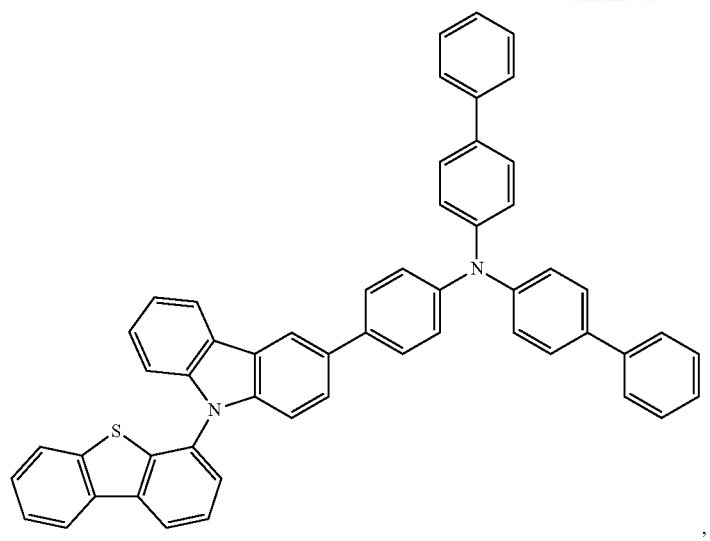
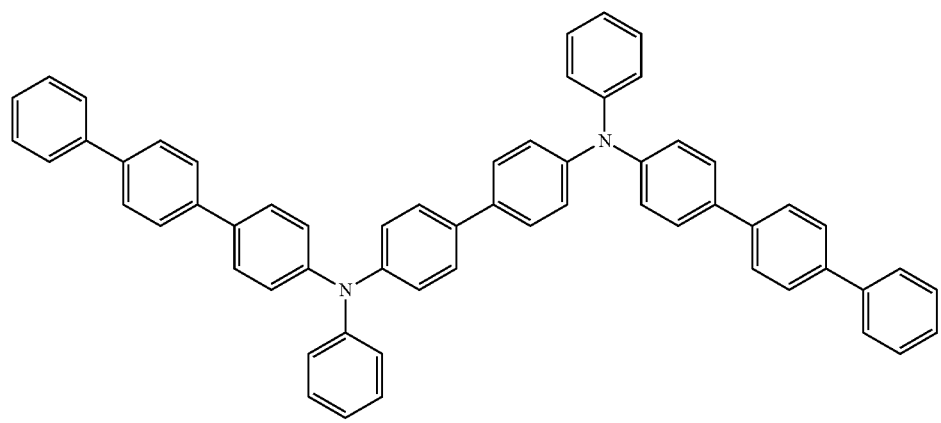
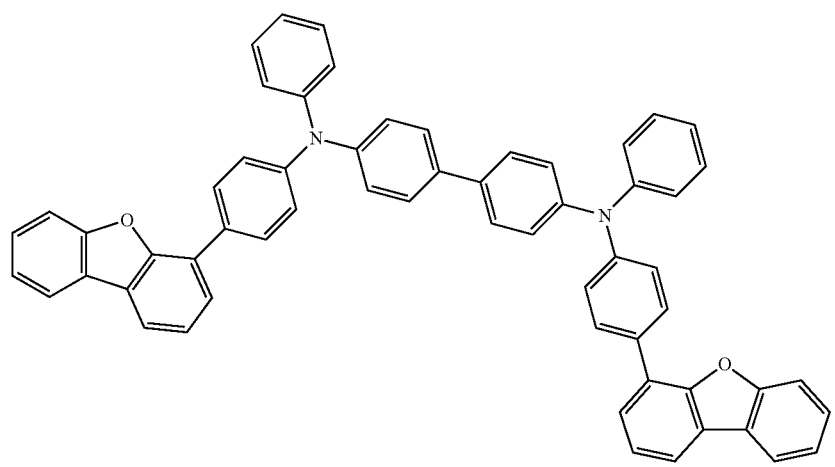

-continued
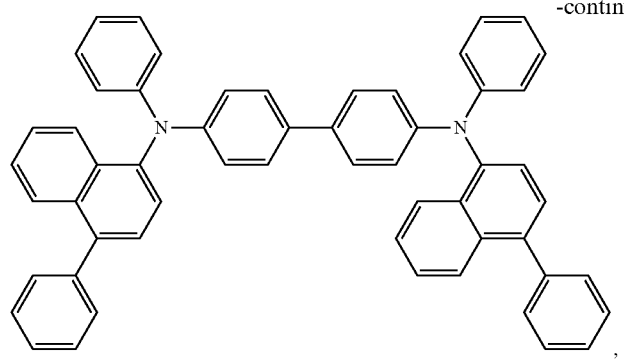
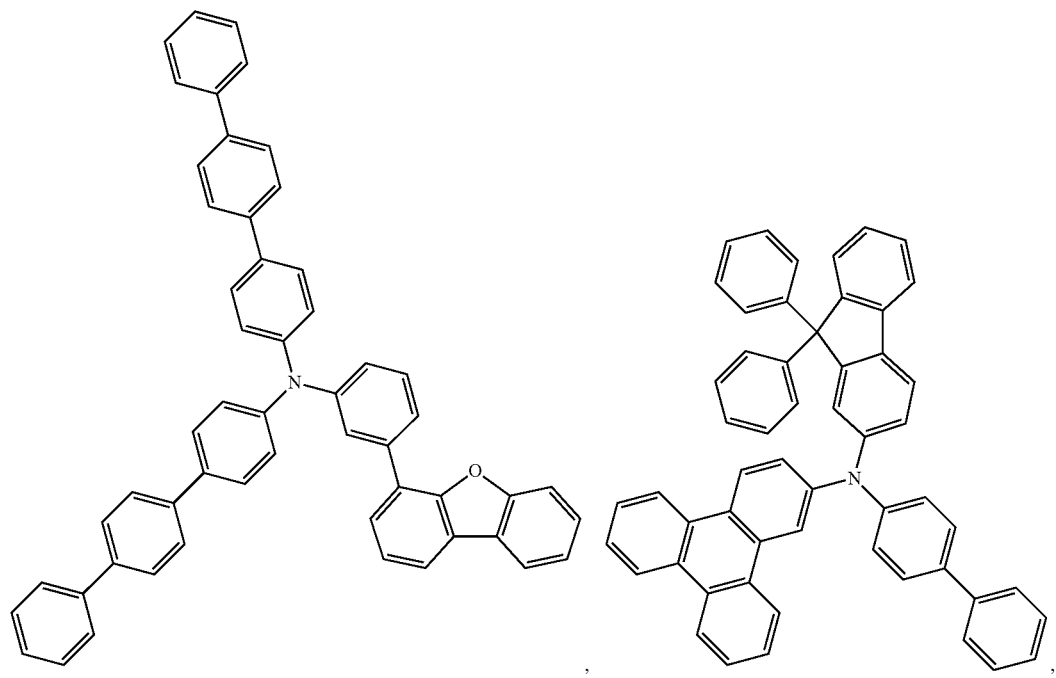
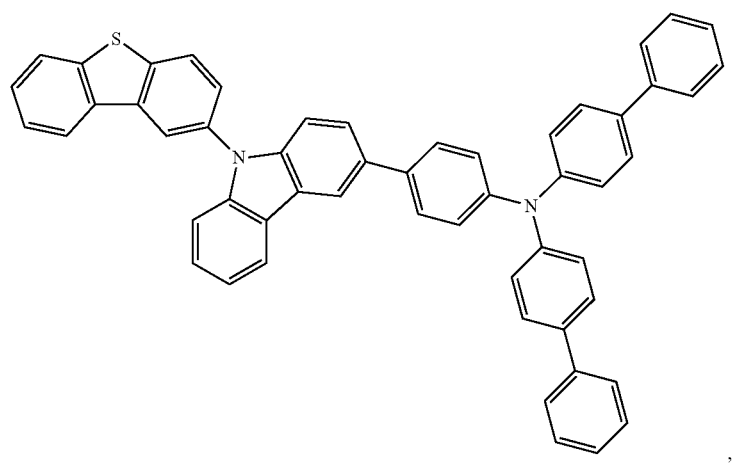

145
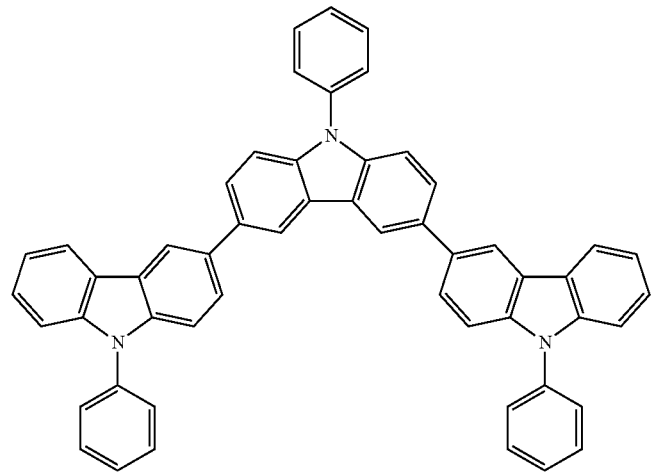
146
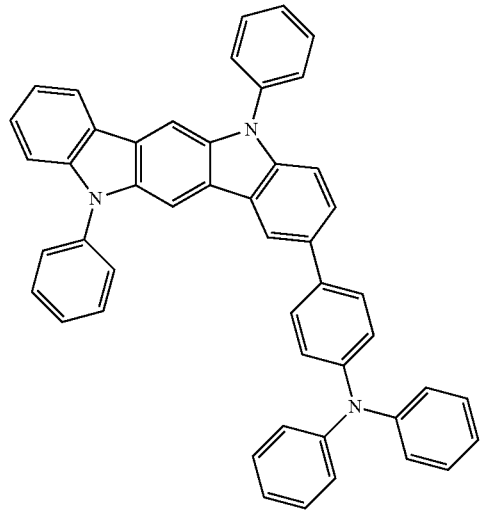
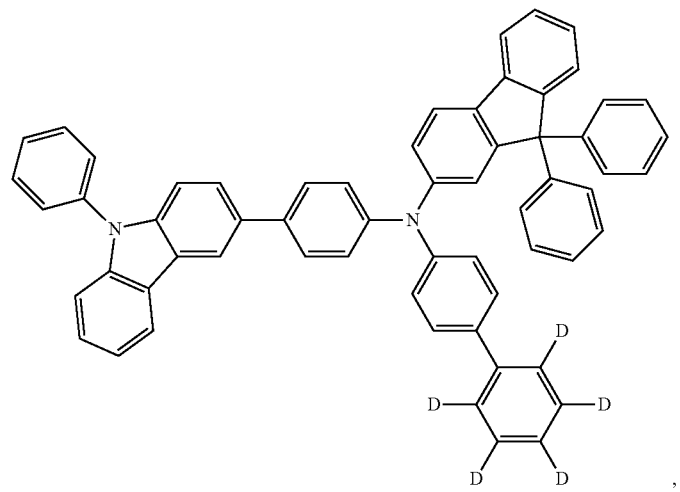
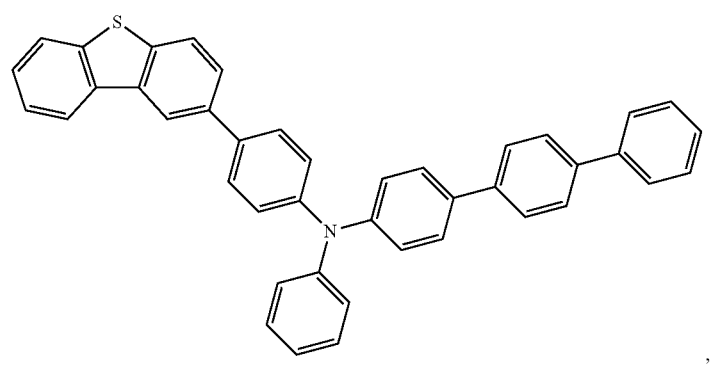

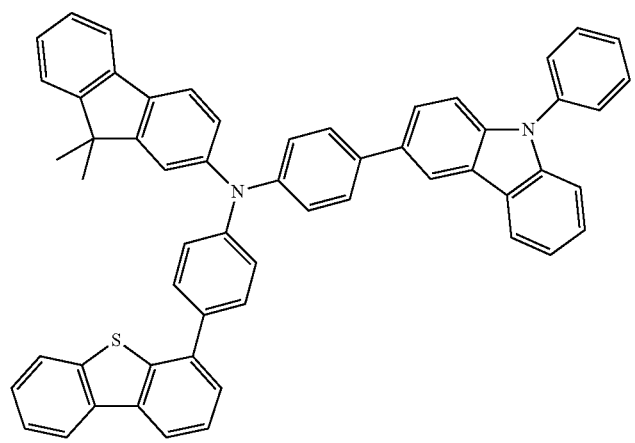
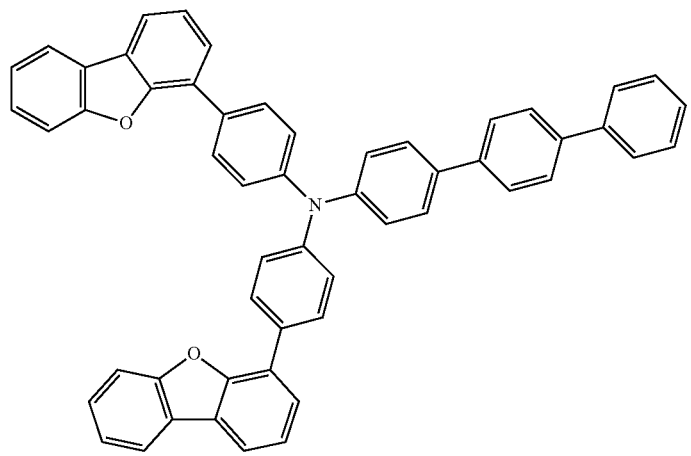
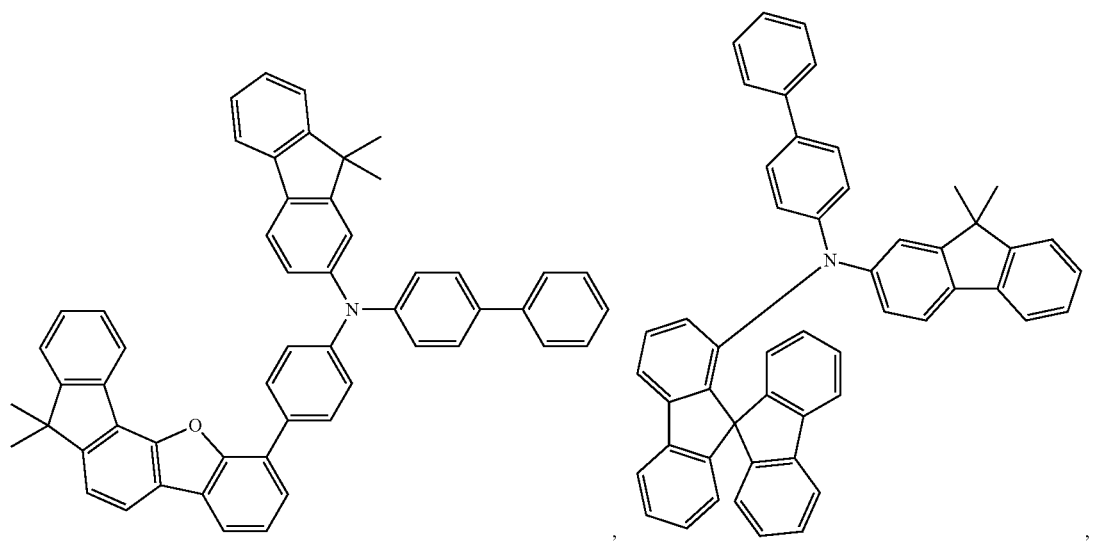

-continued
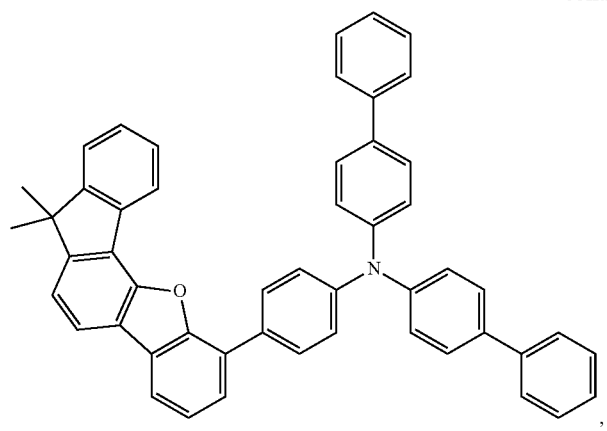
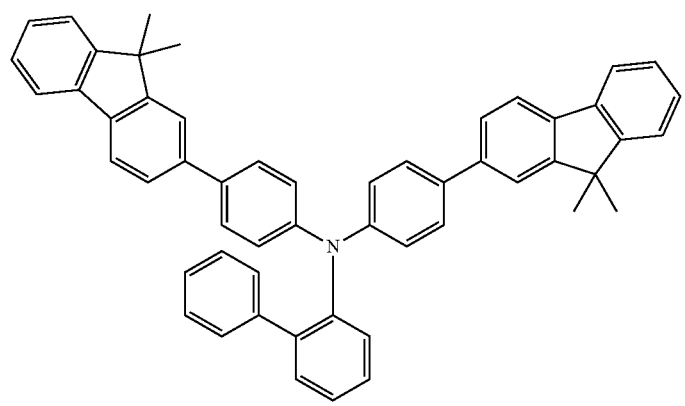
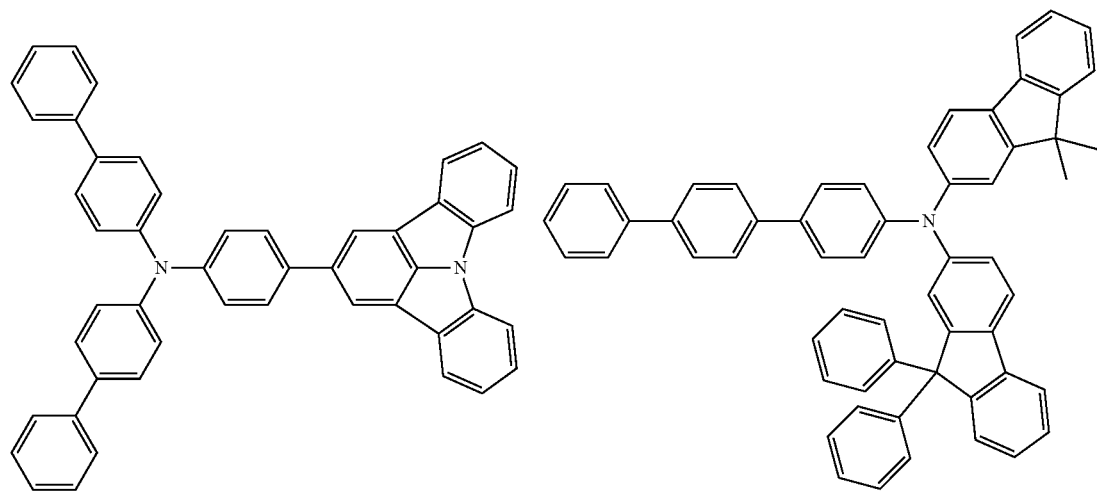

151 152
-continued
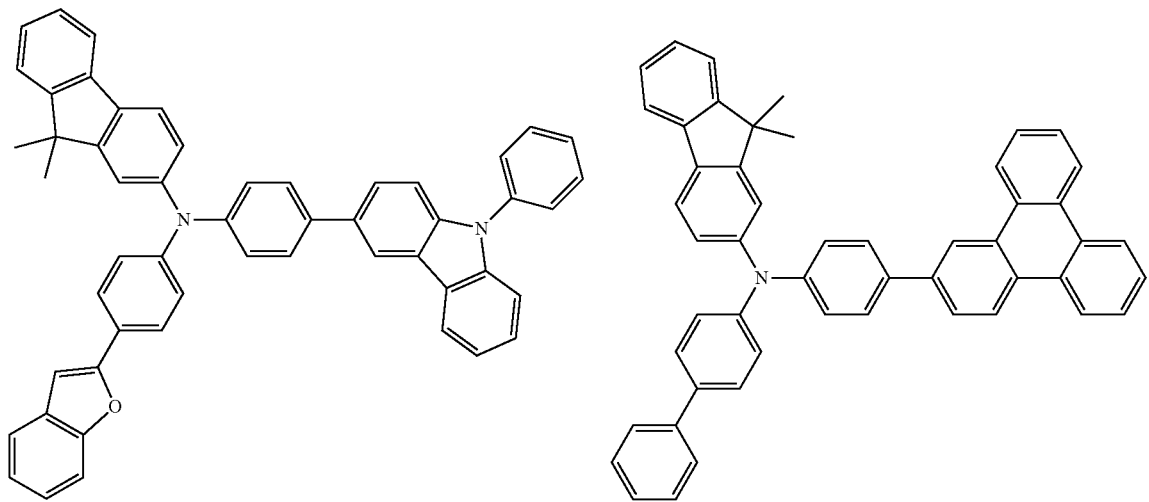
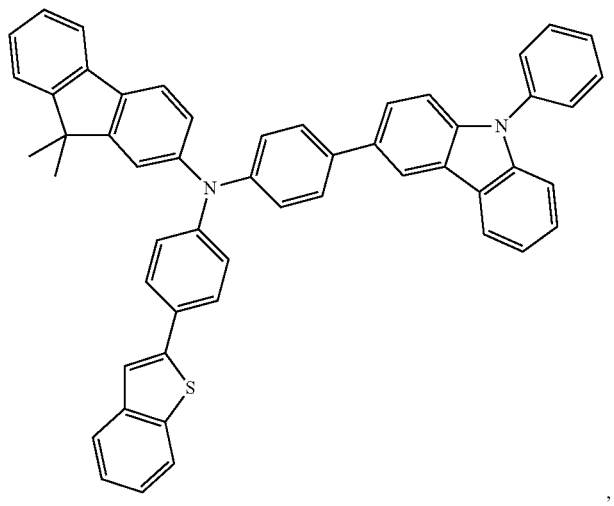
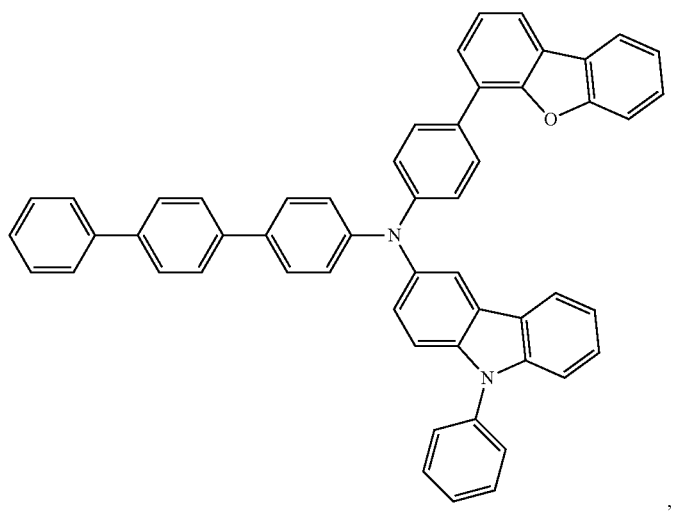

153 154
-continued
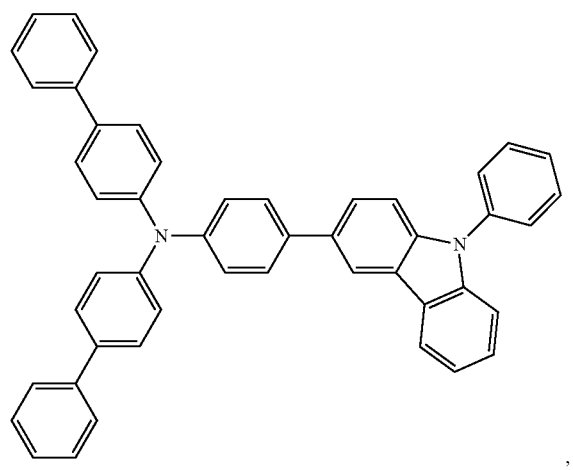
,
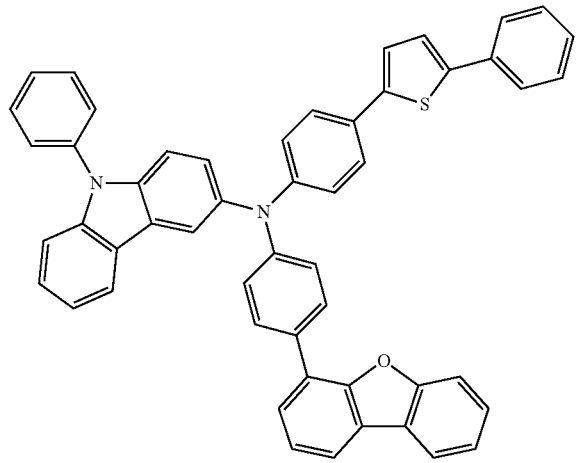
,
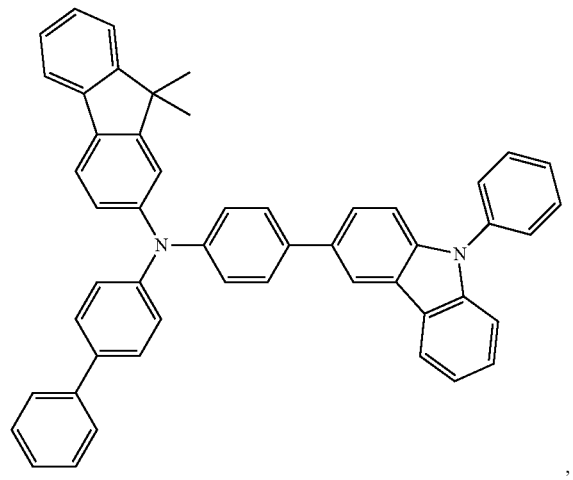
,
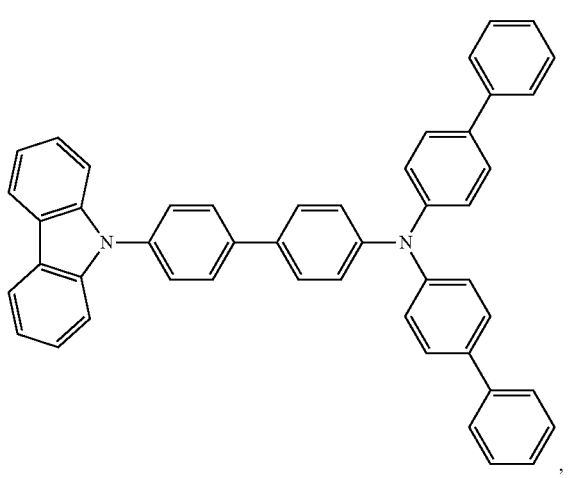
,
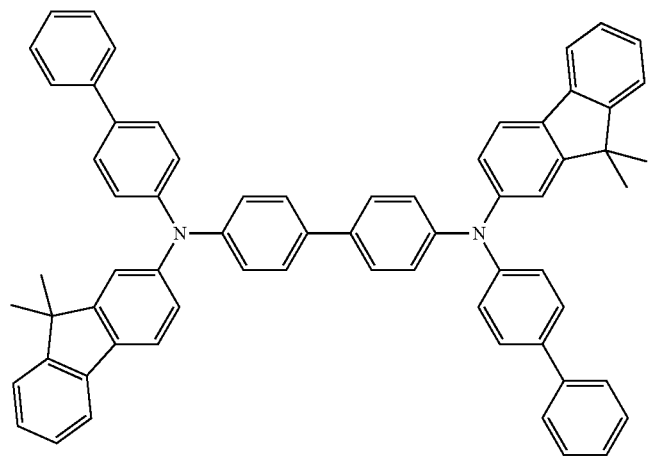
, -continued
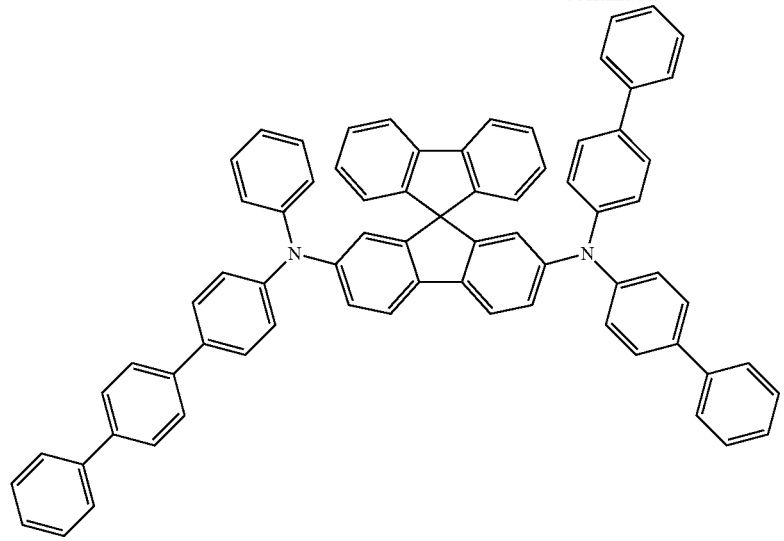
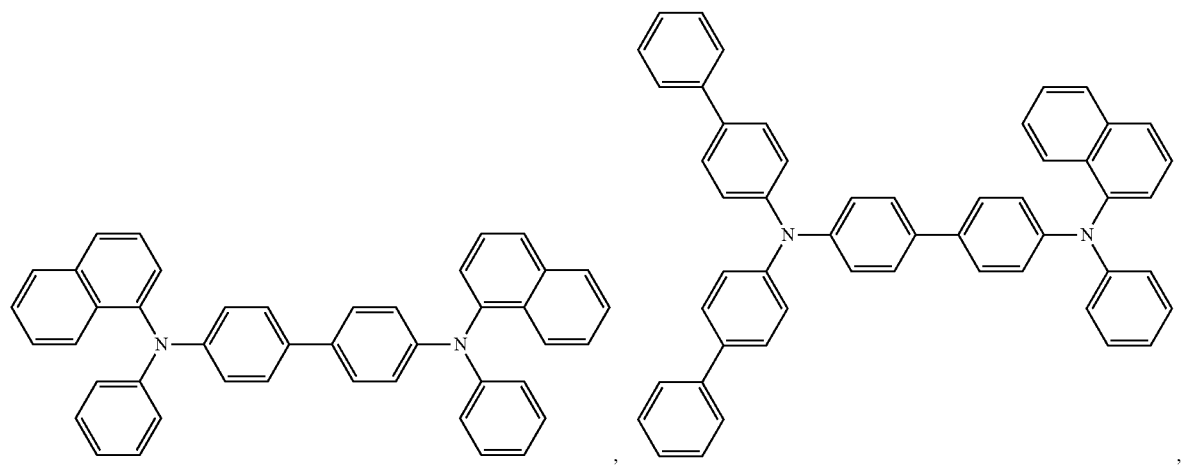
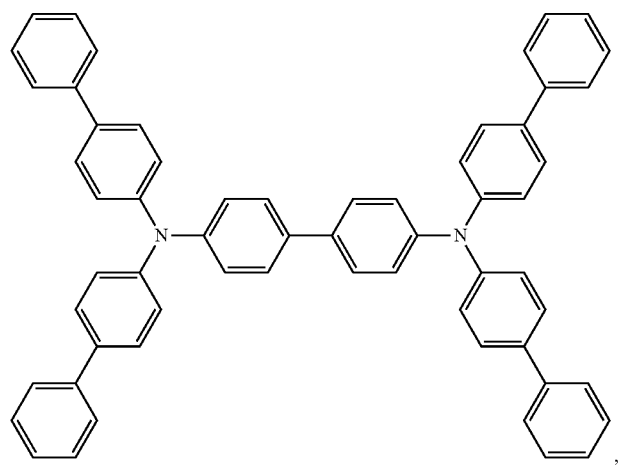

-continued
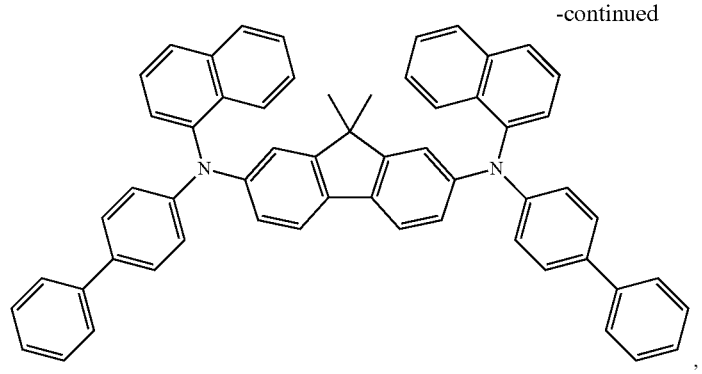
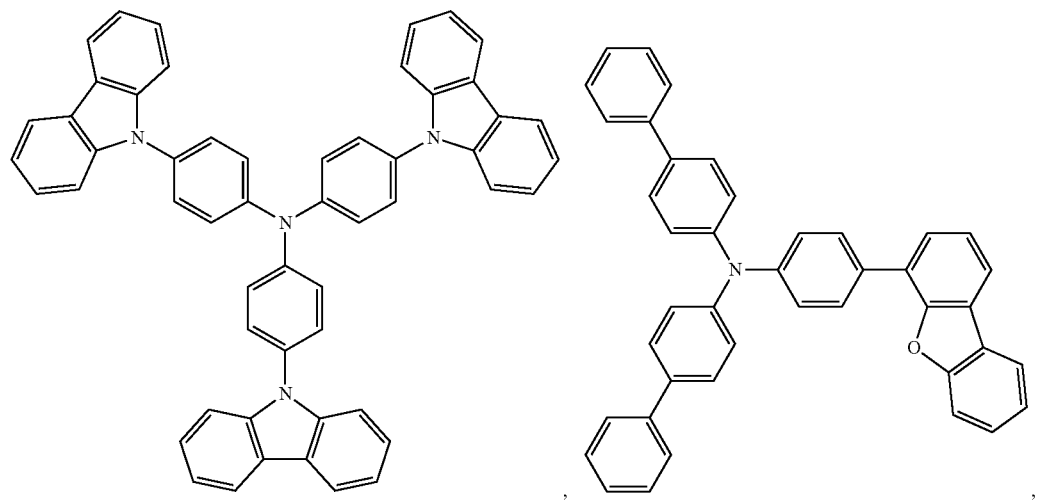
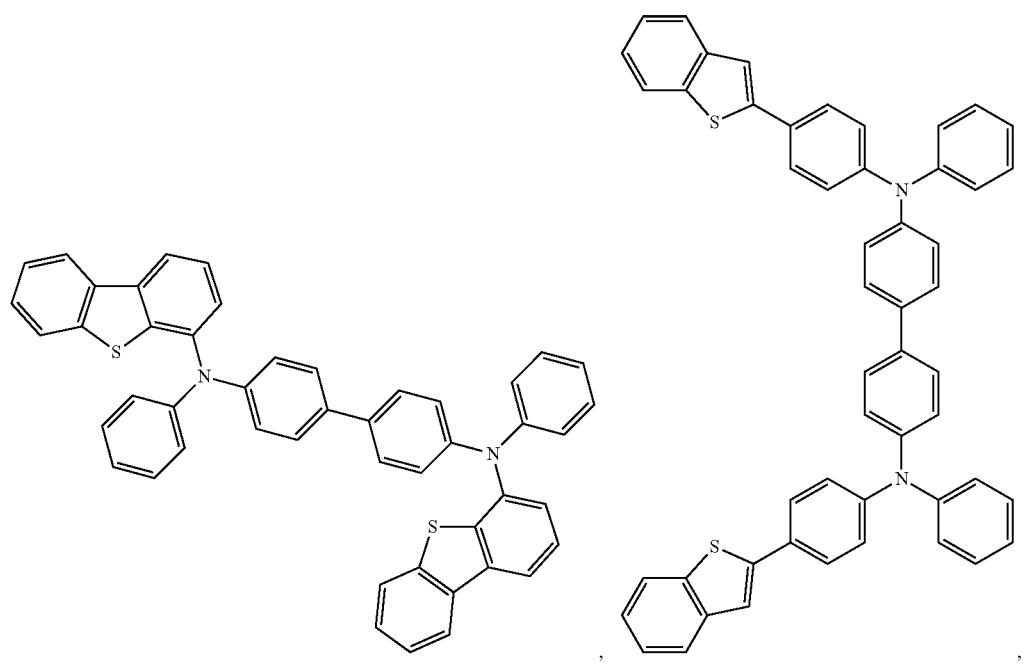, and

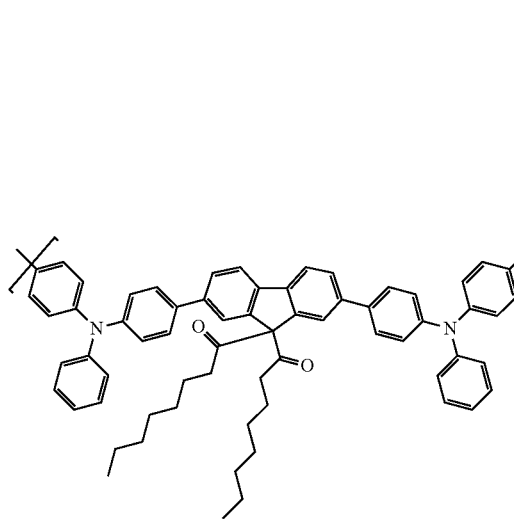
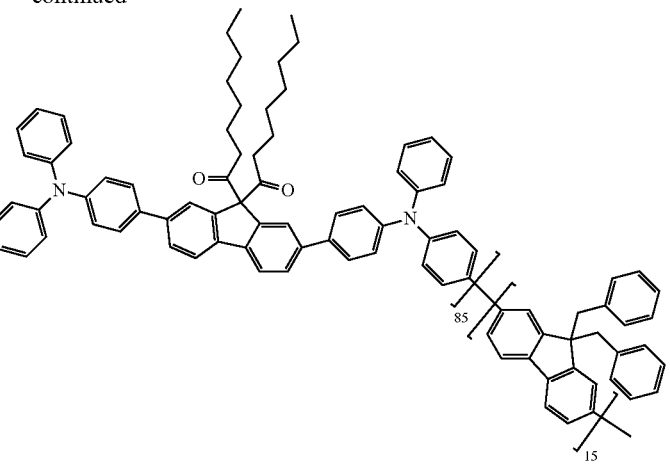

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Additional Hosts:

The light emitting layer of the organic EL device of the present invention preferably contains at least a metal complex as light emitting dopant material, and may contain one or more additional host materials using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

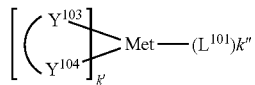

wherein Met is a metal; $(Y^{103}\text{-}Y^{104})$ is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

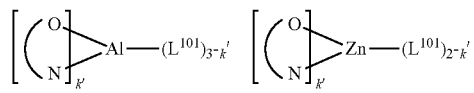

wherein (O—N) is a bidentate ligand, having metal coordinated to atoms O and N.

In another aspect, Met is selected from Ir and Pt. In a further aspect, $(Y^{103}\text{-}Y^{104})$ is a carbene ligand.

Examples of other organic compounds used as additional host are selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, host compound contains at least one of the following groups in the molecule:

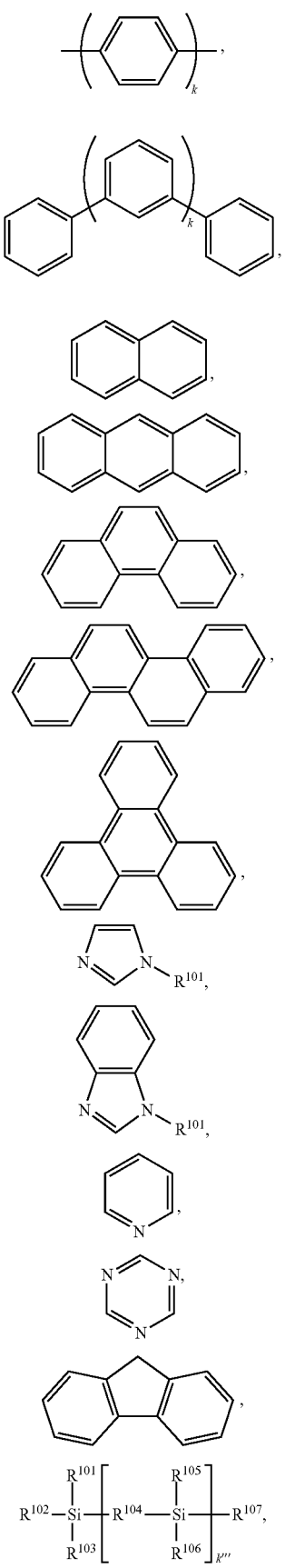

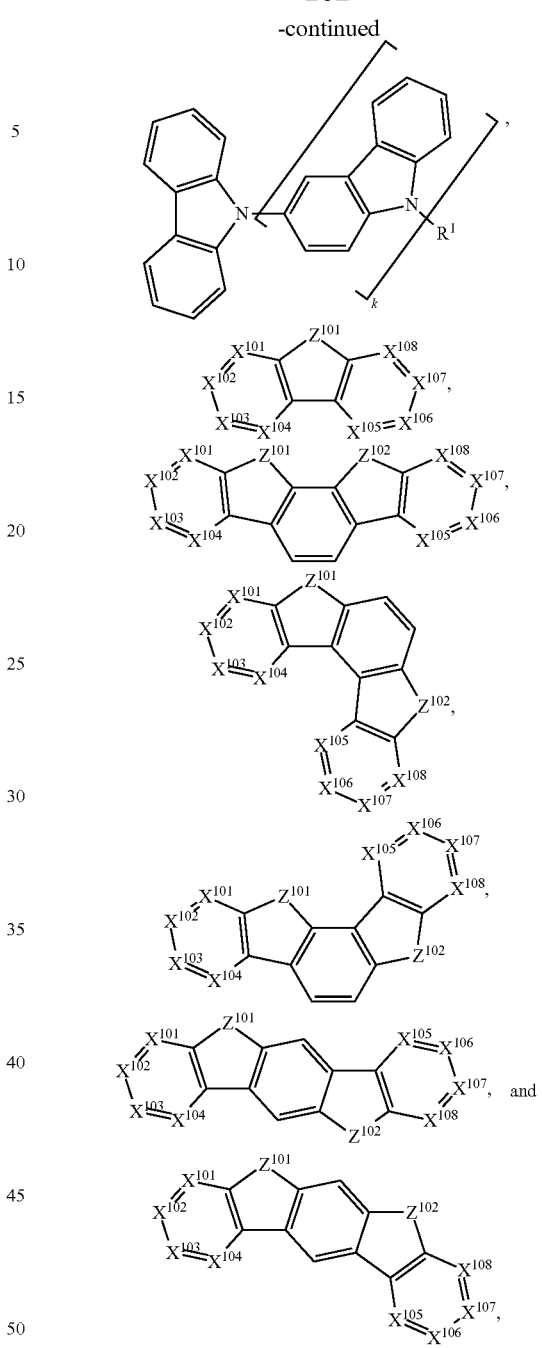

wherein $R^{101}$ to $R^{107}$ is independently selected from the group consisting of hydrogen, deuterium, halide, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. k is an integer from 0 to 20 or 1 to 20; k''' is an integer from 0 to 20. $X^{101}$ to $X^{108}$ is selected from C (including CH) or N. $Z^{101}$ and $Z^{102}$ is selected from $NR^{101}$, O, or S.

Non-limiting examples of the additional host materials that may be used in an OLED in combination with the host compound disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404 WO2014142472,
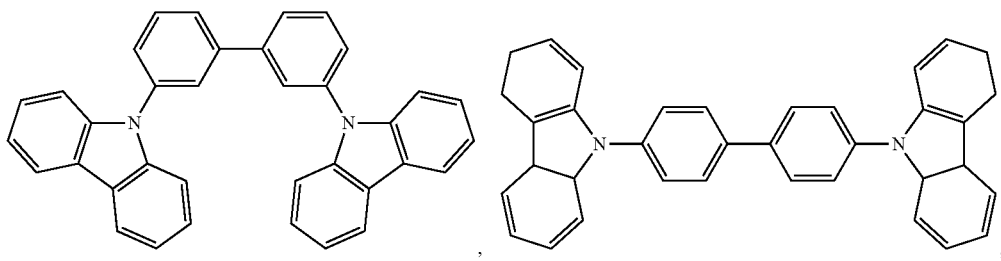
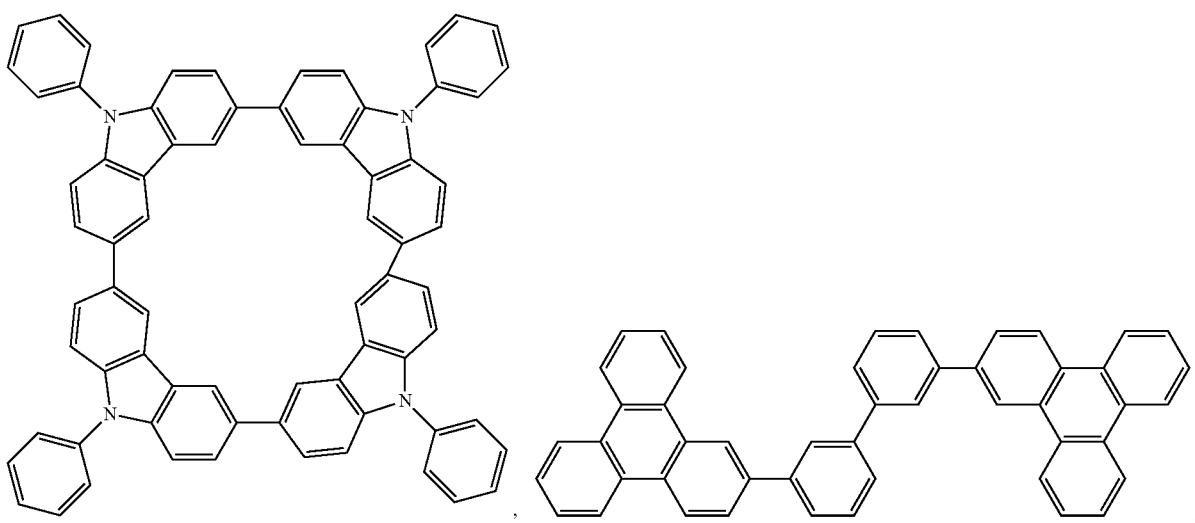
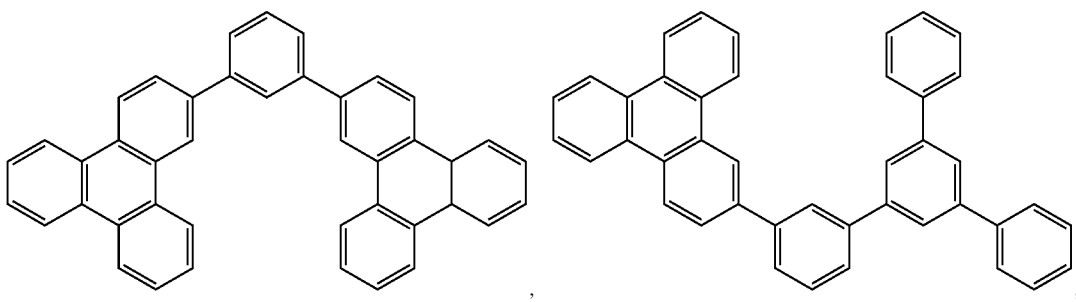

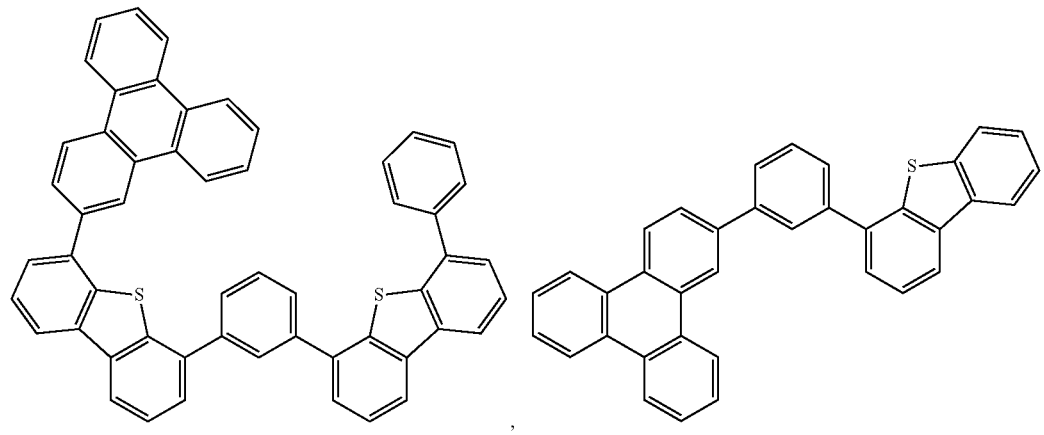
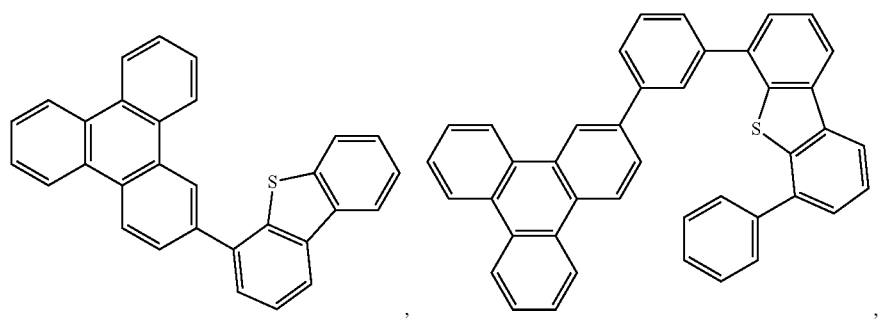
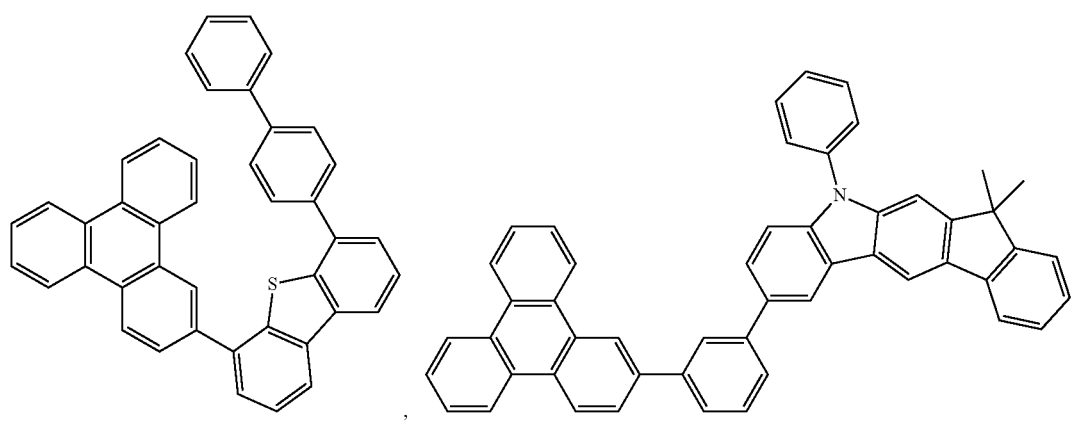
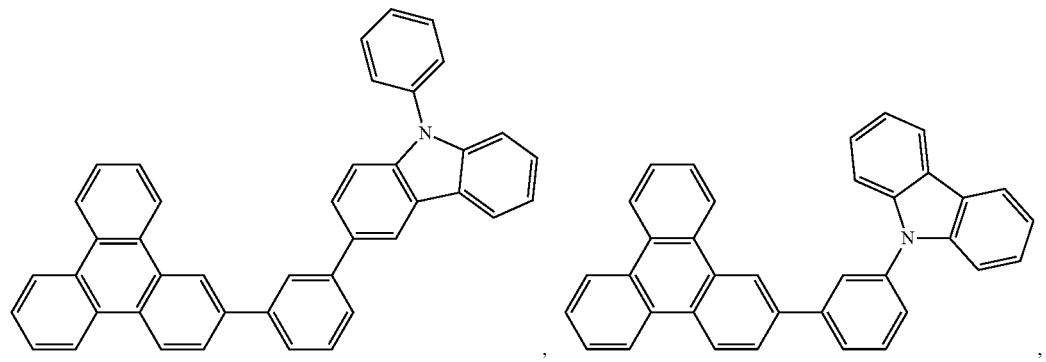

-continued
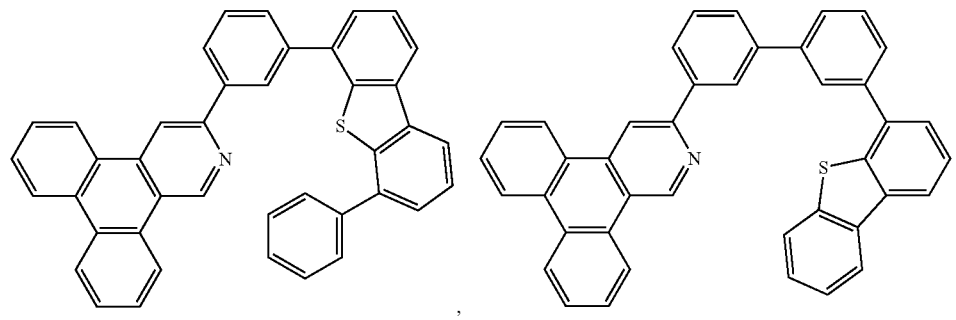
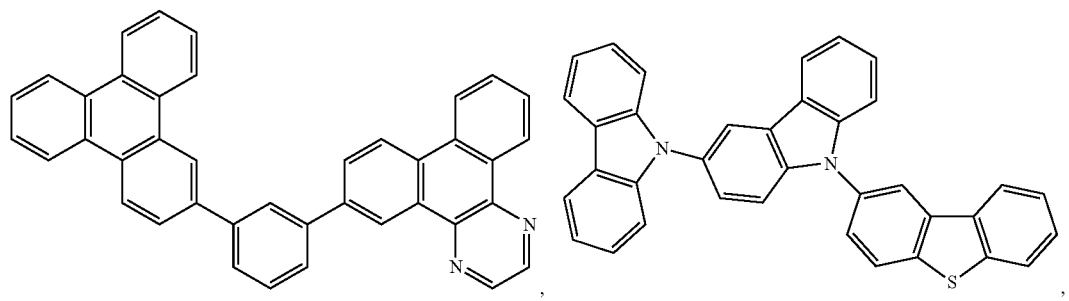
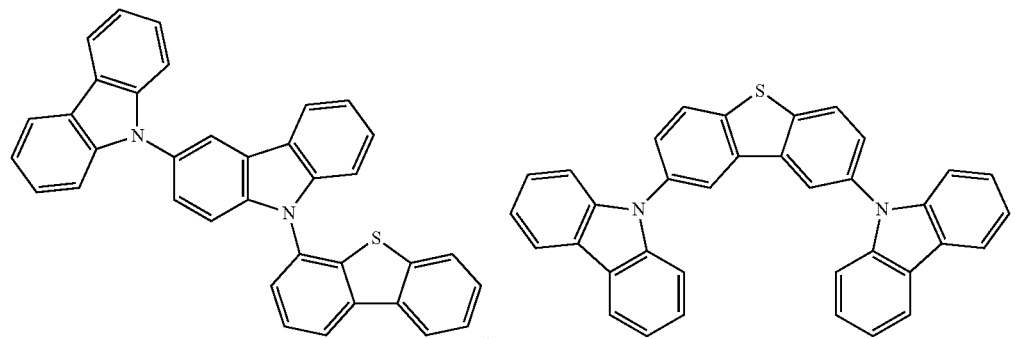
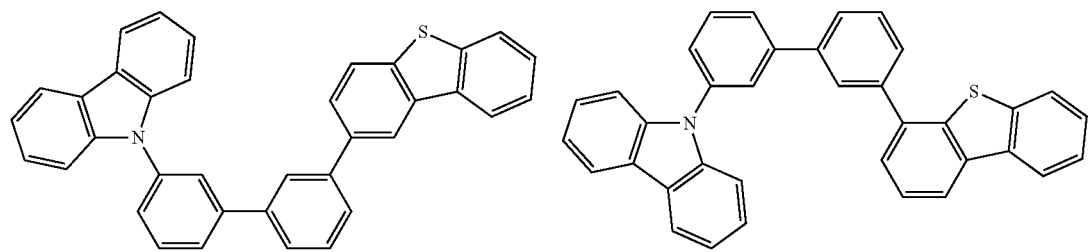
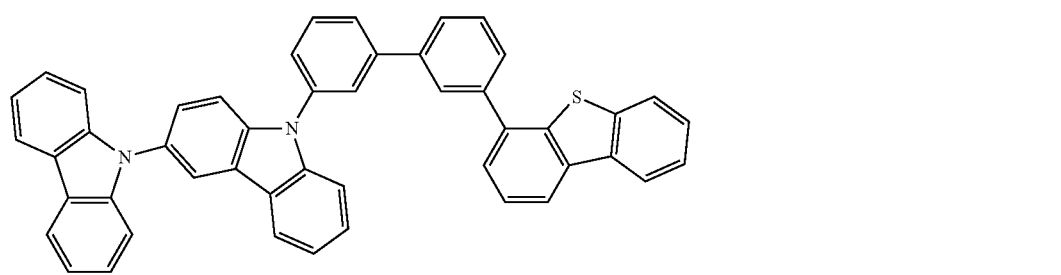

-continued
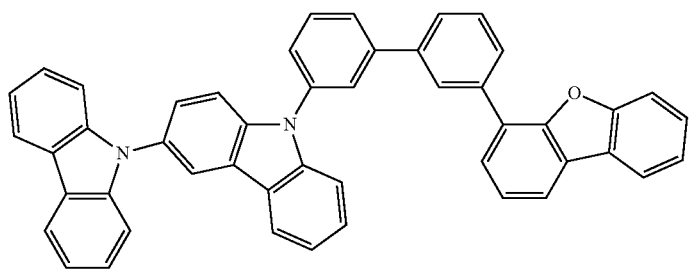
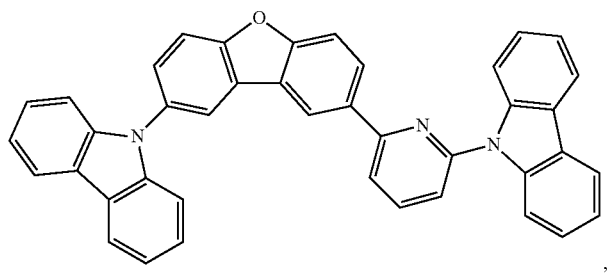
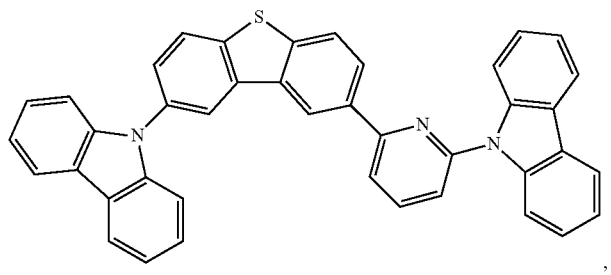
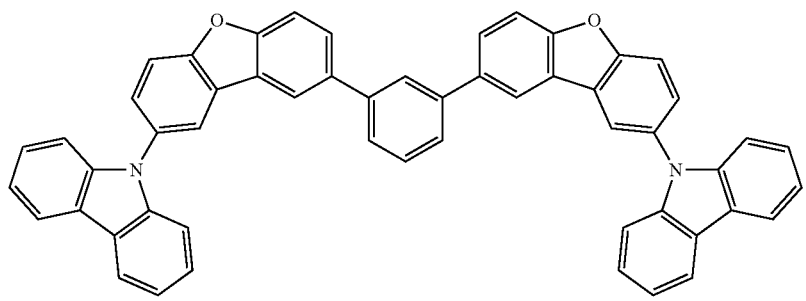
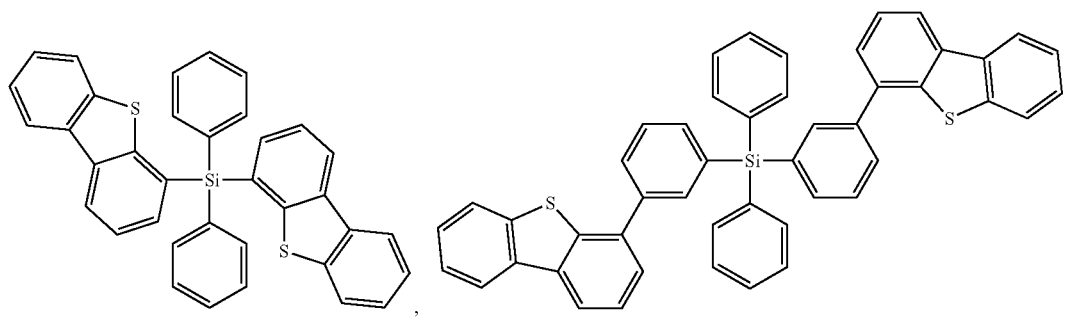

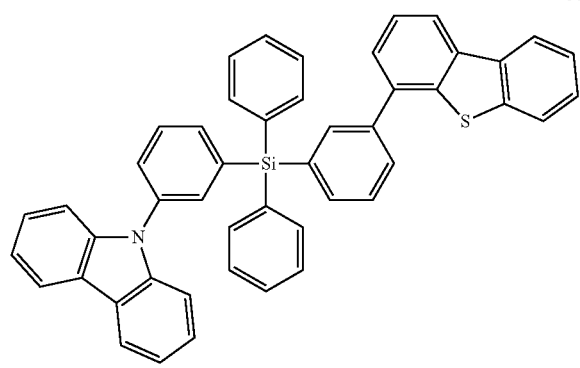
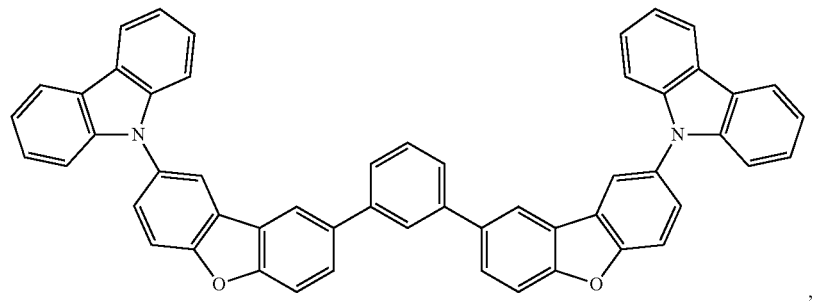
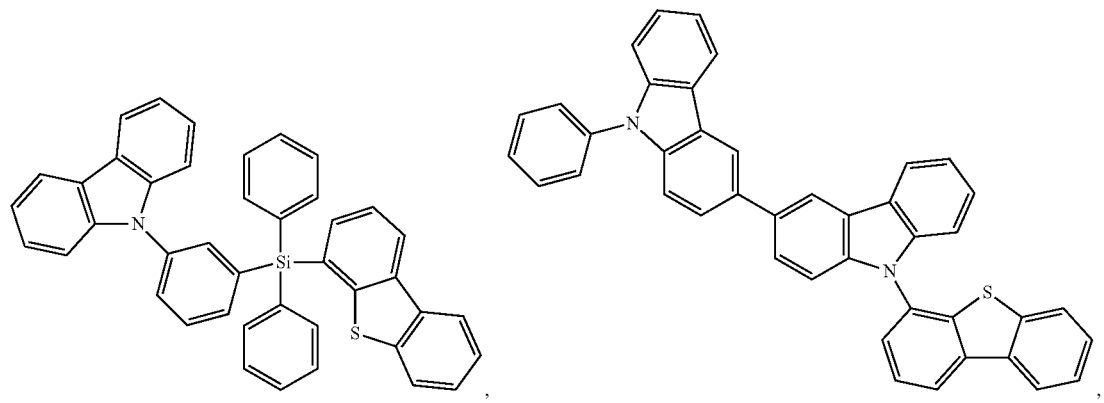
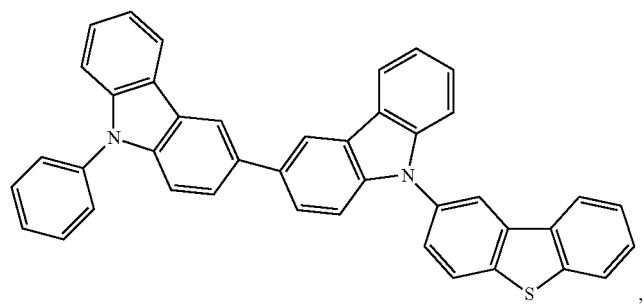

-continued
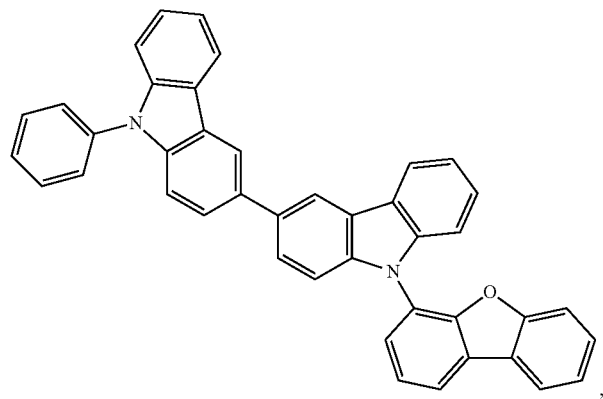
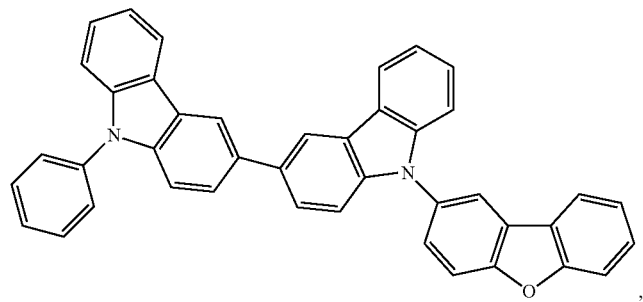
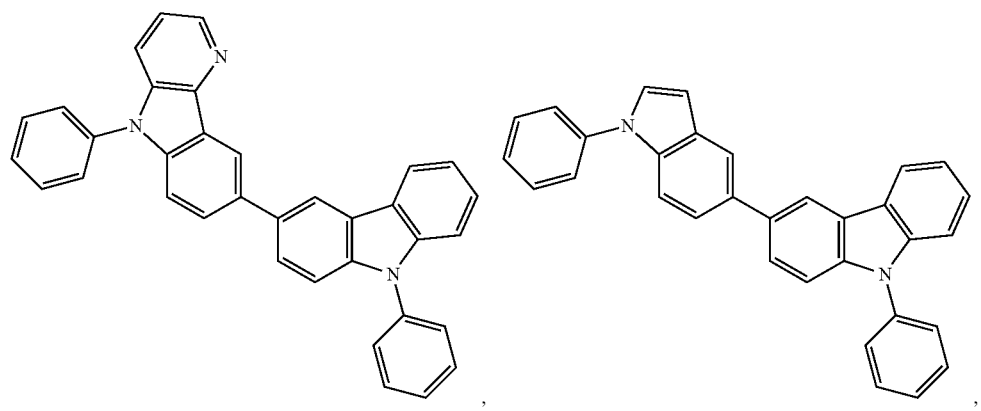
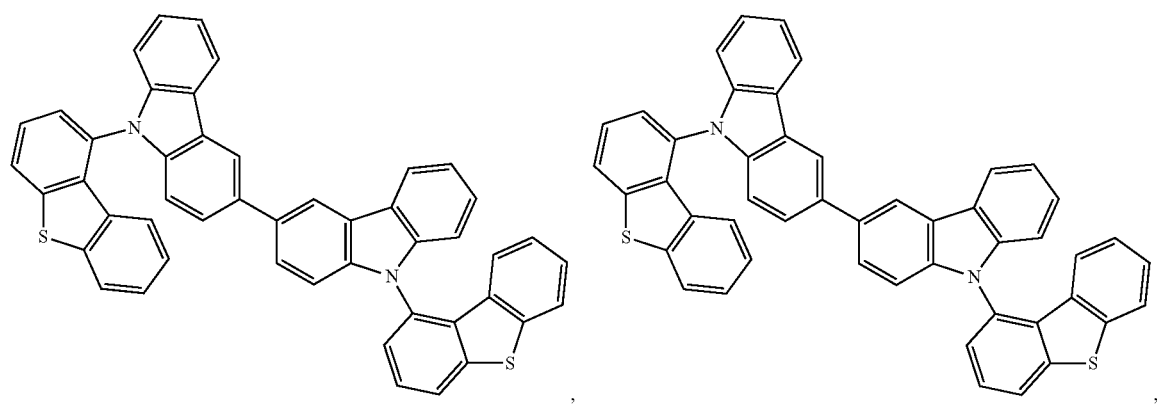

-continued
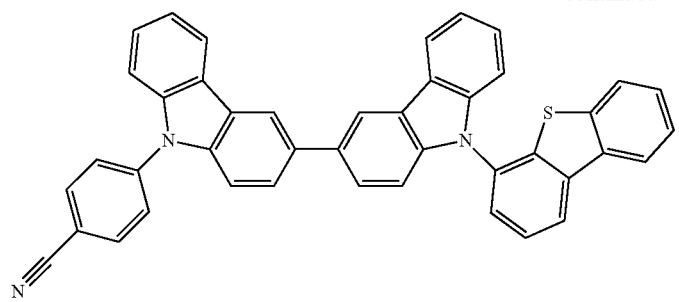
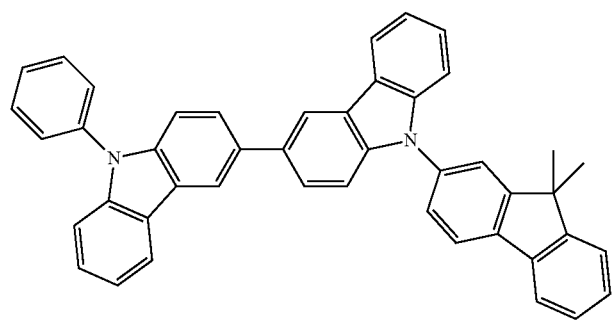
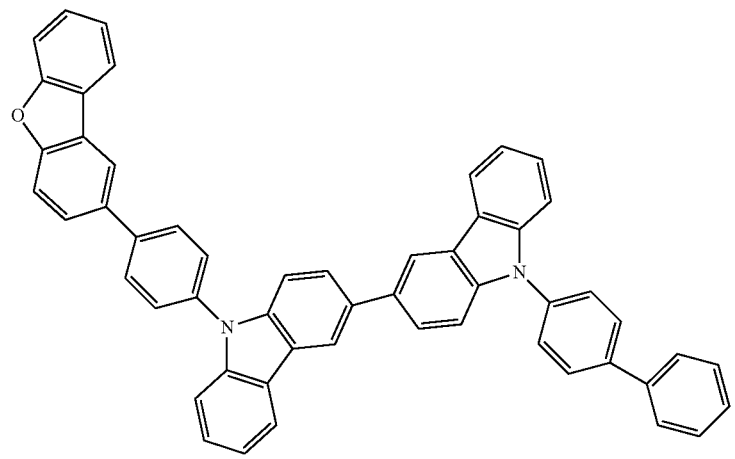
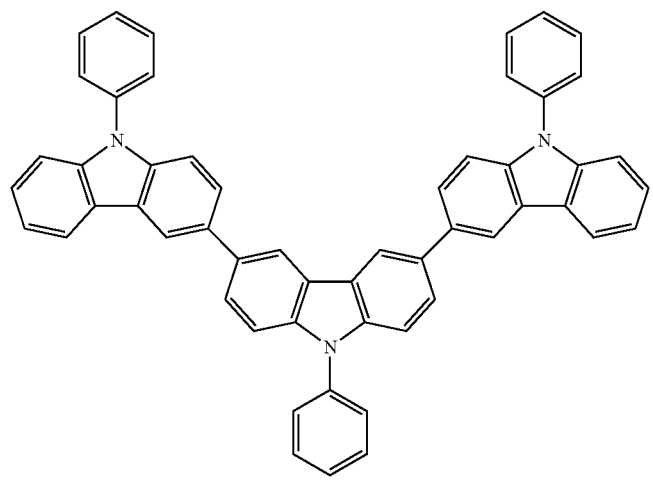

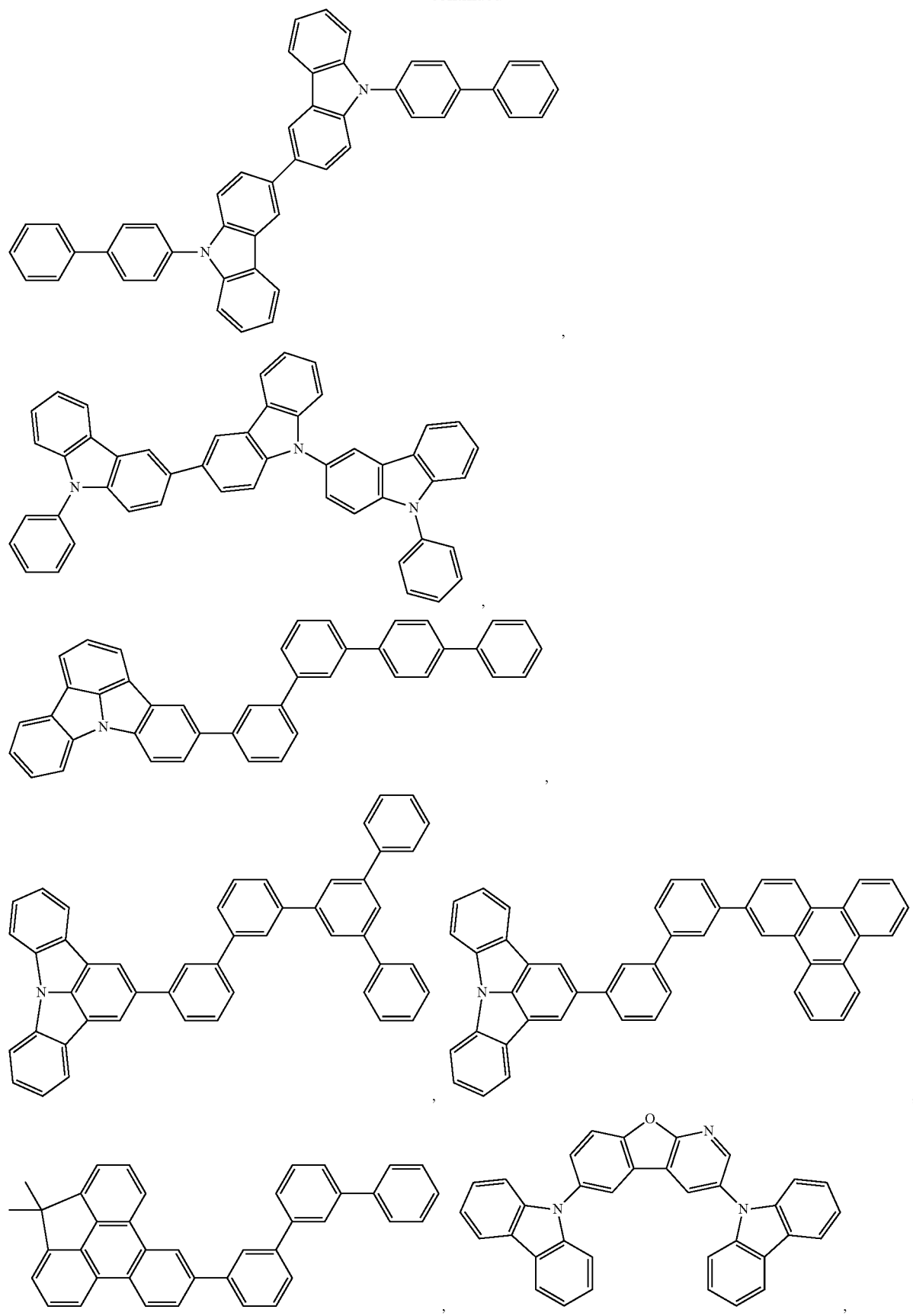

-continued
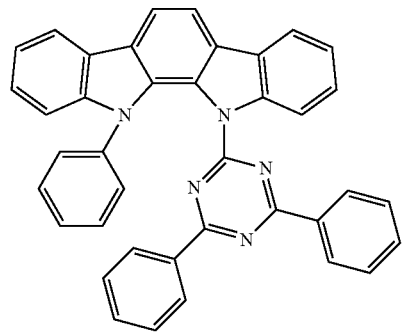 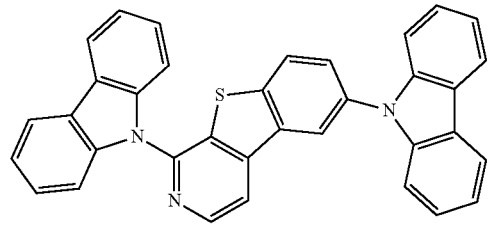 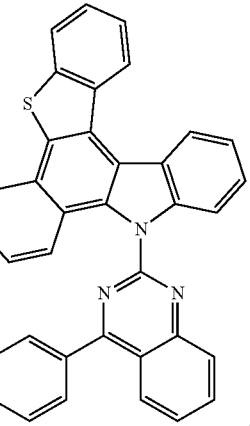
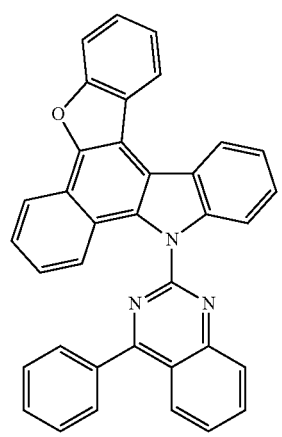 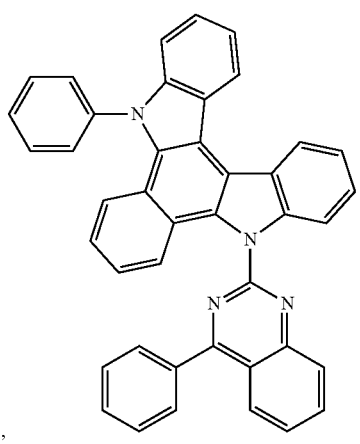 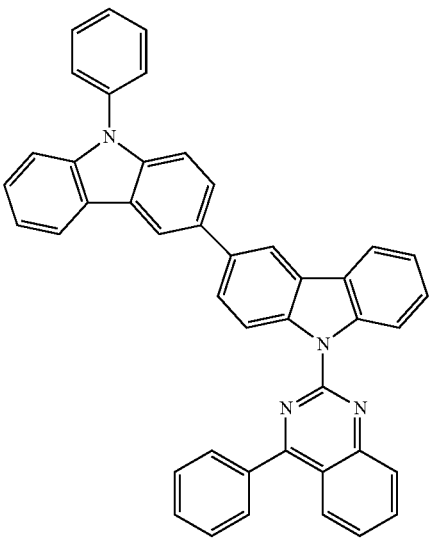
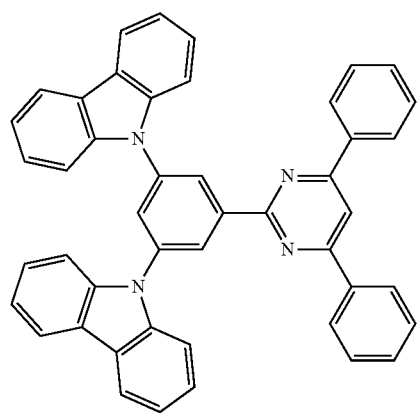 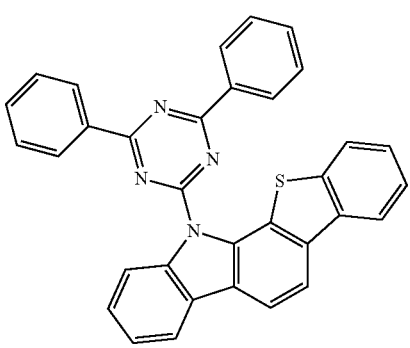

-continued
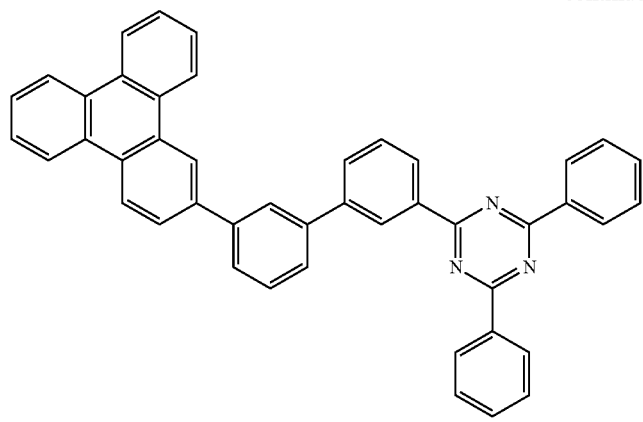
,
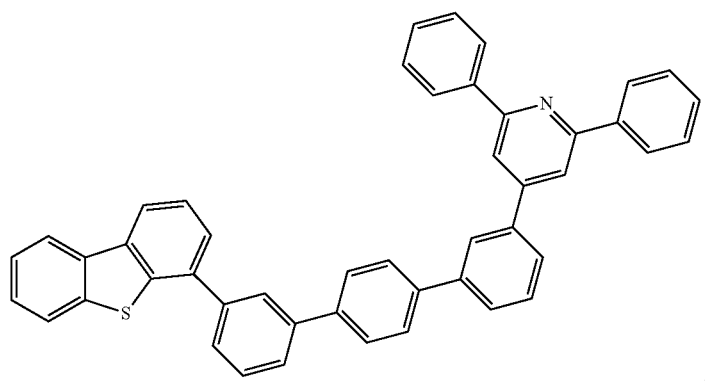
,
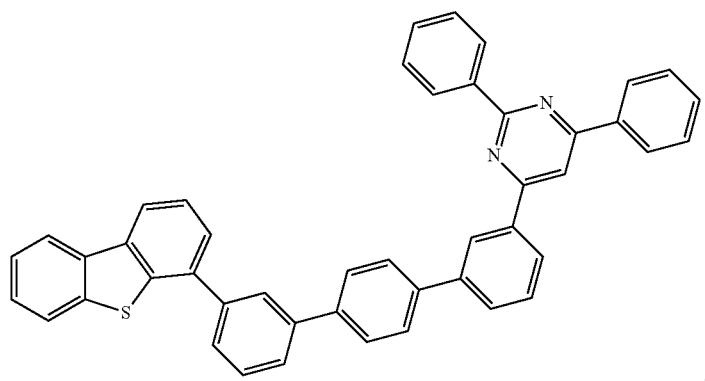
,
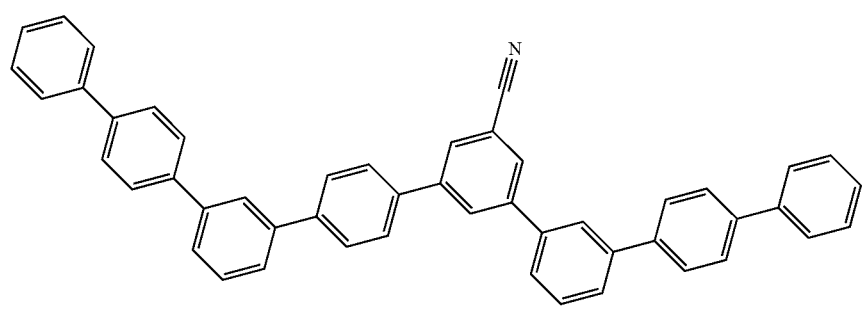
,

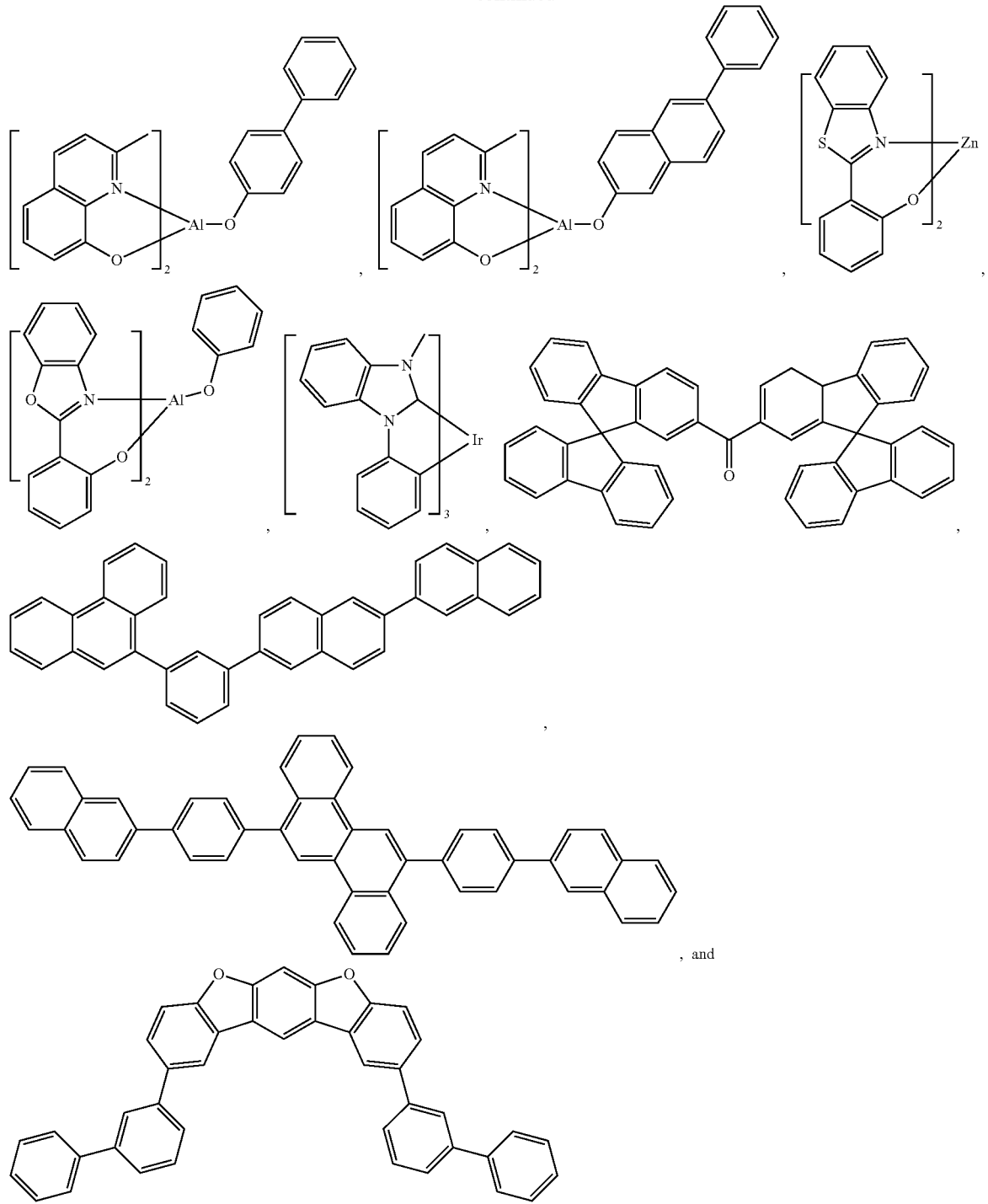

Emitter:

An emitter example is not particularly limited, and any compound may be used as long as the compound is typically used as an emitter material. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450,
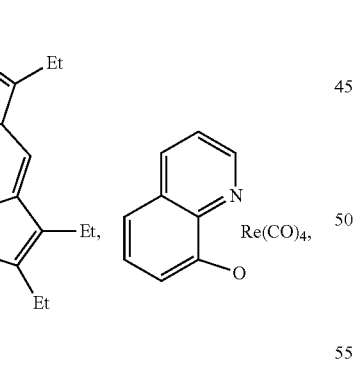
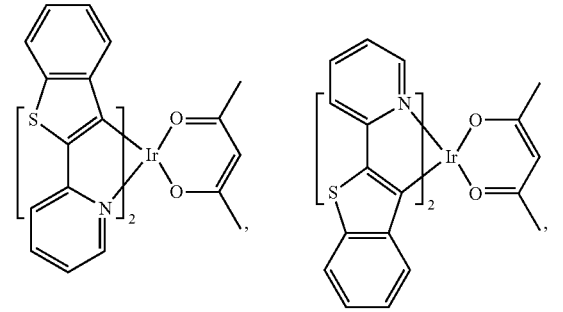
-continued
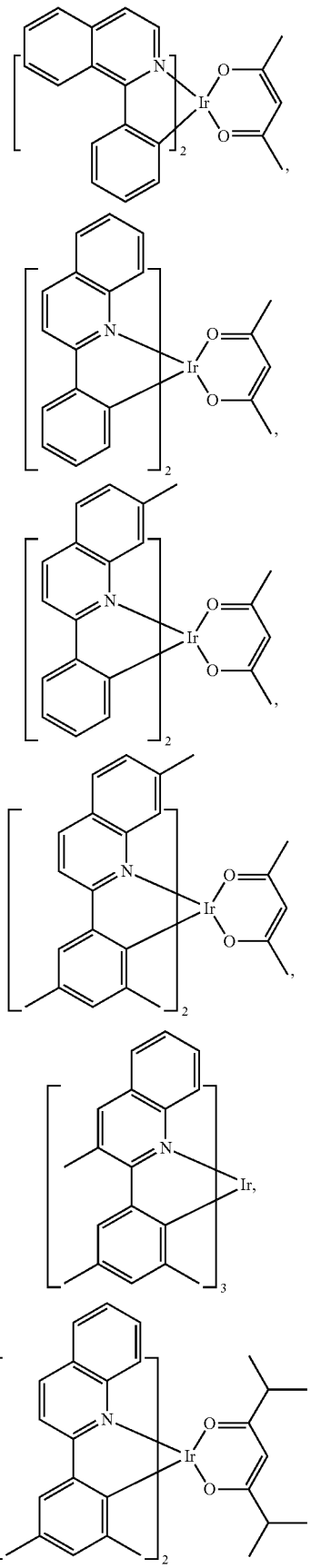

187
-continued
188
-continued
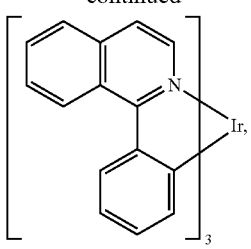
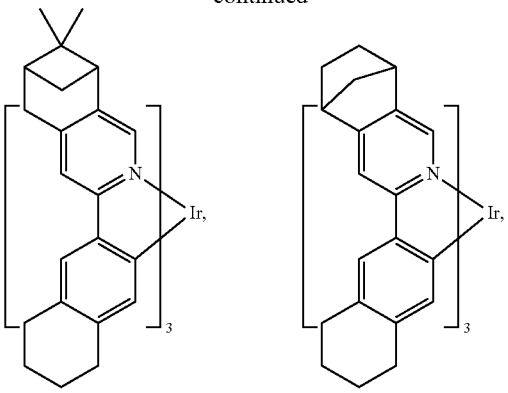
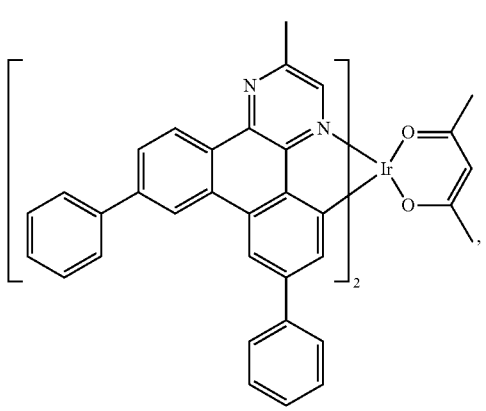
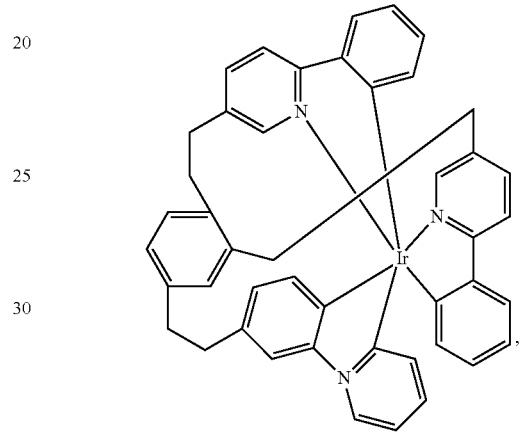
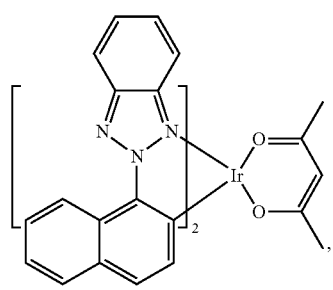
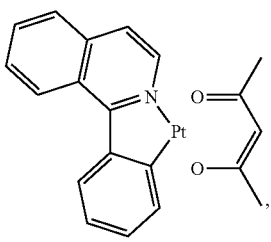
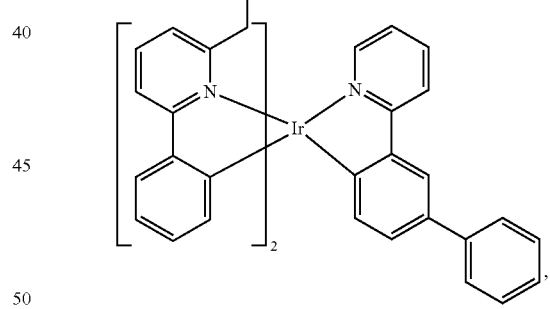
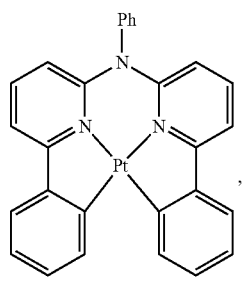 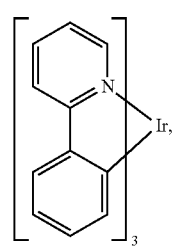
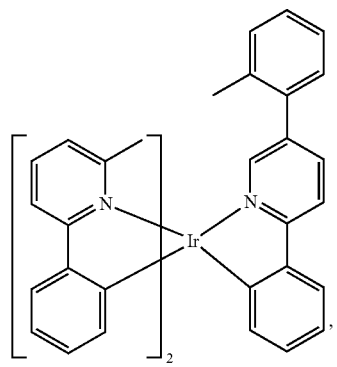

-continued
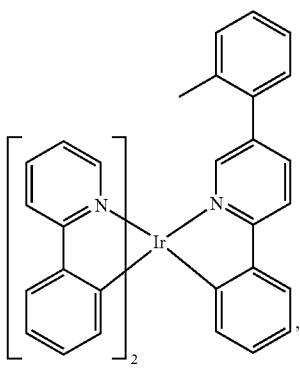
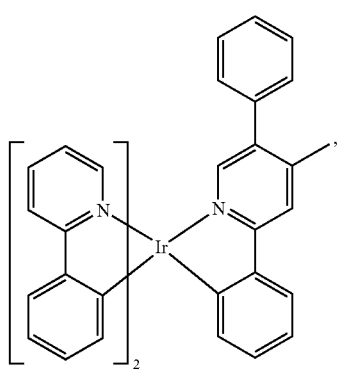
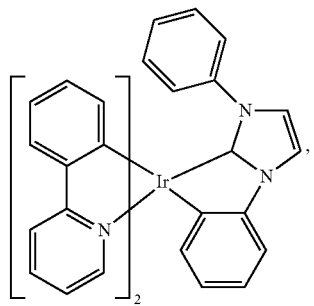
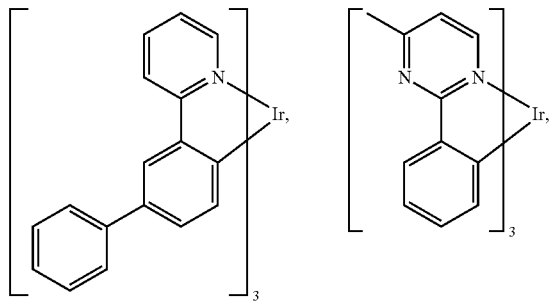
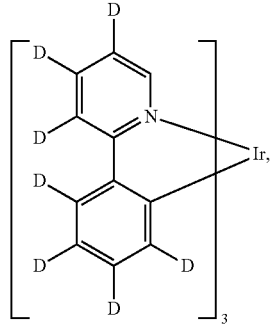
-continued
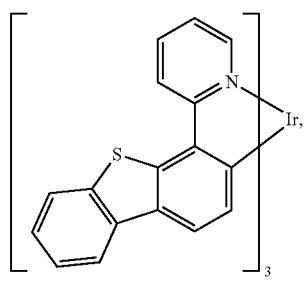
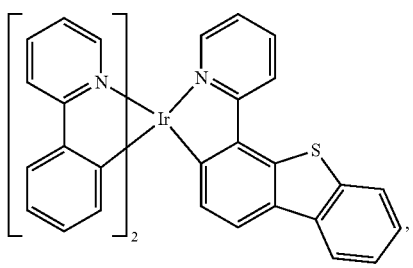
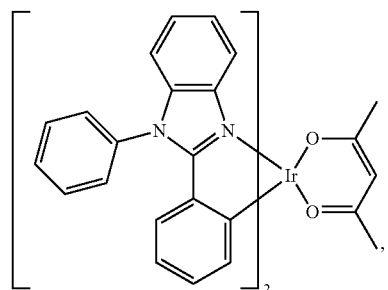
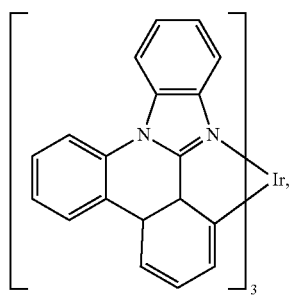
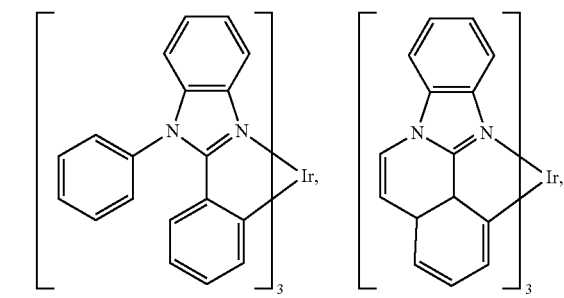
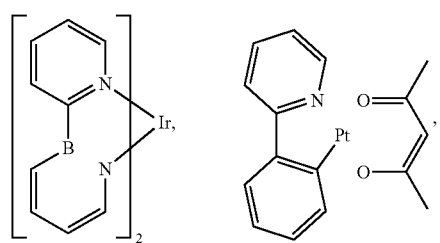

191
-continued
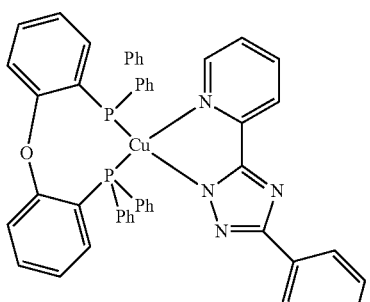
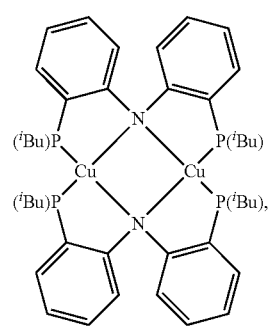
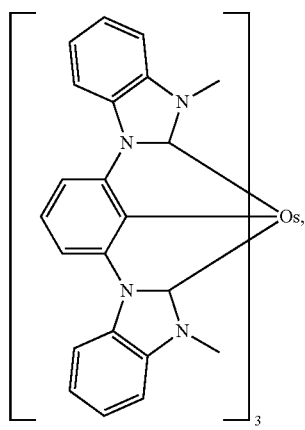 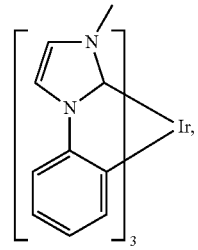
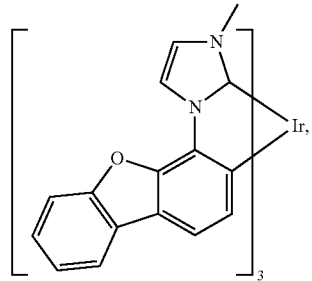
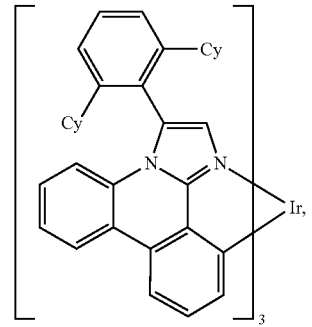
192
-continued
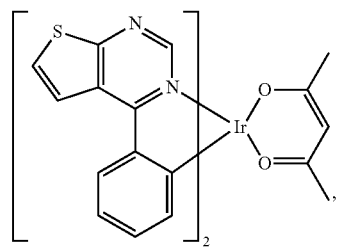
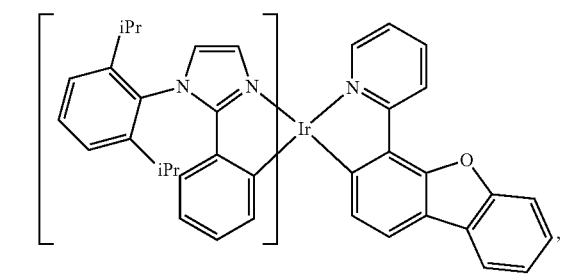
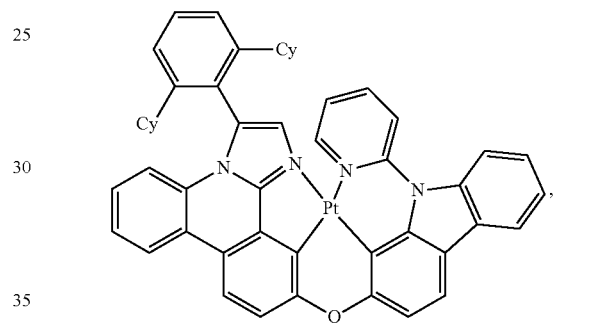
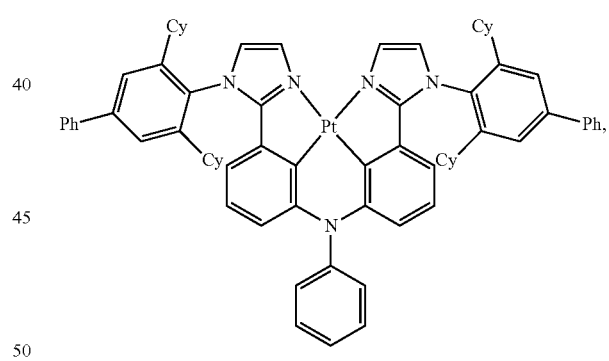
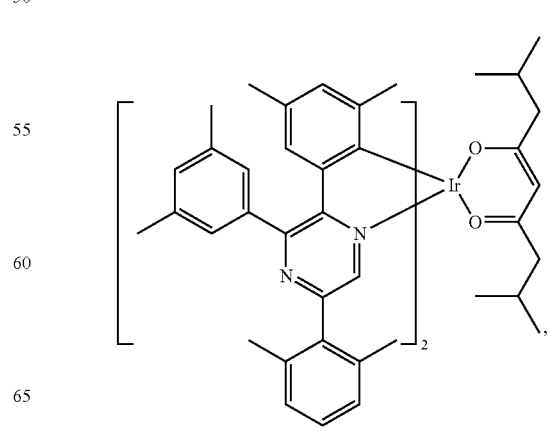

-continued
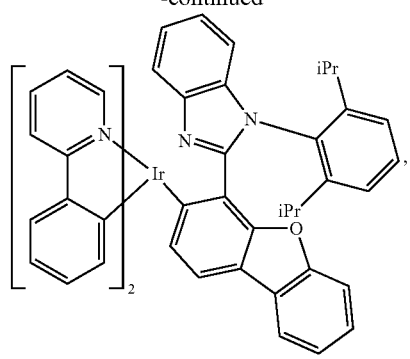
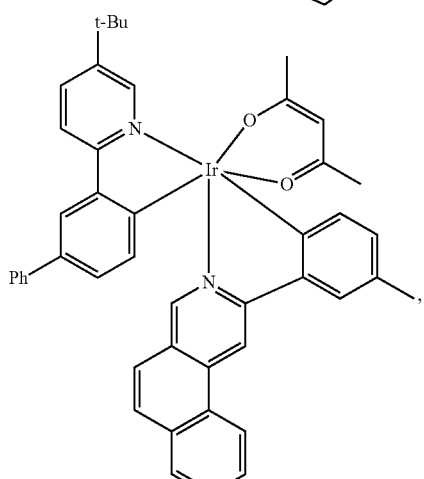
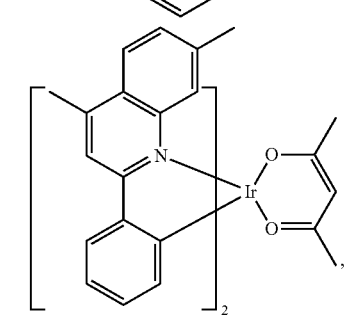
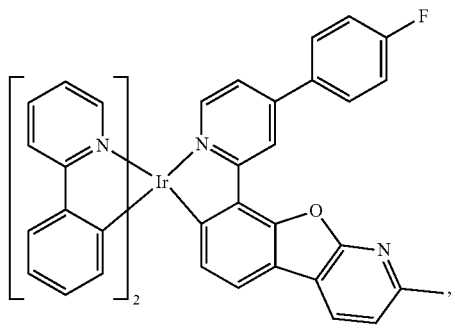
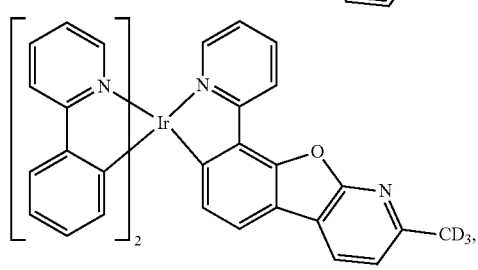
-continued
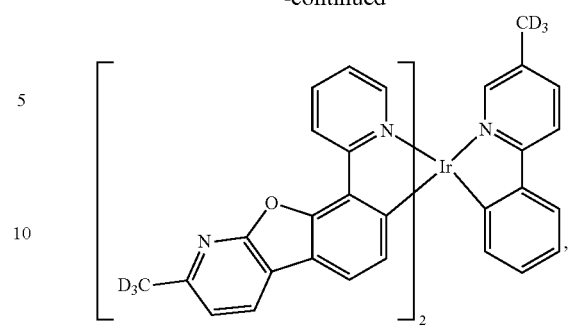
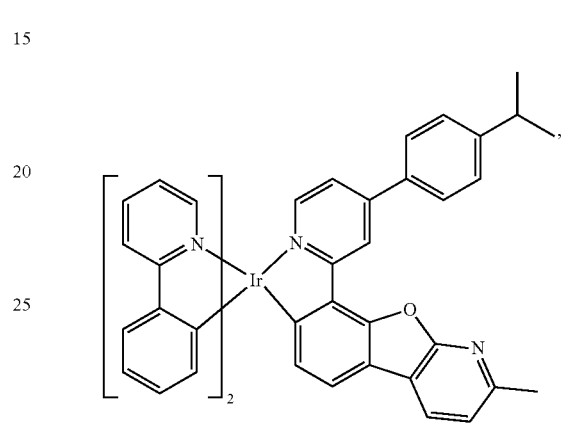
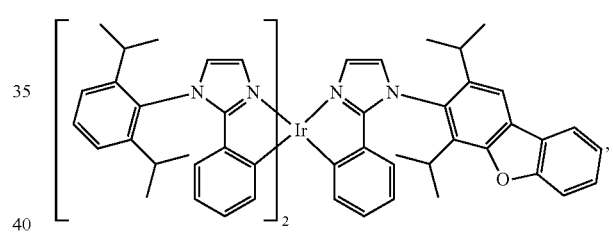
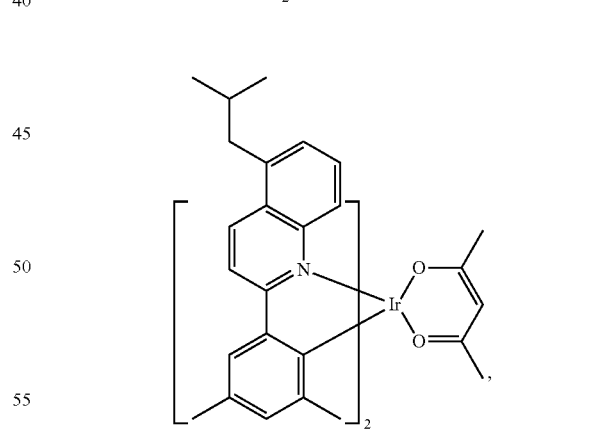
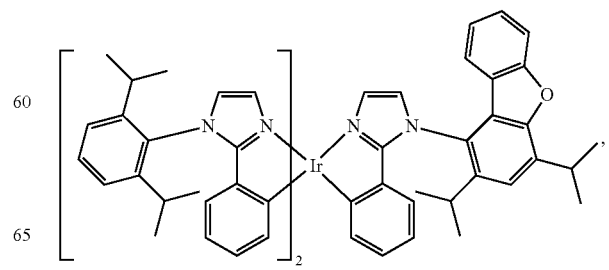

195
-continued
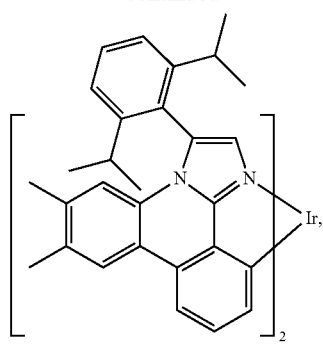
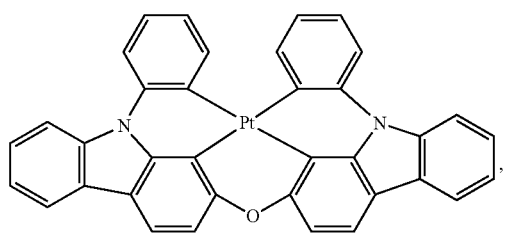
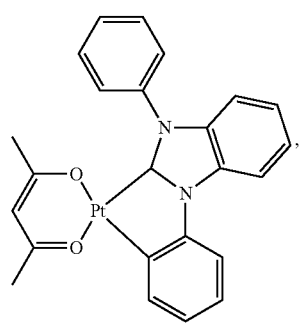
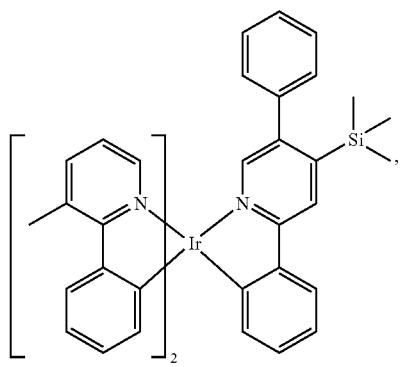
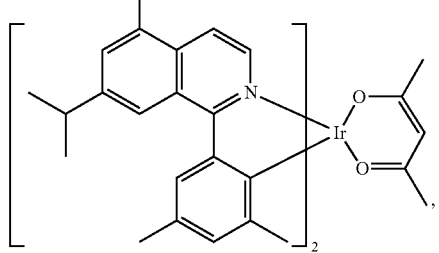
196
-continued
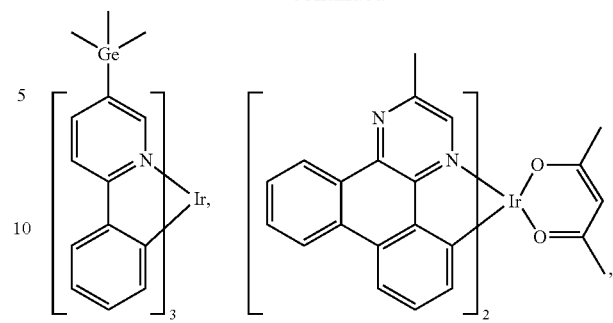
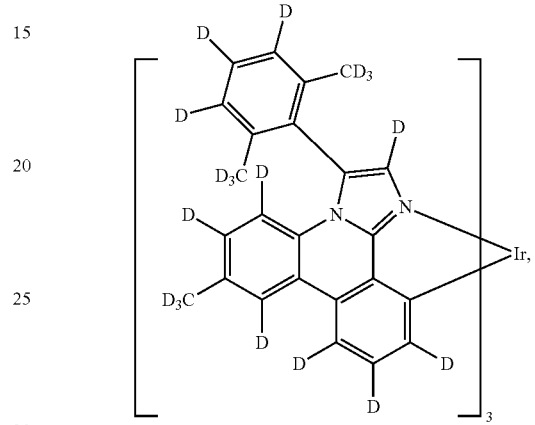
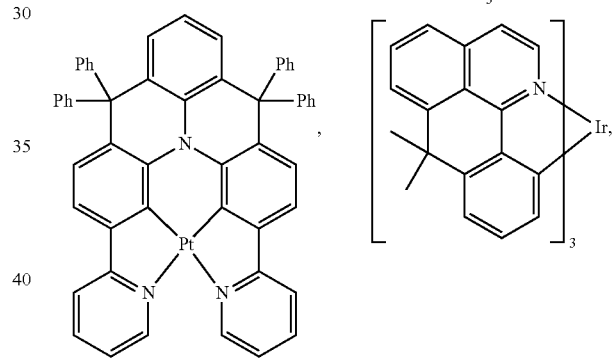
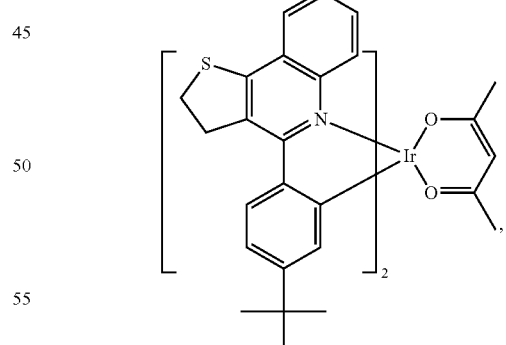
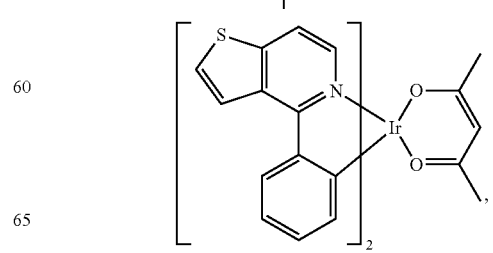

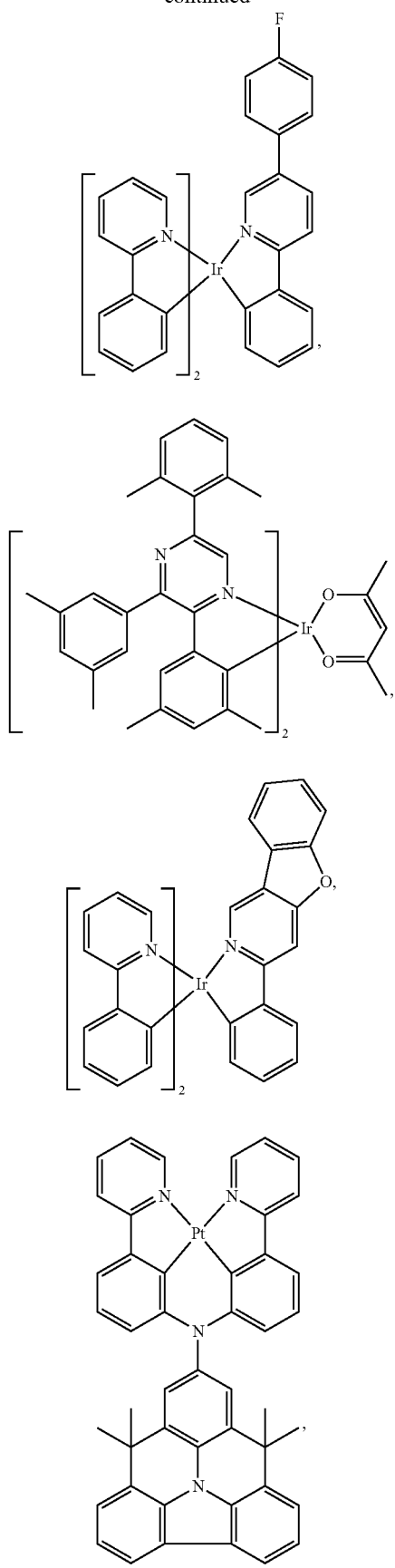
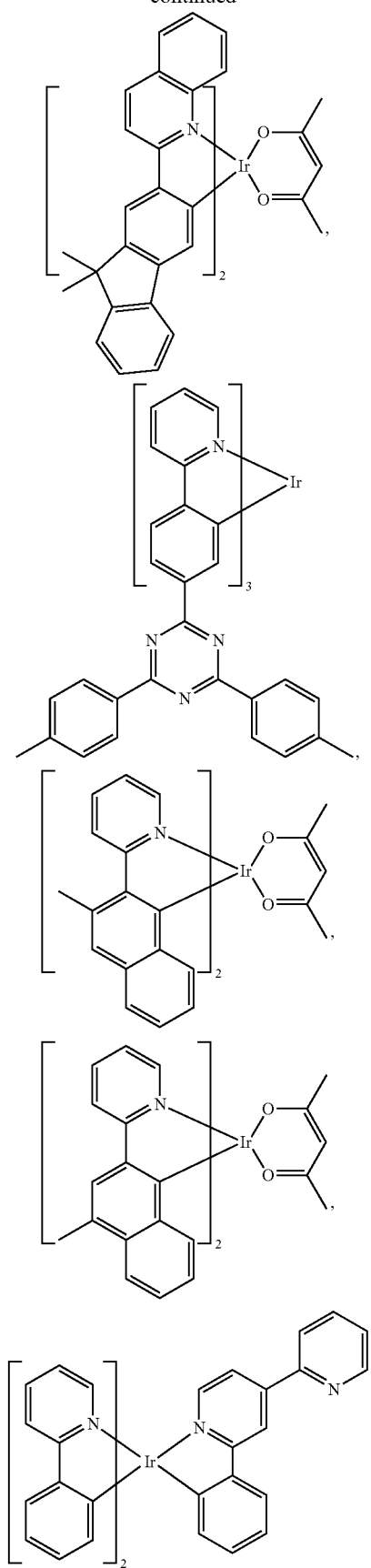

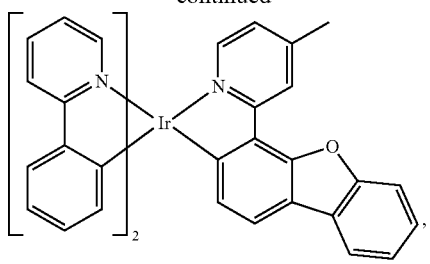
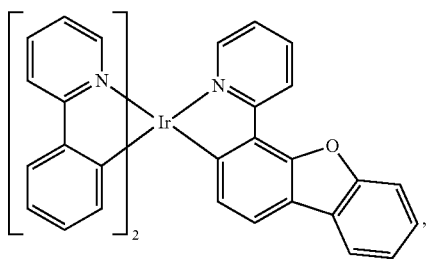
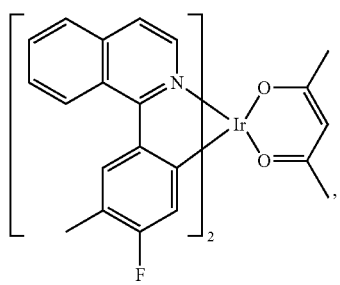
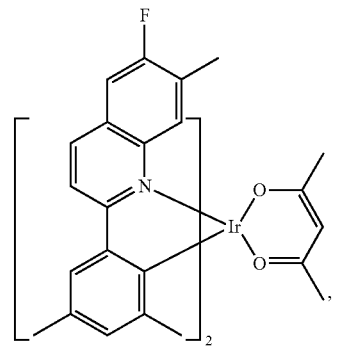
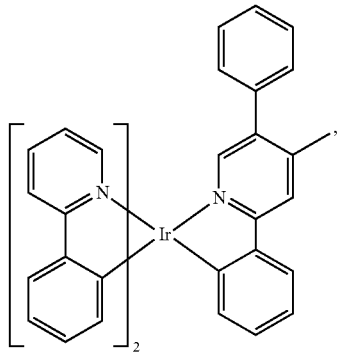
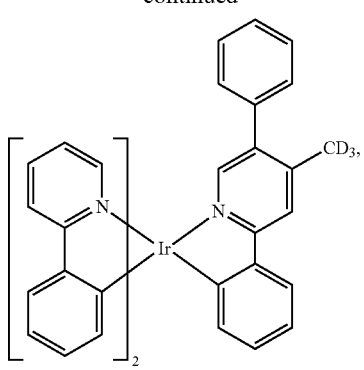
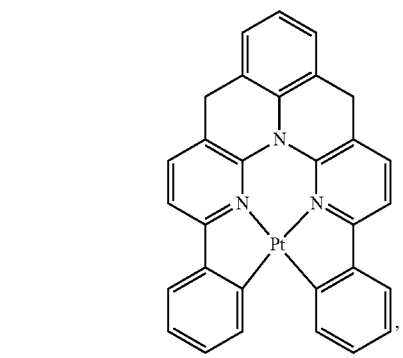
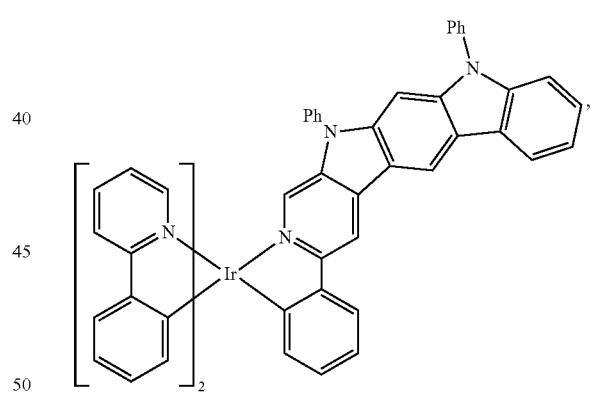
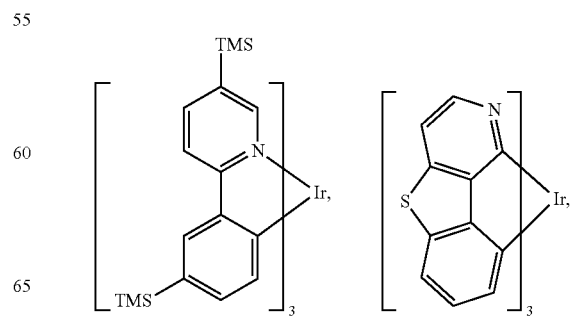

201
-continued
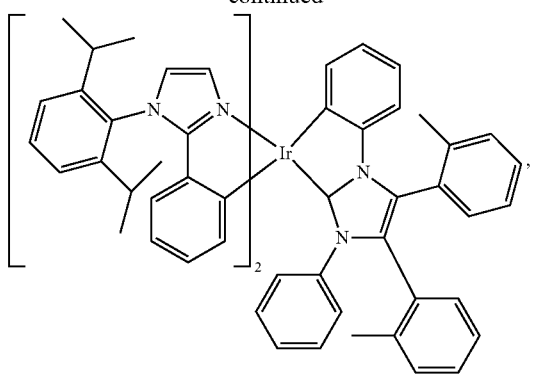
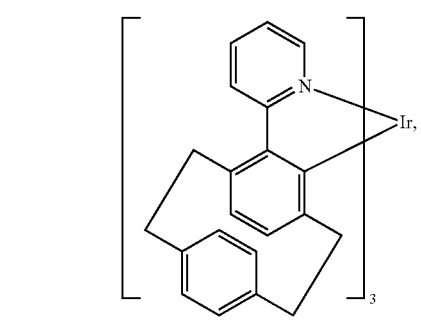
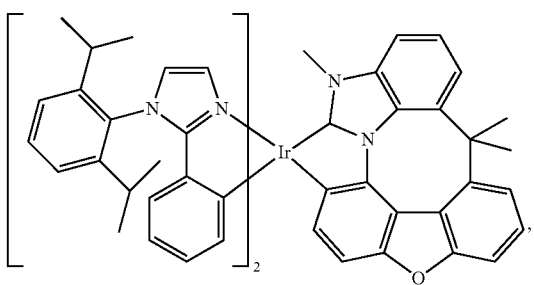
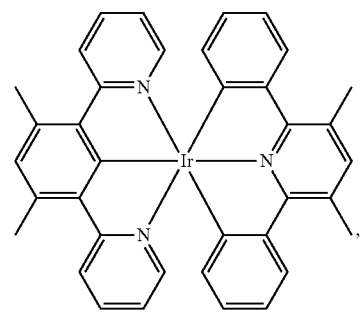
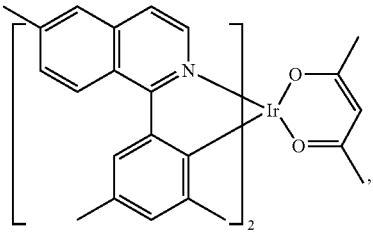
202
-continued
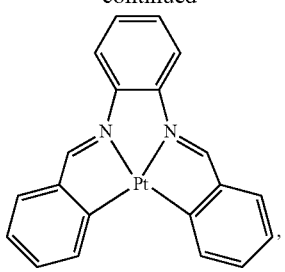
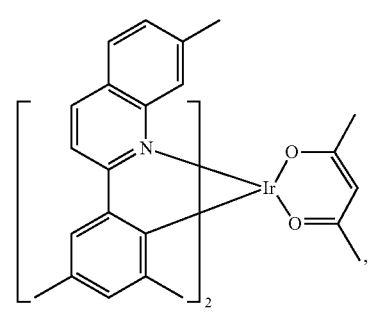
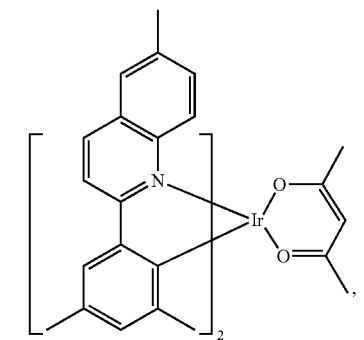
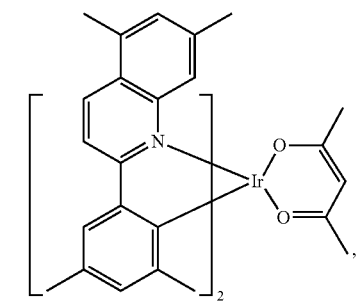
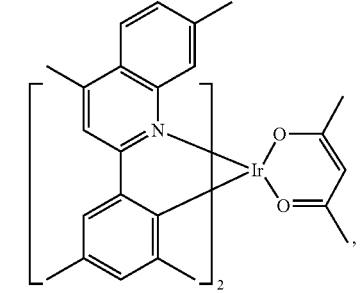

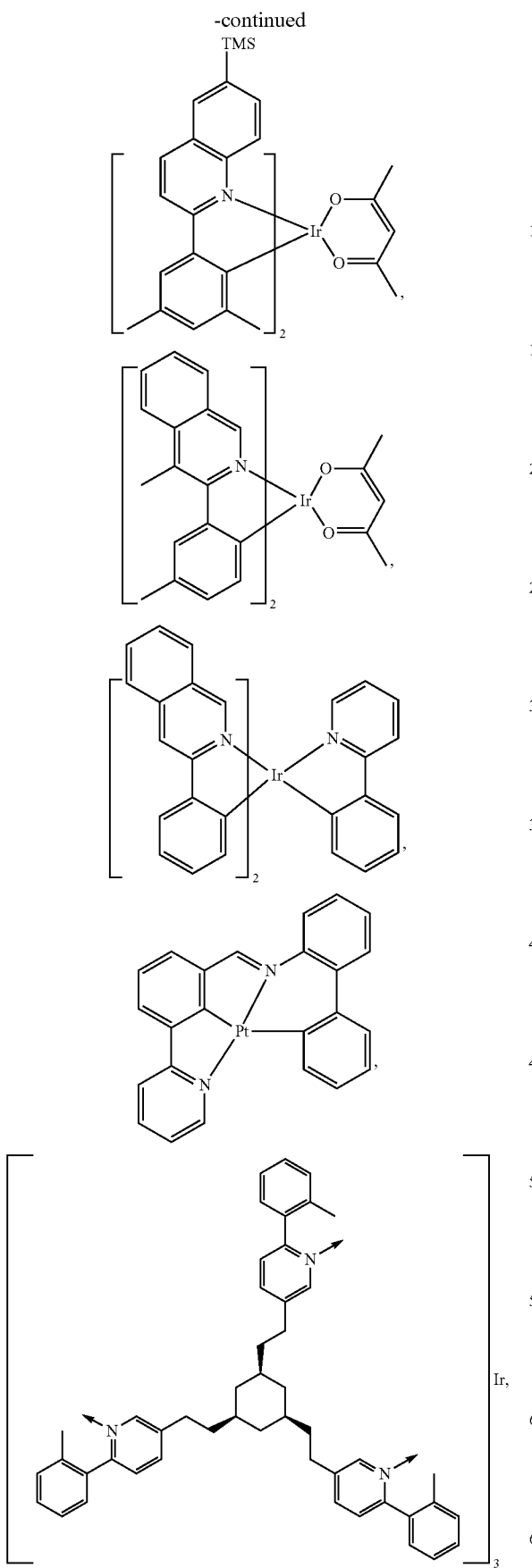
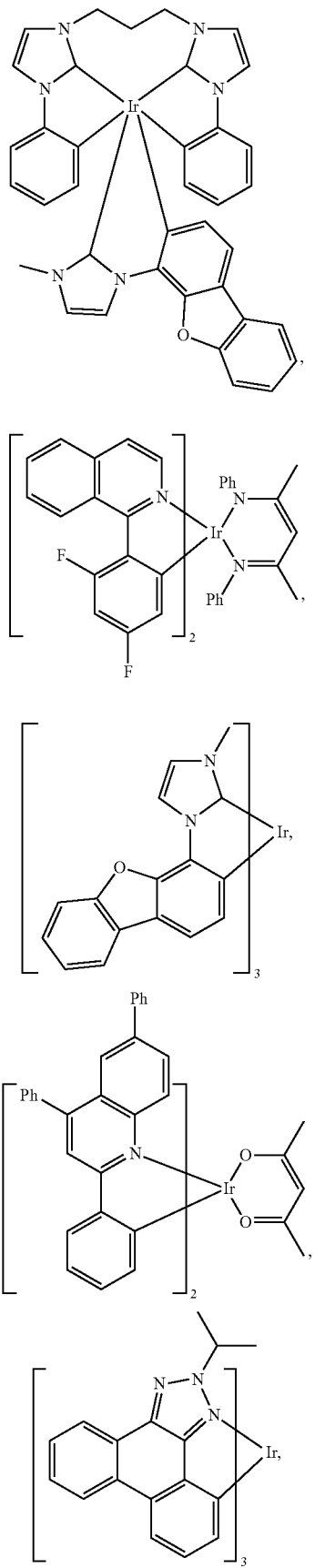

-continued

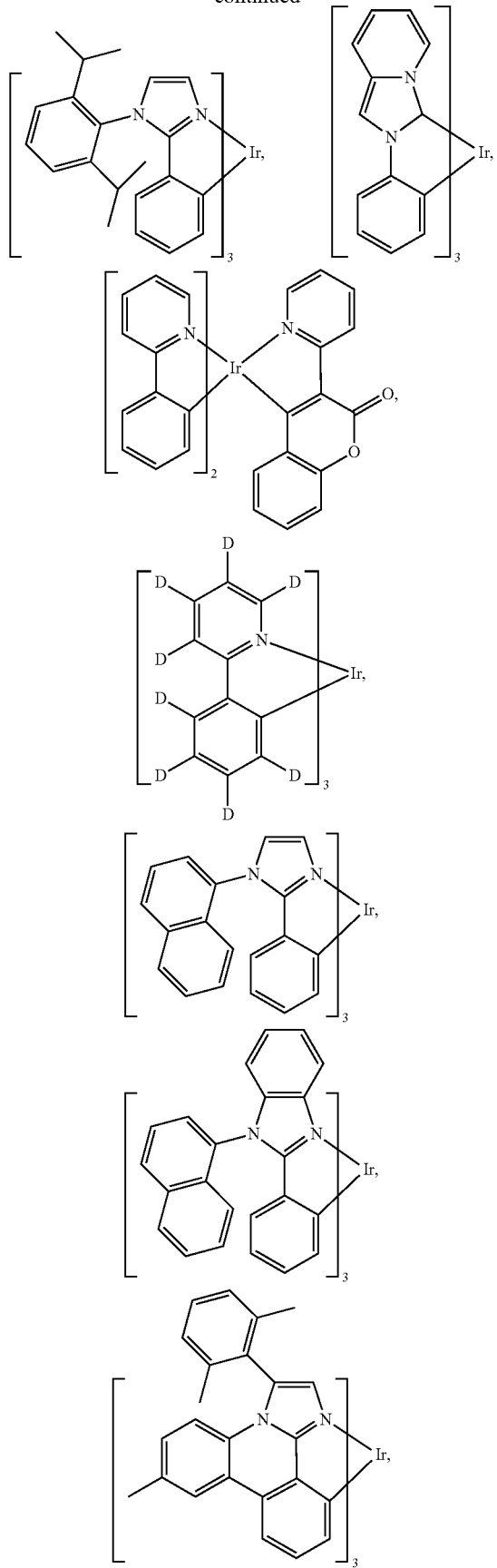

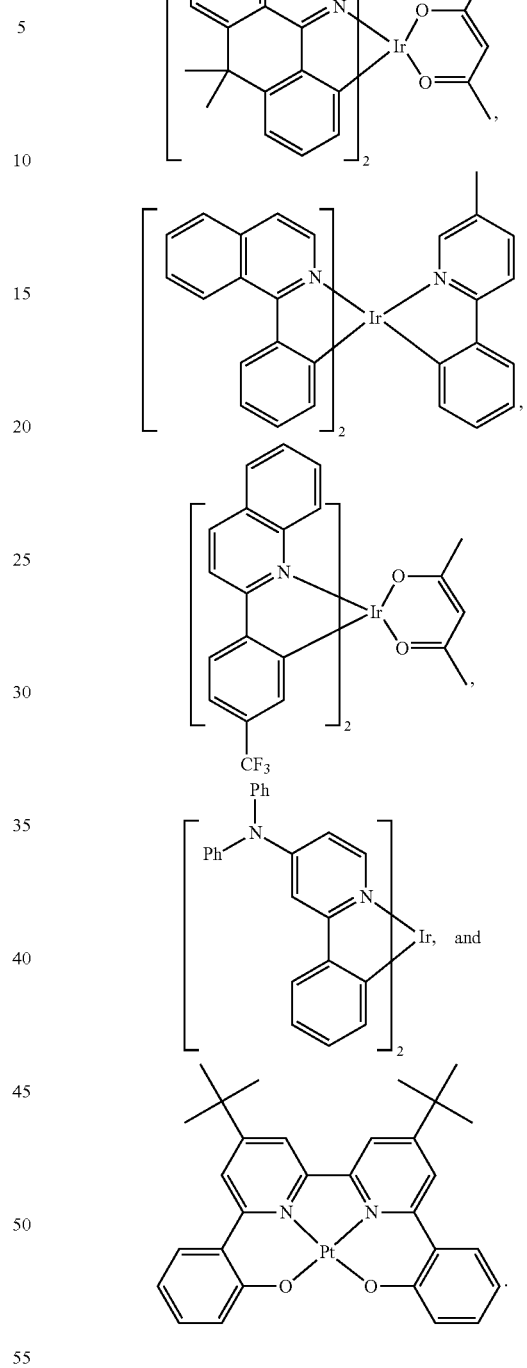

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

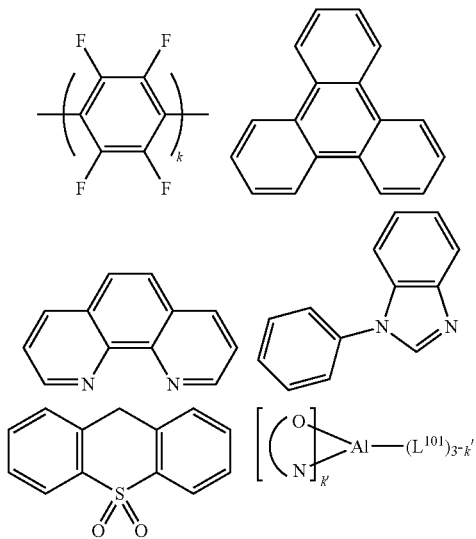

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

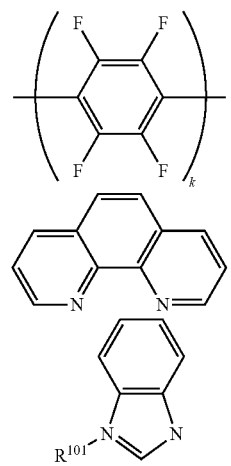

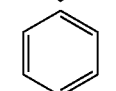

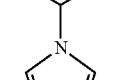

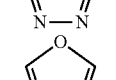

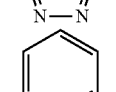

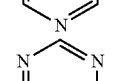

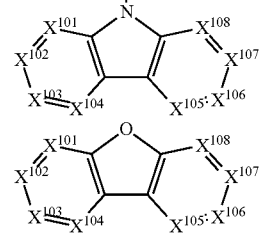

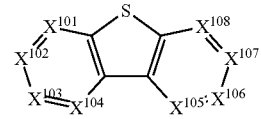

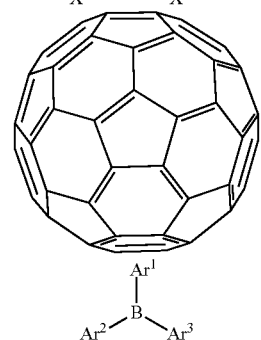

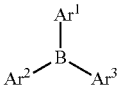

wherein $R^{101}$ is selected from the group consisting of hydrogen, deuterium, halide, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL include, but are not limited to the following general formula:

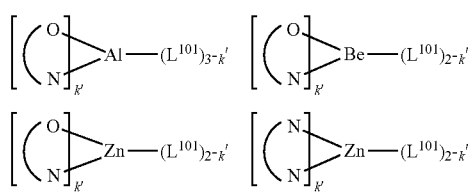

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217 WO2013145667 WO2013180376 WO2014104499 WO2014104535,

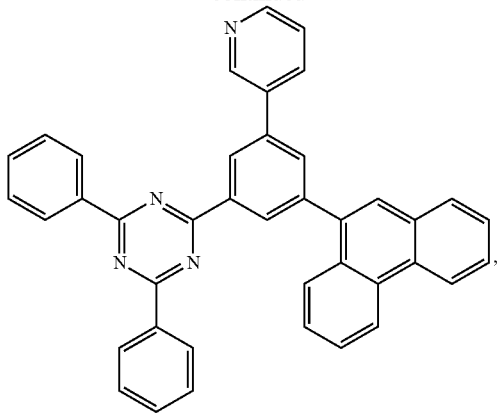

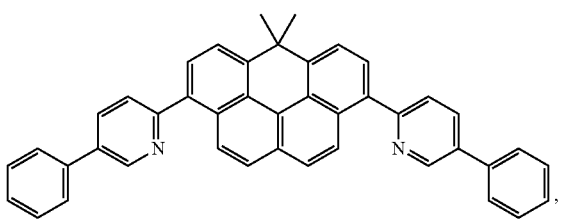

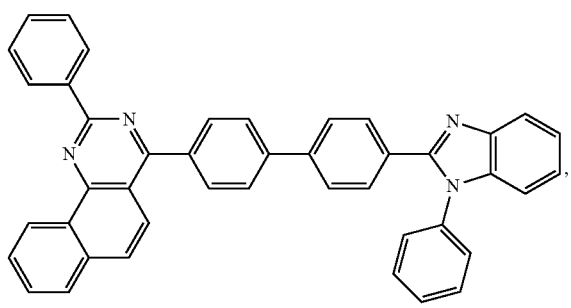

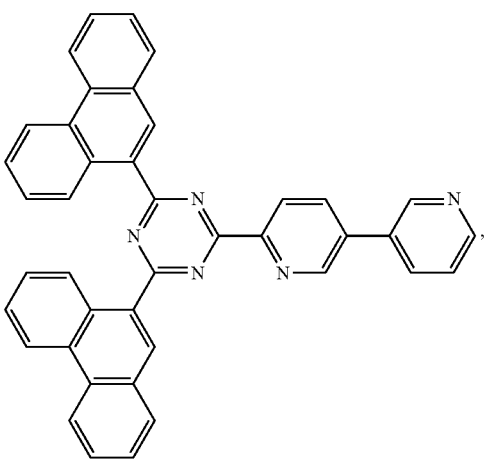

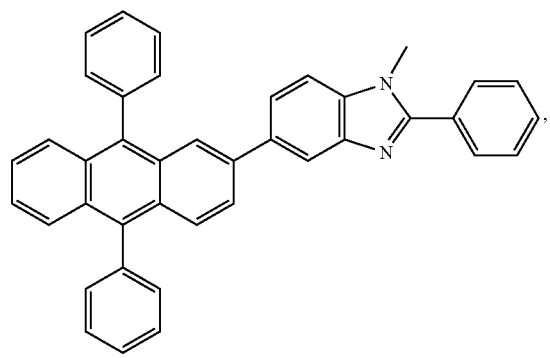

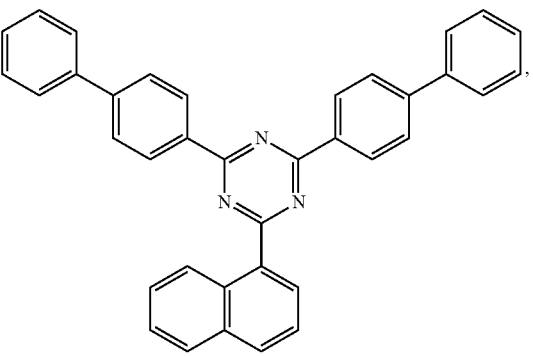

211
-continued
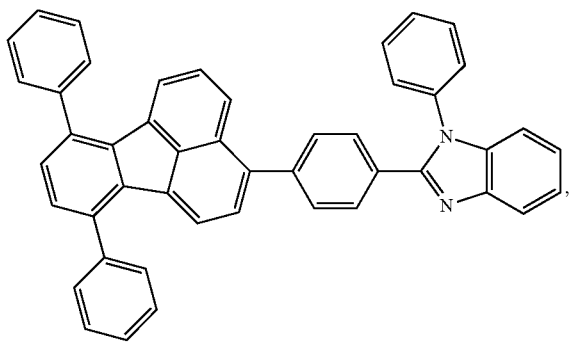
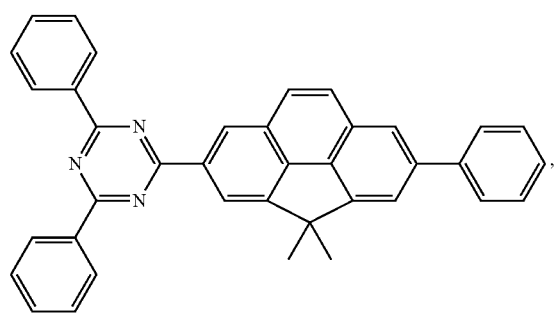
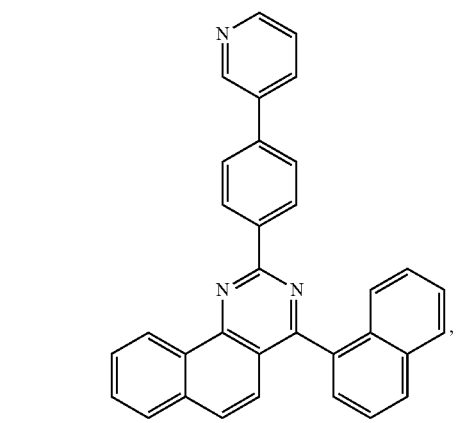
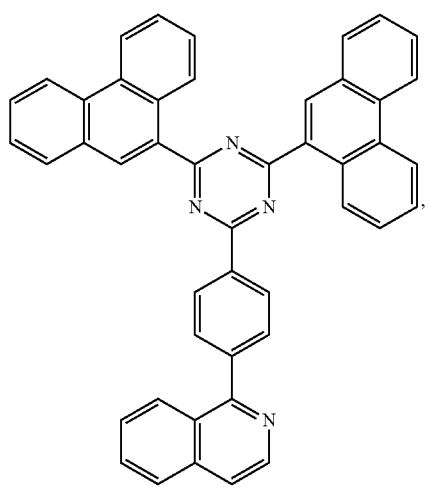
212
-continued
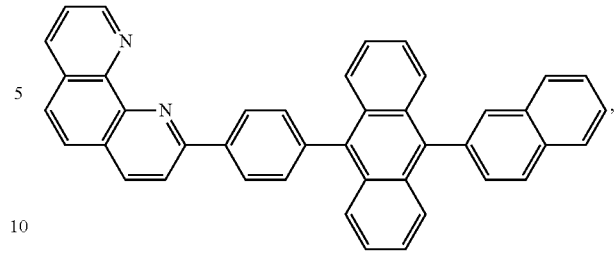
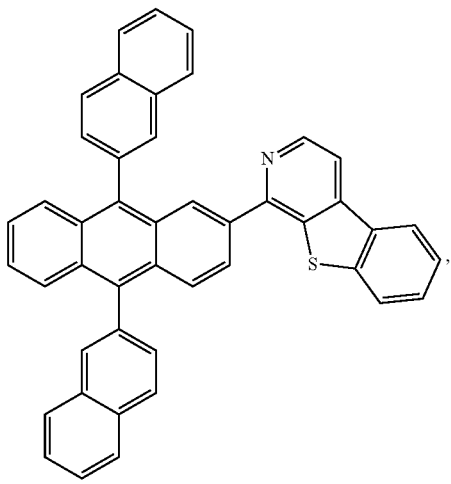
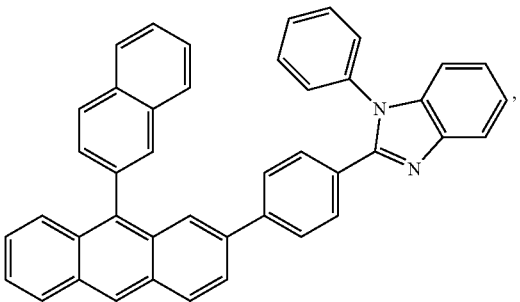
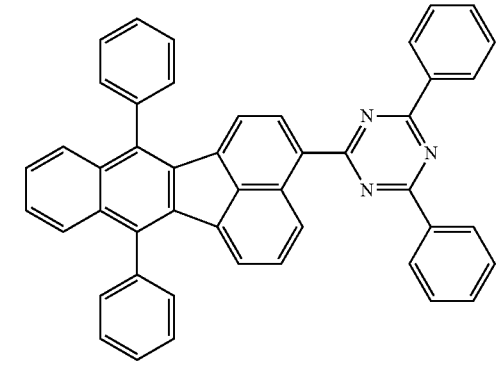

213
-continued
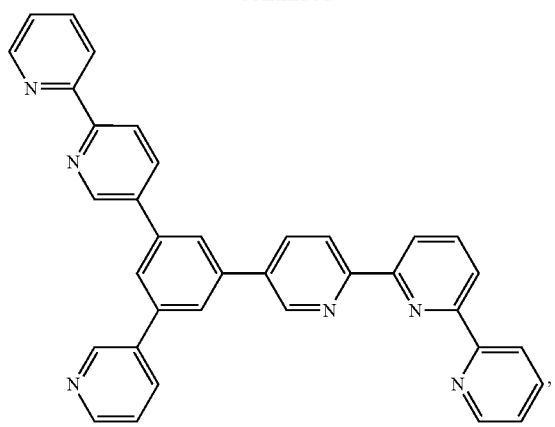
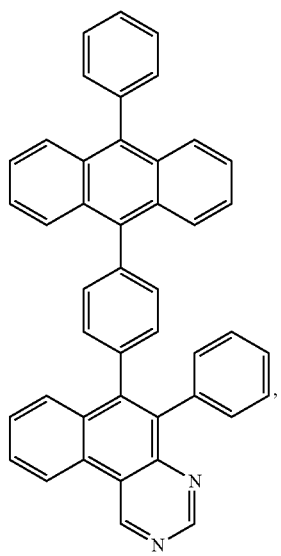
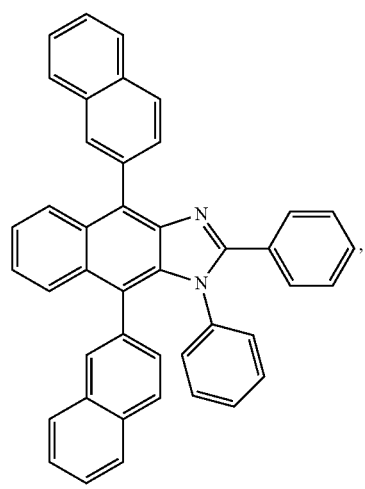
214
-continued
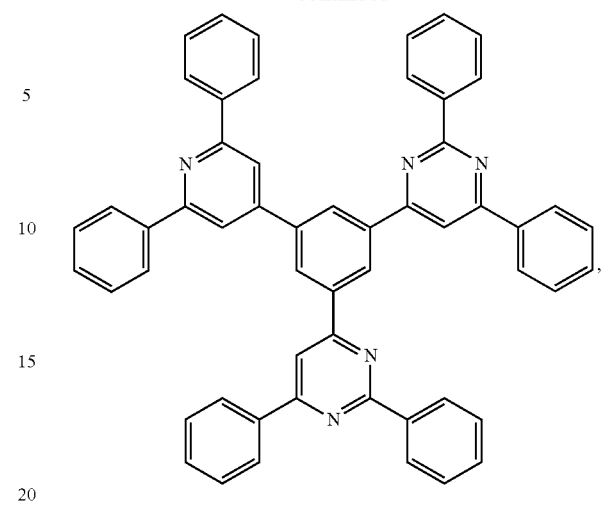
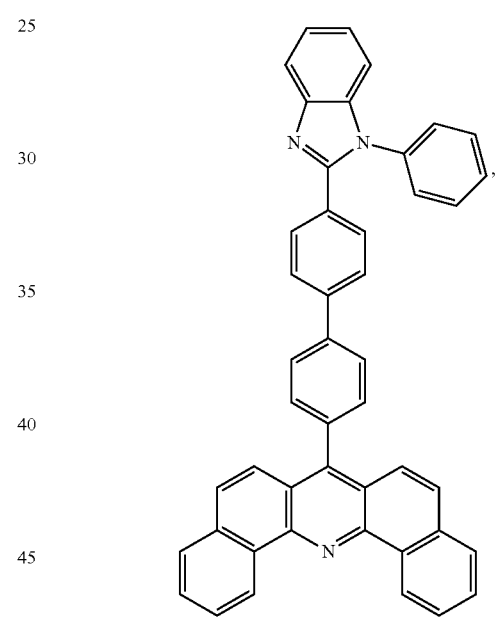
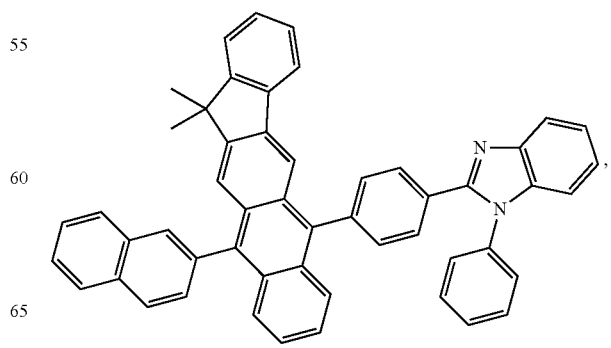

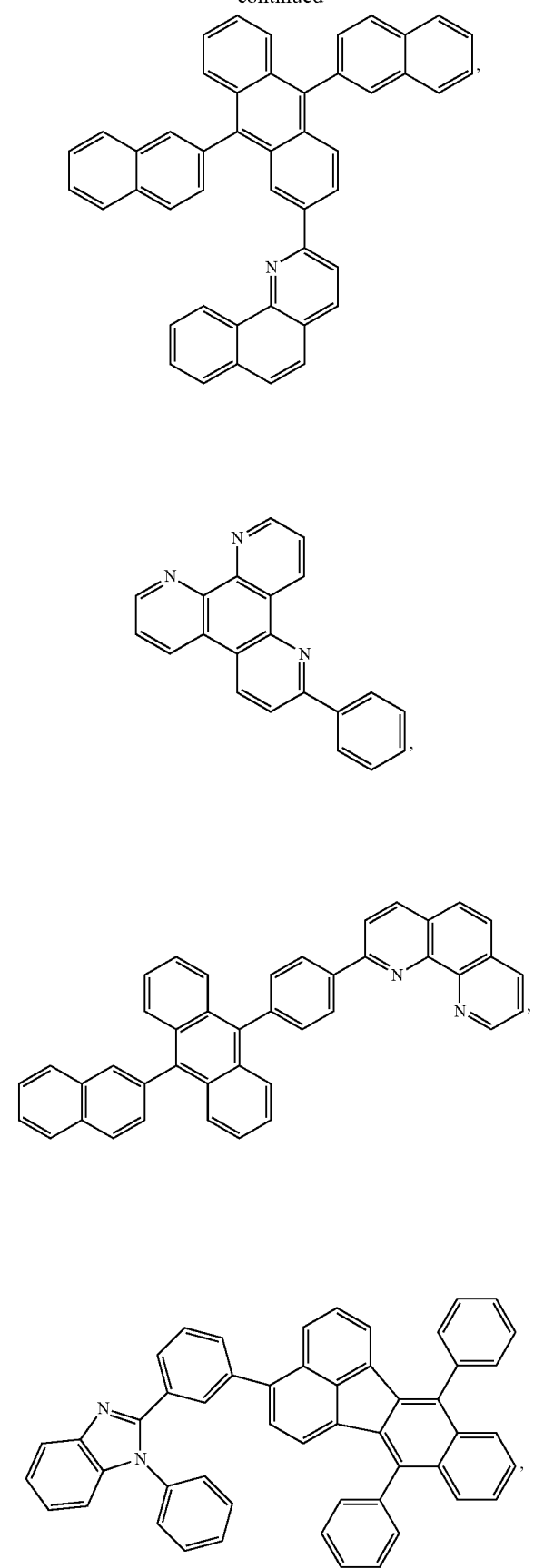
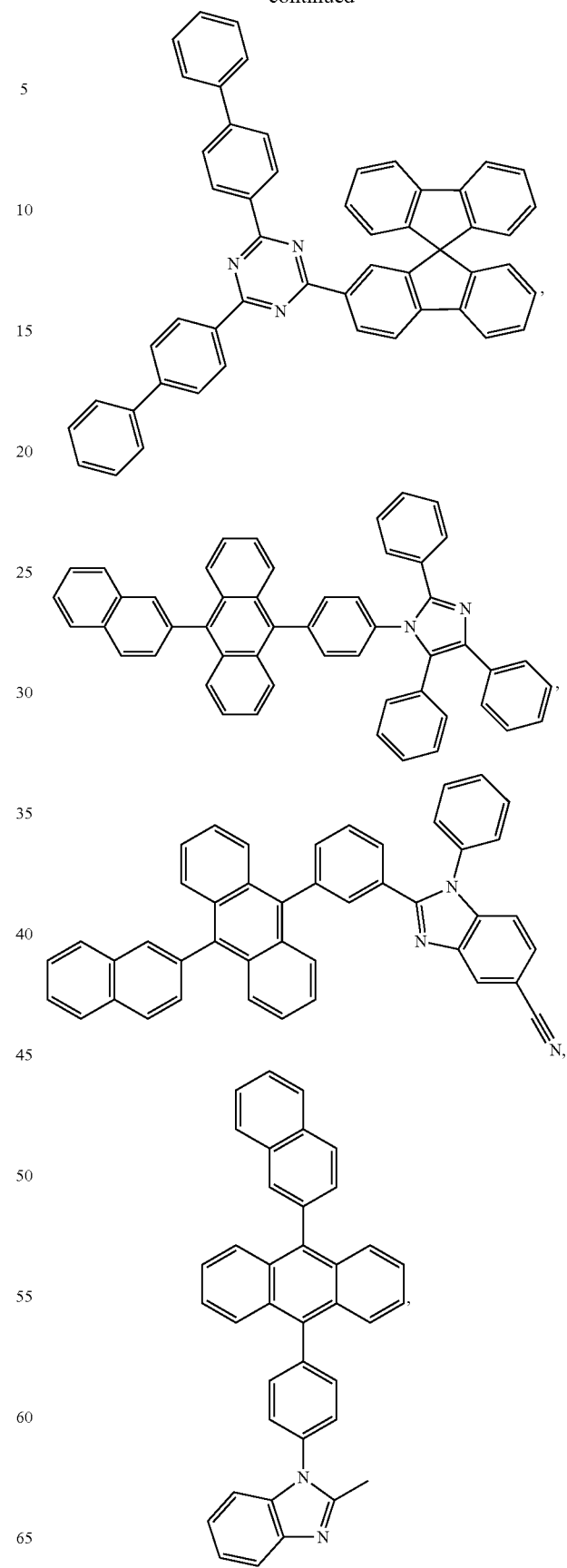

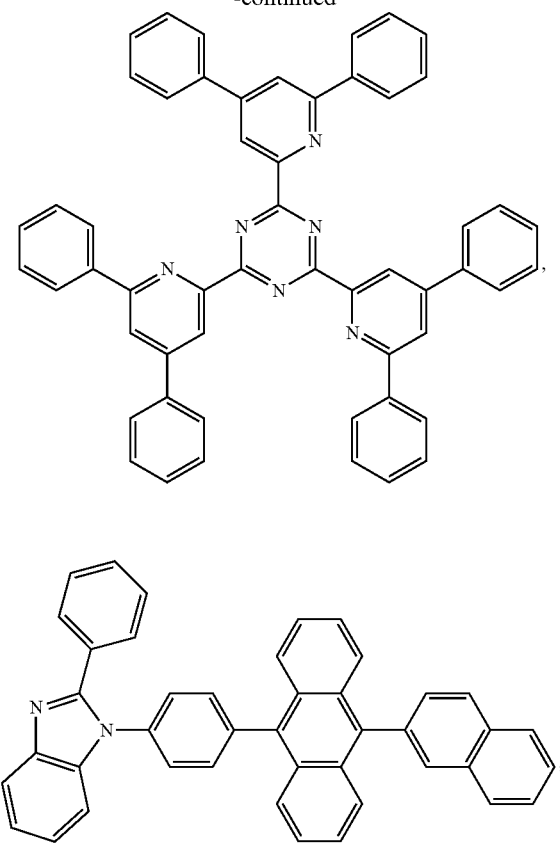

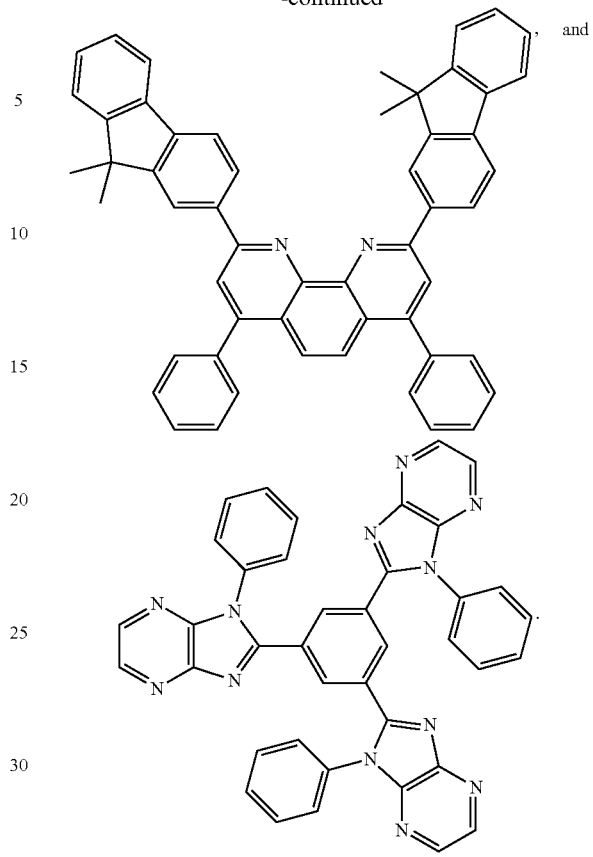

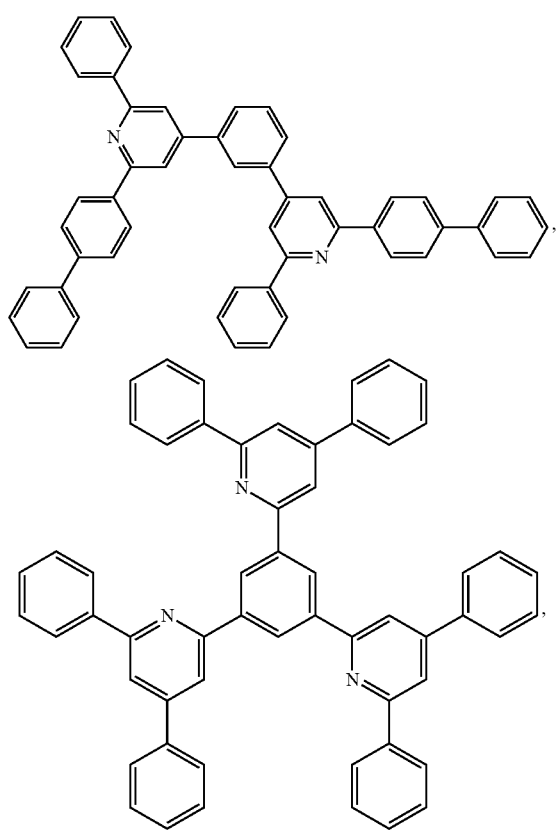

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:
1. A composition comprising, a mixture of a first compound and a second compound;
wherein the first compound has a structure of Formula I:

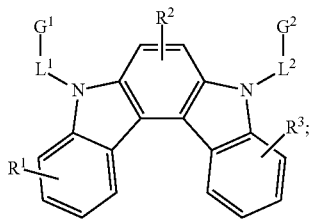

Formula I wherein the second compound has a structure of Formula II:

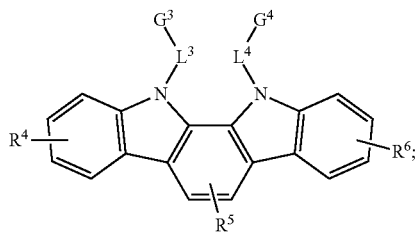

Formula II wherein $L^1$, $L^2$, $L^3$ and $L^4$ are each independently selected from the group consisting of direct bond, alkyl, alkenyl, alkynyl, aryl, heteroaryl, and combinations thereof;
wherein $G^1$ and $G^2$ are each independently selected from the group consisting of hydrogen, deuterium, halogen, alkyl, alkyloxy, cycloalkyl, cycloalkoxyl, silyl, amino, benzene, biphenyl, terphenyl, naphthalene, triphenylene, pyrene, anthracene, phenanthrene, fluoranthene, fluorene, dibenzofuran, dibenzothiophene, dibenzoselenophene, carbazole, and combinations thereof;
wherein $G^3$ is selected from the group consisting of pyridine, pyramidine, pyrazine, triazine, quinoline, isoquinoline, quinazoline, quinoxaline, benzimidazole, aza-triphenylene, phenanthroline, aza-pyrene, aza-anthracene, aza-fluorene, aza-dibenzofuran, aza-dibenzothiophene, aza-dibenzoselenophene, aza-carbazole, and combinations thereof;
wherein $G^4$ is selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;
wherein $G^3$ is optionally further substituted with substituent selected from the group consisting of hydrogen, deuterium, halogen, alkyl, alkyloxy, cycloalkyl, cycloalkoxyl, silyl, amino, cycloalkenyl, heteroalkenyl, alkynyl, aryl, heteroaryl and combinations thereof;
wherein $R^1$, $R^2$, $R^3$, $R^4$, $R^5$ and $R^6$ each independently represents mono to maximum allowable substitutions, or no substitution; and
wherein $R^1$, $R^2$, $R^3$, $R^4$, $R^5$ and $R^6$ are each independently selected from the group consisting of hydrogen, deuterium, halogen, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, and wherein any two adjacent substituents optionally join or fuse into a ring;
wherein (i) the first compound is selected from the group consisting of Specific First Compounds, (ii) the second compound is selected from the group consisting of Specific Second Compounds, or (iii) both;
wherein the Specific First Compounds are defined as the following compounds:

Compound HA2

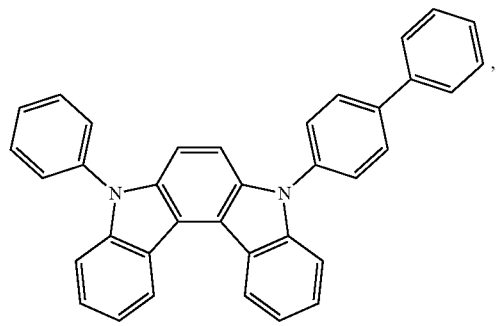

Compound HA3

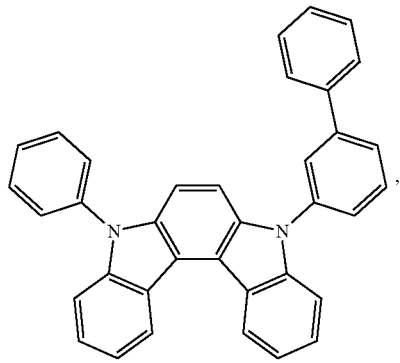

Compound HA4

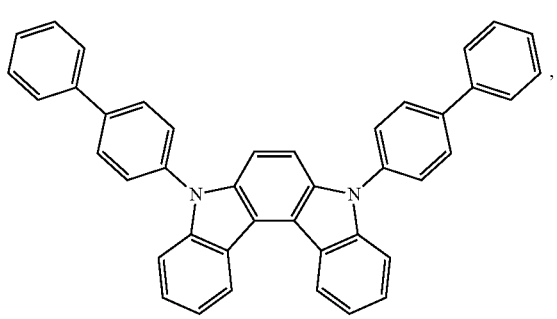

Compound HA5
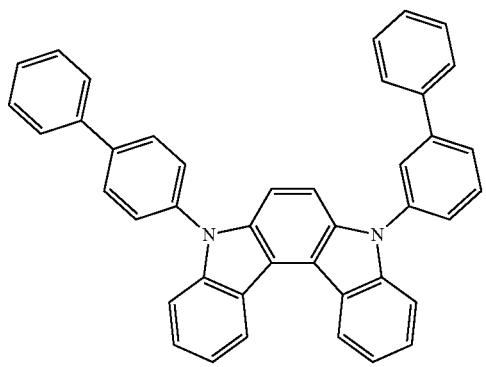
Compound HA6
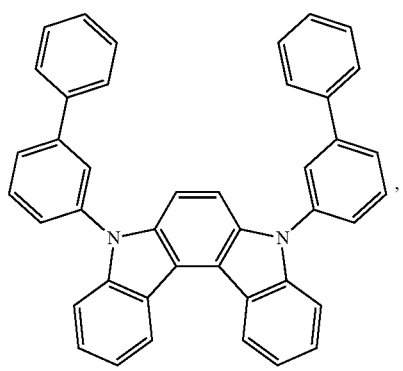
Compound HA7
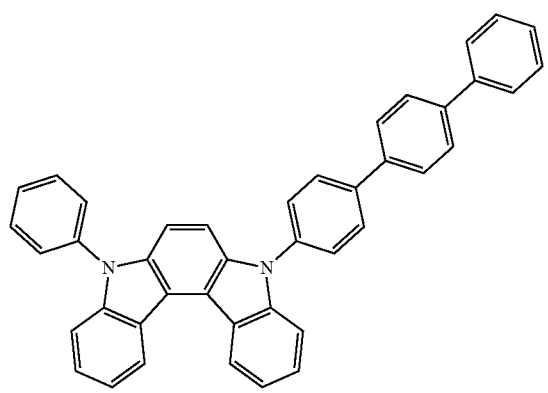
Compound HA8
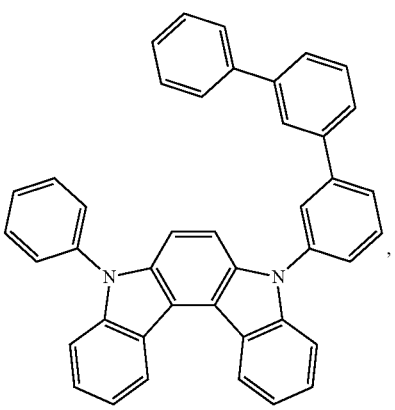
Compound HA9
Compound HA10
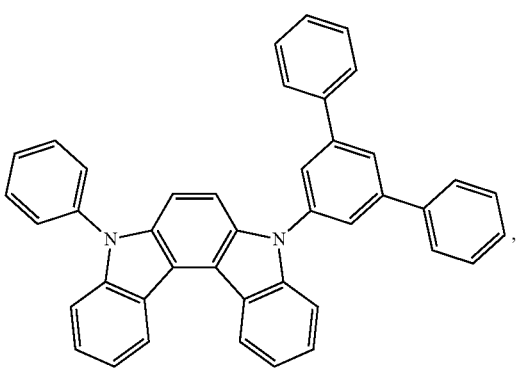

Compound HA11
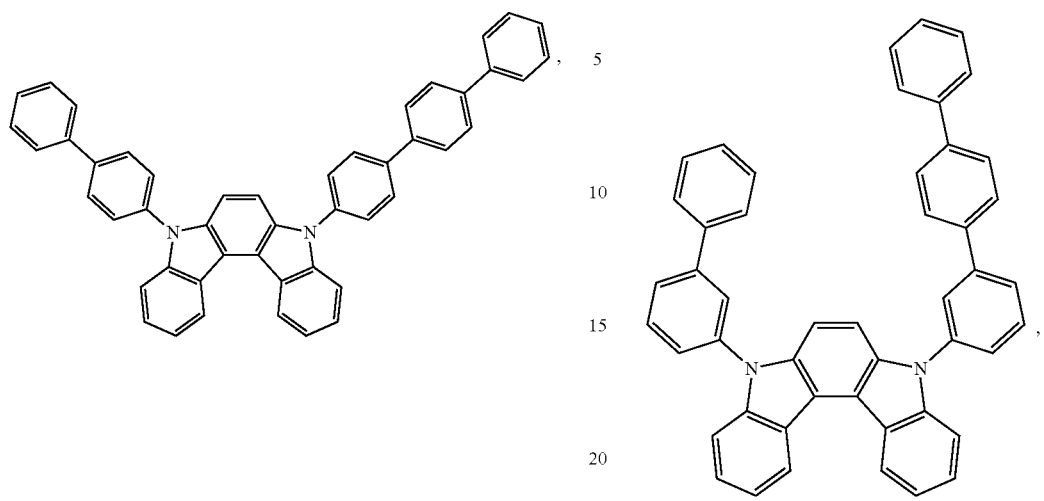
Compound HA14
Compound HA12
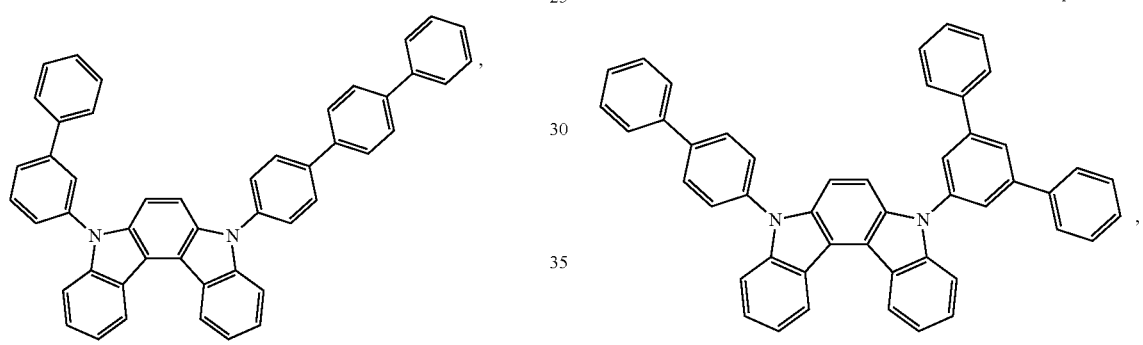
Compound HA15
Compound HA16
Compound HA13
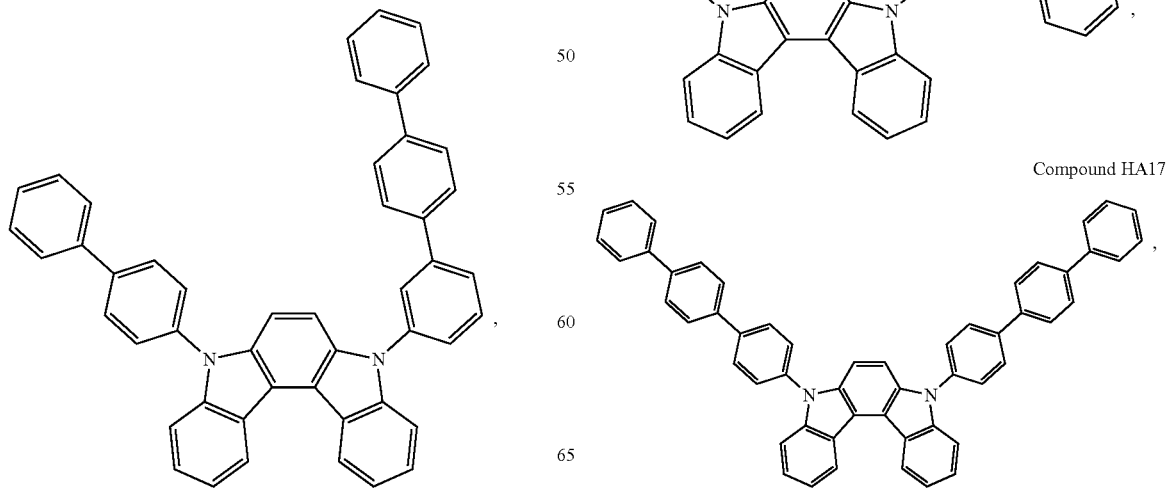
Compound HA17

Compound HA18
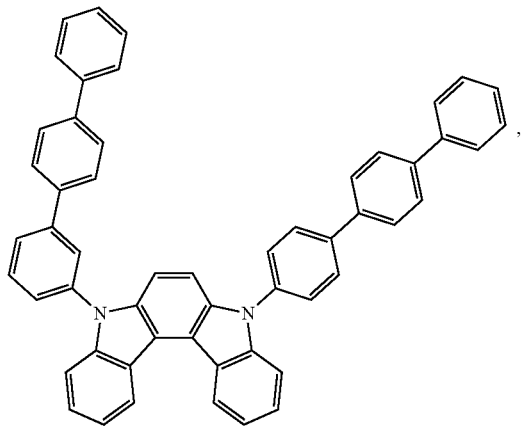
Compound HA19
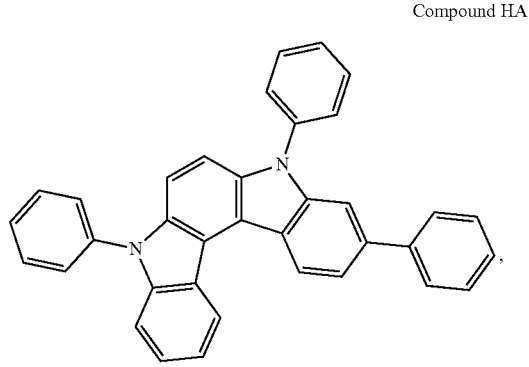
Compound HA20
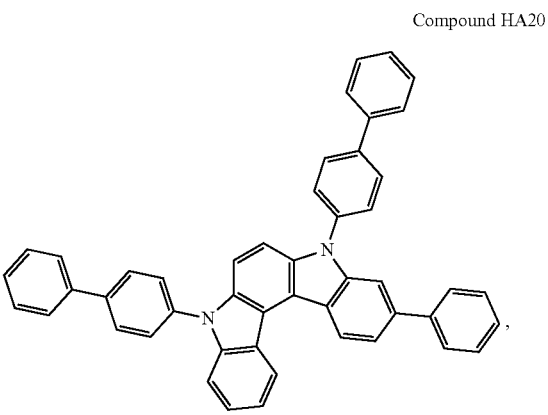
Compound HA21
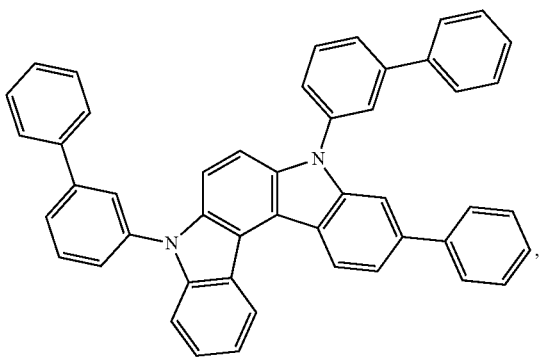
Compound HA22
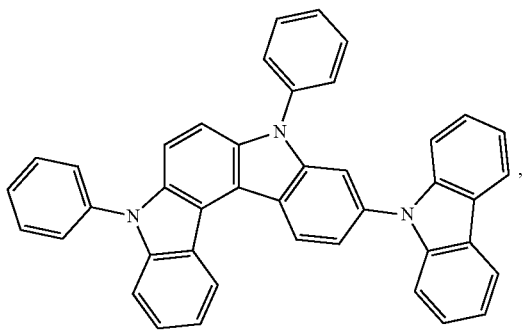
Compound HA23
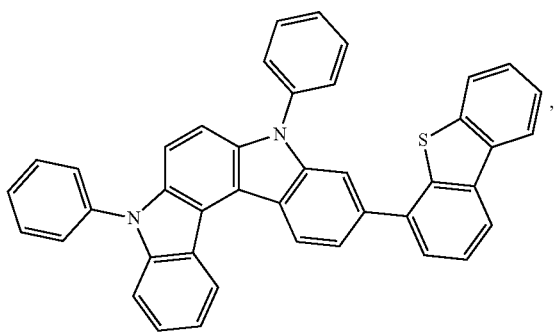
Compound HA24
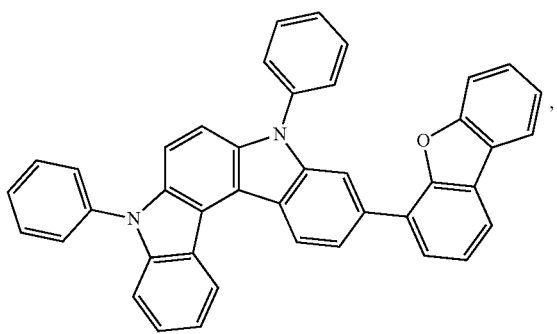
Compound HA25
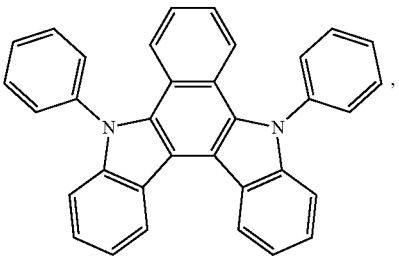

Compound HA26

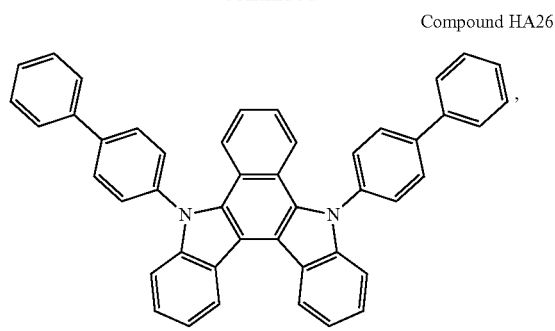

Compound HA27

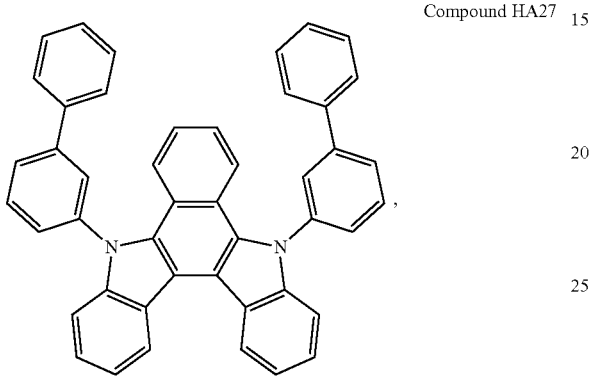

Compound HA28

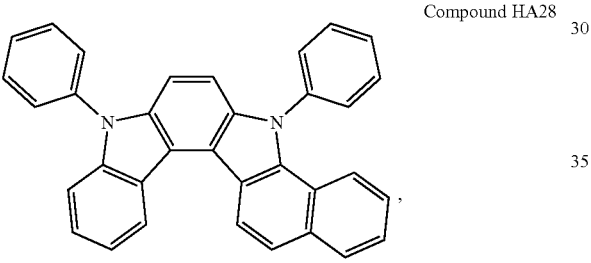

Compound HA29

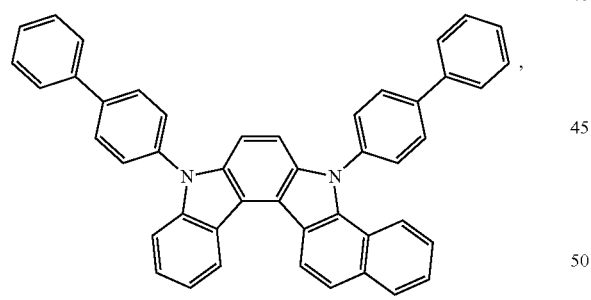

Compound HA30

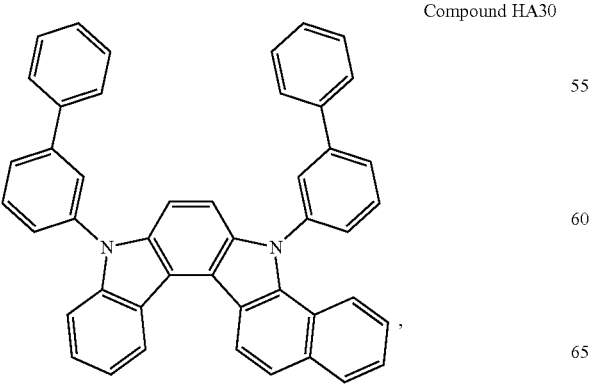

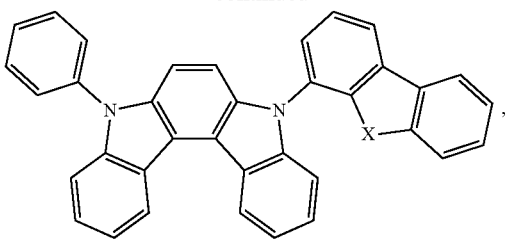

Compound HB1, wherein X is O;
Compound HB2, wherein X is S;
Compound HB3, wherein X is Se

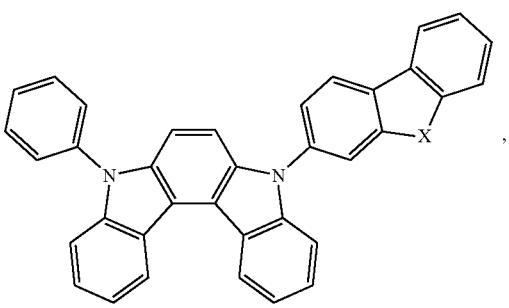

Compound HB4, wherein X is O;
Compound HB5, wherein X is S;
Compound HB6, wherein X is Se

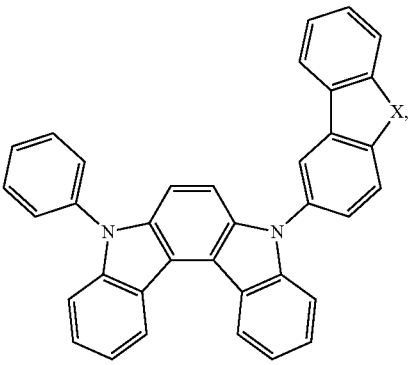

Compound HB7, wherein X is O;
Compound HB8, wherein X is S;
Compound HB9, wherein X is Se

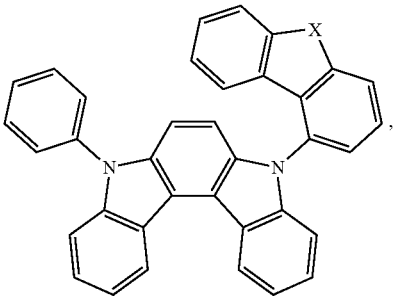

Compound HB10, wherein X is O;
Compound HB11, wherein X is S;
Compound HB12, wherein X is Se

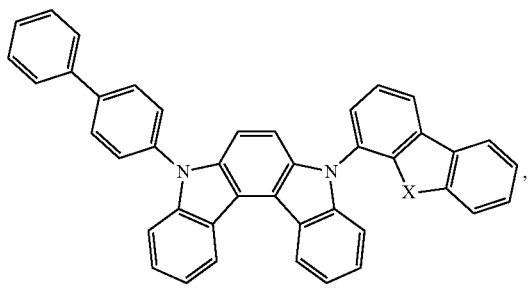

Compound HB13, wherein X is O;
Compound HB14, wherein X is S;
Compound HB15, wherein X is Se

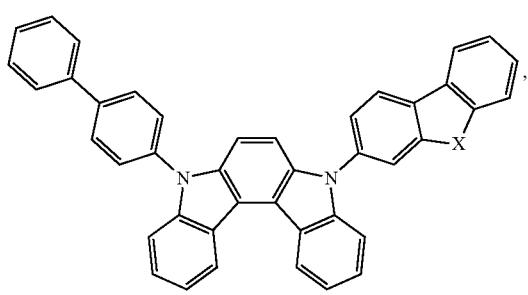

Compound HB16, wherein X is O;
Compound HB17, wherein X is S;
Compound HB18, wherein X is Se

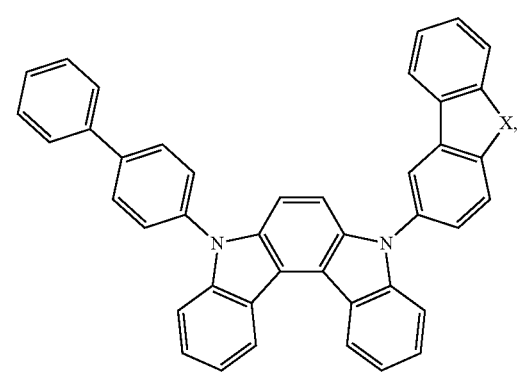

Compound HB19, wherein X is O;
Compound HB20, wherein X is S;
Compound HB21, wherein X is Se

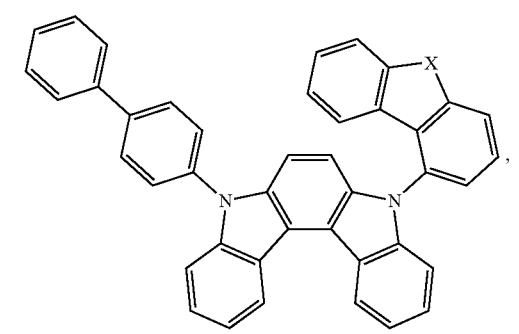

Compound HB22, wherein X is O;
Compound HB23, wherein X is S;
Compound HB24, wherein X is Se

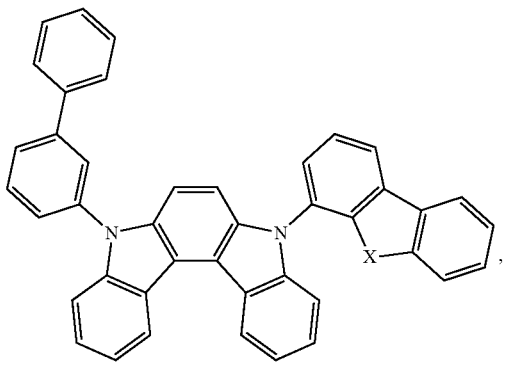

Compound HB25, wherein X is O;
Compound HB26, wherein X is S;
Compound HB27, wherein X is Se

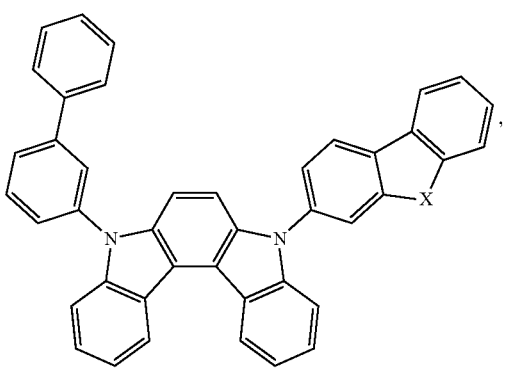

Compound HB28, wherein X is O;
Compound HB29, wherein X is S;
Compound HB30, wherein X is Se

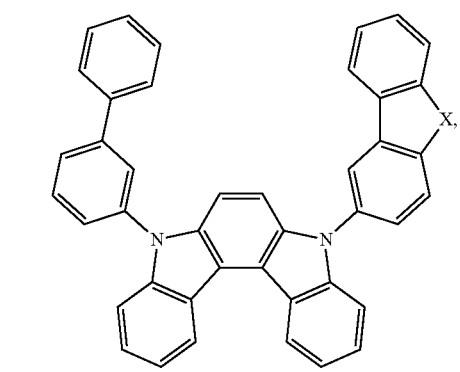

Compound HB31, wherein X is O;
Compound HB32, wherein X is S;
Compound HB33, wherein X is Se -continued

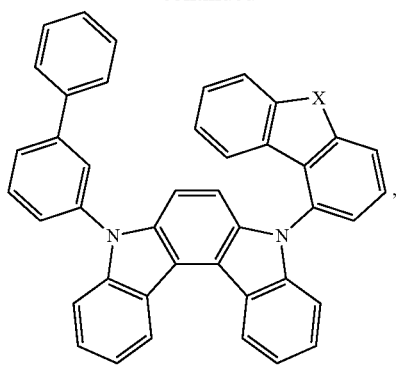

Compound HB34, wherein X is O;
Compound HB35, wherein X is S;
Compound HB36, wherein X is Se

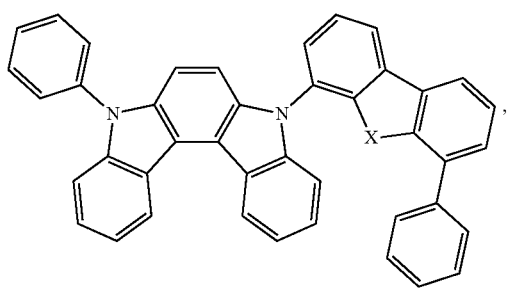

Compound HB37, wherein X is O;
Compound HB38, wherein X is S;
Compound HB39, wherein X is Se

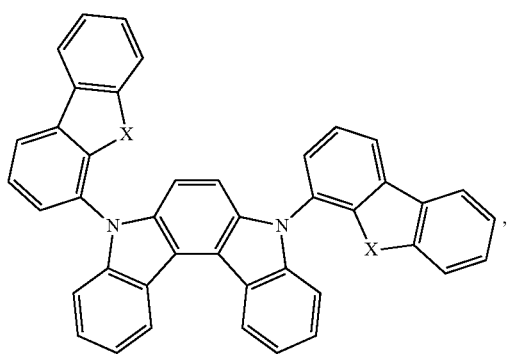

Compound HB40, wherein X is O;
Compound HB41, wherein X is S;
Compound HB42, wherein X is Se

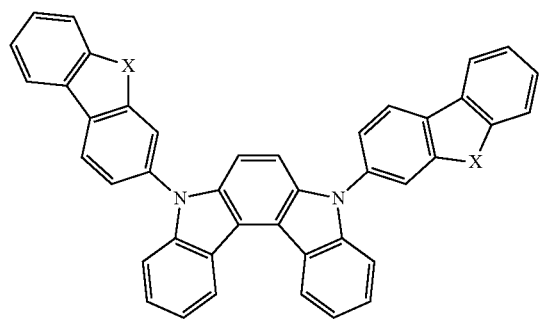

Compound HB43, wherein X is O;
Compound HB44, wherein X is S;
Compound HB45, wherein X is Se -continued Compound HC1

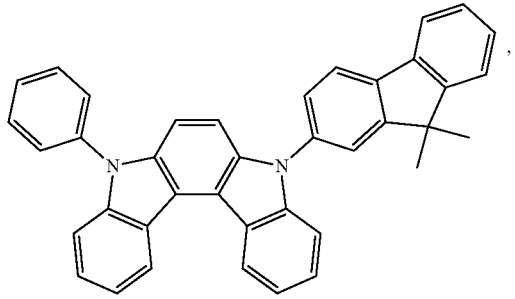

Compound HC2

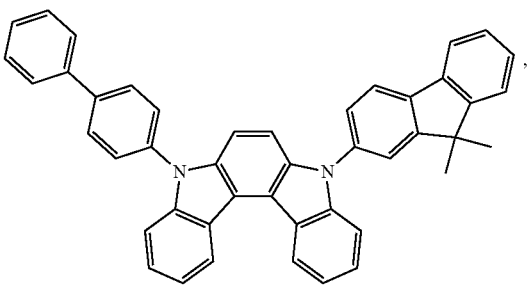

Compound HC3

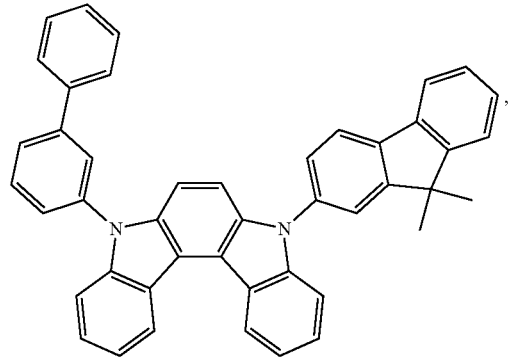

Compound HC4

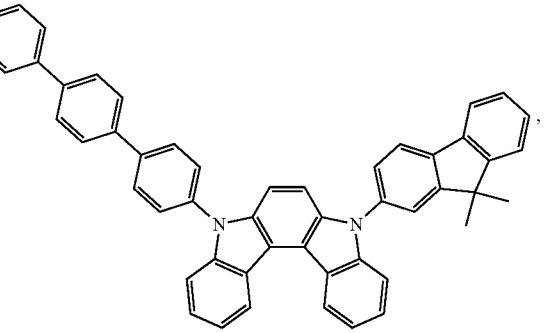

Compound HC5
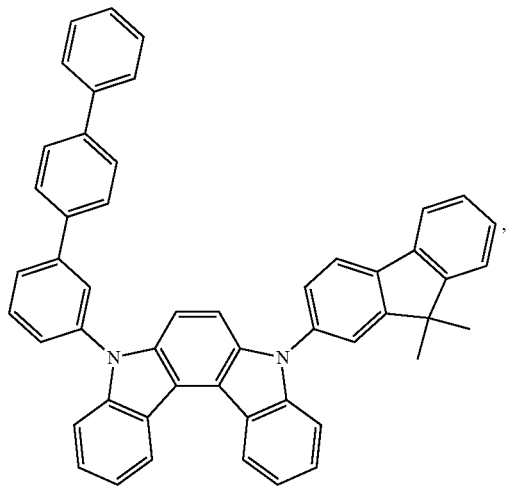
Compounds HC6
Compounds HC7
Compounds HC8
Compounds HC9
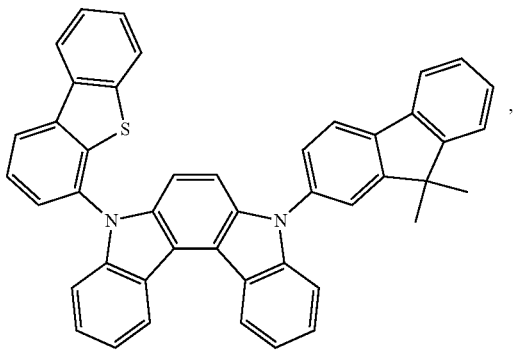
Compound HC10
Compound HC11
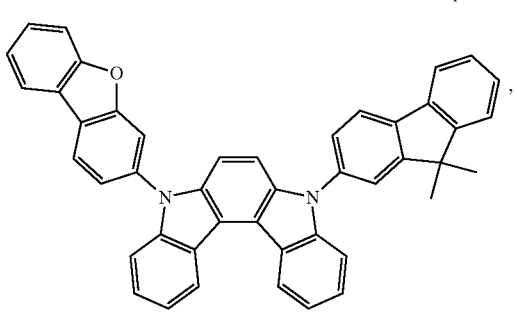
Compound HC12
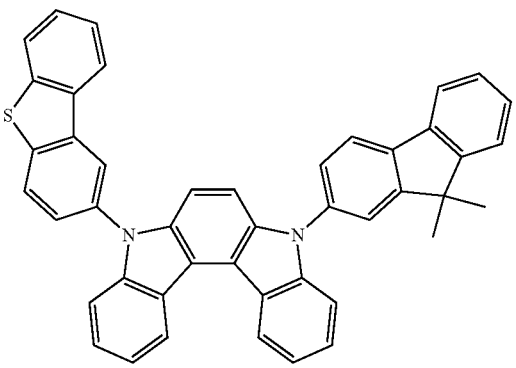

-continued
Compound HD1
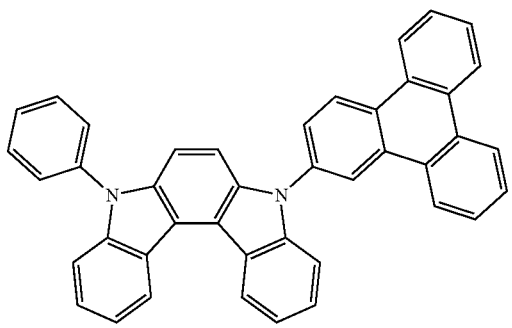
Compound HD2
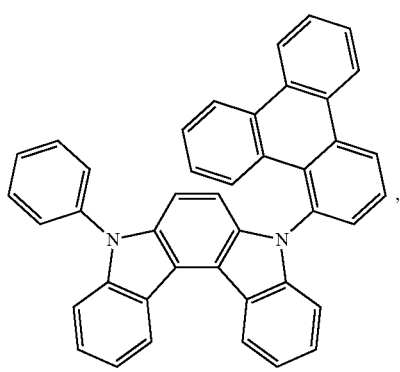
Compound HD3
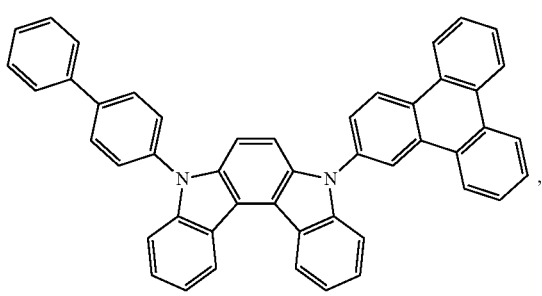
Compound HD4
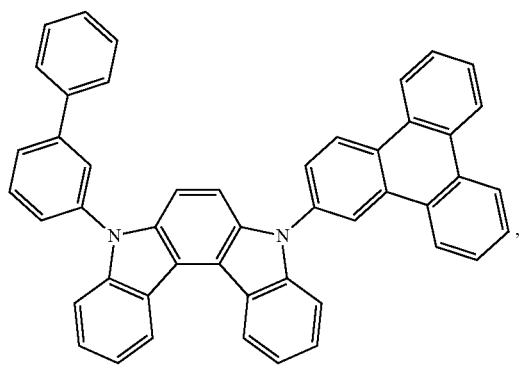
-continued
Compound HD5
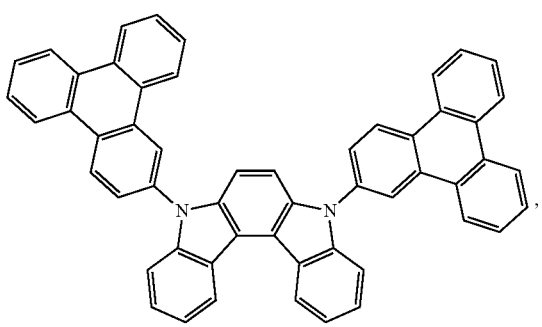
Compound HD6
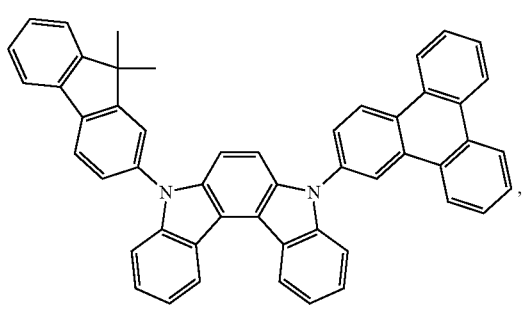
Compound HD7
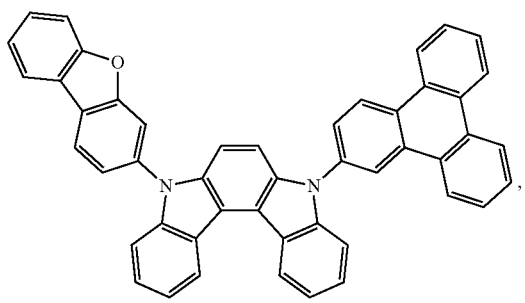
Compound HD8
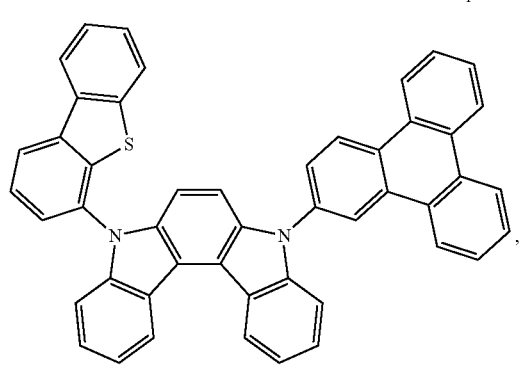

-continued
Compound HD9
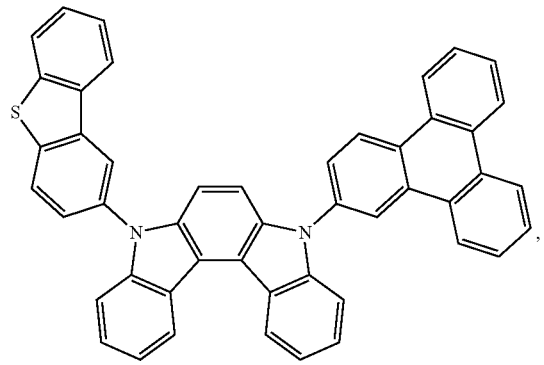
Compound HE1
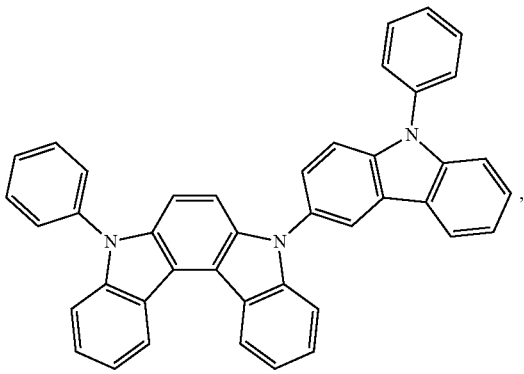
Compound HE4
Compound HE2
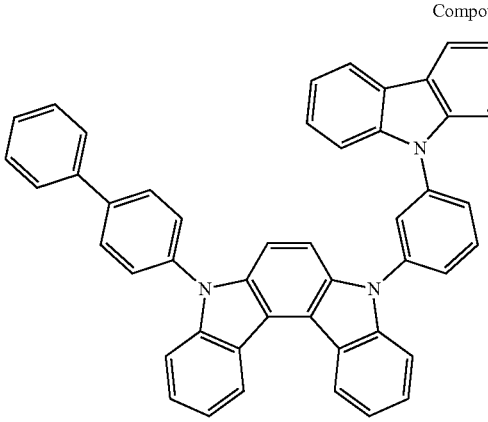
Compound HE5
Compound HE3
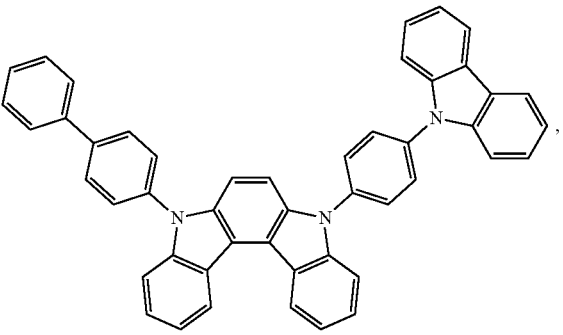
Compound HE6
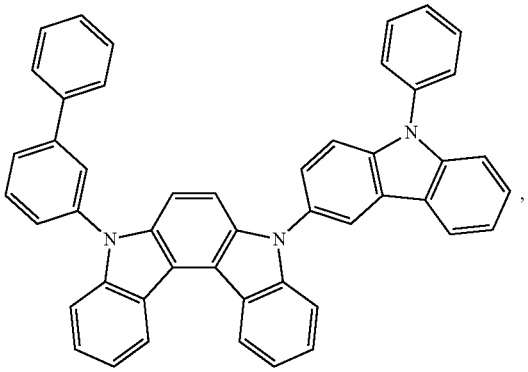
Compound HE7

Compound HE8
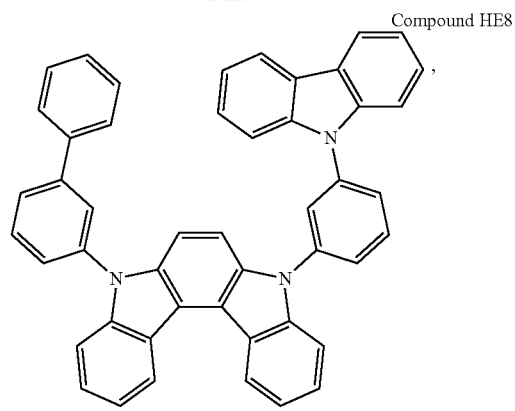
Compound HE9
Compound HE10
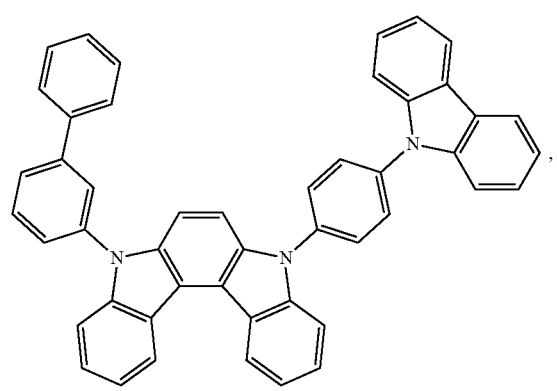
Compound HE11
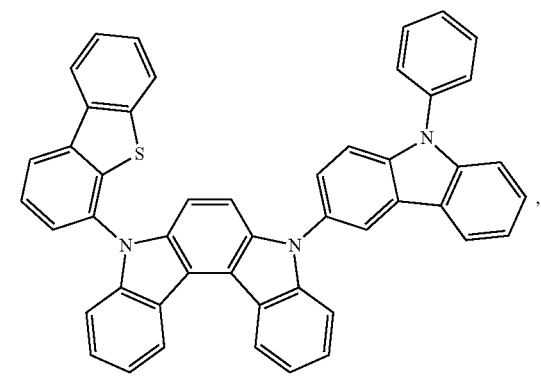
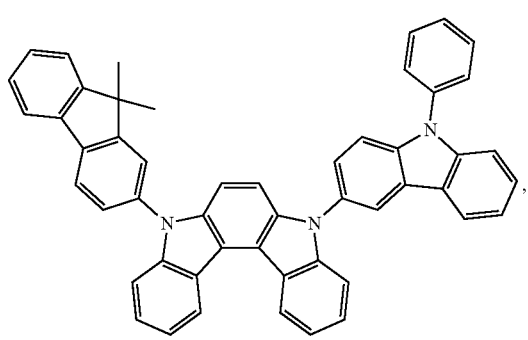
Compound HE12
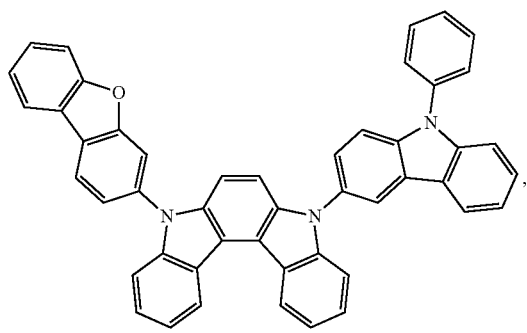
Compound HE13
Compound HE14
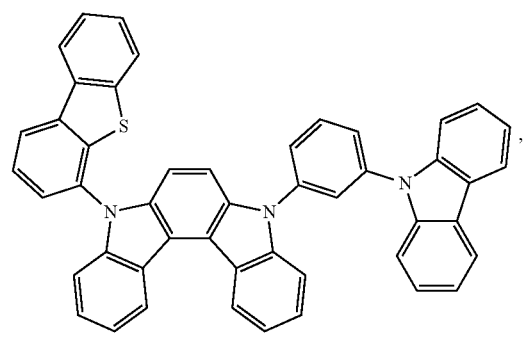
Compound HE15
Compound HF1

Compound HF2
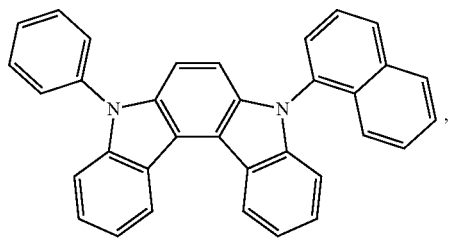
Compound HF3
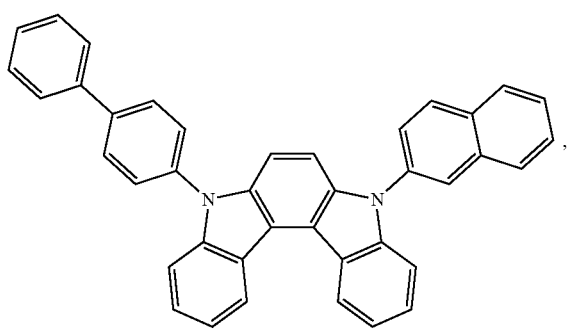
Compound HF4
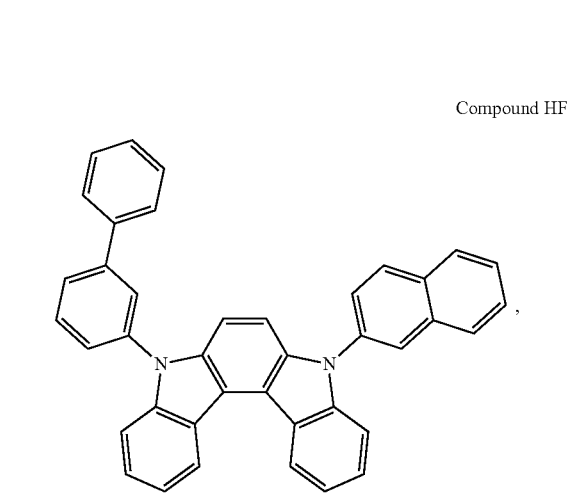
Compound HF5
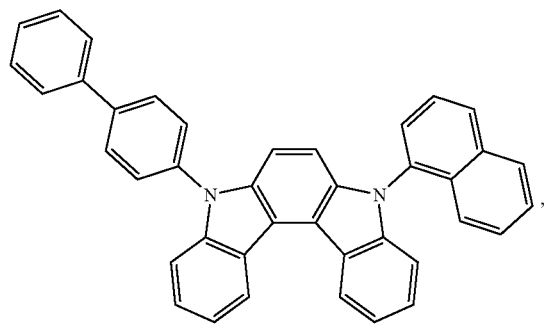
Compound HF6
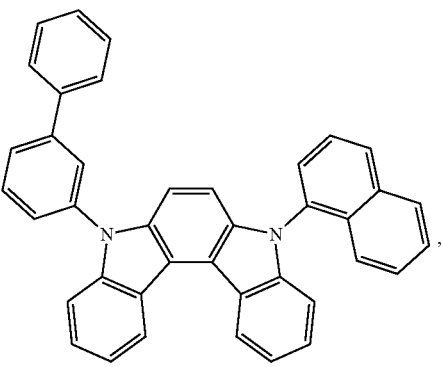
Compound HF7
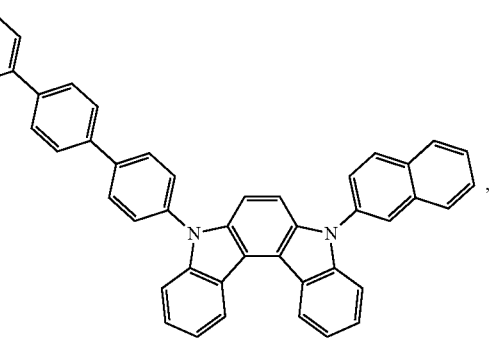
Compound HF8
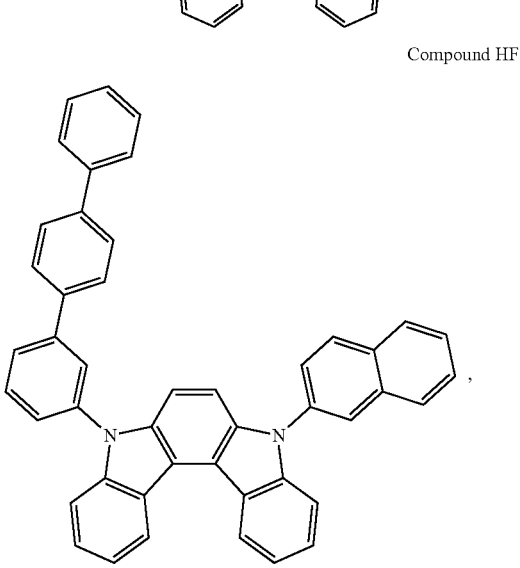
Compound HF9
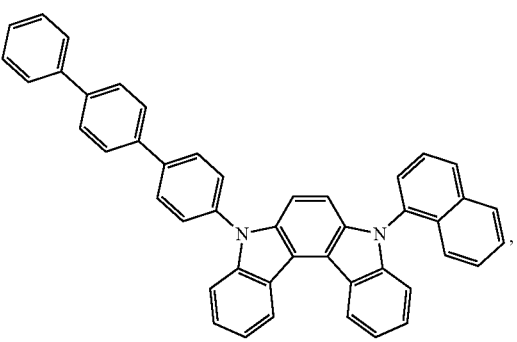

Compound HF10
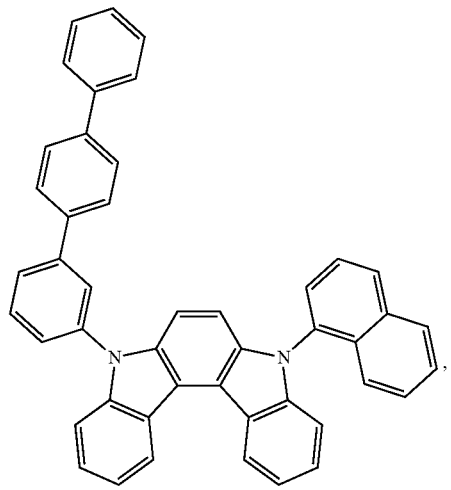
Compound HF11
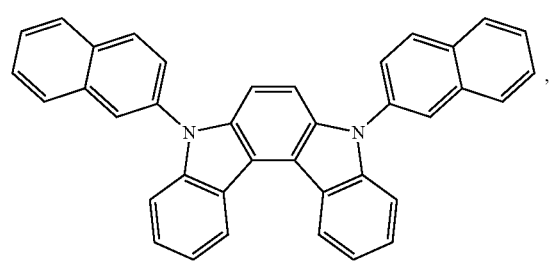
Compound HF12
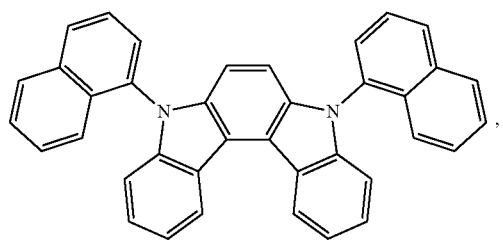
Compound HF13
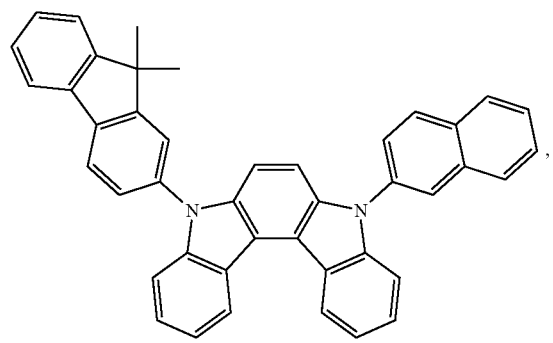
Compound HF14
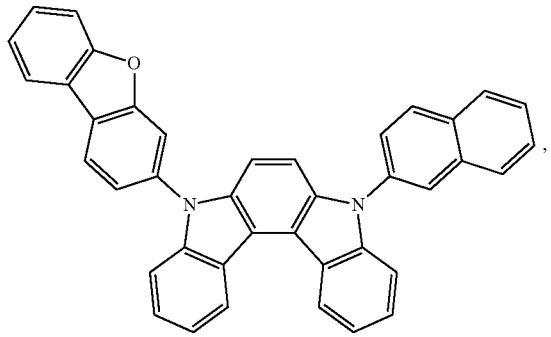
Compound HF15
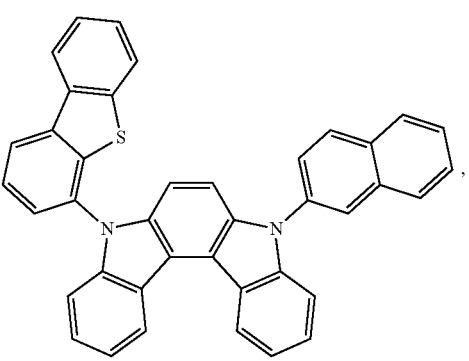
Compound HF16
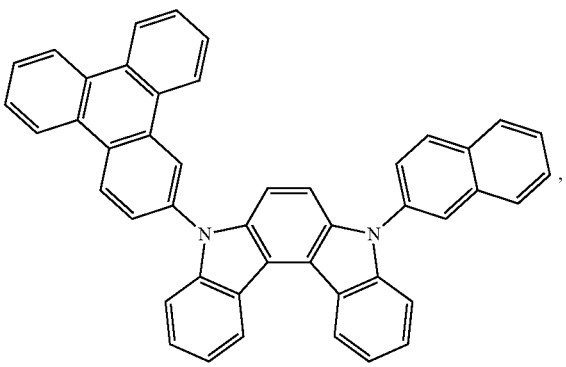
Compound HF17
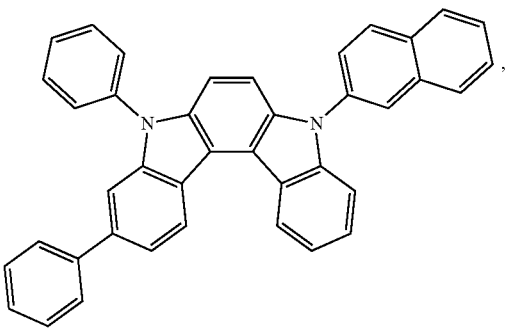

Compound HF18
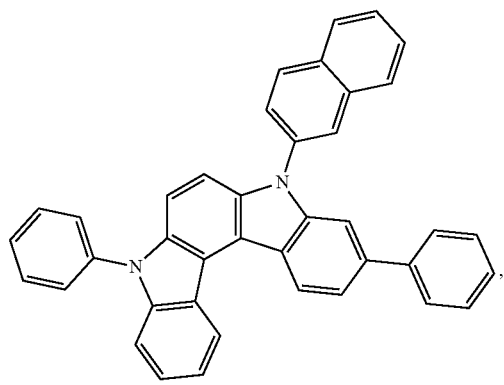
Compound HF19
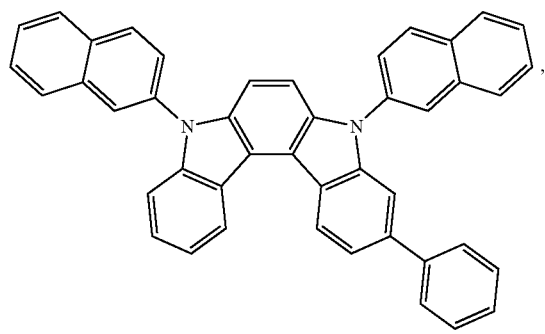
Compound HF20
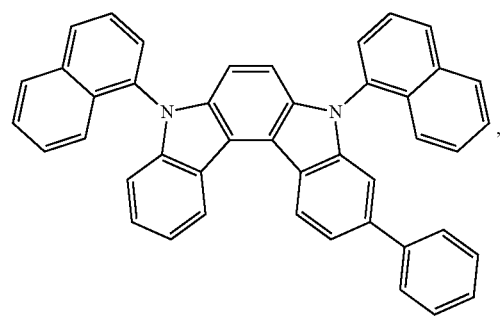
Compound HF20
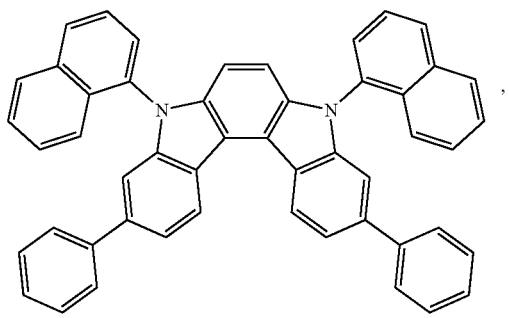
Compound HG1
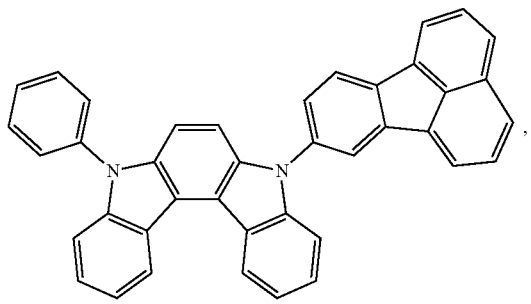
Compound HG2
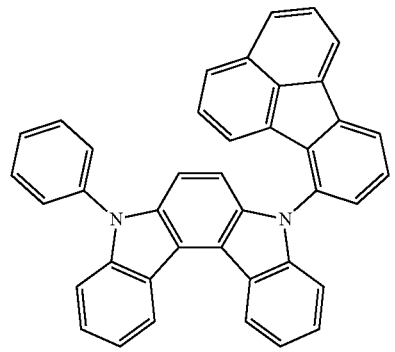
Compound HG3
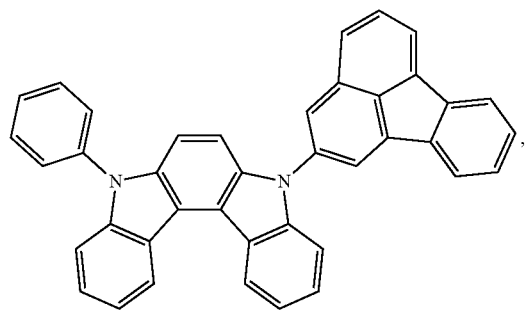
Compound HG4
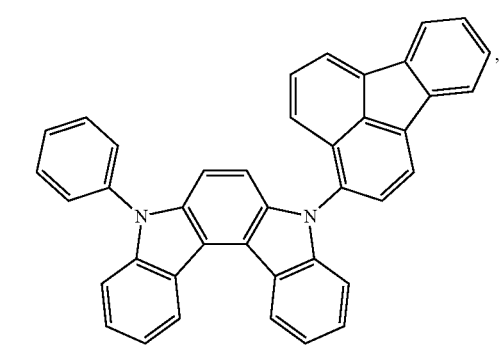
Compound HG5
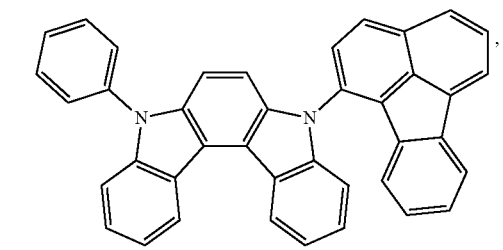

-continued
Compound HG6
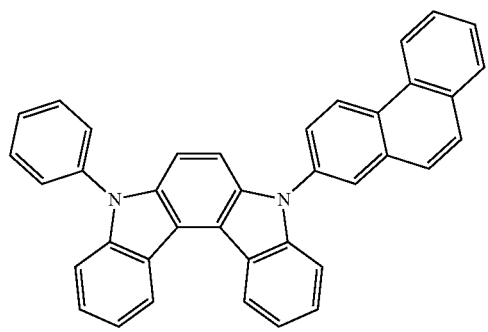
Compound HG7
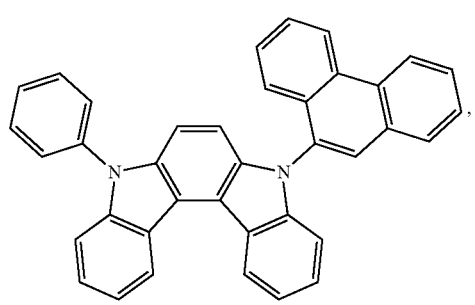
Compound HG8
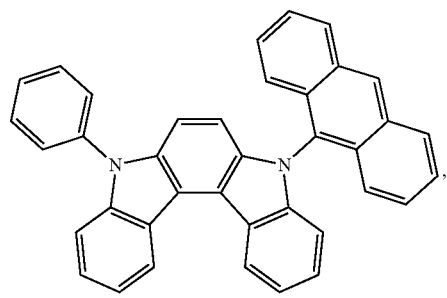
Compound HG9
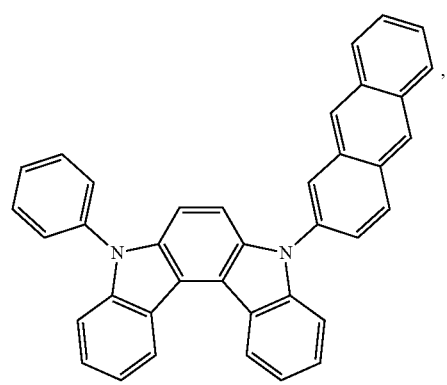
-continued
Compound HG10
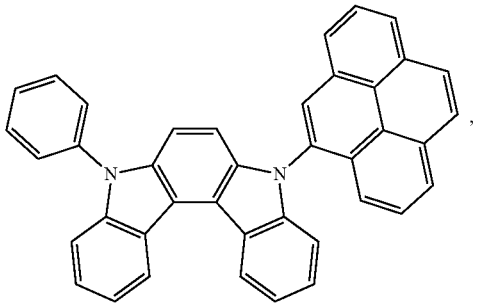
Compound HG11
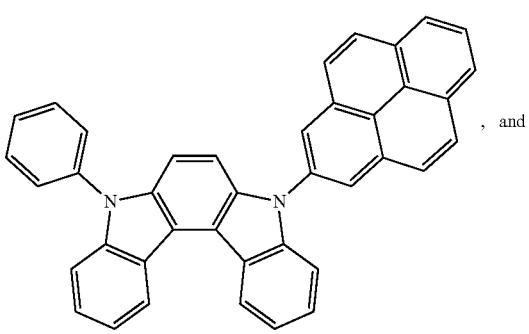
, and
Compound HG12
, and
the Specific Second Compounds are defined as the following commpounds:
Compound EA1
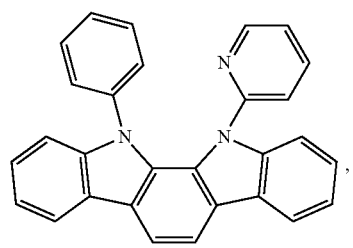

-continued
Compound EA2
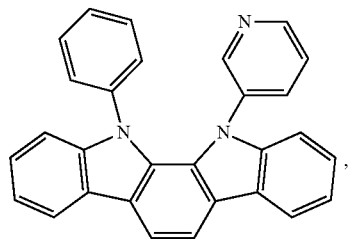
Compound EA3
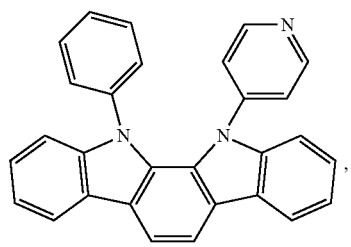
Compound EA4
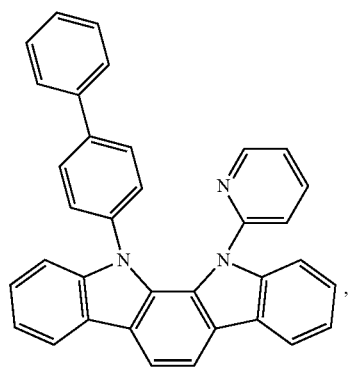
Compound EA5
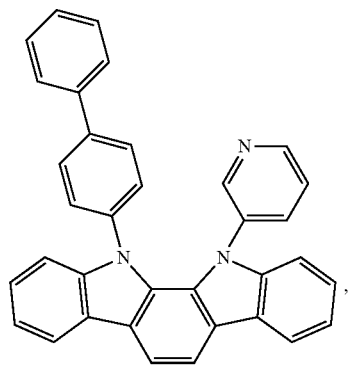
-continued
Compound EA6
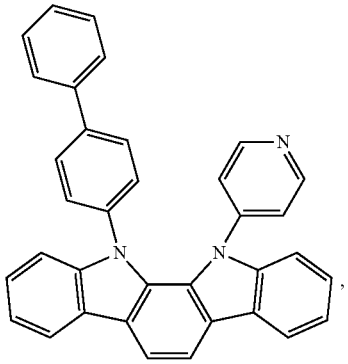
Compound EA7
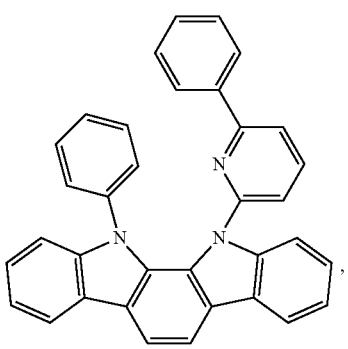
Compound EA8
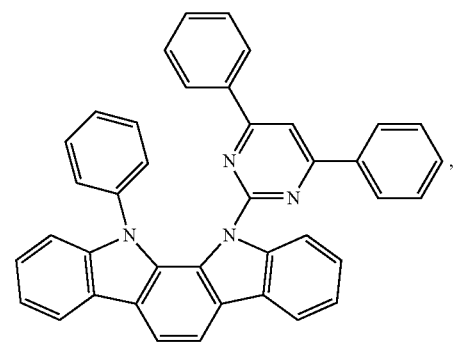
Compound EA9
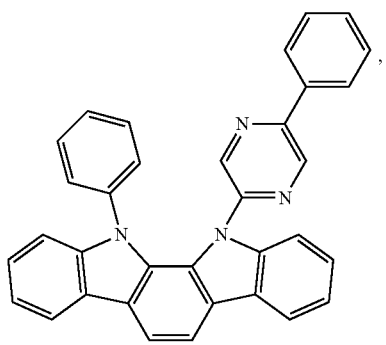

Compound EA10
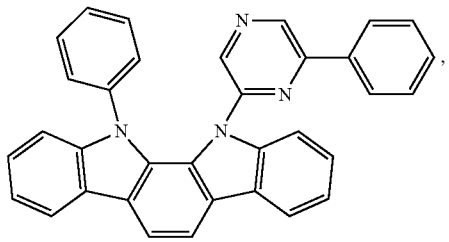
Compound EA11
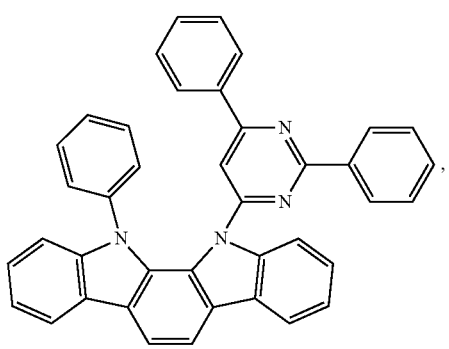
Compound EA12
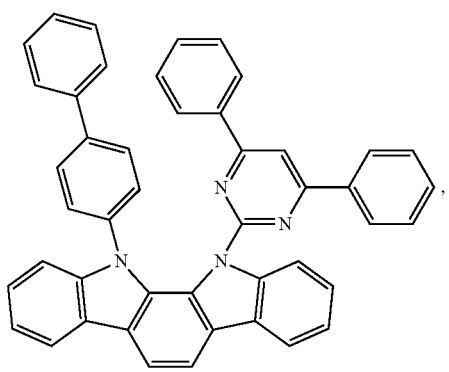
Compound EB2
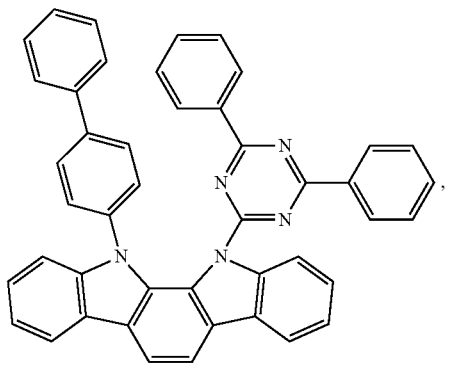
Compound EB3
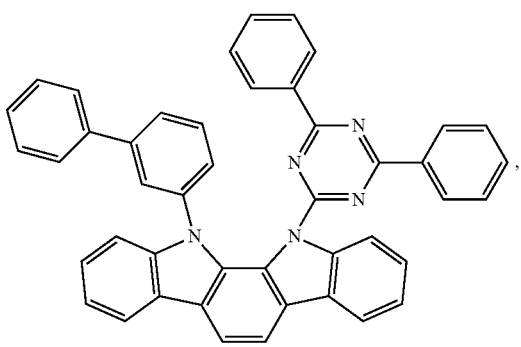
Compound EB4
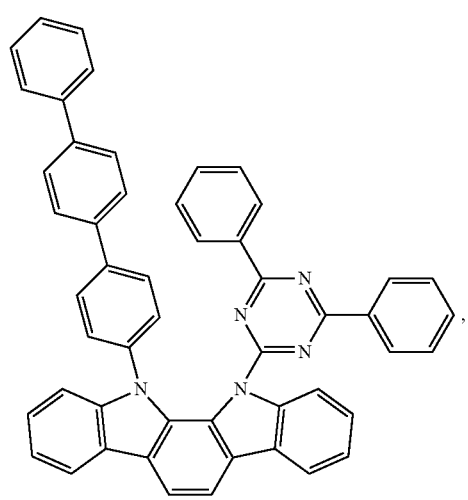
Compound EB5
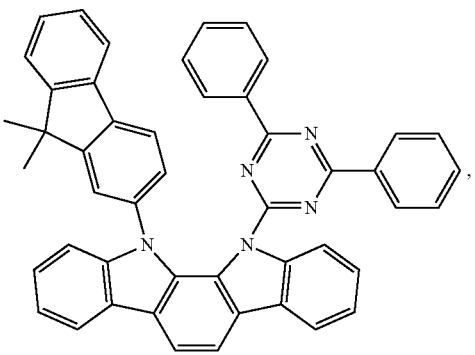
Compound EB6
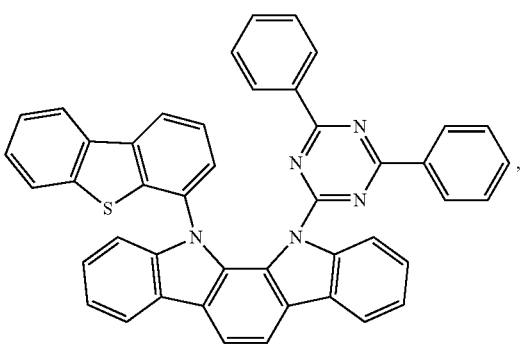

Compound EB7
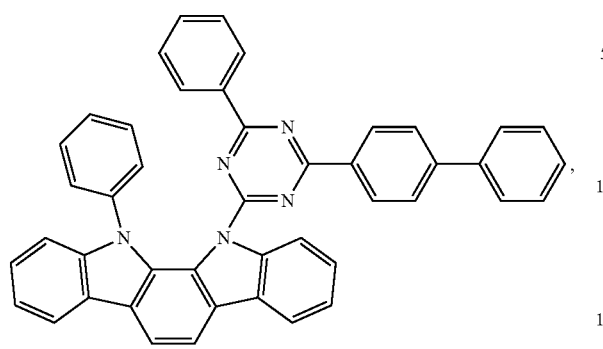
Compound EB8
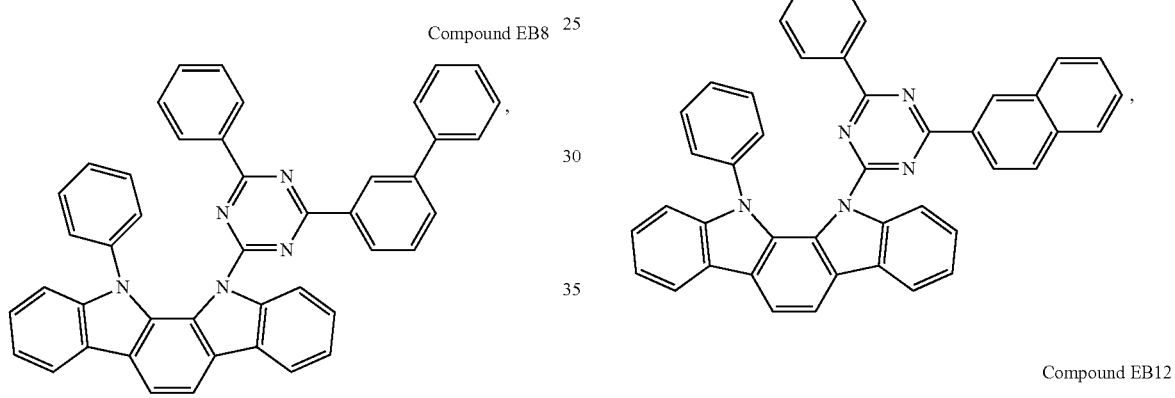
Compound EB9
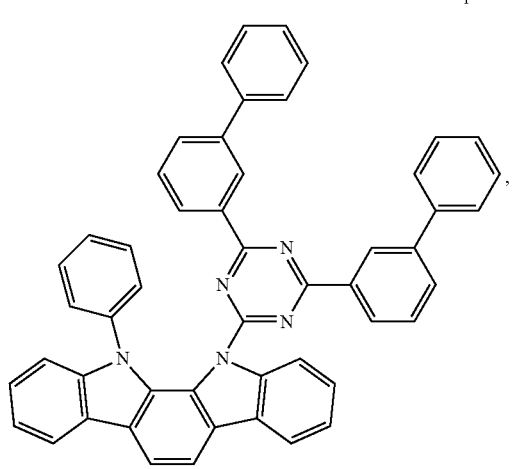
Compound EB10
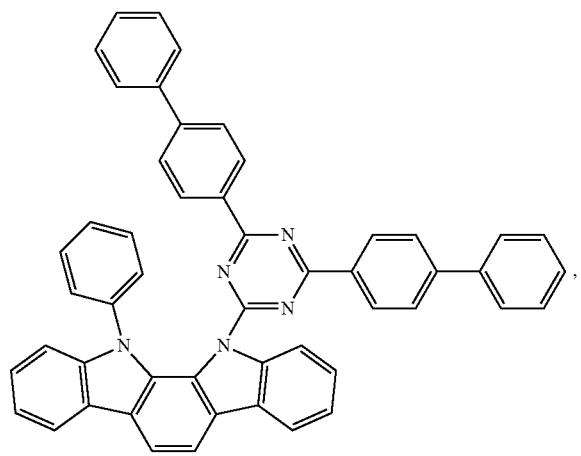
Compound EB11
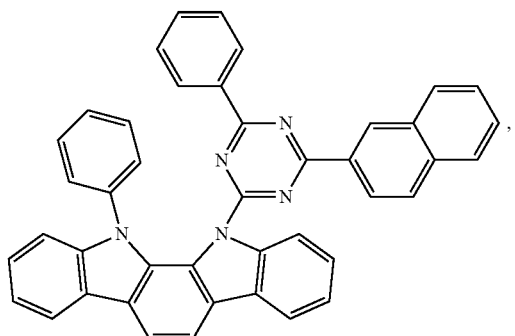
Compound EB12
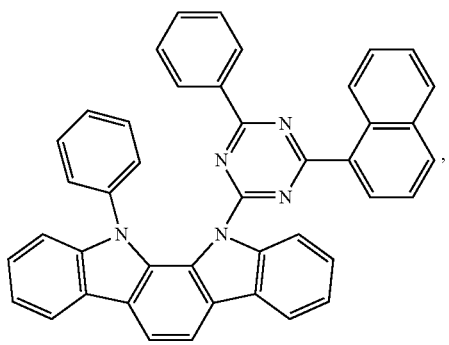
Compound EB13
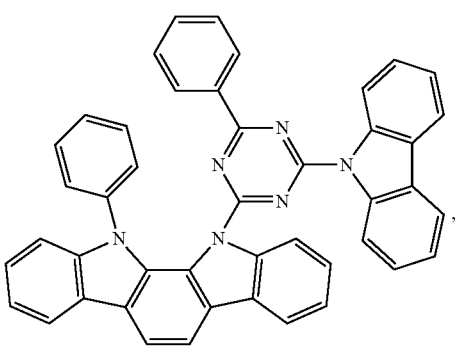

-continued
Compound EB14
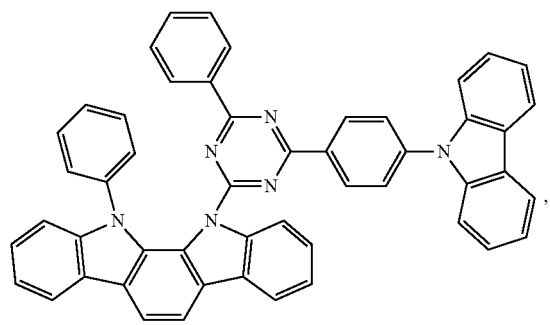
Compound EB15
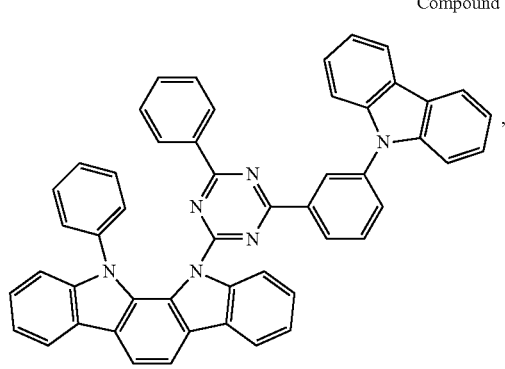
Compound EB16
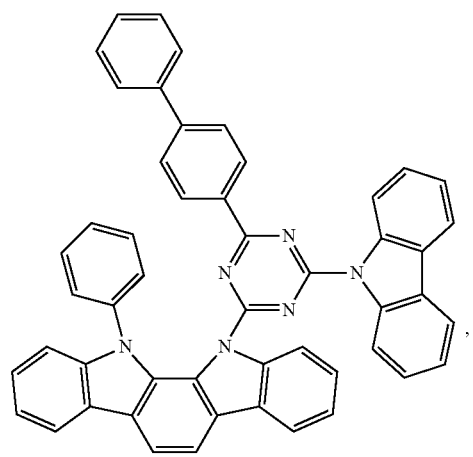
Compound EB17
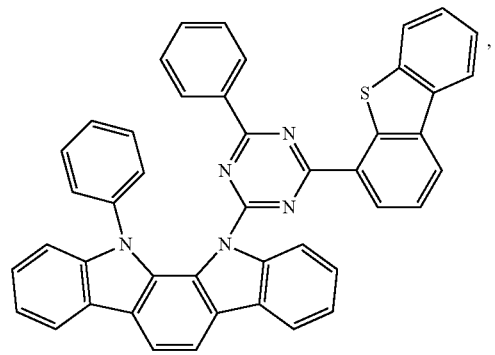
-continued
Compound EB18
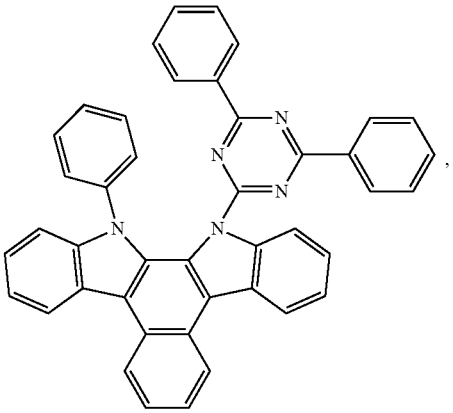
Compound EB19
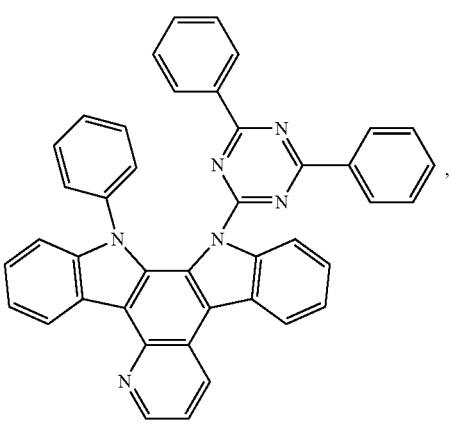
Compound EB20
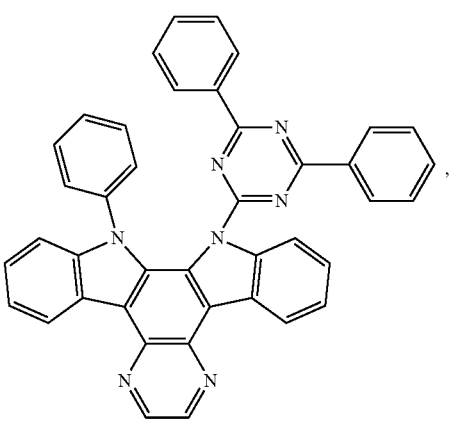

Compound EB21
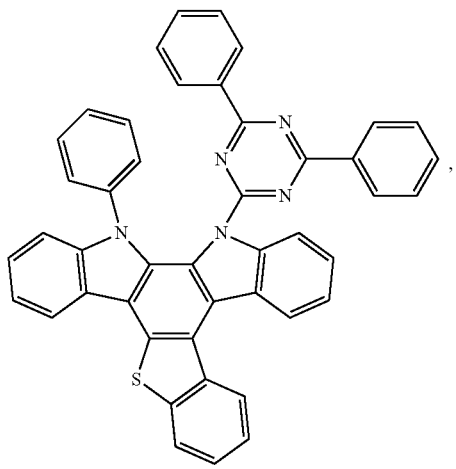
Compound EC1
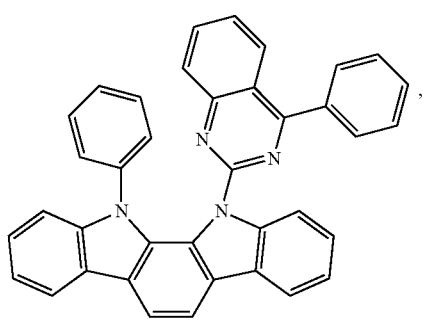
Compound EC2
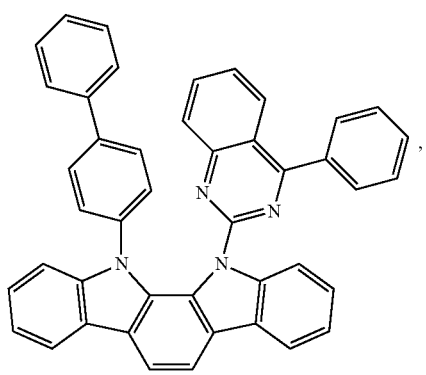
Compound EC3
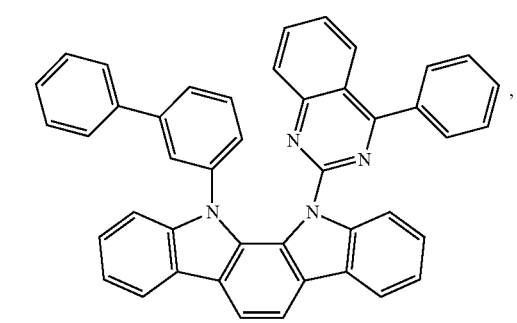
Compound EC4
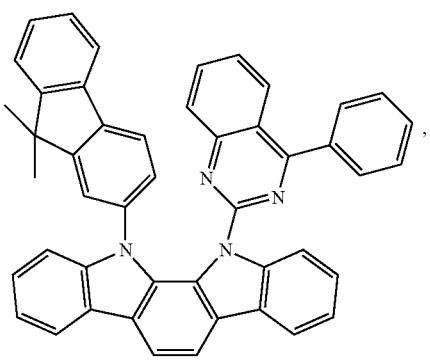
Compound EC5
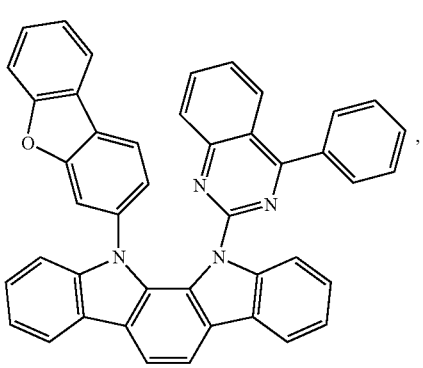
Compound EC6
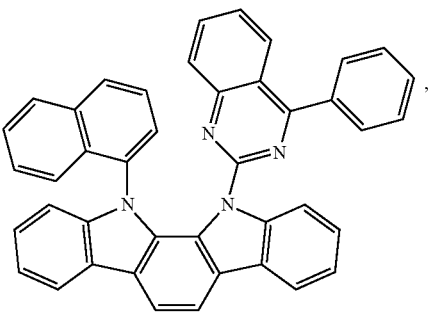
Compound EC7

Compound EC8
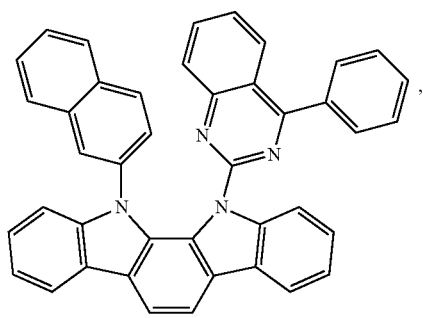
Compound EC9
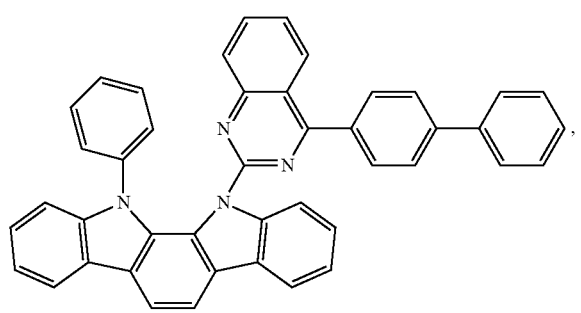
Compound EC10
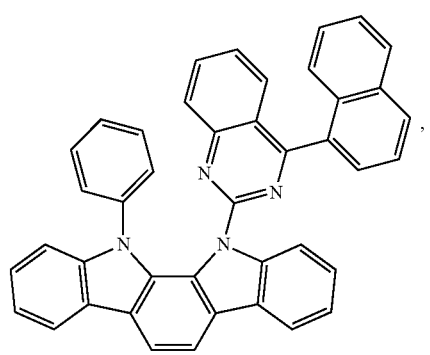
Compound EC11
Compound EC12
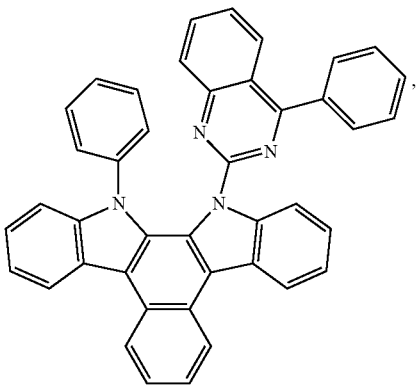
Compound EC13
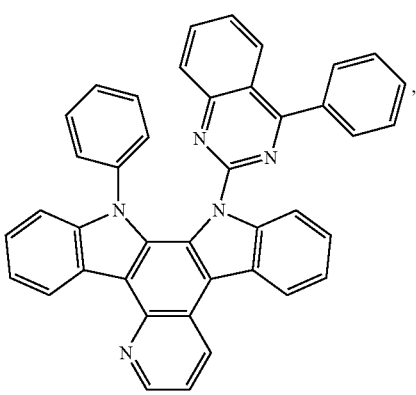
Compound EC14
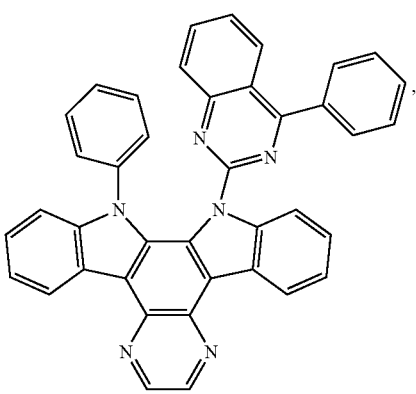

Compound EC15

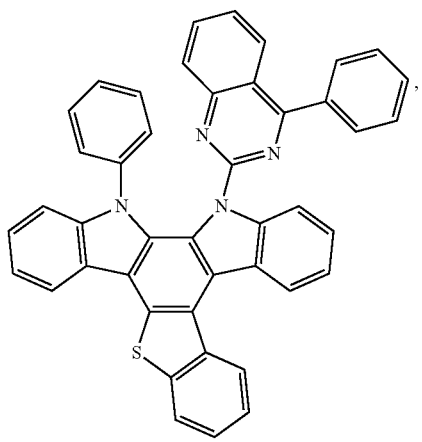

Compound EC16

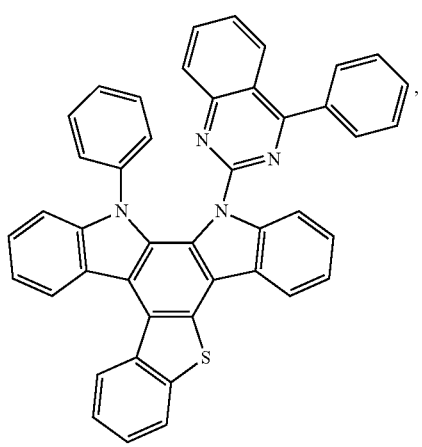

Compound EC17

Compound EC18

Compounds ED1 through ED2 having the following structure,

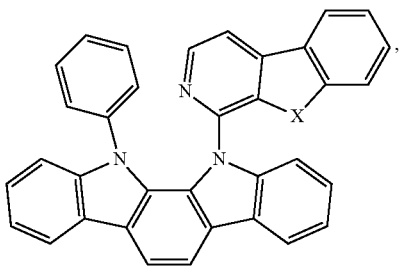

wherein in Compound ED1, X is O;
in Compound ED2, X is S;
in Compound ED3, X is Se Compounds ED4 through ED6 having the following structure,

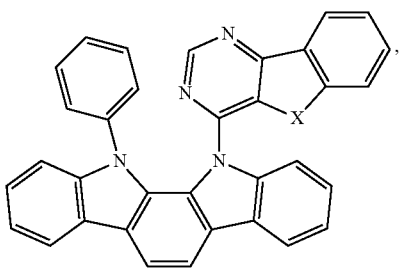

wherein, in Compound ED4, X is O;
in Compound ED5, X is S;
in Compound ED6, X is Se Compounds ED7 through ED9 having the following structure,

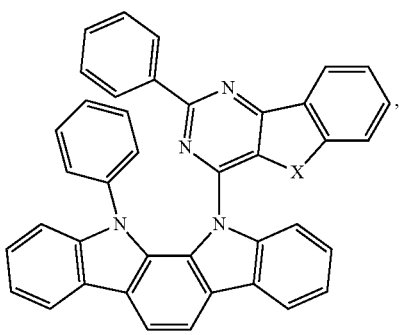

wherein, in Compound ED7, X is O;
in Compound ED8, X is S;
in Compound ED9, X is Se -continued Compounds ED10 through ED12 having the following structure,

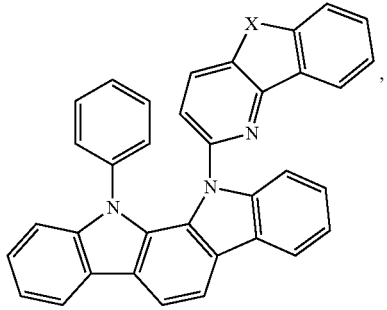

wherein in Compound ED10, X is O;
in Compound ED11, X is S;
in Compound ED12, X is Se Compounds ED13 through ED15 having the following structure,

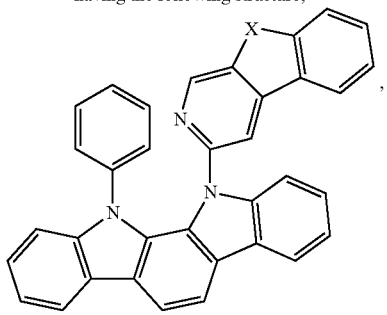

wherein in Compound ED13, X is O;
in Compound ED14, X is S;
in Compound ED15, X is Se Compounds ED16 through ED18 having the following structure,

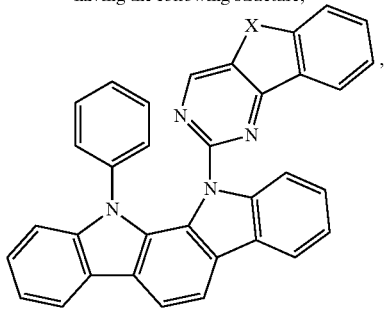

wherein in Compound ED16, X is O;
in Compound ED17, X is S;
in Compound ED18, X is Se -continued Compounds ED19 through ED21 having the following structure,

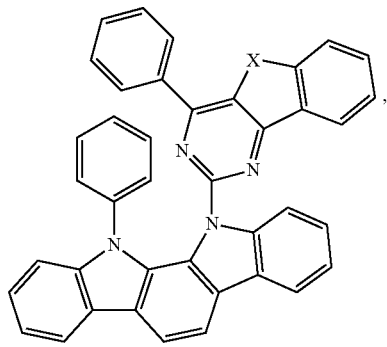

wherein in Compound ED19, X is O;
in Compound ED20, X is S;
in Compound ED21, X is Se Compounds ED22 through ED24 having the following structure,

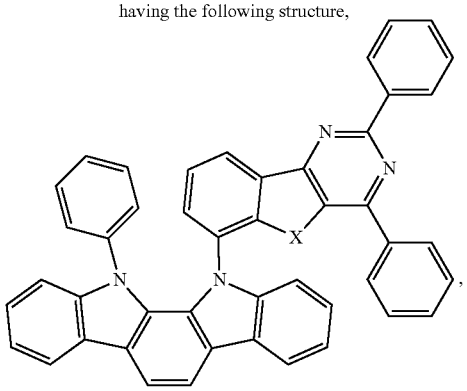

wherein in Compound ED22, X is O;
in Compound ED23, X is S;
in Compound ED24, X is Se Compounds ED25 through ED27 having the following structure,

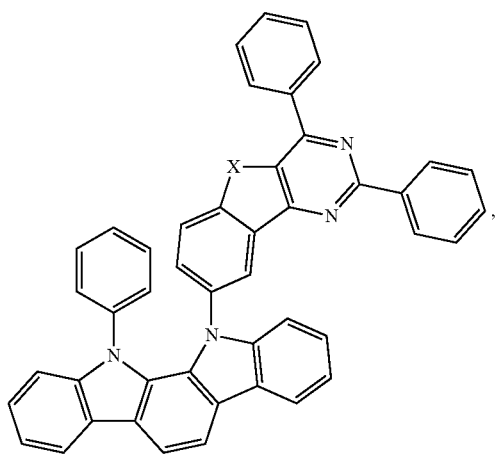

wherein in Compound ED25, X is O;
in Compound ED26, X is S;
in Compound ED27, X is Se Compound EF1

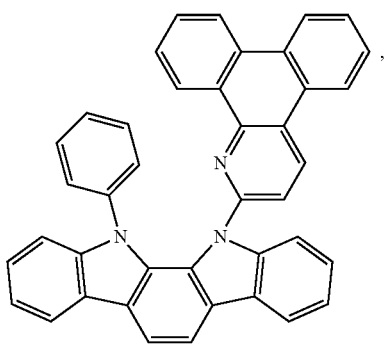

Compound EF2

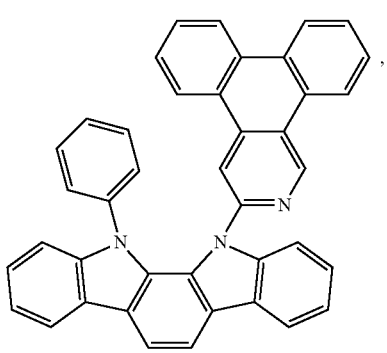

Compound EF3

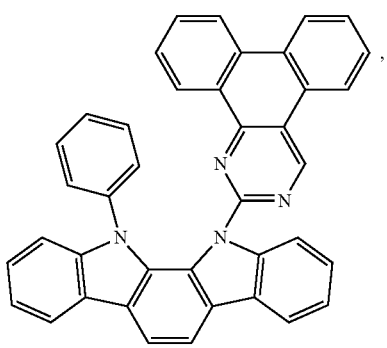

Compound EF4

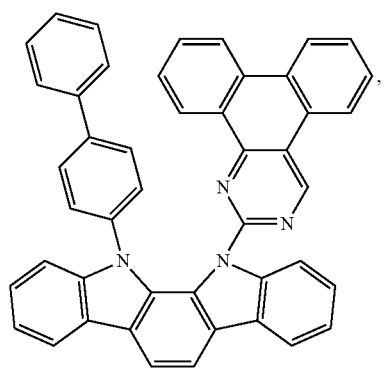

Compound EF5

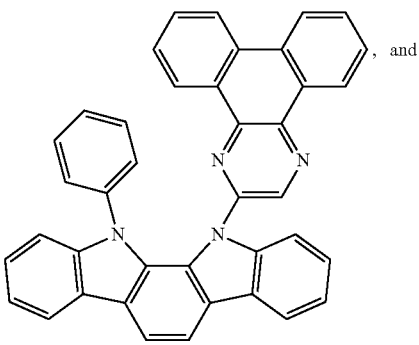

, and

Compound EF6

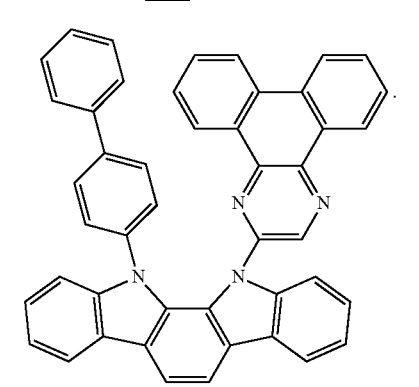

.

2. The composition of claim 1, wherein the first compound has an evaporation temperature $T_1$ of 150 to 350° C.; wherein the second compound has an evaporation temperature $T_2$ of 150 to 350° C.;
wherein absolute value of $T_1-T_2$ is less than 20° C.;
wherein the first compound has a concentration $C_1$ in said mixture and a concentration $C_2$ in a film formed by evaporating the mixture in a vacuum deposition tool at a constant pressure between $1\times10^{-6}$ Torr to $1\times10^{-9}$ Torr, at a 2 Å/sec deposition rate on a surface positioned at a predefined distance away from the mixture being evaporated; and
wherein absolute value of $(C_1-C_2)/C_1$ is less than 0.05.

3. The composition of claim 1, wherein the first compound has a vapor pressure of $P_1$ at $T_1$ at 1 atm, and the second compound has a vapor pressure of $P_2$ at $T_2$ at 1 atm; and
wherein the ratio of $P_1/P_2$ is within the range of 0.90:1 to 1.10:1.

4. The composition of claim 1, wherein the first compound has a first mass loss rate and the second compound has a second mass loss rate, wherein the ratio between the first mass loss rate and the second mass loss rate is within the range of 0.90:1 to 1.10:1.

5. The composition of claim 1, wherein the mixture of the first compound and the second compound is selected from the group consisting of: (Compound HA4, Compound EB1), (Compound HA5, Compound EB1), (Compound HA6, Compound EB1), (Compound HA11, Compound EB1), (Compound HA17, Compound EB1), (Compound HA20, Compound EB1), (Compound HA22, Compound EB1) (Compound HA29, Compound EB1), (Compound HB14, Compound EB1), (Compound HB20, Compound EB1), (Compound HC2, Compound EB1), (Compound HC8, Compound EB1), (Compound HD3, Compound EB1)

(Compound HE4, Compound EB1), (Compound HF5, Compound EB1), (Compound HA1, Compound EB7), (Compound HA4, Compound EB7), (Compound HA5, Compound EB7), (Compound HA6, Compound EB7), (Compound HA11, Compound EB7), (Compound HA17, Compound EB7), (Compound HA20, Compound EB7), (Compound HA22, Compound EB7) (Compound HA29, Compound EB7), (Compound HB14, Compound EB7), (Compound HB20, Compound EB7), (Compound HC2, Compound EB7), (Compound HC8, Compound EB7), (Compound HD3, Compound EB7) (Compound HE4, Compound EB7), (Compound HF5, Compound EB7), (Compound HA1, Compound EA1), (Compound HA4, Compound EB2), (Compound HA5, Compound EB8), (Compound HA6, Compound EB13), (Compound HA11, Compound EC1), (Compound HA17, Compound EC2), (Compound HA20, Compound EC9), (Compound HA22, Compound EC11) (Compound HA29, Compound EC12), (Compound HB14, Compound EC15),(Compound HB20, Compound EC16), (Compound HC2, Compound ED2), (Compound HC8, Compound ED5), (Compound HD3, Compound ED20), (Compound HE4, Compound ED23), and (Compound HF5, Compound EF5).

6. An organic light emitting device (OLED) comprising:
an anode;
a cathode; and
an organic layer, disposed between the anode and the cathode, comprising a composition of claim 1.

7. The OLED of claim 6, wherein the organic layer is an emissive layer and the first and second compounds in the mixture are co-hosts.

8. The OLED of claim 7, wherein the organic layer further comprises a phosphorescent emissive dopant; wherein the emissive dopant is a transition metal complex having at least one ligand or part of the ligand if the ligand is more than bidentate selected from the group consisting of:

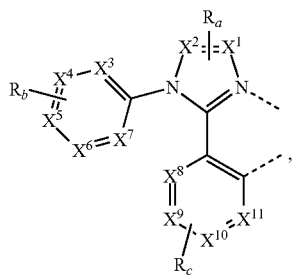

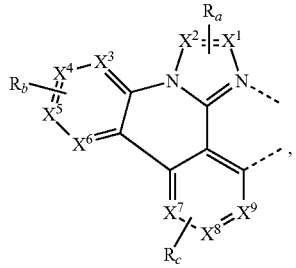

-continued

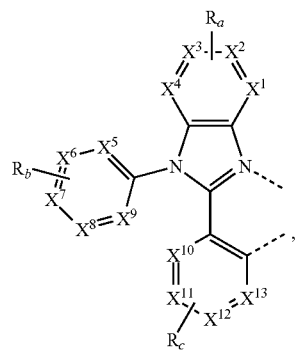

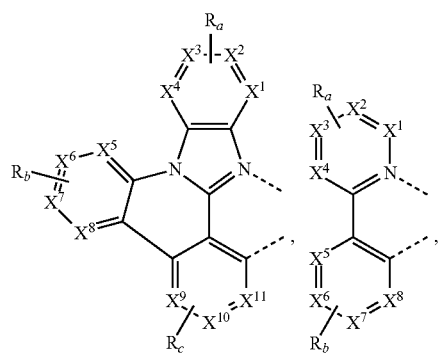

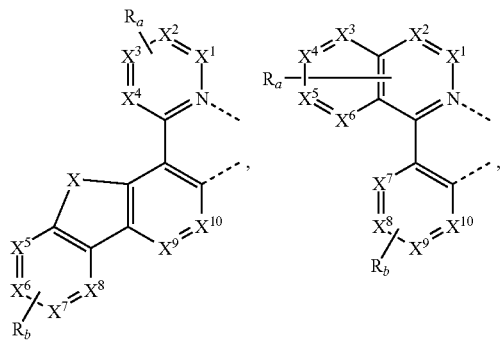

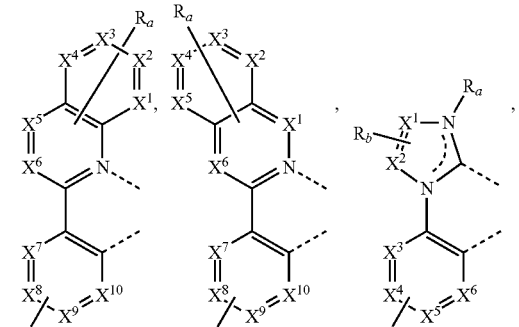

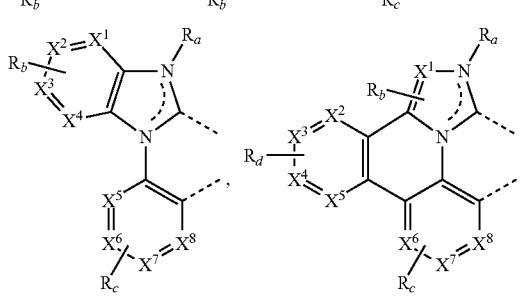

-continued

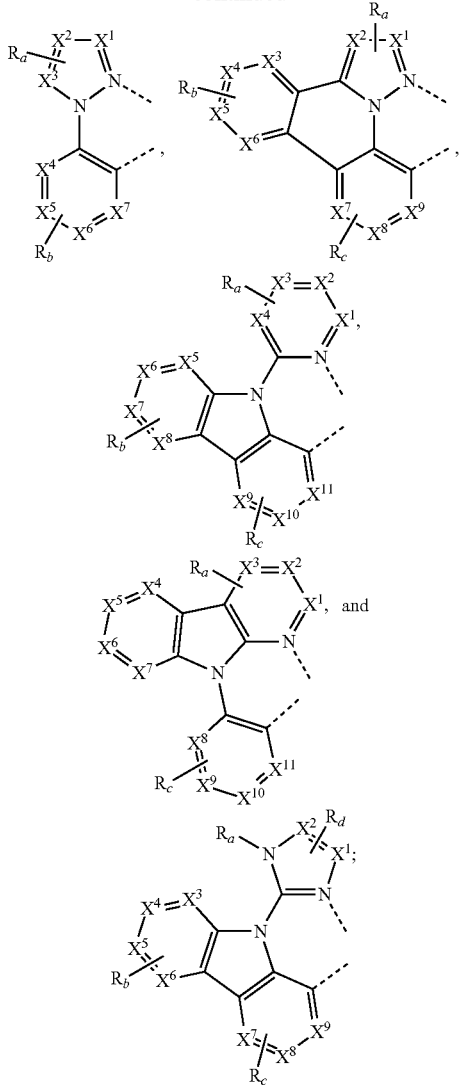

wherein each $X^1$ to $X^{13}$ are independently selected from the group consisting of carbon and nitrogen;
wherein X is selected from the group consisting of BR', NR', PR', O, S, Se, C=O, S=O, SO$_2$, CR'R", SiR'R", and GeR'R";
wherein R' and R" are optionally fused or joined to form a ring;
wherein each $R_a$, $R_b$, $R_c$, and $R_d$ may represent from mono substitution to the possible maximum number of substitution, or no substitution;
wherein R', R", $R_a$, $R_b$, $R_c$, and $R_d$ are each independently selected from the group consisting of hydrogen, deuterium, halide, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and
wherein any two adjacent substituents of $R_a$, $R_b$, $R_c$, and $R_d$ are optionally fused or joined to form a ring or form a multidentate ligand.

9. The OLED of claim 6, wherein the organic layer is a blocking layer and the mixture is used as blocking materials in the organic layer.

10. The OLED of claim 6, wherein the organic layer is a transporting layer and the mixture is used as transporting materials in the organic layer.

11. An organic light emitting device (OLED) comprising:
an anode;
a cathode; and
an electron blocking layer, disposed between the anode and the cathode, comprising a compound having a structure selected from the group consisting of:

Compound HA19

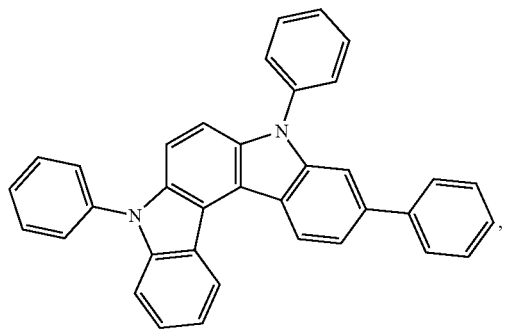

Compound HA20

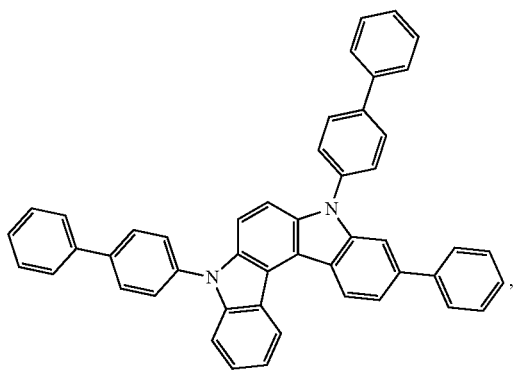

Compound HA21

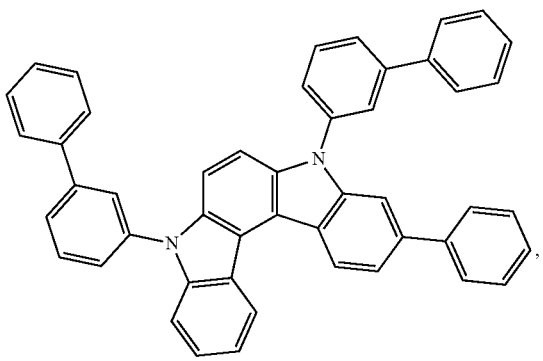

Compound HA22

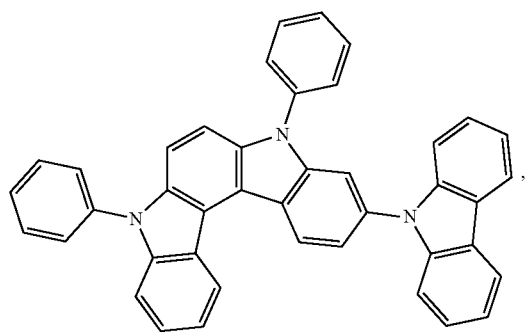

Compound HA23

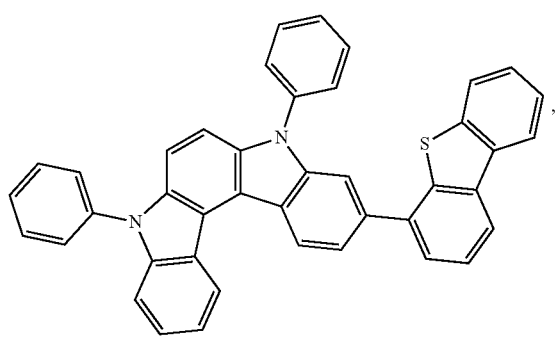

Compound HA24

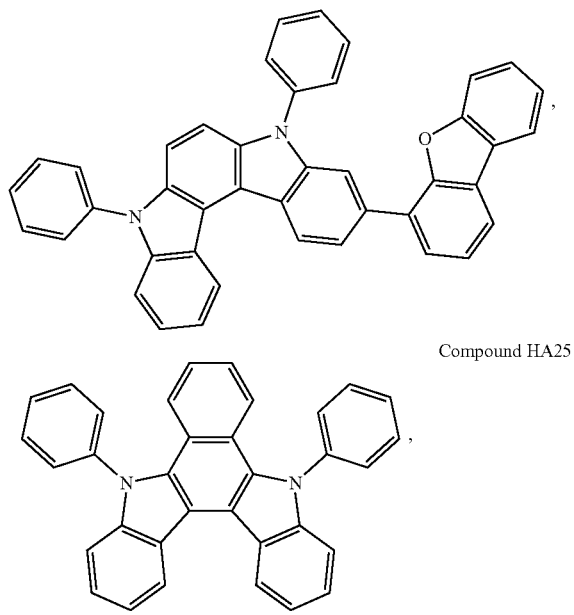

Compound HA25

Compound HA26

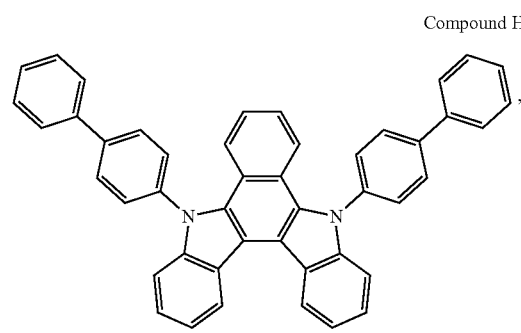

Compound HA27

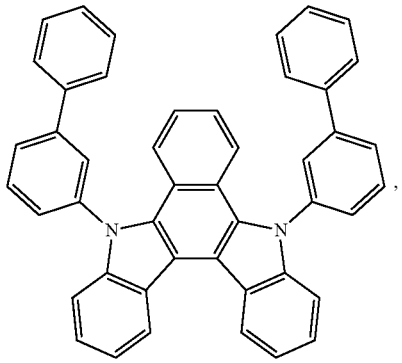

Compound HA28

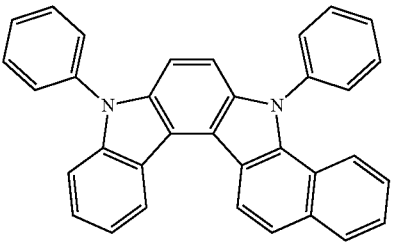

Compound HA29

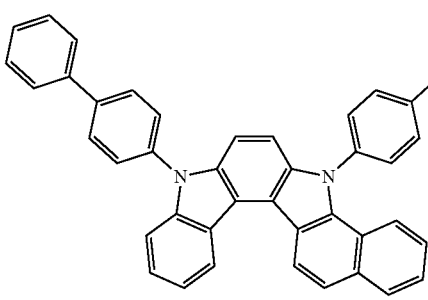, and

Compound HA30

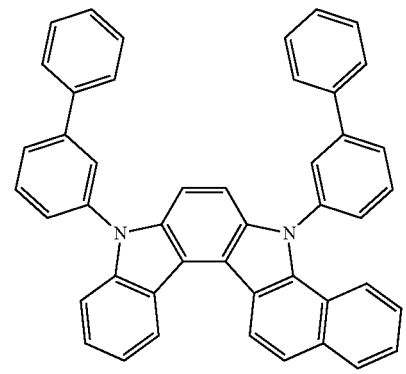.

12. The OLED of claim 6, wherein the compound of Formula I has an evaporation temperature $T_1$ of 150 to 350° C.;
wherein the second compound has an evaporation temperature $T_2$ of 150 to 350° C.;
wherein absolute value of $T_1-T_2$ is less than 20° C.;
wherein the first compound has a concentration $C_1$ in said mixture and a concentration $C_2$ in a film formed by evaporating the mixture in a vacuum deposition tool at a constant pressure between $1\times10^{-6}$ Torr to $1\times10^{-9}$ Torr, at a 2 Å/sec deposition rate on a surface positioned at a predefined distance away from the mixture being evaporated; and
wherein absolute value of $(C_1-C_2)/C_1$ is less than 0.05.

13. The OLED of claim 6, wherein the compound of Formula I has a vapor pressure of $P_1$ at $T_1$ at 1 atm, and the second compound has a vapor pressure of $P_2$ at $T_2$ at 1 atm; and wherein the ratio of $P_1/P_2$ is within the range of 0.90:1 to 1.10:1.

14. The OLED of claim 6, wherein the compound of Formula I has a first mass loss rate and the second compound has a second mass loss rate, wherein the ratio between the first mass loss rate and the second mass loss rate is within the range of 0.90:1 to 1.10:1.

15. The OLED of claim 11, wherein the OLED further comprises an emissive layer;

wherein the emissive layer comprises a phosphorescent emissive dopant;

wherein the emissive dopant is a transition metal complex having at least one ligand or part of the ligand if the ligand is more than bidentate selected from the group consisting of:

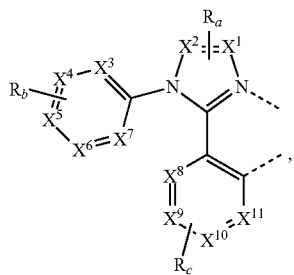

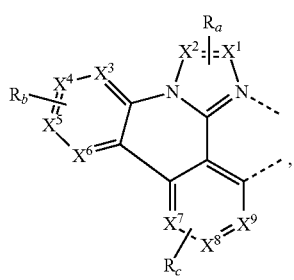

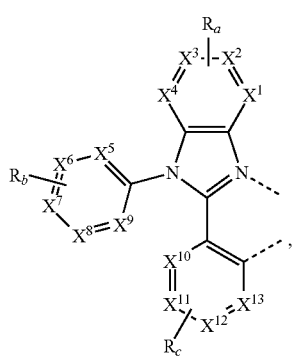

-continued

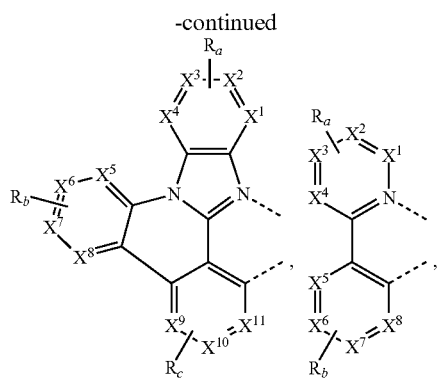

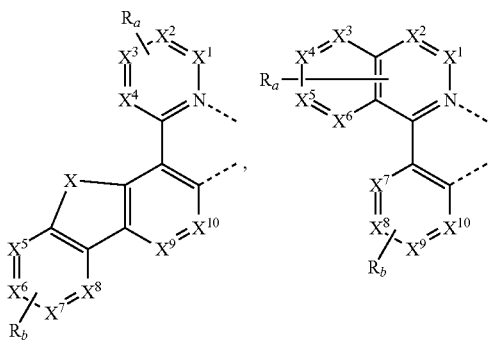

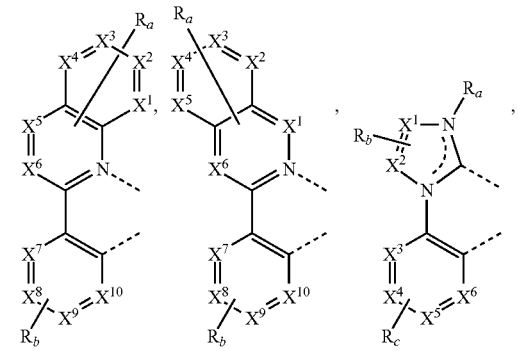

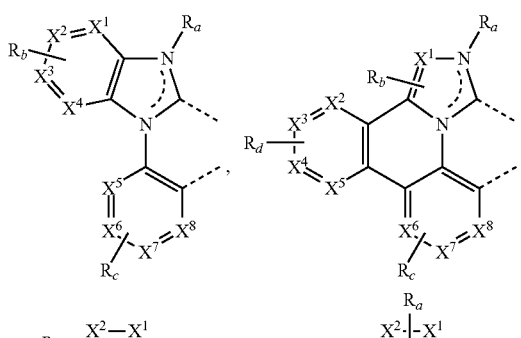

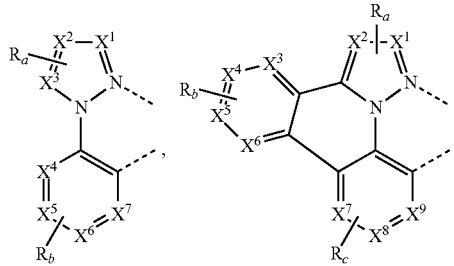

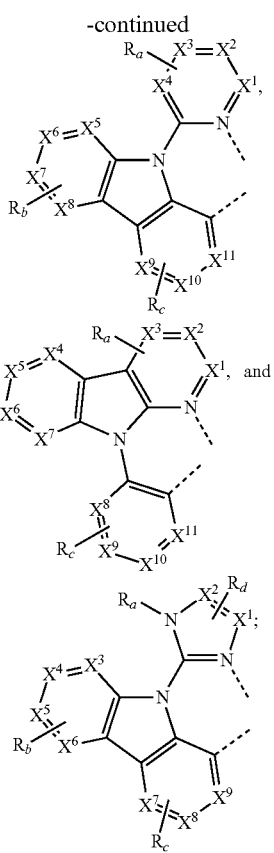

wherein each $X^1$ to $X^{13}$ are independently selected from the group consisting of carbon and nitrogen;

wherein X is selected from the group consisting of BR', NR', PR', O, S, Se, C=O, S=O, SO$_2$, CR'R", SiR'R", and GeR'R";

wherein R' and R" are optionally fused or joined to form a ring;

wherein each $R_a$, $R_b$, $R_c$, and $R_d$ may represent from mono substitution to the possible maximum number of substitution, or no substitution;

wherein R', R", $R_a$, $R_b$, $R_c$, and $R_d$ are each independently selected from the group consisting of hydrogen, deuterium, halide, alkyl, cycloalkyl, heteroalkyl, arylalkyl, alkyloxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any two adjacent substituents of $R_a$, $R_b$, $R_c$, and $R_d$ are optionally fused or joined to form a ring or form a multidentate ligand.

16. The composition of claim 1, wherein the first compound is selected from the group consisting of the Specific First Compounds.

17. The composition of claim 16, wherein the second compound is selected from the group consisting of the Specific Second Compounds.

18. The composition of claim 1, wherein the second compound is selected from the group consisting of the Specific Second Compounds.

19. The OLED of claim 6, wherein the first compound has a vapor pressure of $P_1$ at $T_1$ at 1 atm, and the second compound has a vapor pressure of $P_2$ at $T_2$ at 1 atm; and wherein the ratio of $P_1/P_2$ is within the range of 0.90:1 to 1.10:1.

* * * * *